(12) United States Patent
Fuchs et al.

(10) Patent No.: US 11,871,654 B2
(45) Date of Patent: * Jan. 9, 2024

(54) HETEROLEPTIC CARBENE COMPLEXES AND THE USE THEREOF IN ORGANIC ELECTRONICS

(71) Applicants: BASF SE, Ludwigshafen (DE); OLEDWORKS GMBH, Aachen (DE); OSRAM OLEO GMBH, Regensburg (DE)

(72) Inventors: Evelyn Fuchs, Mannheim (DE); Oliver Molt, Weinheim (DE); Korinna Dormann, Bad Duerkheim (DE); Thomas Gessner, Heidelberg (DE); Nicolle Langer, Heppenheim (DE); Ingo Muenster, Boehl-Iggelheim (DE); JianQiang Qu, Shanghai (CN); Christian Lennartz, Schifferstadt (DE); Christian Schildknecht, Mannheim (DE); Soichi Watanabe, Mannheim (DE); Gerhard Wagenblast, Wachenheim (DE); Guenter Schmid, Hemhofen (DE); Herbert Friedrich Boerner, Aachen (DE); Volker van Elsbergen, Aachen (DE)

(73) Assignee: UDC IRELAND LIMITED, Dublin (IE)

( * ) Notice: Subject to any disclaimer, the term of this patent is extended or adjusted under 35 U.S.C. 154(b) by 115 days.

This patent is subject to a terminal disclaimer.

(21) Appl. No.: 17/526,503

(22) Filed: Nov. 15, 2021

(65) Prior Publication Data

US 2022/0144869 A1 May 12, 2022

Related U.S. Application Data

(63) Continuation of application No. 16/294,403, filed on Mar. 6, 2019, now Pat. No. 11,189,806, which is a
(Continued)

(51) Int. Cl.
*H01L 51/50* (2006.01)
*H10K 85/30* (2023.01)
(Continued)

(52) U.S. Cl.
CPC ....... *H10K 85/342* (2023.02); *C07F 15/0033* (2013.01); *C07F 15/0086* (2013.01);
(Continued)

(58) Field of Classification Search
CPC .......................... H10K 85/342; H10K 85/361
See application file for complete search history.

(56) References Cited

U.S. PATENT DOCUMENTS

| 8,383,828 B2 | 2/2013 | Molt |
| 8,692,241 B1 | 4/2014 | Zeng |

(Continued)

FOREIGN PATENT DOCUMENTS

| EP | 1097981 A2 | 5/2001 |
| EP | 1786050 A1 | 5/2007 |

(Continued)

OTHER PUBLICATIONS

Ma et al., "Organic light-emitting diodes based on new n-doped electron transport layer", Synthetic Metals 158, pp. 810-814 (2008).

*Primary Examiner* — Anthony Ho
(74) *Attorney, Agent, or Firm* — Riverside Law LLP

(57) ABSTRACT

The present invention relates to heteroleptic complexes comprising a phenylimidazole or phenyltriazole unit bonded via a carbene bond to a central metal atom, and phenylimidazole ligands attached via a nitrogen-metal bond to the
(Continued)

central atom, to OLEDs which comprise such heteroleptic complexes, to light-emitting layers comprising at least one such heteroleptic complex, to a device selected from the group consisting of illuminating elements, stationary visual display units and mobile visual display units comprising such an OLED, to the use of such a heteroleptic complex in OLEDs, for example as emitter, matrix material, charge transport material and/or charge blocker.

20 Claims, 3 Drawing Sheets

Related U.S. Application Data continuation of application No. 13/504,725, filed as application No. PCT/EP2010/066400 on Oct. 28, 2010, now abandoned.

(60) Provisional application No. 61/255,499, filed on Oct. 28, 2009.

(51) Int. Cl.
| | | |
|---|---|---|
| C07F 15/00 | (2006.01) | |
| H10K 50/11 | (2023.01) | |
| H10K 50/14 | (2023.01) | |
| H10K 85/40 | (2023.01) | |
| H10K 85/60 | (2023.01) | |

(52) U.S. Cl.
CPC ........... *H10K 85/361* (2023.02); *H10K 50/11* (2023.02); *H10K 50/14* (2023.02); *H10K 85/40* (2023.02); *H10K 85/6572* (2023.02)

(56) References Cited

U.S. PATENT DOCUMENTS

| | | | |
|---|---|---|---|
| 9,812,656 | B2 | 11/2017 | Lin |
| 9,847,495 | B2 | 12/2017 | Lin |
| 11,189,806 | B2 * | 11/2021 | Fuchs .................. H10K 85/361 |
| 2002/0086180 | A1 | 7/2002 | Seo |
| 2005/0258433 | A1 | 11/2005 | Djurovich |
| 2005/0260448 | A1 | 11/2005 | Lin |
| 2006/0246315 | A1 | 11/2006 | Begley |
| 2006/0251923 | A1 | 11/2006 | Lin |
| 2007/0088167 | A1 | 4/2007 | Lin |
| 2007/0190359 | A1 | 8/2007 | Knowles |
| 2007/0224446 | A1 | 9/2007 | Nakano |
| 2008/0106188 | A1 | 5/2008 | Hwang |
| 2009/0017330 | A1 | 1/2009 | Iwakuma |
| 2009/0054657 | A1 | 2/2009 | Molt |
| 2009/0134784 | A1 | 5/2009 | Lin |
| 2009/0153034 | A1 | 6/2009 | Lin |
| 2009/0284138 | A1 | 11/2009 | Yasukawa |
| 2011/0203649 | A1 | 8/2011 | Koenemann |
| 2011/0253988 | A1 | 10/2011 | Molt |
| 2012/0012821 | A1 | 1/2012 | Langer |

FOREIGN PATENT DOCUMENTS

| | | | |
|---|---|---|---|
| EP | 1837926 | A1 | 9/2007 |
| EP | 1988587 | A1 | 11/2008 |
| EP | 2180029 | A1 | 4/2010 |
| JP | 2007059688 | A | 3/2007 |
| JP | 2008021687 | A | 1/2008 |
| JP | 2008066569 | A | 3/2008 |
| JP | 2008074939 | A | 4/2008 |
| JP | 2008084913 | A | 4/2008 |
| JP | 2008207520 | A | 9/2008 |
| JP | 2009021336 | A | 1/2009 |
| JP | 2009046408 | A | 3/2009 |
| JP | 2009057505 | A | 3/2009 |
| JP | 2009059767 | A | 3/2009 |
| JP | 2009510796 | A | 3/2009 |
| JP | 2009114369 | A | 5/2009 |
| JP | 2009114370 | A | 5/2009 |
| JP | 2009135183 | A | 6/2009 |
| JP | 2009170764 | A | 7/2009 |
| JP | 2009182298 | A | 8/2009 |
| JP | 2009267255 | A | 11/2009 |
| JP | 2010021336 | A | 1/2010 |
| JP | 2010040830 | A | 2/2010 |
| JP | 2010114180 | A | 5/2010 |
| JP | 2010135467 | A | 6/2010 |
| KR | 20090104044 | A | 10/2009 |
| WO | 2002060910 | A1 | 8/2002 |
| WO | 2005019373 | A2 | 3/2005 |
| WO | 2005113704 | A2 | 12/2005 |
| WO | 2006012880 | A1 | 2/2006 |
| WO | 2006056418 | A1 | 6/2006 |
| WO | 2006067074 | | 6/2006 |
| WO | 2006121811 | | 11/2006 |
| WO | 2007065549 | | 6/2007 |
| WO | 2007077810 | A1 | 7/2007 |
| WO | 2007095118 | A2 | 8/2007 |
| WO | 2007108362 | A1 | 9/2007 |
| WO | 2007108459 | A1 | 9/2007 |
| WO | 2007114244 | A1 | 10/2007 |
| WO | 2007115970 | A1 | 10/2007 |
| WO | 2007115981 | A1 | 10/2007 |
| WO | 2007119816 | A1 | 10/2007 |
| WO | 2008000727 | A1 | 1/2008 |
| WO | 2008029652 | A1 | 3/2008 |
| WO | 2008029729 | A1 | 3/2008 |
| WO | 2008034758 | A2 | 3/2008 |
| WO | 2008035571 | A1 | 3/2008 |
| WO | 2008054584 | | 5/2008 |
| WO | 2008072596 | A1 | 6/2008 |
| WO | 2008078115 | A1 | 7/2008 |
| WO | 2008090912 | A1 | 7/2008 |
| WO | 2008140114 | A1 | 11/2008 |
| WO | 2008146838 | A1 | 12/2008 |
| WO | 2008156105 | A1 | 12/2008 |
| WO | 2009003898 | A1 | 1/2009 |
| WO | 2009003919 | A1 | 1/2009 |
| WO | 2009008099 | A1 | 1/2009 |
| WO | 2009008100 | A1 | 1/2009 |
| WO | 2009010448 | A1 | 1/2009 |
| WO | 2009050281 | A1 | 4/2009 |
| WO | 2009060742 | A1 | 5/2009 |
| WO | 2009060757 | A1 | 5/2009 |
| WO | 2009060779 | A1 | 5/2009 |
| WO | 2009060780 | A1 | 5/2009 |
| WO | 2009063757 | A1 | 5/2009 |
| WO | 2009084413 | A1 | 7/2009 |
| WO | 2009086028 | A2 | 7/2009 |
| WO | 2010001830 | A1 | 1/2010 |
| WO | 2010004877 | A1 | 1/2010 |
| WO | 2010040777 | A1 | 4/2010 |
| WO | 2010044342 | A1 | 4/2010 |
| WO | 2010067746 | | 6/2010 |
| WO | 2010079051 | A1 | 7/2010 |
| WO | 2010079678 | A1 | 7/2010 |
| WO | 2010087222 | A1 | 8/2010 |
| WO | 2010090077 | A1 | 8/2010 |
| WO | 2010095564 | A1 | 8/2010 |

* cited by examiner

HETEROLEPTIC CARBENE COMPLEXES AND THE USE THEREOF IN ORGANIC ELECTRONICS

CROSS REFERENCE TO RELATED APPLICATIONS

This application is a continuation of U.S. patent application Ser. No. 16/294,403, filed Mar. 6, 2019, now allowed, which is a continuation of U.S. patent application Ser. No. 13/504,725, filed Apr. 27, 2012, which is a 35 U.S.C. § 371 National Stage Patent Application of International Patent Application No. PCT/EP2010/066400, filed Oct. 28, 2010, which claims priority to U.S. Provisional Application No. 61/255,499, filed Oct. 28, 2009, the entire disclosures of which are incorporated herein by reference.

BACKGROUND OF THE INVENTION

The present invention relates to heteroleptic complexes comprising a phenylimidazole or phenyltriazole unit bonded via a carbene bond to a central metal atom, and phenylimidazole ligands attached via a nitrogen-metal bond to the central atom, to OLEDs which comprise such heteroleptic complexes, to light-emitting layers comprising at least one such heteroleptic complex, to a device selected from the group consisting of illuminating elements, stationary visual display units and mobile visual display units comprising such an OLED, to the use of such a heteroleptic complex in OLEDs, for example as emitter, matrix material, charge transport material and/or charge blocker.

Organic Light-Emitting Diodes (OLEDs) exploit the property of materials to emit light when they are excited by electrical current. OLEDs are of particular interest as an alternative to cathode ray tubes and liquid-crystal displays for production of flat visual display units. Owing to the very compact design and the intrinsically low power consumption, devices comprising OLEDs are suitable especially for mobile applications, for example for applications in cellphones, laptops, etc.

In addition, white OLEDs give great advantages over the illumination technologies known to date, especially a particularly high efficiency.

The prior art proposes numerous materials, examples of which include heteroleptic complexes with iridium as the central metal atom, which emit light on excitation by electrical current.

WO 2006/121811 A1 discloses phosphorescent heteroleptic metal complexes which comprise carbene ligands. The complexes specified in WO 2006/121811 A1, for example iridium complexes, all have benzimidazolocarbenes (benzimidazolylidenes) as carbene ligands. Compounds which have imidazolocarbenes (imidazolylidenes) or triazolocarbenes (triazolylidenes) as ligands are not disclosed in WO 2006/121811 A1.

WO 2006/067074 A1 likewise discloses electroluminescent heteroleptic metal complexes with carbene ligands. The noncarbene ligands used include arylpyridines, arylpyrazoles and aryltriazoles. Use of 2-phenyl-1H-imidazoles as noncarbene ligands is not disclosed in WO 2006/067074 A1.

WO 2007/115981 discloses heteroleptic metal complexes comprising both carbene ligands and heterocyclic noncarbene ligands, a process for preparation thereof, and the use of these compounds in OLEDs. The compounds disclosed by way of example in WO 2007/115981 do not comprise a combination of 2-phenyl-1H-imidazole ligands with an imidazolocarbene (imidazolylidene) ligand or a triazolocarbene (triazolylidene) ligand.

JP 2009057505 discloses optoelectronic components which comprise compounds with tunable emission wavelength, high light emission efficiency and long lifetime. The components according to this document comprise metal complexes which, as well as two ligands optionally joined to one another, comprise at least one ligand attached to the metal atom firstly via a carbene bond and secondly via a noncarbene bond. No combination of a 2-phenyl-1H-imidazole ligand with an imidazolocarbene (imidazolylidene) ligand or a triazolocarbene (triazolylidene) ligand is disclosed.

Even though compounds which exhibit electroluminescence in the visible region, more particularly in the red, green and especially blue region of the electromagnetic spectrum, for example iridium complexes, are already known, the provision of alternative compounds which possess high quantum yields and exhibit long diode lifetimes is desirable. In the context of the present invention, electroluminescence is understood to mean both electrofluorescence and electrophosphorescence.

It is therefore an object of the present invention to provide alternative iridium and platinum complexes which are suitable for electroluminescence in the visible region, more particularly in the red, green and especially blue region of the electromagnetic spectrum, which enables the production of full-color displays and white OLEDs. It is a further object of the present invention to provide corresponding complexes which can be used as a mixture with a host compound (matrix material) or in substance, i.e. in the absence of host substances, as a light-emitting layer in OLEDs. It is a further object of the present invention to provide corresponding complexes which have a high quantum yield and a high stability in diodes. The complexes should be usable as emitter, matrix material, charge transport material, especially hole transport material, or charge blocker in OLEDs.

BRIEF SUMMARY OF THE INVENTION

These objects are achieved in accordance with the invention by heteroleptic complexes of the general formula (I)

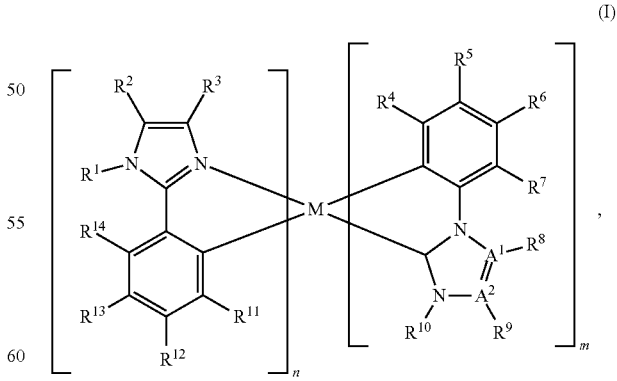

in which M, $A^1$, $A^2$, n, m, $R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$ are each defined as follows:

M is a metal atom selected from the group consisting of Ir and Pt, $A^1$, $A^2$ are each independently N or C, n, m are each independently 1 or 2, where, if M is Pt, the sum of n and m is 2, or, if M is Ir, the sum of n and m is 3, $R^1$ is a linear or branched alkyl radical optionally interrupted by at least one heteroatom, optionally bearing at least one functional group and having 1 to 20 carbon atoms, cycloalkyl radical optionally interrupted by at least one heteroatom, optionally bearing at least one functional group and having 3 to 20 carbon atoms, substituted or unsubstituted aryl radical optionally interrupted by at least one heteroatom, optionally bearing at least one functional group and having 6 to 30 carbon atoms. substituted or unsubstituted heteroaryl radical optionally interrupted by at least one heteroatom, optionally bearing at least one functional group and having 5 to 18 carbon atoms and/or heteroatoms, $R^2$, $R^3$ are each independently hydrogen, linear or branched alkyl radical optionally interrupted by at least one heteroatom, optionally bearing at least one functional group and having 1 to 20 carbon atoms, cycloalkyl radical optionally interrupted by at least one heteroatom, optionally bearing at least one functional group and having 3 to 20 carbon atoms, substituted or unsubstituted aryl radical optionally interrupted by at least one heteroatom, optionally bearing at least one functional group and having 6 to 30 carbon atoms, substituted or unsubstituted heteroaryl radical optionally interrupted by at least one heteroatom, optionally bearing at least one functional group and having 5 to 18 carbon atoms and/or heteroatoms, $R^4$, $R^5$, $R^6$, $R^7$ are each independently hydrogen, substituent with donor or acceptor action, linear or branched alkyl radical optionally interrupted by at least one heteroatom, optionally bearing at least one functional group and having 1 to 20 carbon atoms, cycloalkyl radical optionally interrupted by at least one heteroatom, optionally bearing at least one functional group and having 3 to 20 carbon atoms, substituted or unsubstituted aryl radical optionally interrupted by at least one heteroatom, optionally bearing at least one functional group and having 6 to 30 carbon atoms, substituted or unsubstituted heteroaryl radical optionally interrupted by at least one heteroatom, optionally bearing at least one functional group and having 5 to 18 carbon atoms and/or heteroatoms, or $R^4$ and $R^5$ or $R^5$ and $R^B$ and/or $R^6$ and $R^7$ together form a saturated, unsaturated or aromatic carbon ring optionally interrupted by at least one heteroatom and having a total of 5 to 30 carbon atoms or heteroatoms, $R^8$, $R^9$ are each independently a free electron pair if $A^1$ or $A^2$ is N, or, if $A^1$ or $A^2$ is C, hydrogen. linear or branched alkyl radical optionally interrupted by at least one heteroatom, optionally bearing at least one functional group and having 1 to 20 carbon atoms, cycloalkyl radical optionally interrupted by at least one heteroatom, optionally bearing at least one functional group and having 3 to 20 carbon atoms, substituted or unsubstituted aryl radical optionally interrupted by at least one heteroatom, optionally bearing at least one functional group and having 6 to 30 carbon atoms, substituted or unsubstituted heteroaryl radical optionally interrupted by at least one heteroatom, optionally bearing at least one functional group and having 5 to 18 carbon atoms and/or heteroatoms, $R^{10}$ is a linear or branched alkyl radical optionally interrupted by at least one heteroatom, optionally bearing at least one functional group and having 1 to 20 carbon atoms, cycloalkyl radical optionally interrupted by at least one heteroatom, optionally bearing at least one functional group and having 3 to 20 carbon atoms, substituted or unsubstituted aryl radical optionally interrupted by at least one heteroatom, optionally bearing at least one functional group and having 6 to 30 carbon atoms, substituted or unsubstituted heteroaryl radical optionally interrupted by at least one heteroatom, optionally bearing at least one functional group and having 5 to 18 carbon atoms and/or heteroatoms $R^{11}$, $R^{12}$, $R^{13}$, $R^{14}$ are each independently hydrogen, substituent with donor or acceptor action, linear or branched alkyl radical optionally interrupted by at least one heteroatom, optionally bearing at least one functional group and having 1 to 20 carbon atoms. cycloalkyl radical optionally interrupted by at least one heteroatom, optionally bearing at least one functional group and having 3 to 20 carbon atoms, substituted or unsubstituted aryl radical optionally interrupted by at least one heteroatom, optionally bearing at least one functional group and having 6 to 30 carbon atoms, substituted or unsubstituted heteroaryl radical optionally interrupted by at least one heteroatom, optionally bearing at least one functional group and having 5 to 18 carbon atoms and/or heteroatoms, or $R^{11}$ and $R^{12}$ or $R^{12}$ and $R^{13}$ and/or $R^{13}$ and $R^{14}$ together form a saturated, unsaturated or aromatic carbon ring optionally interrupted by at least one heteroatom and having a total of 5 to 30 carbon atoms and/or heteroatoms and/or $R^1$ and $R^{14}$ together form a saturated or unsaturated, linear or branched bridge optionally comprising heteroatoms, aromatic units, heteroaromatic units and/or functional groups and having a total of 1 to 30 carbon atoms and/or heteroatoms, to which a substituted or unsubstituted. five- to eight-membered ring comprising carbon atoms and/or heteroatoms, preferably a six-membered aromatic ring, is optionally fused, and/or if $A^1$ is C, $R^7$ and $R^8$ together form a saturated or unsaturated, linear or branched bridge optionally comprising heteroatoms, aromatic units, heteroaromatic units and/or functional groups and having a total of 1 to 30 carbon atoms and/or heteroatoms, to which a substituted or unsubstituted, five- to eight-membered ring comprising carbon atoms and/ or heteroatoms, preferably a six-membered aromatic ring, is optionally fused.

DETAILED DESCRIPTION

Figure 1:
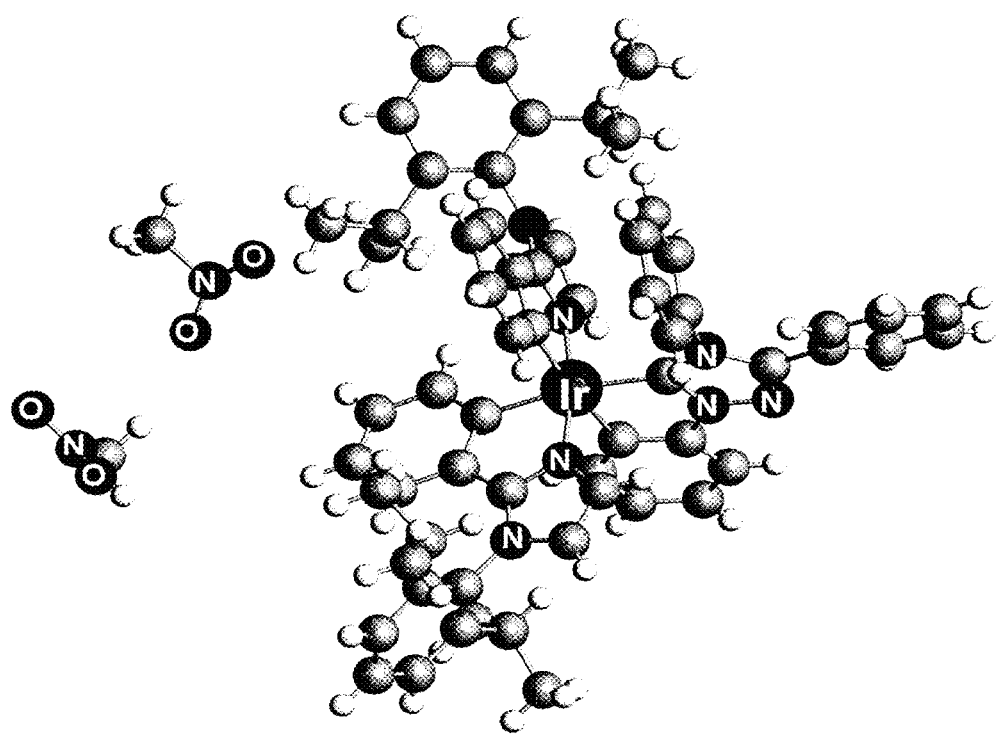
FIG. 1 depicts a crystal structure of Em1-s.

In the context of the present invention, the terms aryl radical, unit or group, heteroaryl radical, unit or group, alkyl radical, unit or group and cycloalkyl radical, unit or group are each defined as follows, as long as no different meanings are mentioned:

An aryl radical or group is understood to mean a radical with a base skeleton of 6 to 30 carbon atoms, preferably 6 to 18 carbon atoms, which is formed from an aromatic ring or a plurality of fused aromatic rings. Suitable base skeletons are, for example, phenyl, benzyl, naphthyl, anthracenyl or phenanthrenyl. This base skeleton may be unsubstituted, which means that all carbon atoms which are substitutable bear hydrogen atoms, or may be substituted at one, more than one or all substitutable positions of the base skeleton. Suitable substituents are, for example, alkyl radicals, preferably alkyl radicals having 1 to 8 carbon atoms, more preferably methyl, ethyl, i-propyl or t-butyl, aryl radicals, preferably $C_6$-aryl radicals, which may in turn be substituted or unsubstituted, heteroaryl radicals, preferably heteroaryl radicals which comprise at least one nitrogen atom, more preferably pyridyl radicals, alkenyl radicals, preferably alkenyl radicals which bear one double bond, more preferably alkenyl radicals with one double bond and 1 to 8 carbon atoms, or groups with donor or acceptor action. Groups with donor action are understood to mean groups which have a +I and/or +M effect, and groups with acceptor action are understood to mean groups which have a −I and/or −M effect. Suitable groups with donor or acceptor action are halogen radicals, preferably F, Cl, Br, more preferably F, alkyl radicals, alkoxy radicals, aryloxy radicals, carbonyl radicals, ester radicals, amine radicals, amide radicals, $CH_2F$ groups, $CHF_2$ groups, $CF_3$ groups, CN groups, thio groups or SCN groups. The aryl radicals most preferably bear substituents selected from the group consisting of methyl, ethyl. iso-propyl, n-propyl, n-butyl, iso-butyl, tert-butyl, aryloxy, amine, thio groups and alkoxy, or the aryl radicals are unsubstituted. The aryl radical or the aryl group is preferably a $C_6$-aryl radical optionally substituted by at least one of the aforementioned substituents. The $C_6$-aryl radical more preferably has none, one, two or three of the aforementioned substituents.

A heteroaryl radical or a heteroaryl group is understood to mean radicals having 5 to 30 carbon atoms and/or heteroatoms, which differ from the aforementioned aryl radicals in that at least one carbon atom in the base skeleton of the aryl radicals is replaced by a heteroatom. Preferred heteroatoms are N, O and S. Most preferably, one or two carbon atoms of the base skeleton of the aryl radicals are replaced by heteroatoms. The base skeleton is especially preferably selected from electron-poor systems such as pyridyl. pyrimidyl, pyrazyl and triazolyl, and five-membered heteroaromatics such as pyrrole, furan, thiophene, imidazole, pyrazole, triazole, oxazole and thiazole. The base skeleton may be substituted at one, more than one or all substitutable positions of the base skeleton. Suitable substituents are the same as have already been specified above for the aryl groups.

An alkyl radical or an alkyl group is understood to mean a radical having 1 to 20 carbon atoms. preferably 1 to 10 carbon atoms, more preferably 1 to 8 carbon atoms. This alkyl radical may be branched or unbranched and may optionally be interrupted by one or more heteroatoms, preferably N, O or S. In addition, this alkyl radical may be substituted by one or more of the substituents already specified for the aryl groups. It is likewise possible that the alkyl radical bears one or more aryl groups. All of the aryl groups listed above are suitable. Particular preference is given to the alkyl radicals selected from the group consisting of methyl, ethyl, i-propyl, n-propyl, i-butyl, n-butyl, t-butyl, sec-butyl, i-pentyl, n-pentyl, sec-pentyl, neopentyl, n-hexyl, i-hexyl and sec-hexyl. Very particular preference is given to methyl, i-propyl, tert-butyl.

A cycloalkyl radical or a cycloalkyl group is understood to mean a cyclic radical having 3 to 20 carbon atoms, preferably 3 to 10 carbon atoms, more preferably 3 to 8 carbon atoms. This cycloalkyl radical may optionally be interrupted by one or more heteroatoms, preferably N, O or S. In addition, this cycloalkyl radical may be unsubstituted or substituted, i.e. may be substituted by one or more of the substituents already specified for the aryl groups. It is likewise possible that the cycloalkyl radical bears one or more aryl groups. All of the aryl groups listed above are suitable.

The statements made for the aryl, heteroaryl, alkyl and cycloalkyl radicals applies, in accordance with the invention, independently to the radicals mentioned in the present application, especially to the $R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$ radicals, where $R^8$ and $R^9$, in the case that $A^1$ and/or $A^2$ is N. are a free electron pair, which means that no substituent selected from the abovementioned group is present on these ring nitrogen atoms. In the case that $A^1$ and/or $A^2$ is C, R and $R^9$ are each independently hydrogen and/or the substituents specified.

In a preferred embodiment, M, $A^1$, $A^2$, n, m, $R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$ are each defined as follows: According to the invention, M is Ir or Pt, preferably Ir. Ir is present in the inventive heteroleptic complexes in the +3 oxidation state. Pt is present in the inventive heteroleptic complexes in the +2 oxidation state.

According to the invention, $A^1$ and $A^2$ are each independently C or N. Preference is given in accordance with the invention to the following embodiments:
1. Both $A^1$ and $A^2$ are C, i.e. the inventive heteroleptic complexes comprise at least one phenylimidazole unit attached via a metal-carbene bond.
2. In a further preferred embodiment, $A^1$ and $A^2$ are each N or C, where $A^1$=N when $A^2$=C or $A^1$=C when $A^2$ is N, i.e. one of $A^1$ and $A^2$ is N, the other is C. In this embodiment, the inventive heteroleptic complexes comprise at least one phenyltriazole unit attached via a metal-carbene bond.

n and m are each independently 1 or 2, where, if M is Pt, the sum of n and m is 2, or, if M is Ir, the sum of n and m is 3. Therefore, if M is Pt, n and m are each 1. If M is Ir, preferably, n=2 and m=1.

In a preferred embodiment, $R^1$ is a linear or branched alkyl radical having 1 to 20 carbon atoms, a substituted or unsubstituted aryl radical having 6 to 30 carbon atoms, a substituted or unsubstituted heteroaryl radical having 5 to 18 carbon atoms and/or heteroatoms.

$R^1$ is more preferably a substituted or unsubstituted aryl radical having 6 to 30 carbon atoms, most preferably a substituted, especially ortho,ortho'- or ortho,ortho',para-substituted, or unsubstituted phenyl radical. The substituents are preferably alkyl radicals having 1 to 10, especially 1 to 6, carbon atoms, for example methyl, ethyl, propyl, butyl. Very particularly preferred $R^1$ radicals are phenyl, 2,6-dimethylphenyl, 2,6-di-iso-propylphenyl or 2,4,6-trimethylphenyl, i.e. mesityl.

The present invention therefore relates more particularly to an inventive heteroleptic complex where $R^1$ is an aryl radical which has 6 to 30 carbon atoms and is substituted in the ortho,ortho' positions in each case by a linear or branched alkyl radical having 1 to 10 carbon atoms.

In a preferred embodiment, $R^2$, $R^3$ are each independently hydrogen, a linear or branched alkyl radical having 1 to 20 carbon atoms, a substituted or unsubstituted aryl radical having 6 to 30 carbon atoms, a substituted or unsubstituted heteroaryl radical having 5 to 18 carbon atoms and/or heteroatoms.

In a preferred embodiment, $R^4$, $R^5$, $R^6$, $R^7$ are each hydrogen or $R^4$ and $R^5$ or $R^5$ and $R^6$ or $R^6$ and $R^7$, especially $R^5$ and $R^6$ or $R^6$ and $R^7$, together form a saturated, unsaturated or aromatic carbon ring optionally interrupted by at least one heteroatom and having a total of 6 to 30 carbon atoms.

In a very particularly preferred embodiment of the inventive heteroleptic complex, $R^4$ and $R^5$ or $R^5$ and $R^6$ or $R^6$ and $R^7$ together form a cycle of the general formula (IIa) or (IIb)

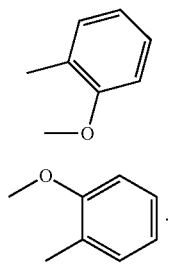

(IIa)

(IIb)

In a further preferred embodiment, $R^8$, $R^9$ are each independently a free electron pair if $A^1$ or $A^2$ is N, or, if $A^1$ or $A^2$ is C, hydrogen or linear or branched alkyl radical having 1 to 20 carbon atoms, substituted or unsubstituted aryl radical having 6 to 30 carbon atoms or substituted or unsubstituted heteroaryl radical having 5 to 18 carbon atoms and/or heteroatoms, most preferably phenyl radical.

In a preferred embodiment, $R^{10}$ is a linear or branched alkyl radical having 1 to 20 carbon atoms, more preferably having 1 to 6 carbon atoms, or a substituted or unsubstituted aryl radical having 6 to 30 carbon atoms, more preferably having 6 to 10 carbon atoms. Examples of particularly preferred alkyl radicals for $R^{10}$ are methyl, ethyl, propyl, especially isopropyl, butyl, especially tert-butyl, or pentyl. Examples of particularly preferred aryl radicals for $R^{10}$ are unsubstituted phenyl or substituted phenyl, preferably substituted in the ortho position, for example by alkyl radicals having 1 to 6 carbon atoms, for example methyl, ethyl or propyl, especially isopropyl.

In a preferred embodiment, $R^{11}$, $R^{12}$, $R^{13}$, $R^{14}$ are each independently hydrogen or a linear or branched alkyl radical having 1 to 20 carbon atoms, more preferably hydrogen.

In a further embodiment of the inventive heteroleptic complexes, $R^1$ and $R^{14}$ together form a saturated or unsaturated, linear or branched bridge optionally comprising heteroatoms, aromatic units, heteroaromatic units and/or functional groups and having a total of 1 to 30 carbon atoms and/or heteroatoms, to which a substituted or unsubstituted, five- to eight-membered ring comprising carbon atoms and/or heteroatoms, preferably a six-membered aromatic ring, is optionally fused. Most preferably, $R^1$ and $R^{14}$ form an unsaturated bridge having two carbon atoms, to which a six-membered aromatic ring is fused, which is either unsubstituted or substituted by one or two alkyl radicals having 1 to 6 carbon atoms, for example methyl or ethyl.

In a further embodiment of the inventive heteroleptic complexes, if $A^1$ is C, $R^7$ and $R^8$ together form a saturated or unsaturated, linear or branched bridge optionally comprising heteroatoms, aromatic units, heteroaromatic units and/or functional groups and having a total of 1 to 30 carbon atoms and/or heteroatoms, to which a substituted or unsubstituted, five- to eight-membered ring comprising carbon atoms and/or heteroatoms, preferably a six-membered aromatic ring, is optionally fused. Most preferably, $R^7$ and $R^8$ form an unsaturated bridge having two carbon atoms, to which a six-membered aromatic ring is fused, which is either unsubstituted or substituted by one or two alkyl radicals having 1 to 6 carbon atoms, for example methyl or ethyl.

The present invention more preferably relates to inventive heteroleptic complexes of the general formula (I) where M, $A^1$, $A^2$, n, m, $R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$ are each defined as follows:

M is Ir,
$A^1$, $A^2$ is C,
n, m are each independently 1 or 2, where the sum of n and m is 3; preferably, n=2 and m=1,
$R^1$ is a linear or branched alkyl radical having 1 to 20 carbon atoms, substituted or unsubstituted aryl radical having 6 to 30 carbon atoms, substituted or unsubstituted heteroaryl radical having 5 to 18 carbon atoms and/or heteroatoms; preferably $R^1$ is an unsubstituted or substituted aryl radical,
$R^2$, $R^3$ are each independently hydrogen, linear or branched alkyl radical having 1 to 20 carbon atoms, substituted or unsubstituted aryl radical having 6 to 30 carbon atoms, substituted or unsubstituted heteroaryl radical having 5 to 18 carbon atoms and/or heteroatoms; preferably $R^2$ and $R^3$ are each hydrogen,
$R^4$, $R^5$,
$R^6$, $R^7$ are each hydrogen
or
$R^4$ and $R^5$ or $R^5$ and $R^6$ or $R^6$ and $R^7$ together form a saturated, unsaturated or aromatic ring optionally interrupted by at least one heteroatom and having a total of 5 to 30 carbon atoms and/or heteroatoms,
$R^8$, $R^9$ are each hydrogen,
$R^{10}$ is a linear or branched alkyl radical having 1 to 20 carbon atoms, substituted or unsubstituted aryl radical having 6 to 30 carbon atoms, and
$R^{11}$, $R^{12}$,
$R^{13}$, $R^{14}$ are each independently hydrogen or linear or branched alkyl radical having 1 to 20 carbon atoms,
and/or
$R^1$ and $R^{14}$ together form a saturated or unsaturated, linear or branched bridge optionally comprising heteroatoms, aromatic units, heteroaromatic units and/or functional groups and having a total of 1 to 30 carbon atoms and/or heteroatoms, to which a substituted or unsubstituted, five- to eight-membered ring comprising carbon atoms and/or heteroatoms, preferably a six-membered aromatic ring, is optionally fused,
and/or
$R^7$ and $R^8$ together form a saturated or unsaturated, linear or branched bridge optionally comprising heteroatoms, aromatic units, heteroaromatic units and/or functional groups and having a total of 1 to 30 carbon atoms and/or heteroatoms, to which a substituted or unsubstituted, five- to eight-membered ring comprising carbon atoms and/or heteroatoms, preferably a six-membered aromatic ring, is optionally fused.

The abovementioned preferred and particularly preferred embodiments apply correspondingly.

The present invention preferably further relates to inventive heteroleptic complexes of the general formula (I) where M, $A^1$, $A^2$, n, m, $R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$ are each defined as follows:

M is Ir,
$A^1$, $A^2$ are each N or C, where $A^1$=N when $A^2$=C and $A^1$=C when $A^2$=N
n, m are each independently 1 or 2, where the sum of n and m is 3; preferably n=2 and m=1,
$R^1$ is a linear or branched alkyl radical having 1 to 20 carbon atoms, substituted or unsubstituted aryl radical having 6 to 30 carbon atoms, substituted or unsubstituted heteroaryl radical having 5 to 18 carbon atoms and/or heteroatoms; preferably $R^1$ is a substituted or unsubstituted aryl radical,
$R^2$, $R^3$ are each independently hydrogen, linear or branched alkyl radical having 1 to 20 carbon atoms, substituted or unsubstituted aryl radical having 6 to 30 carbon atoms, substituted or unsubstituted heteroaryl radical having 5 to 18 carbon atoms and/or heteroatoms; preferably, $R^2$ and $R^3$ are each hydrogen, $R^4$, $R^5$, $R^6$, $R^7$ are each hydrogen or $R^4$ and $R^5$ or $R^5$ and $R^6$ or $R^6$ and $R^7$ together form a saturated, unsaturated or aromatic ring optionally interrupted by at least one heteroatom and having a total of 5 to 30 carbon atoms and/or heteroatoms, $R^8$, $R^9$ are each independently a free electron pair if $A^1$ or $A^2$ is N, or, if $A^1$ or $A^2$ is C, hydrogen, linear or branched alkyl radical having 1 to 20 carbon atoms, substituted or unsubstituted aryl radical having 6 to 30 carbon atoms, substituted or unsubstituted heteroaryl radical having 5 to 18 carbon atoms and/or heteroatoms, $R^{10}$ linear or branched alkyl radical having 1 to 20 carbon atoms, substituted or unsubstituted aryl radical having 6 to 30 carbon atoms, and $R^{11}$, $R^{12}$, $R^{13}$, $R^{14}$ hydrogen or linear or branched alkyl radical having 1-20 carbon atoms and/or $R^1$ and $R^{14}$ together form a saturated or unsaturated, linear or branched bridge optionally comprising heteroatoms, aromatic units, heteroaromatic units and/or functional groups and having a total of 1 to 30 carbon atoms and/or heteroatoms, to which a substituted or unsubstituted, five- to eight-membered ring comprising carbon atoms and/or heteroatoms, preferably a six-membered aromatic ring, is optionally fused.

and/or $R^T$ and $R^o$ together form a saturated or unsaturated, linear or branched bridge optionally comprising heteroatoms, aromatic units, heteroaromatic units and/or functional groups and having a total of 1 to 30 carbon atoms and/or heteroatoms, to which a substituted or unsubstituted, five- to eight-membered ring comprising carbon atoms and/or heteroatoms, preferably a six-membered aromatic ring, is optionally fused.

The abovementioned preferred and particularly preferred embodiments apply correspondingly.

The present invention preferably also relates to inventive heteroleptic complexes of the general formula (I) where M, $A^1$, $A^2$, n, m, $R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$ are each defined as follows:

M is Ir, $A^1$ is C.

$A^2$ is N or C, n, m are each independently 1 or 2, where the sum of n and m is 3; preferably n=2 and m=1, $R^1$ is a linear or branched alkyl radical having 1 to 20 carbon atoms, substituted or unsubstituted aryl radical having 6 to 30 carbon atoms, substituted or unsubstituted heteroaryl radical having 5 to 18 carbon atoms and/or heteroatoms; preferably, $R^1$ is a substituted or unsubstituted aryl radical, $R^2$, $R^3$ are each independently hydrogen, linear or branched alkyl radical having 1 to 20 carbon atoms, substituted or unsubstituted aryl radical having 6 to 30 carbon atoms, substituted or unsubstituted heteroaryl radical having 5 to 18 carbon atoms and/or heteroatoms; preferably $R^2$ and $R^3$ are each hydrogen, $R^4$, $R^5$, $R^6$ are each independently hydrogen, linear or branched alkyl radical having 1 to 20 carbon atoms, substituted or unsubstituted aryl radical having 6 to 30 carbon atoms, $R^7$, $R^8$ together form an unsaturated $C_2$ bridge, to which a substituted or unsubstituted, five- to eight-membered ring comprising carbon atoms and/or heteroatoms, may be fused, $R^9$ is a free electron pair if $A^2$ is N or, if $A^2$ is C, hydrogen, linear or branched alkyl radical having 1 to 20 carbon atoms, substituted or unsubstituted aryl radical having 6 to 30 carbon atoms, substituted or unsubstituted heteroaryl radical having 5 to 18 carbon atoms and/or heteroatoms, $R^{10}$ is a linear or branched alkyl radical having 1 to 20 carbon atoms, substituted or unsubstituted aryl radical having 6 to 30 carbon atoms, and $R^{11}$, $R^{12}$ $R^{13}$, $R^{14}$ are each independently hydrogen or linear or branched alkyl radical having 1 to 20 carbon atoms, and/or $R^1$ and $R^{14}$ together form a saturated or unsaturated, linear or branched bridge optionally comprising heteroatoms, aromatic units, heteroaromatic units and/or functional groups and having a total of 1 to 30 carbon atoms and/or heteroatoms, to which a substituted or unsubstituted, five- to eight-membered ring comprising carbon atoms and/or heteroatoms, preferably a six-membered aromatic ring, is optionally fused.

The latter embodiment corresponds to the following general formula (Ib):

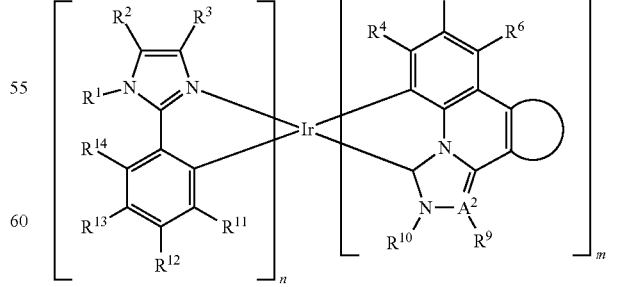

(Ib)

Very particularly preferred inventive heteroleptic complexes of the general formula (I) have the ligands depicted in table 1, especially preferably in the combinations shown:

TABLE 1
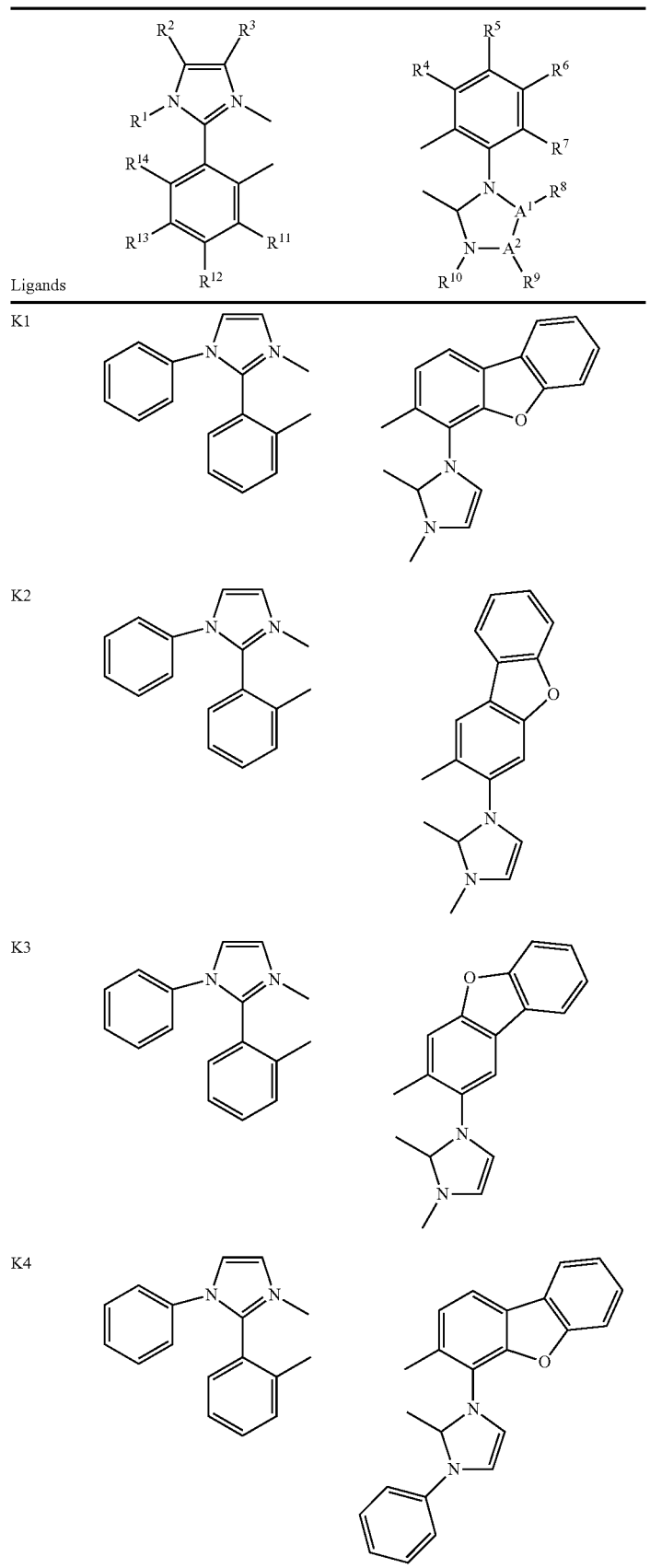
Ligands

TABLE 1-continued
| Ligands | 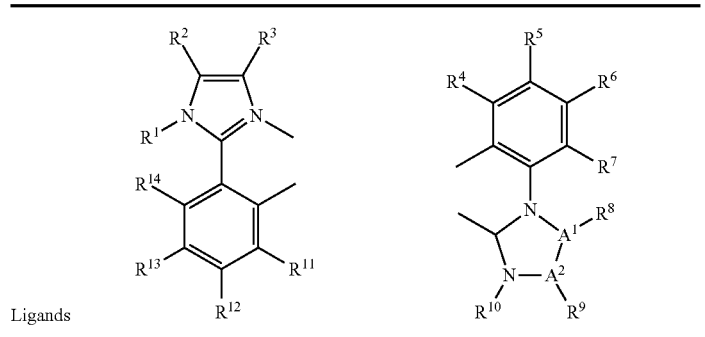 |
|---|---|
| K5 | |
| K6 | 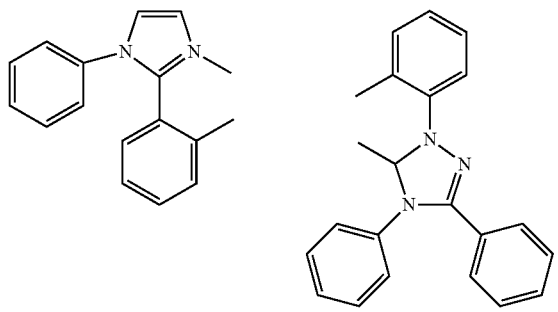 |
| K7 | 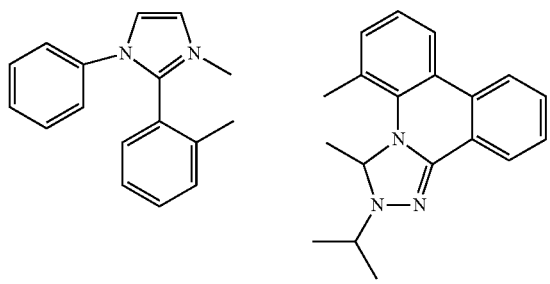 |
| K8 | 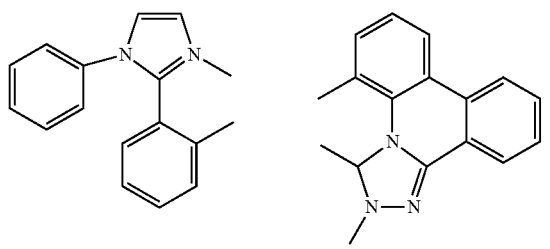 |
|    | 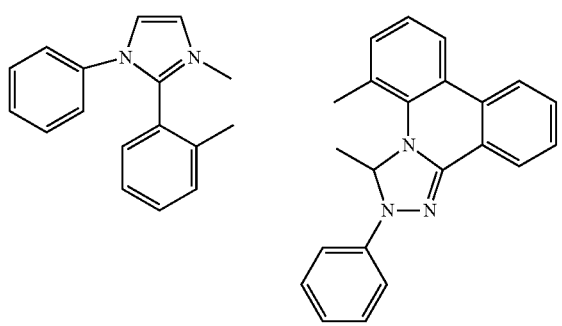 |

TABLE 1-continued

Ligands (structures with R¹–R¹⁴ substituents on imidazole-phenyl and phenyl-diazole frameworks)

| | | |
|---|---|---|
| K9 | | |
| K10 | | |
| K11 | | |
| K12 | | |

TABLE 1-continued
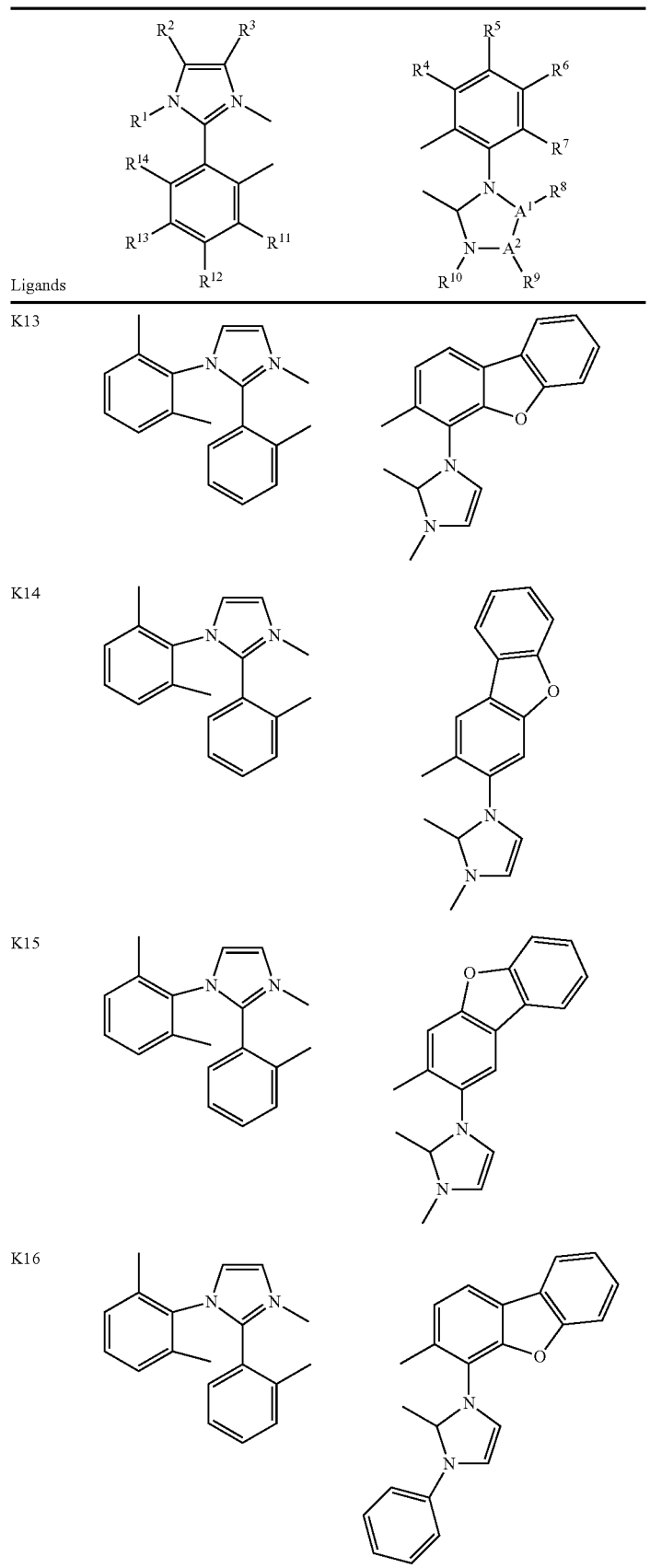

TABLE 1-continued

Ligands: (generic structures with substituents R¹–R¹⁴, A¹, A²)

K17

K18

K19

K20

TABLE 1-continued
| Ligands | | |
|---|---|---|
| K21 | 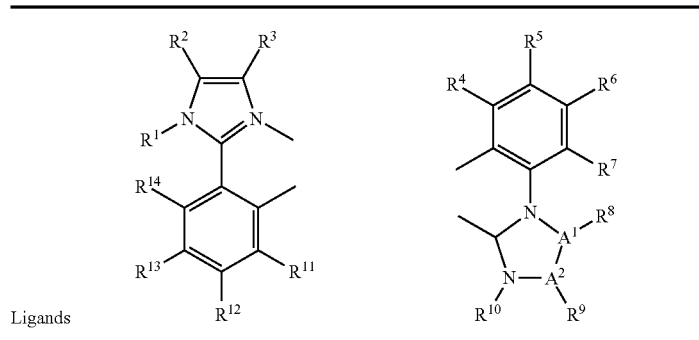 | |
| K22 | 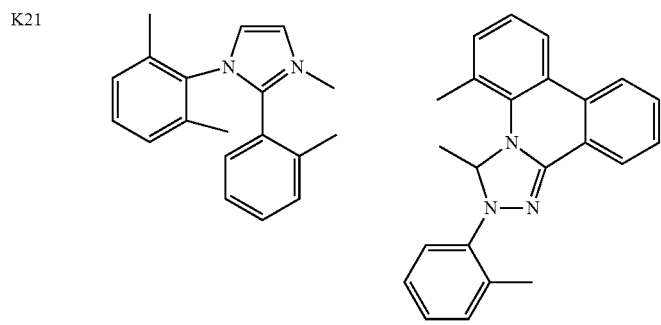 | |
| K23 | 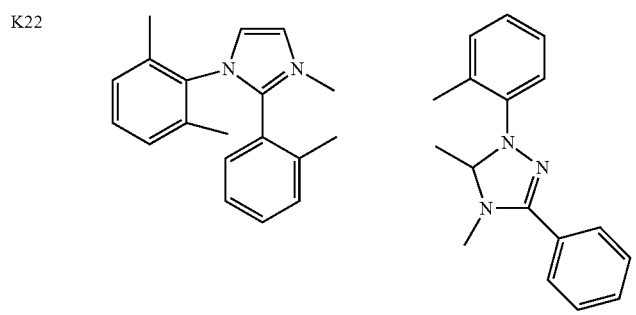 | |
| K24 | 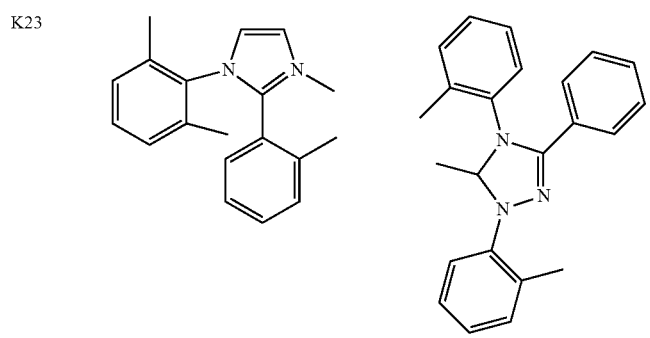 | |

TABLE 1-continued
| Ligands | | |
|---|---|---|
| K25 | 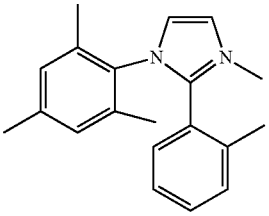 | 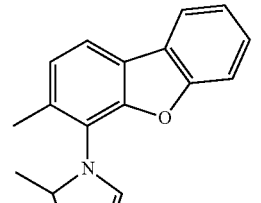 |
| K26 | 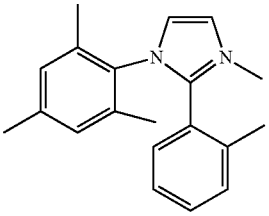 | 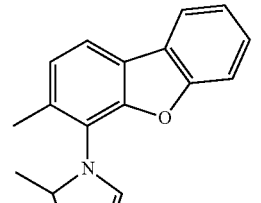 |
| K27 | 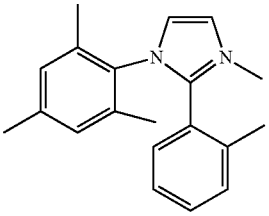 | 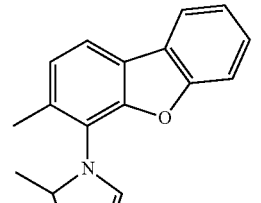 |
| K28 | 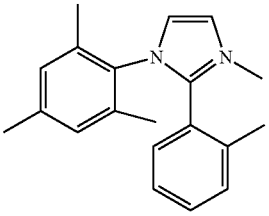 | 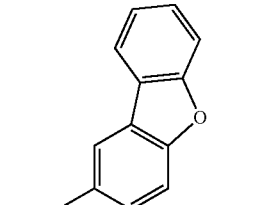 |

TABLE 1-continued
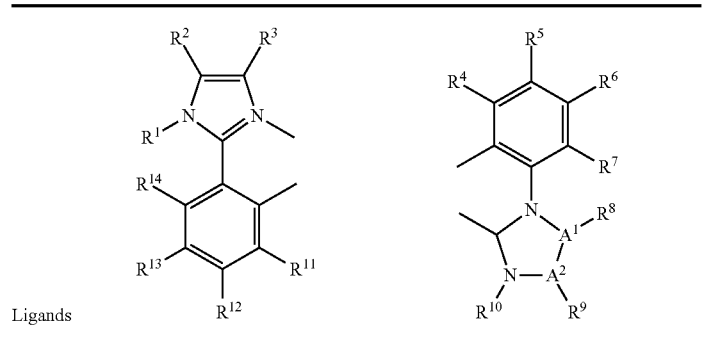
Ligands
K29
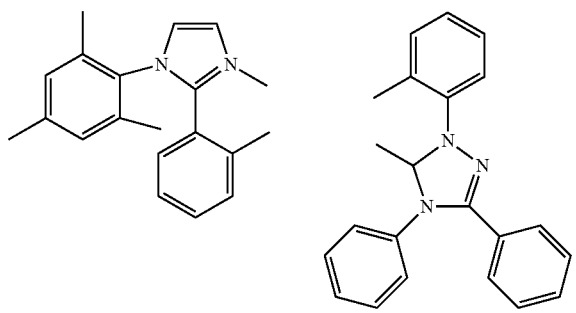
K30
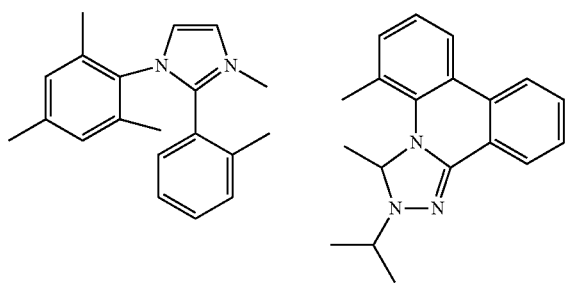
K31
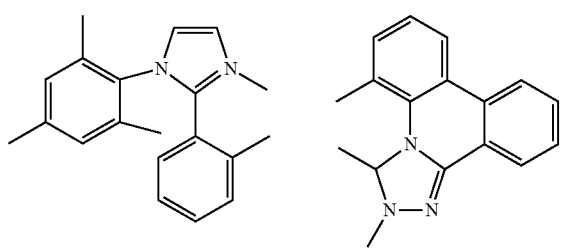
K32
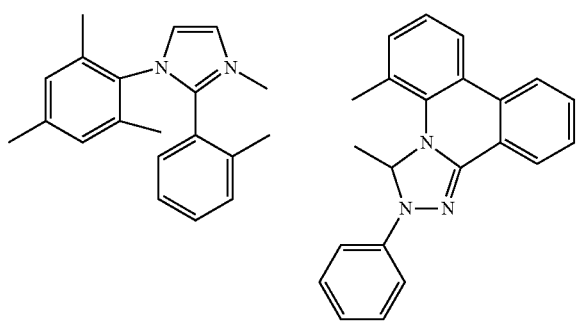

TABLE 1-continued
| Ligands | |
|---|---|
| K33 | 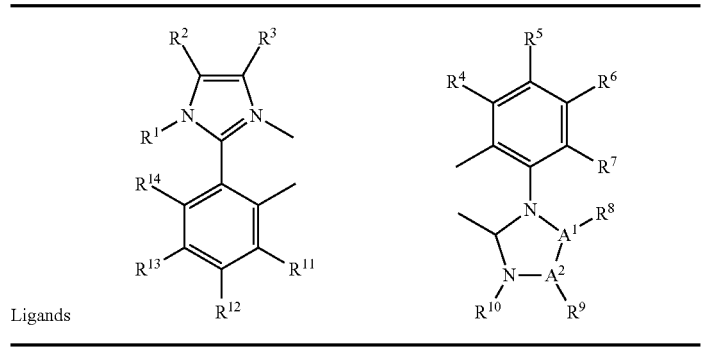 |
| K34 | 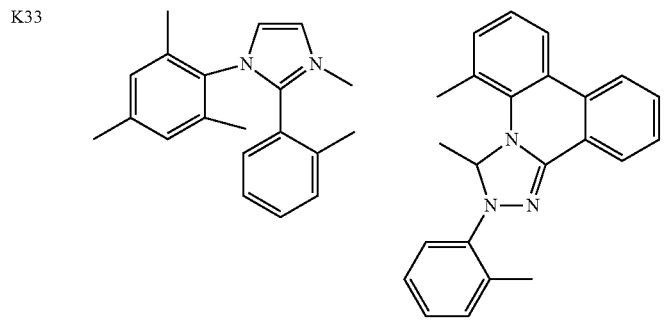 |
| K35 | 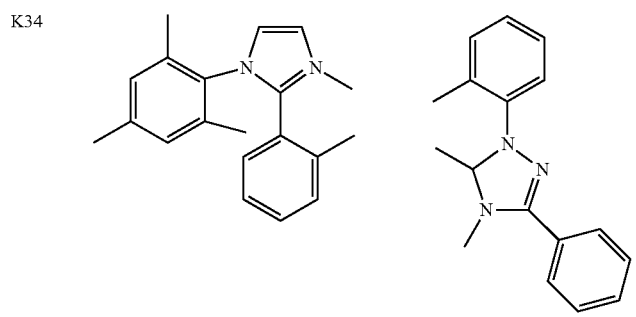 |
| K36 | 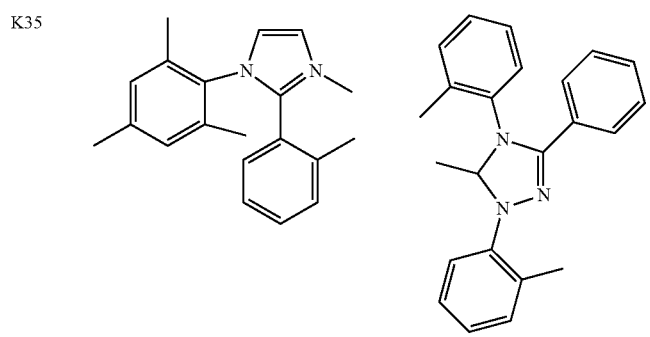 |

TABLE 1-continued
| Ligands | | |
|---|---|---|
| K37 | 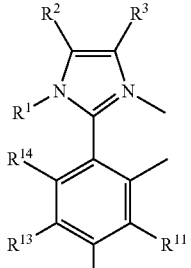 | 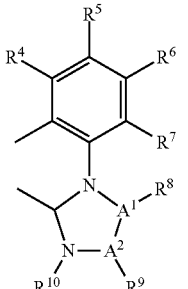 |
| K38 | 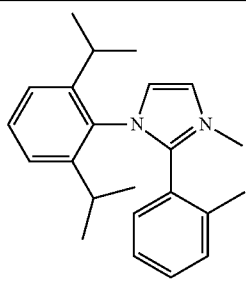 | 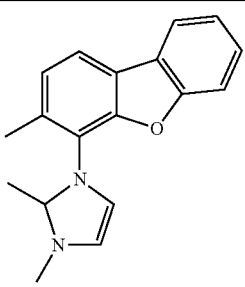 |
| K39 | 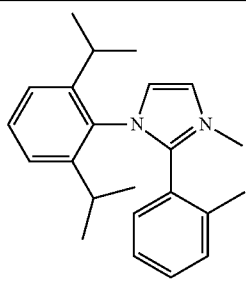 | 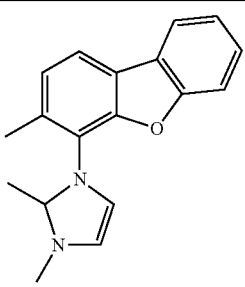 |
| K40 | 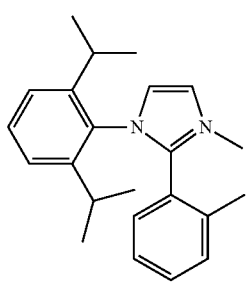 | 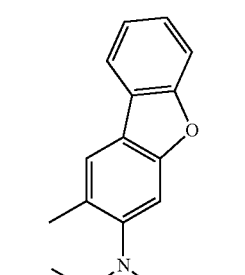 |

TABLE 1-continued
| Ligands | | |
|---|---|---|
| | 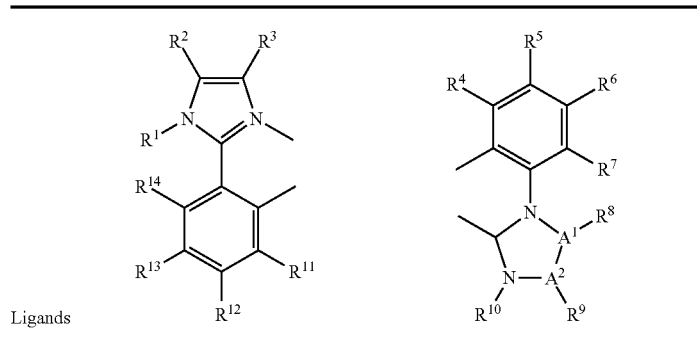 | |
| K41 | | |
| K42 | 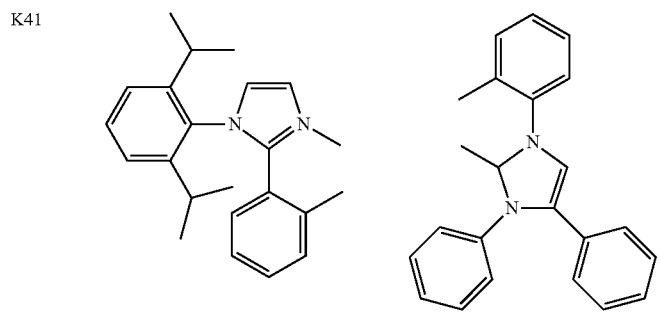 | |
| K43 | 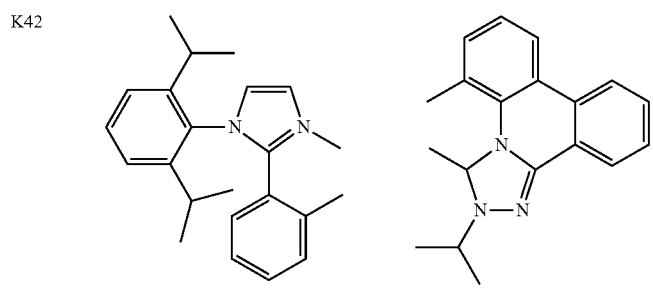 | |
| K44 | 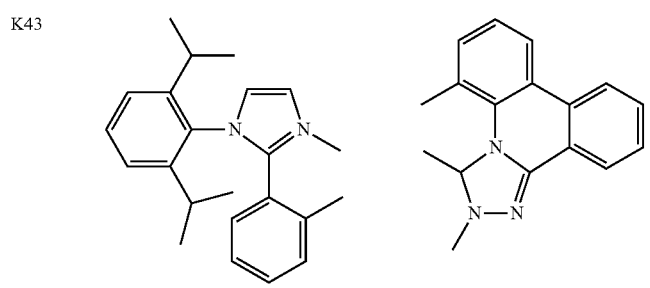 | |
| | 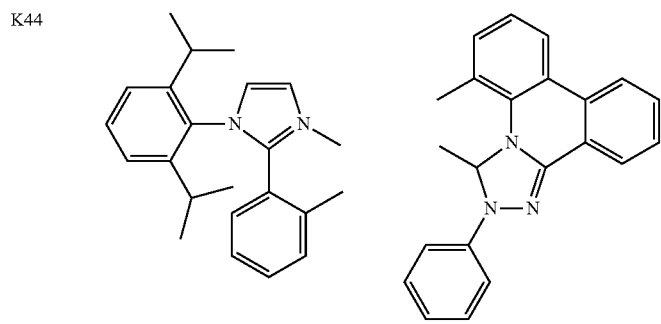 | |

TABLE 1-continued
| Ligands | 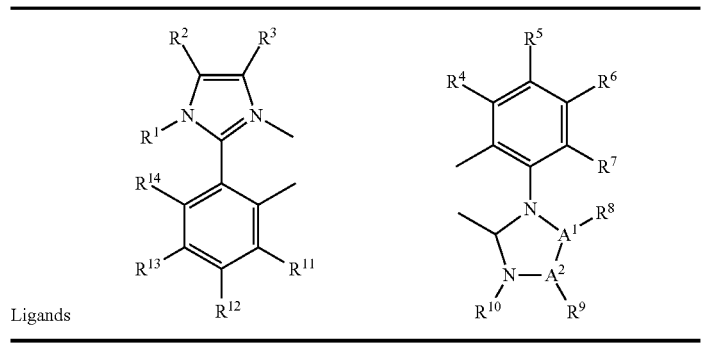 | |
|---|---|---|
| K45 | | |
| K46 | | |
| K47 | | |
| K48 | | |
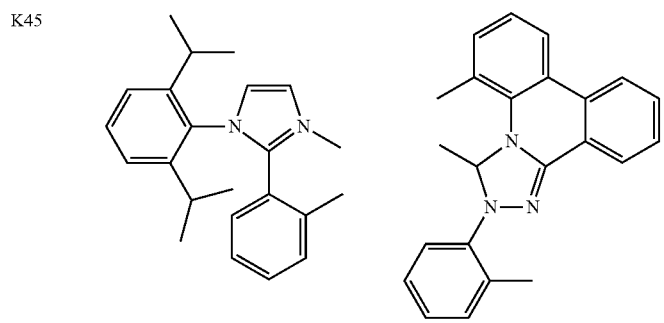
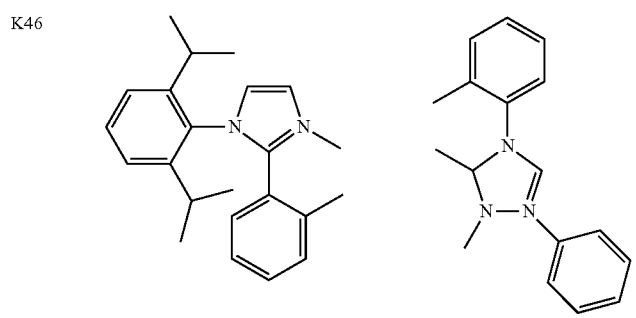
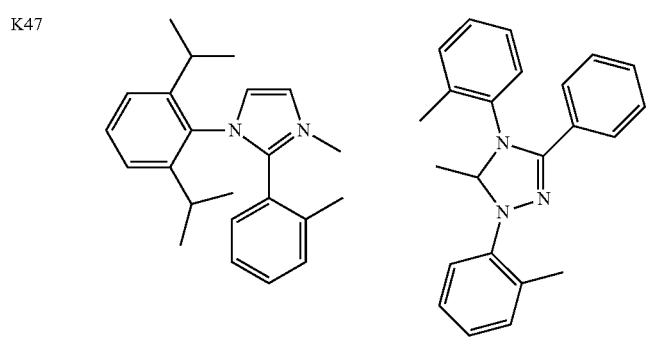
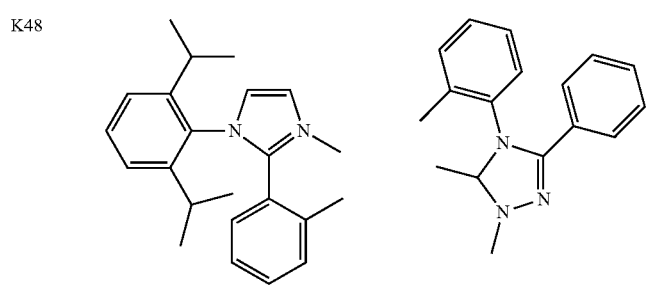

TABLE 1-continued
| Ligands | | |
|---|---|---|
| K49 | 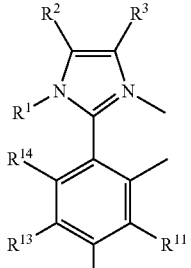 | 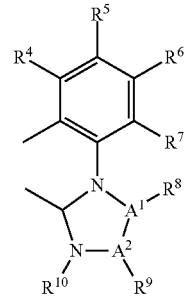 |
| K50 | 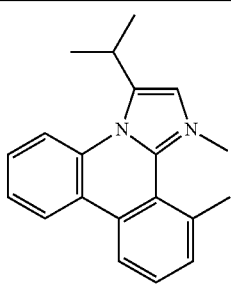 | 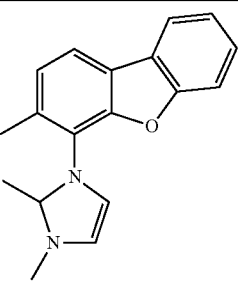 |
| K51 | 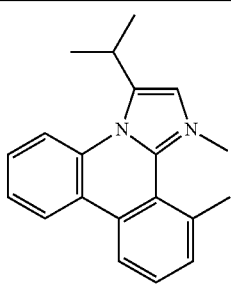 | 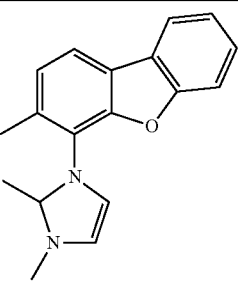 |
| K52 | 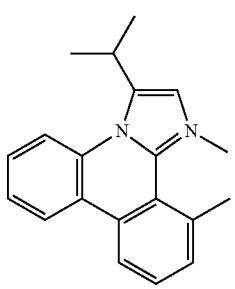 | 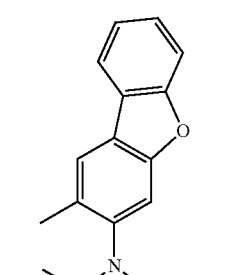 |

TABLE 1-continued
| Ligands | | |
|---|---|---|
| K53 | 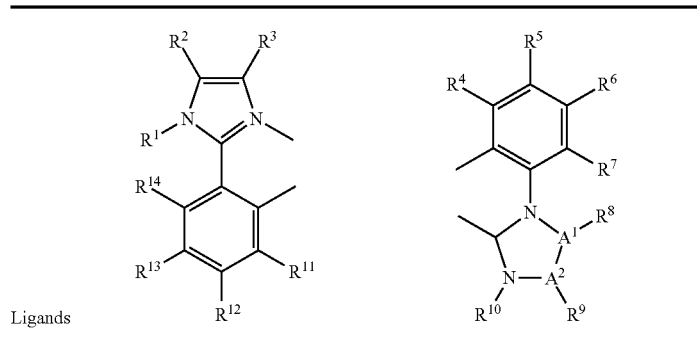 | |
| K54 | 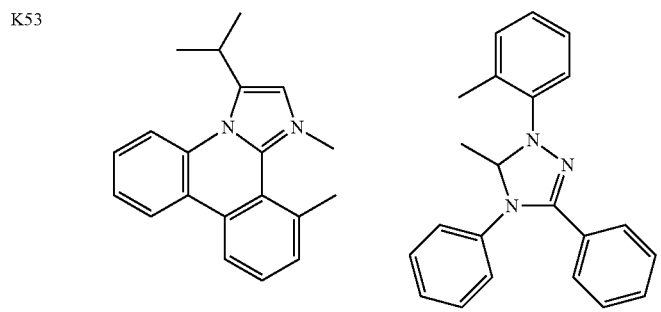 | |
| K55 | 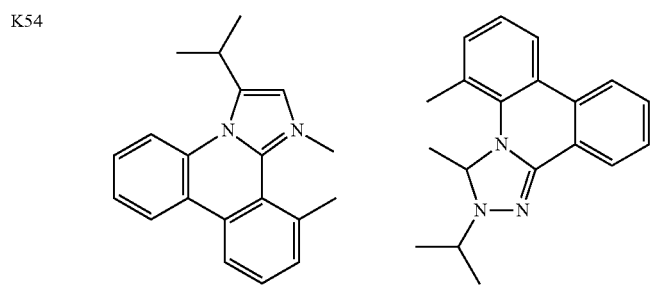 | |
| K56 | 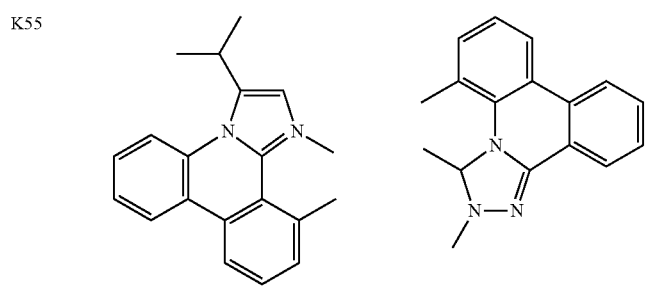 | |

TABLE 1-continued
| Ligands | | |
|---|---|---|
| K57 | 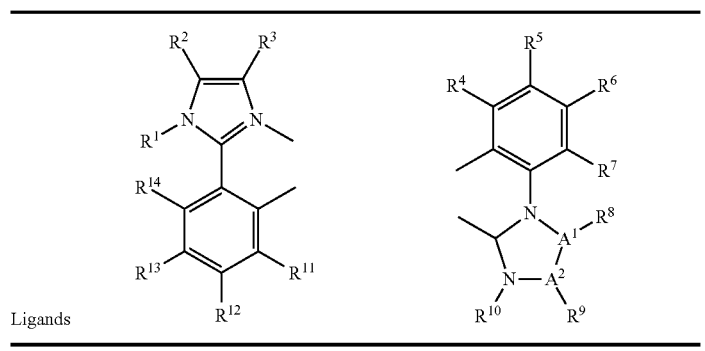 | |
| K58 | 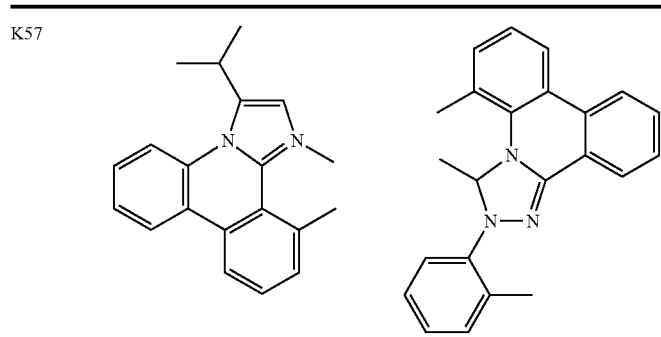 | |
| K59 | 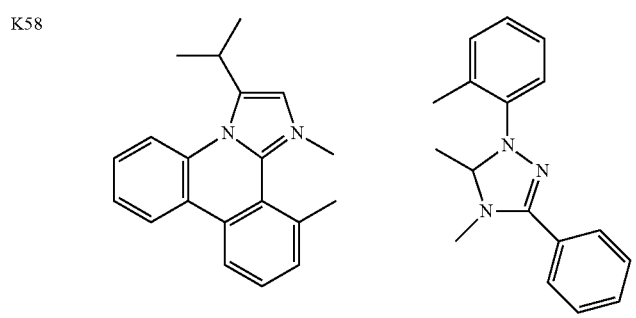 | |
| K60 | 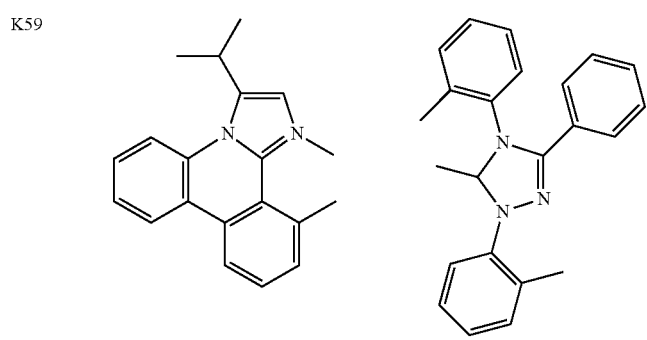 | |

TABLE 1-continued
| Ligands | 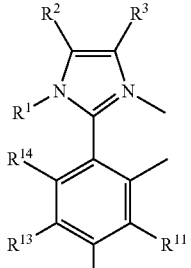 | 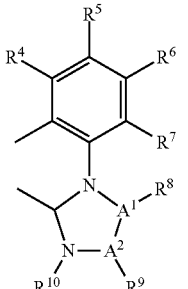 |
|---|---|---|
| K61 | 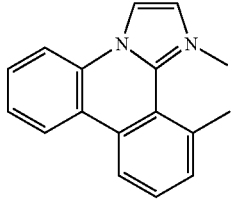 | 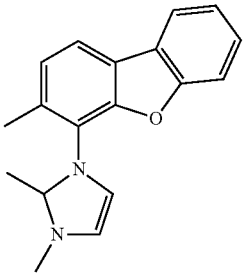 [SMILES: Cc1ccc2c(oc3ccccc32)c1N1C=CN(C)C1C] |
| K62 | 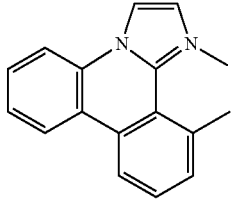 | 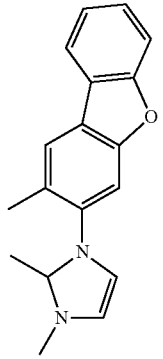 [SMILES: Cc1cc2c(cc1N1C=CN(C)C1C)oc1ccccc12] |
| K63 | 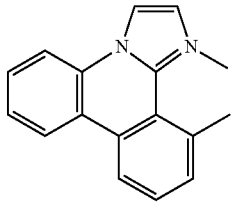 | 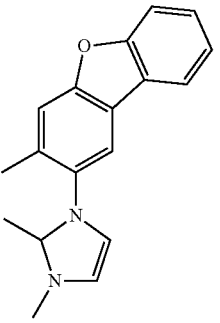 [SMILES: Cc1cc2oc3ccccc3c2cc1N1C=CN(C)C1C] |
| K64 | 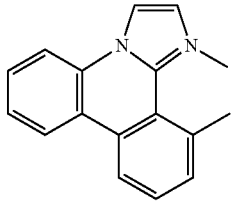 | 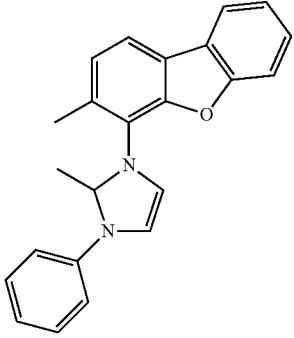 [SMILES: Cc1ccc2c(oc3ccccc32)c1N1C=CN(c2ccccc2)C1C] |

TABLE 1-continued
| Ligands | | |
|---|---|---|
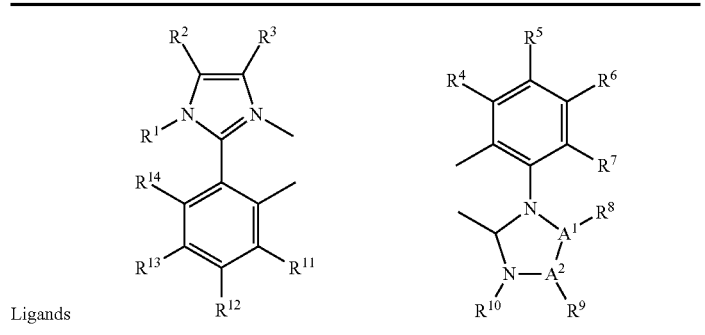
K65
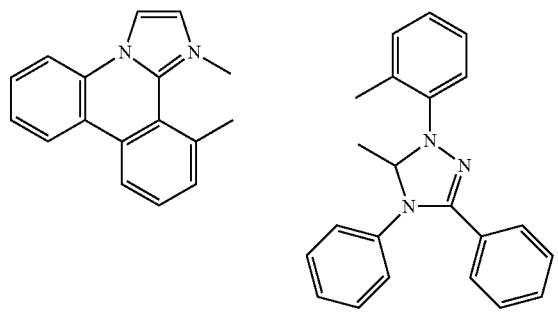
K66
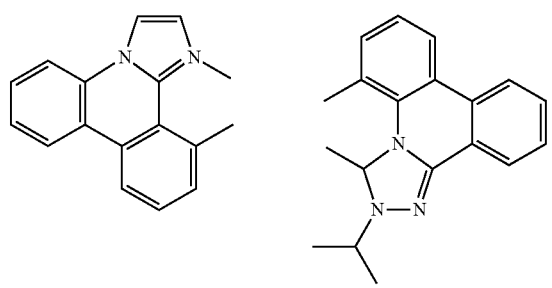
K67
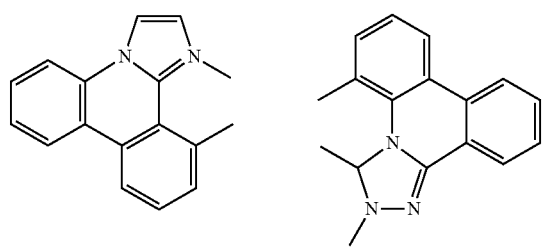
K68
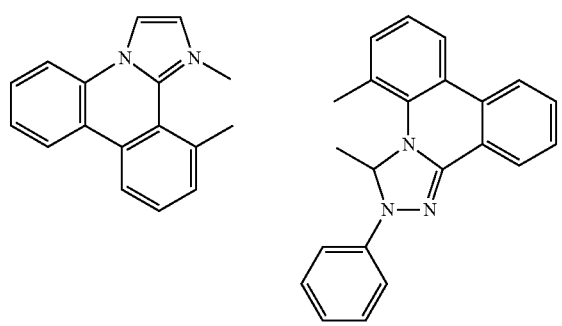

TABLE 1-continued
| Ligands | 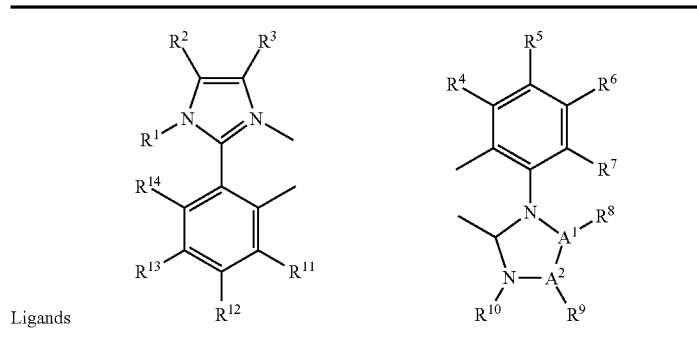 | |
|---|---|---|
| K69 | | |
| K70 | 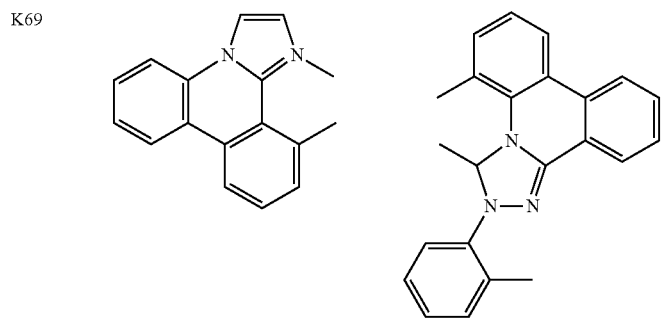 | |
| K71 | 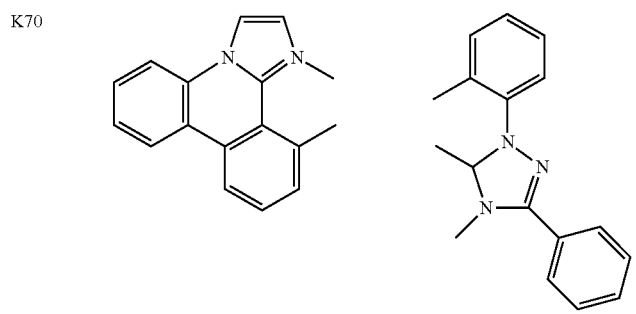 | |
| | 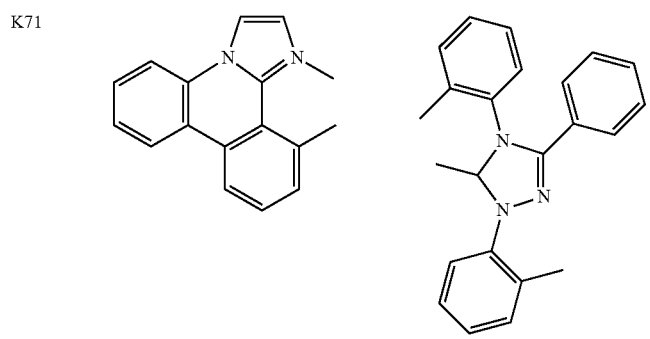 | |
| K72 | 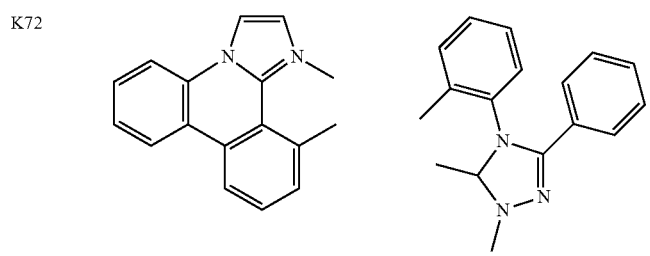 | |

TABLE 1-continued

| Ligands | | |
|---|---|---|
| K73 | | |
| K74 | | |
| K75 | | |
| K76 | | |

TABLE 1-continued
| Ligands | | |
|---|---|---|
| | 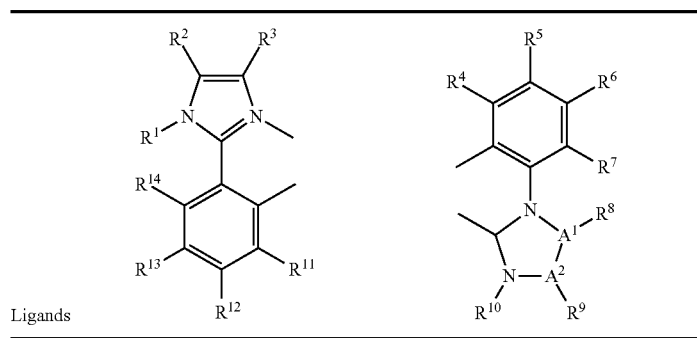 | |
| K77 | 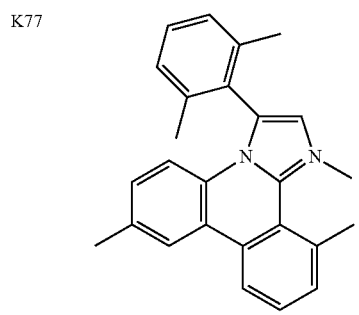 | |
| K78 | 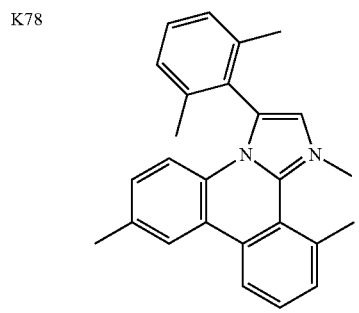 | |
| K79 | 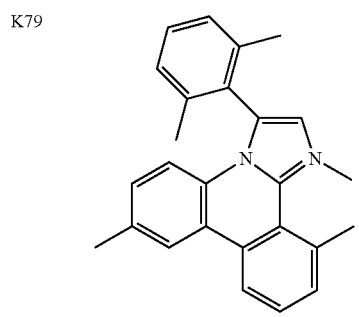 | |
| K80 | 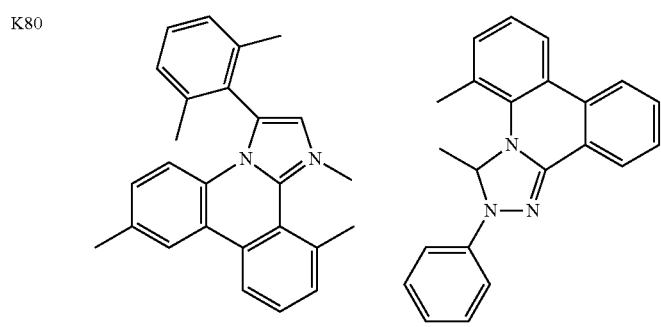 | |

TABLE 1-continued
| Ligands | 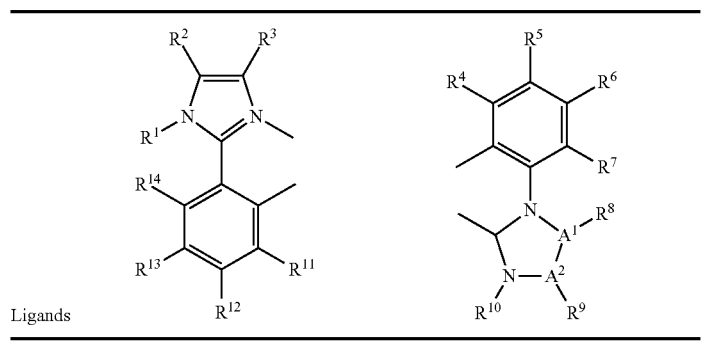 | |
|---|---|---|
| K81 | 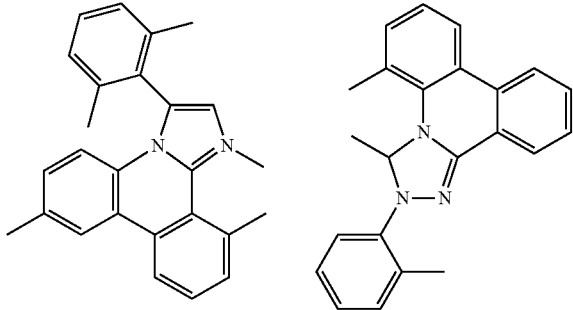 | |
| K82 | 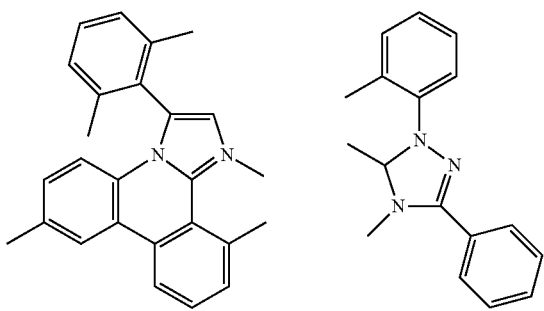 | |
| K83 | 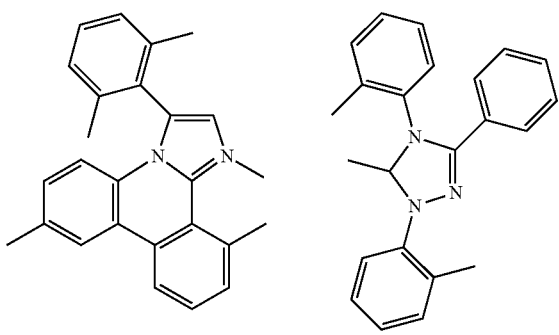 | |
| K84 | 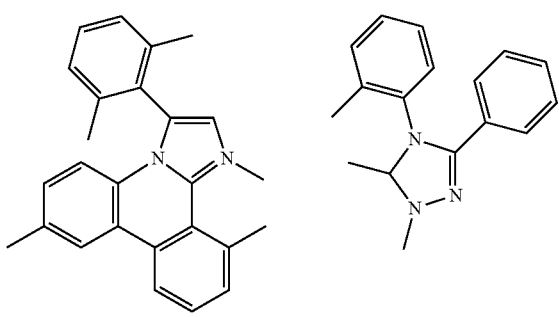 | |

TABLE 1-continued

| Ligands | | |
|---|---|---|

K85

K86

K87

K88

TABLE 1-continued
| Ligands | 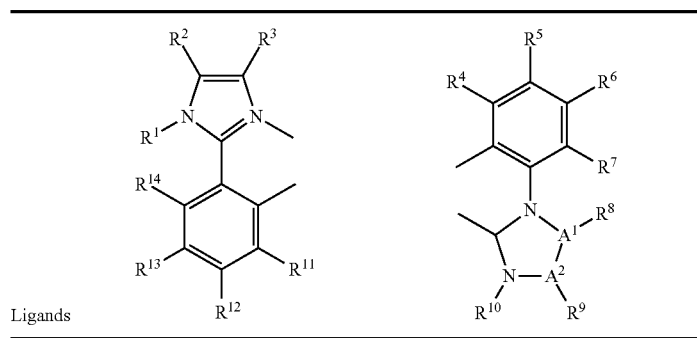 | |
|---|---|---|
| K89 | | |
| K90 | | |
| K91 | | |
| K92 | | |
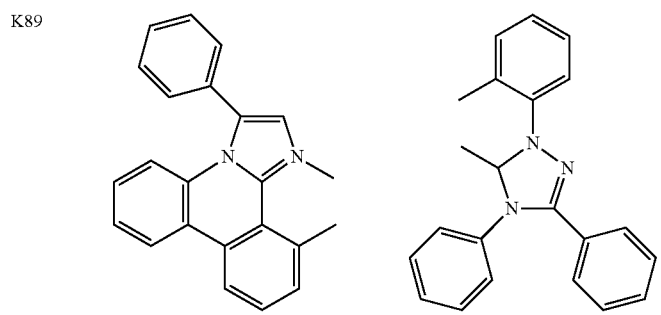
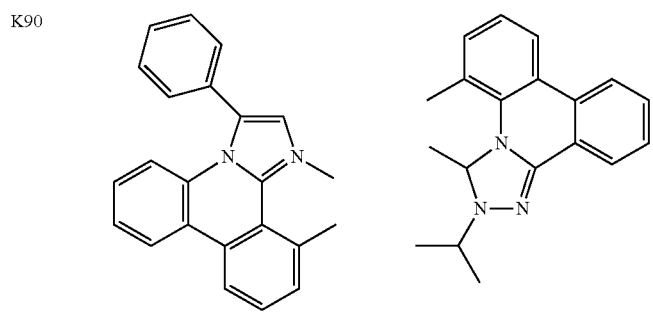
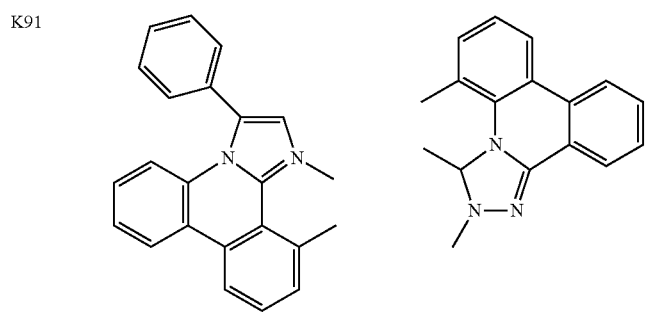
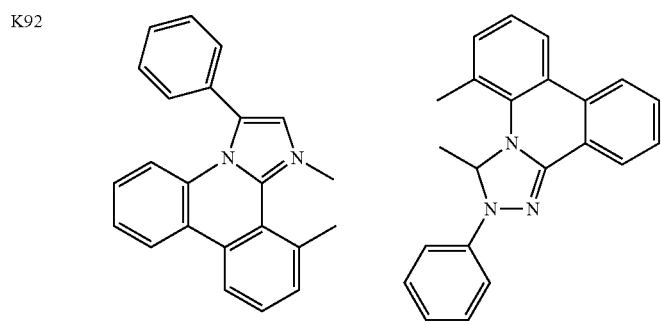

TABLE 1-continued

| Ligands | | |
|---|---|---|
| K93 | | |
| K94 | | |
| K95 | | |
| K96 | | |

In each case where M=Ir, n=2 and m=1.

Depending on the coordination number of the metal M present in the inventive heteroleptic complexes of the general formula (I) and the number of carbene ligands and noncarbene ligands used, different isomers of the corresponding heteroleptic metal complexes may be present with the same metal M and the same nature of the carbene ligands and noncarbene ligands used.

For example, for octahedral iridium(III) complexes with two noncarbene ligands and one carbene ligand, the following isomers S1 to S4 are possible, each of which may be present in the form of two enantiomers (a and b):

S1a
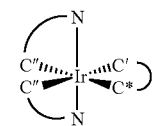

S2a
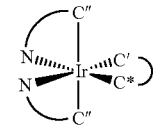

S3a
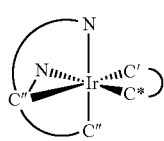

S4a
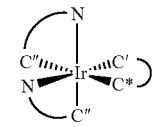

S1b
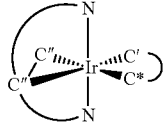

S2b
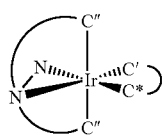

S3b
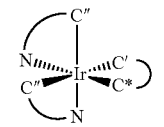

S4b
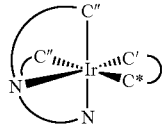

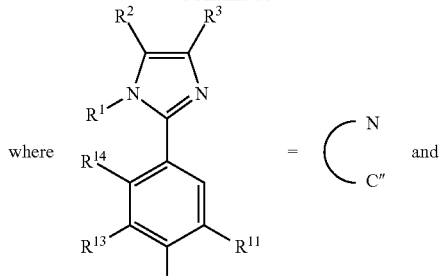

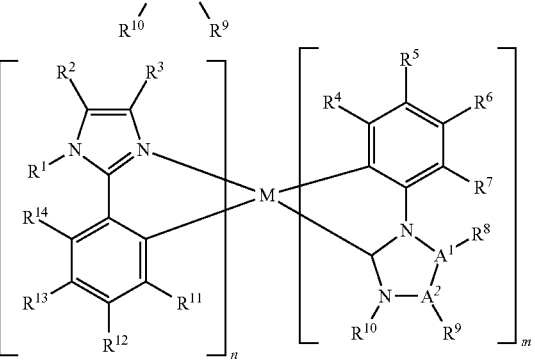

where M = Ir, n = 2, m = 1

In the present application, owing to the arrangement of the two 2-phenyl-1H-imidazole ligands, the S1a/S1b and S2a/S2b isomers are referred to as pseudo-meridional isomers and the S3a/S3b and S4a/S4b isomers as pseudo-facial isomers.

It has been found in accordance with the invention that, surprisingly, the S3 and S4 isomers, when used in OLEDs, give particularly good results with regard to efficiency and lifetime when used in diodes. The S3a/S3b and S4a/S4b isomers, i.e. the pseudo-facial isomers, are therefore particularly preferred in accordance with the invention. More preferably, the inventive complexes of the general formula (I) which comprise two noncarbene ligands and one carbene ligand are present as pseudo-facial isomers.

For iridium(III) complexes with one noncarbene ligand and two carbene ligands, the following isomers T1 to T4 are possible, each of which may in turn be present in the form of two enantiomers (a and b):

T1a
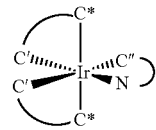

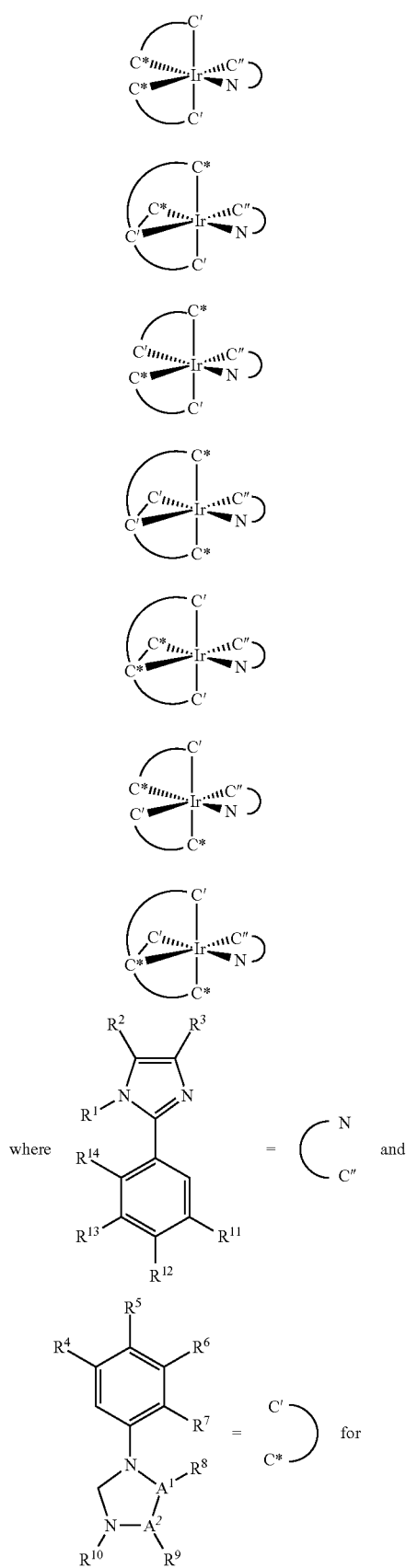

T2a

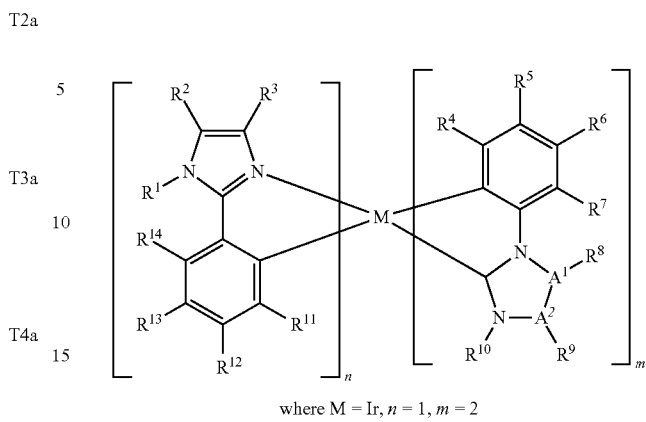

T3a

T4a

T1b

T2b

T3b

T4b

In the present application, owing to the arrangement of the two phenylcarbene ligands, the T1a/T1b and T2a/T2b isomers are referred to as pseudo-meridional isomers and the T3a/T3b and T4a/T4b isomers as pseudo-facial isomers.

It has been found in accordance with the invention that, surprisingly, the T3 and T4 isomers, when used in OLEDs, usually give particularly good results with regard to efficiency and lifetime when used in diodes. The T3a/T3b and T4a/T4b isomers, i.e. the pseudo-facial isomers, are therefore particularly preferred in accordance with the invention. More preferably, the inventive complexes of the general formula (I) which comprise one noncarbene ligand and two carbene ligands are present as pseudo-facial isomers.

In the case of square-planar platinum(II) complexes with one carbene ligand and one noncarbene ligand, the two isomers U1 and U2 are possible:

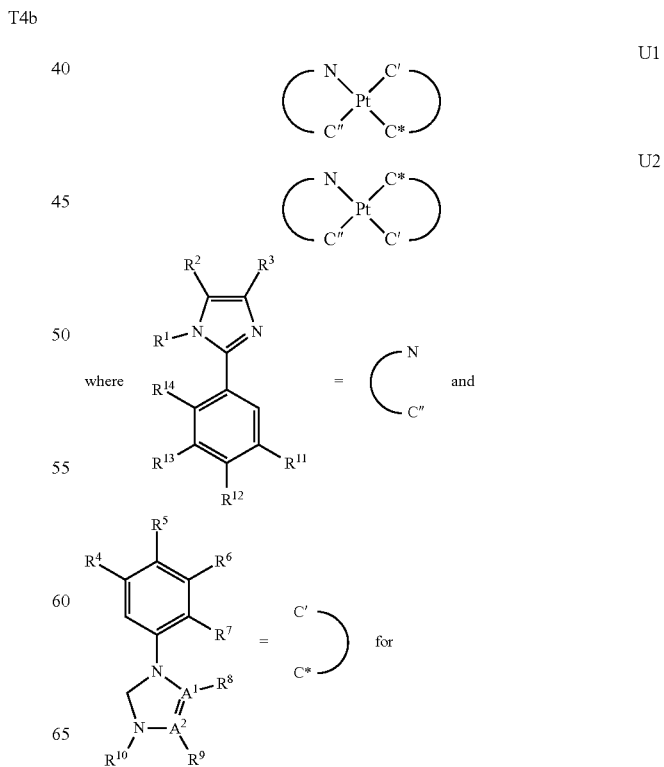

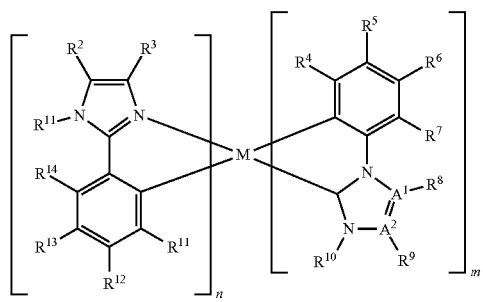

where M = Pt, n = 1, m = 1

In general, the different isomers of the heteroleptic metal complexes of the formula (I) can be separated by processes known to those skilled in the art, for example by chromatography, sublimation or crystallization. The different isomers can generally be interconverted by suitable reaction conditions (e.g. pH), thermally or photochemically.

The present invention relates both to the individual isomers or enantiomers of the heteroleptic complexes of the formula (I) and to mixtures of different isomers or enantiomers in any desired mixing ratio.

The present invention therefore relates, in a particularly preferred embodiment, to the inventive heteroleptic complexes with the general and preferred definitions specified for M, $A^1$, $A^2$, n, m, $R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$, where these have one of the following configurations IIIa, IIIb, IVa or IVb:

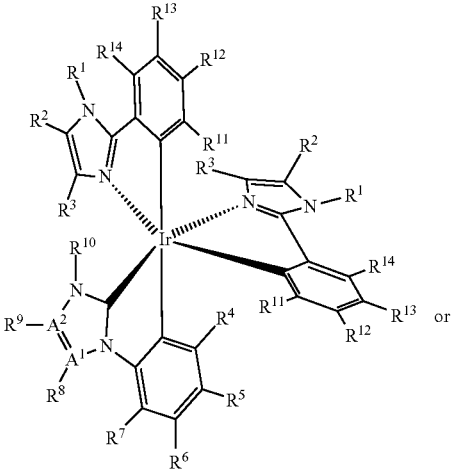

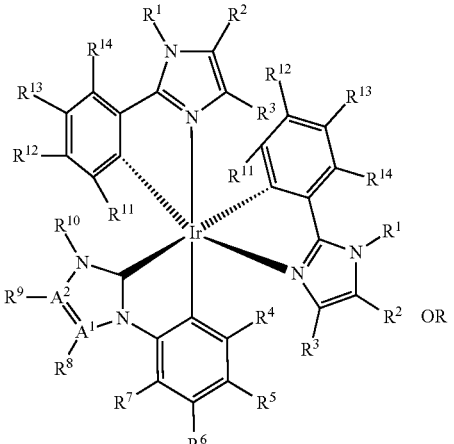

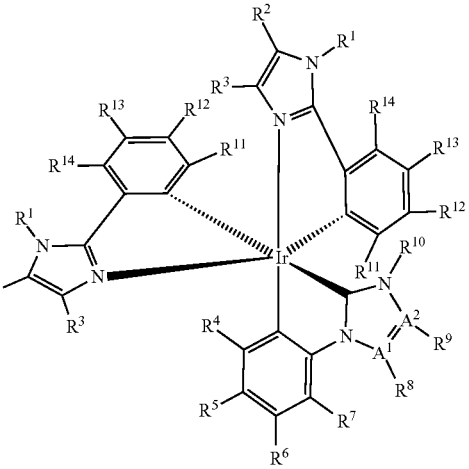

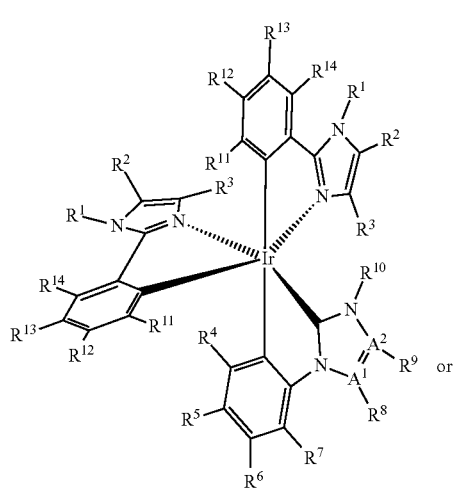

The present invention additionally also relates to a process for preparing an inventive heteroleptic complex of the general formula (I) by contacting at least one precursor compound comprising the metal M and the at least one ligand which, in the complexes of the general formula (I), is attached to M via noncarbene bonds with at least one ligand which, in the complexes of the general formula (I), is attached to M via at least one carbene bond, or the ligand precursor thereof, for example a corresponding imidazolium salt, or by contacting at least one precursor compound comprising the metal M and a ligand which, in the complexes of the general formula (I), is bonded to M via at least one carbene bond with at least one ligand which, in the complexes of the general formula (I), is attached to M via noncarbene bonds.

In a preferred embodiment of the process according to the invention, a complex comprising appropriate noncarbene ligands, attached to the appropriate metal M, preferably iridium, and appropriate carbene ligands, preferably in deprotonated form as the free carbene or in the form of a protected carbene, for example as the silver-carbene complex, are contacted. Suitable precursor compounds comprise the appropriate substituents $R^1$ to $R^{14}$ which are to be present in the complexes of the general formula (I).

Appropriate complexes comprising appropriate noncarbene ligands attached to the appropriate metal M, preferably iridium, are known to those skilled in the art. In addition to the noncarbene ligands present in the complex of the general formula (I), these complexes used as precursor compounds may comprise further ligands known to those skilled in the art, for example halides, preferably chloride. Further suitable ligands are, for example 1,5-cyclooctadiene (COD), phosphines, cyanides, alkoxides, pseudohalides and/or alkyl.

Particularly preferred complexes comprising appropriate noncarbene ligands, attached to the appropriate metal M, are, for example, compounds of the general formula (VI)

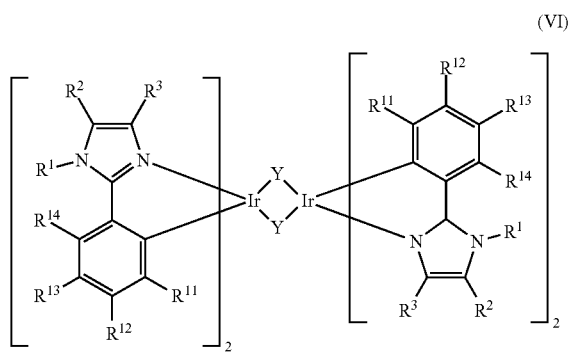

(VI)

with the abovementioned definitions of $R^1$, $R^2$, $R^3$, $R^{11}$, $R^{12}$, $R^{13}$ und $R^{14}$, where Y may independently be F, Cl, Br, I, methoxy or carboxylate.

Particularly preferred precursor compounds for the carbene ligands used in complexes of the general formula (I) correspond, for example, to the general formulae (VII) or (VIII)

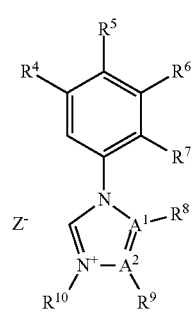

(VII)

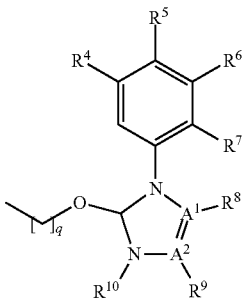

(VIII)

q = 0, 1 or 2 with the abovementioned definitions of $R^4$, $R^5$, $R^6$, $R^7$, $R^8$, $R^9$, $R^{10}$ and A, where Z may be F, Cl, Br, I, $BF_4$, $PF_6$, $ClO_4$ or $SbF_6$.

The carbene ligand precursors are deprotonated, preferably before the reaction, for example, by basic compounds known to those skilled in the art, for example basic metalates, basic metal acetates, acetylacetonates or alkoxides, or bases such as KO$^t$Bu, NaO$^t$Bu, LiO$^t$Bu, NaH, silylamides, Ag$_2$O and phosphazene bases. In a further preferred embodiment, the carbene can also be released by removing volatile substances, for example lower alcohols such as methanol, ethanol, for example at elevated temperature and/or reduced pressure, from precursor compounds of the carbene ligands. Corresponding processes are known to those skilled in the art.

The contacting is preferably effected in a solvent. Suitable solvents are known to those skilled in the art and are preferably selected from the group consisting of aromatic or aliphatic solvents, for example benzene or toluene, cyclic or acyclic ethers, alcohols, esters, amides, ketones, nitriles, halogenated compounds and mixtures thereof. Particularly preferred solvents are toluene, xylenes, dioxane and THF.

The molar ratio of metal-noncarbene complex used to carbene ligand precursor used is generally 1:10 to 10:1, preferably 1:1 to 1:5, more preferably 1:2 to 1:4.

The contacting is generally effected at a temperature of 20 to 200° C., preferably 50 to 150° C., more preferably 60 to 130° C.

The reaction time depends on the desired carbene complex and is generally 0.02 to 50 hours, preferably 0.1 to 24 hours, more preferably 1 to 12 hours.

The complexes of the general formula (I) obtained after the reaction can optionally be purified by processes known to those skilled in the art, for example washing, crystallization or chromatography, and optionally isomerized under conditions likewise known to those skilled in the art, for example thermally or photochemically.

The aforementioned heteroleptic complexes and mixtures thereof are outstandingly suitable as emitter molecules in organic light-emitting diodes (OLEDs). Variations in the ligands make it possible to provide corresponding complexes which exhibit electroluminescence in the red, green and especially in the blue region of the electromagnetic spectrum. The inventive heteroleptic complexes of the general formula (I) are therefore outstandingly suitable as emitter substances, since they have emission (electroluminescence) in the visible region of the electromagnetic spectrum, for example at 400 to 800 nm, preferably 400 to 600 nm. The inventive heteroleptic complexes make it possible to provide compounds which have electroluminescence in the red, green and especially in the blue region of the electromagnetic spectrum. It is thus possible, with the aid of the inventive heteroleptic complexes as emitter substances, to provide industrially usable OLEDs.

Further the inventive heteroleptic complexes of the general formula (I) are suitable as matrix material, charge transport material, especially hole transport material, and/or charge blocker material.

The inventive heteroleptic complex of the general formula (I) are preferably suitable as emitter and/or hole transport material, more preferably as emitter.

Particular properties of the inventive heteroleptic complexes of the general formula (I) are particularly good efficiencies and lifetimes when used in OLEDs.

The present application therefore further provides an OLED comprising at least one inventive heteroleptic complex of the general formula (I). The inventive heteroleptic complex of the general formula (I) is preferably employed in the OLED as emitter, matrix material, charge transport material, especially hole transport material, and/or hole blocker, more preferably as emitter and/or hole transport material, particularly preferably as emitter.

The present application also provides for the use of the heteroleptic complexes of the general formula (I) as a light-emitting layer in OLEDs, preferably as an emitter, matrix material, charge transport material, especially hole transport material, and/or charge blocker, more preferably as emitter and/or hole transport material, particularly preferably as emitter.

Organic light-emitting diodes are in principle formed from a plurality of layers:
anode (1)
hole-transporting layer (2)
light-emitting layer (3)
electron-transporting layer (4)
cathode (5).

However, it is also possible, that the OLED does not comprise all of the layers mentioned, an OLED formed from the layers (1) (anode), (3) (light-emitting layer) and (5) (cathode) is for example also useful, wherein the functions of the layers (2) (hole-transport layer) and (4) (electron-transporting layer) are taken over by the adjacent layers. OLEDs comprising the layers (1), (2), (3) and (5) respectively the layers (1), (3), (4) and (5) are also suitable.

The heteroleptic complexes of the general formula (I) are preferably used as emitter molecules and/or matrix materials in the light-emitting layer (3). The inventive heteroleptic complexes of the general formula (I) can also be employed—in addition to the application as emitter molecules and/or matrix materials in the light-emitting layer (3) or instead of the application in the light-emitting layer—as charge transport material in the hole-transporting layer (2) or in the electron-transporting layer (4) and/or as charge blocker, wherein the application as charge transport material in the hole-transporting layer (2) (hole-transport material) is preferred.

The present application therefore further provides a light-emitting layer comprising at least one of the inventive heteroleptic complexes of the general formula (I), preferably as emitter molecule. Preferred heteroleptic complexes of the general formula (I) have already been specified above.

The heteroleptic complexes of the general formula (I) used in accordance with the invention may be present in the light-emitting layer in substance, i.e. without further additions. However, it is also possible that, in addition to the heteroleptic complexes of the general formula (I) used in accordance with the invention, further compounds are present in the light-emitting layer. For example, a fluorescent dye may be present in order to alter the emission color of the heteroleptic complex used as the emitter molecule. In addition, a diluent material (matrix material) may be used. This diluent material may be a polymer, for example poly(N-vinylcarbazole) or polysilane. The diluent material may, however, likewise be a small molecule, for example 4,4'-N, N'-dicarbazolebiphenyl (CDP) or tertiary aromatic amines. When a diluent material is used, the proportion of the inventive heteroleptic complexes of the general formula (I) used in the light-emitting layer is generally less than 40% by weight, preferably 3 to 30% by weight. The inventive heteroleptic complexes of the general formula (I) are preferably used in a matrix. The light-emitting layer thus preferably comprises at least one inventive heteroleptic complex of the general formula (I) and at least one matrix material as diluent material.

Suitable matrix materials are—in addition to the aforementioned dilution materials—in principle the materials specified hereinafter as hole and electron transport materials, and also carbene complexes, for example the carbene complexes of the formula (I) or the carbene complexes mentioned in WO 2005/019373. Particularly suitable are carbazole derivatives, for example 4,4'-bis(carbazol-9-yl)-2,2'-dimethylbiphenyl (CDBP), 4,4'-bis(carbazol-9-yl)biphenyl (CBP), 1,3-bis(N-carbazolyl)benzene (mCP), and the matrix materials specified in the following applications: WO2008/034758, WO2009/003919.

Further suitable matrix materials, which may be small molecules or (co)polymers of the small molecules mentioned, are specified in the following publications:
WO2007108459 (H-1 to H-37), preferably H-20 to H-22 and H-32 to H-37, most preferably H-20, H-32, H-36, H-37, WO2008035571 A1 (Host 1 to Host 6), JP2010135467 (compounds 1 to 46 and Host-1 to Host-39 and Host-43), WO2009008100 compounds No. 1 to No. 67, preferably No. 3, No. 4, No. 7 to No. 12, No. 55, No. 59, No. 63 to No. 67, more preferably No. 4, No. 8 to No. 12, No. 55, No. 59, No. 64, No. 65, and No. 67, WO2009008099 compounds No. 1 to No. 110, WO2008140114 compounds 1-1 to 1-50, WO2008090912 compounds OC-7 to OC-36 and the polymers of Mo-42 to Mo-51, JP2008084913 H-1 to H-70, WO2007077810 compounds 1 to 44, preferably 1, 2, 4-6, 8, 19-22, 26, 28-30, 32, 36, 39-44, WO201001830 the polymers of monomers 1-1 to 1-9, preferably of 1-3, 1-7, and 1-9, WO2008029729 the (polymers of) compounds 1-1 to 1-36, WO201100443342 HS-1 to HS-101 and BH-1 to BH-17, preferably BH-1 to BH-17, JP2009182298 the (co) polymers based on the monomers 1 to 75, JP2009170764, JP2009135183 the (co)polymers based on the monomers 1-14, WO2009063757 preferably the (co)polymers based on the monomers 1-1 to 1-26, WO2008146838 the compounds a-1 to a-43 and 1-1 to 1-46, JP2008207520 the (co)polymers based on the monomers 1-1 to 1-26, JP2008066569 the (co)polymers based on the monomers 1-1 to 1-16, WO2008029652 the (co)polymers based on the monomers 1-1 to 1-52, WO2007114244 the (co)polymers based on the monomers 1-1 to 1-18, JP2010040830 the compounds HA-1 to HA-20, HB-1 to HB-16, HC-1 to HC-23 and the (co) polymers based on the monomers HD-1 to HD-12, JP2009021336, WO2010090077 the compounds 1 to 55, WO2010079678 the compounds H1 to H42, WO2010067746, WO2010044342 the compounds HS-1 to HS-101 and Poly-1 to Poly-4, JP2010114180 the compounds PH-1 to PH-36, US2009284138 the compounds 1 to 111 and H1 to H71, WO2008072596 the compounds 1 to 45, JP2010021336 the compounds H-1 to H-38, preferably H-1, WO2010004877 the compounds H-1 to H-60, JP2009267255 the compounds 1-1 to 1-105, WO2009104488 the compounds 1-1 to 1-38, WO2009086028, US2009153034, US2009134784, WO2009084413 the compounds 2-1 to 2-56, JP2009114369 the compounds 2-1 to 2-40, JP2009114370 the compounds 1 to 67, WO2009060742 the compounds 2-1 to 2-56, WO2009060757 the compounds 1-1 to 1-76, WO2009060780 the compounds 1-1 to 1-70, WO2009060779 the compounds 1-1 to 1-42, WO2008156105 the compounds 1 to 54, JP2009059767 the compounds 1 to 20, JP2008074939 the compounds 1 to 256, JP2008021687 the compounds 1 to 50, WO2007119816 the compounds 1 to 37, WO2010087222 the compounds H-1 to H-31, WO2010095564 the compounds HOST-1 to HOST-61, WO2007108362, WO2009003898, WO2009003919, WO2010040777, US2007224446 and WO06128800.

In a particularly preferred embodiment, one or more compounds of the general formula (X) specified hereinafter are used as matrix material. Preferred embodiments of the compounds of the general formula (X) are likewise specified hereinafter.

The matrix materials mentioned above as well as the compounds of the general formula (X) mentioned below are not only applicable as matrix material in the light-emitting layer, but also as matrix materials in other layers of an OLED, for example in the electron-transport layer and/or in the hole transport layer. It is also possible, to apply two or more different matrix materials mentioned before and/or compounds of the general formula (X) mentioned below as matrix materials.

In order to obtain particularly efficient OLEDs, the HOMO (highest occupied molecular orbital) of the hole-transporting layer should be aligned to the work function of the anode, and the LUMO (lowest unoccupied molecular orbital) of the electron-transporting layer should be aligned to the work function of the cathode.

The present application further provides an OLED comprising at least one inventive light-emitting layer. The further layers in the OLED may be formed from any material which is typically used in such layers and is known to those skilled in the art.

Suitable materials for the aforementioned layers (anode, cathode, hole and electron injection materials, hole and electron transport materials and hole and electron blocker materials, matrix materials, fluorescence and phosphorescence emitters) are known to those skilled in the art and are specified, for example, in H. Meng, N. Herron, *Organic Small Molecule Materials for Organic Light-Emitting Devices in Organic Light-Emitting Materials and Devices*, eds: Z. Li, H. Meng, Taylor & Francis, 2007, Chapter 3, pages 295 to 411.

The anode is an electrode which provides positive charge carriers. It may be composed, for example, of materials which comprise a metal, a mixture of different metals, a metal alloy, a metal oxide or a mixture of different metal oxides. Alternatively, the anode may be a conductive polymer. Suitable metals comprise the metals of groups 11, 4, 5 and 6 of the Periodic Table of the Elements, and also the transition metals of groups 8 to 10. When the anode is to be transparent, mixed metal oxides of groups 12, 13 and 14 of the Periodic Table of the Elements are generally used, for example indium tin oxide (ITO). It is likewise possible that the anode (1) comprises an organic material, for example polyaniline, as described, for example, in Nature, Vol. 357, pages 477 to 479 (Jun. 11, 1992). At least either the anode or the cathode should be at least partly transparent in order to be able to emit the light formed.

Suitable hole transport materials for layer (2) of the inventive OLED are disclosed, for example, in Kirk-Othmer Encyclopedia of Chemical Technology, 4th Edition, Vol. 18, pages 837 to 860, 1996. Either hole-transporting molecules or polymers may be used as the hole transport material. Customarily used hole-transporting molecules are selected from the group consisting of 4,4'-bis[N-(1-naphthyl)-N-phenylamino]biphenyl (α-NPD), N,N'-diphenyl-N,N'-bis(3-methylphenyt)-[1,1'-biphenyl]-4,4'-diamine (TPD), 1,1-bis [(di-4-tolylamino)phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis(3-methylphenyl)-N,N,N',N'-2,5-phenylenediamine (PDA), α-phenyl-4-N,N-diphenylaminostyrene (TPS), p-(diethylamino)benzaldehyde diphenylhydrazone (DEH), triphenylamine (TPA), bis[4-(N,N-diethylamino)-2-methylphenyl](4-methylphenyl)methane (MPMP), 1-phenyl-3-[p-(diethylamino)styryl]-5-[p-(diethylamino)phenyl] pyrazoline (PPR or DEASP), 1,2-trans-bis(9H-carbazol-9-yl)-cyclobutane (DCZB), N,N,N',N'-tetrakis(4-methylphenyl)-(1,1'-biphenyl)-4,4'-diamine (TTB), fluorene compounds such as 2,2', 7, 7'-tetra(N,N-di-tolyl)amino-9,9-spirobifluorene (spiro-TTB), N, N'-bis(naphthalene-1-yl)-N, N'-bis(phenyl)-9,9-spirobifluorene (spiro-NPB) and 9,9-bis (4-(N,N-bis-biphenyl-4-yl-amino)phenyl-9H-fluorene, benzidine compounds such as N,N'-bis(naphthalene-1-yl)-N,N'-bis(phenyl)benzidine and porphyrin compounds such as copper phthalocyanines. Customarily used hole-transporting polymers are selected from the group consisting of polyvinylcarbazoles, (phenylmethyl)polysilanes and polyanilines. It is likewise possible to obtain hole-transporting polymers by doping hole-transporting molecules into polymers such as polystyrene and polycarbonate. Suitable hole-transporting molecules are the molecules already mentioned above.

In addition—in one embodiment—it is possible to use carbene complexes as hole conductor materials, in which case the band gap of the at least one hole conductor material is generally greater than the band gap of the emitter material used. In the context of the present invention, band gap is understood to mean the triplet energy. Suitable carbene complexes are, for example, the inventive carbene complexes of the general formula (I), carbene complexes as described in WO 2005/019373 A2, WO 2006/056418 A2, WO 2005/113704, WO 2007/115970, WO 2007/115981 and WO 2008/000727. One example of a suitable carbene complex is Ir(DPBIC)$_3$ with the formula:

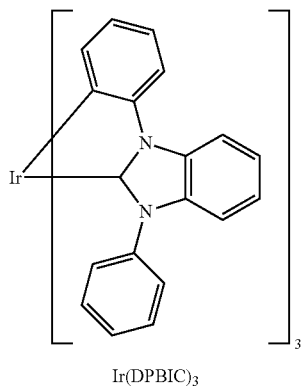

Ir(DPBIC)$_3$

It is likewise possible to use mixtures in the hole-transporting layer, in particular mixtures which lead to electrical p-doping of the hole-transporting layer. p-Doping is achieved by the addition of oxidizing materials. These mixtures may, for example, be the following mixtures: mixtures of the abovementioned hole transport materials with at least one metal oxide, for example $MoO_2$, $MoO_3$, $WO_x$, $ReO_3$, and/or preferably $MoO_3$ and/or $ReO_3$, more preferably $ReO_3$ or mixtures comprising the aforementioned hole transport materials and one or more compounds selected from $V_2O_5$, 7,7,8,8-tetracyanoquinodimethane (TCNQ), 2,3,5,6-tetrafluoro-7,7,8,8-tetracyanoquinodimethane ($F_4$-TCNQ), 2,5-bis(2-hydroxyethoxy)-7,7,8,8-tetracyanoquinodimethane, bis(tetra-n-butylammonium)tetracyanodiphenoquino-dimethane, 2,5-dimethyl-7,7,8,8-tetracyanoquinodimethane, tetracyanoethylene, 11,11,12,12-tetracyanonaphtho-2,6-quinodimethane, 2-fluoro-7,7,8,8-tetracyanoquino-dimethane, 2,5-difluoro-7,7,8,8-tetracyanoquinodimethane, dicyanomethylene-1,3,4,5,7,8-hexafluoro-6H-naphthalen-2-ylidene)malononitrile (FeTNAP), Mo(tfd)$_3$ (from Kahn et al., J. Am. Chem. Soc. 2009, 131 (35), 12530-12531), compounds as mentioned in EP 1 988 587 and in EP 2 180 029 and with quinone compounds as mentioned in EP 09153776.1.

Suitable electron-transporting materials for layer (4) of the inventive OLEDs comprise metals chelated with oxinoid compounds, such as tris(8-hydroxyquinolato)aluminum (Alq$_3$), compounds based on phenanthroline such as 2,9-dimethyl-4,7-diphenyl-1,10-phenanthroline (DDPA=BCP), 4,7-diphenyl-1,10-phenanthroline (Bphen), 4,7-diphenyl-1,10-phenanthroline (DPA) or phenanthroline derivatives disclosed in EP1786050 or in EP1097981, and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ). Layer (4) may serve both to ease the electron transport and as a buffer layer or as a barrier layer in order to prevent quenching of the exciton at the interfaces of the layers of the OLED. Layer (4) preferably improves the mobility of the electrons and reduces quenching of the exciton.

It is likewise possible to use mixtures of at least two materials in the electron-transporting layer, in which case at least one material is electron-conducting. Preferably, in such mixed electron-transporting layers, at least one phenanthroline compound is used. More preferably, in mixed electron-transporting layers, in addition to at least one phenanthroline compound, alkali metal hydroxyquinolate complexes, for example Liq, are used. In addition, it is possible to use mixtures which lead to electrical n-doping of the electron-transporting layer. n-Doping is achieved by the addition of reducing materials. These mixtures may, for example, be mixtures of the abovementioned electron transport materials with alkali/alkaline earth metals or alkali/alkaline earth metal salts, for example Li, Cs, Ca, Sr, $Cs_2CO_3$, with alkali metal complexes, for example 8-hydroxyquinolatolithium (Liq), and with Y, Ce, Sm, Gd, Tb, Er, Tm, Yb, $Li_3N$, $Rb_2CO_3$, dipotassium phthalate, W(hpp)$_4$ from EP 1786050, or with compounds as described in EP1837926 B1.

The present invention therefore also relates to an inventive OLED which comprises an electron-transporting layer comprising at least two different materials, of which at least one material should be electron-conductive.

In a preferred embodiment, the present invention relates to an inventive OLED wherein the electron-transporting layer comprises at least one phenanthroline derivative.

In a further preferred embodiment, the invention relates to an inventive OLED wherein the electron-transporting layer comprises at least one phenanthroline derivative and at least one alkali metal hydroxyquinolate complex.

In a further preferred embodiment, the invention relates to an inventive OLED wherein the electron-transporting layer comprises at least one phenanthroline derivative and 8-hydroxyquinolatolithium.

Some of the materials mentioned above as hole transport materials and electron-transporting materials can fulfill several functions. For example, some of the electron-transporting materials are simultaneously hole-blocking materials if they have a low-lying HOMO.

The charge-transporting layers may also be electronically doped in order to improve the transport properties of the materials used, in order firstly to make the layer thickness more generous (avoidance of pinholes/short circuits) and in order secondly to minimize the operating voltage of the device. The hole transport materials may for example be doped with electron acceptors, phthalocyanines respectively arylamines like TPD or TDTA may be for example doped with tetrafluorotetracyano-chinodimethane (F4-TCNQ). Electronic doping is known to those skilled in the art and is disclosed, for example, in W. Gao, A. Kahn, J. Appl. Phys., Vol. 94, No. 1, 1. July 2003 (p-doped organic layers); A. G. Werner, F. Li, K. Harada, M. Pfeiffer, T. Fritz, K. Leo, Appl. Phys. Lett., Vol. 82, No. 25, 23. June 2003 and Pfeiffer et al., Organic Electronics 2003, 4, 89-103 and K. Walzer, B. Maennig, M. Pfeiffer, K. Leo, Chem. Soc. Rev. 2007, 107, 1233.

The cathode (5) is an electrode which serves to introduce electrons or negative charge carriers. The cathode may be any metal or nonmetal which has a lower work function than the anode. Suitable materials for the cathode are selected from the group consisting of alkali metals of group 1, for example Li, Cs, alkaline earth metals of group 2, metals of group 12 of the Periodic Table of the Elements, comprising the rare earth metals and the lanthanides and actinides. In addition, metals such as aluminum, indium, calcium, barium, samarium and magnesium, and combinations thereof, may be used. In addition, lithium-comprising organometallic compounds such as 8-hydroxyquinolatolithium (Liq) or LiF or at least one of the following compounds ($Cs_2CO_3$, KF, CsF or NaF) may be applied between the organic layer and the cathode as an electron injection layer in order to reduce the operating voltage.

The OLED of the present invention may additionally comprise further layers which are known to those skilled in the art. For example, a layer which eases the transport of the positive charge and/or matches the band gaps of the layers to one another may be applied between the layer (2) and the light-emitting layer (3). Alternatively, this further layer may serve as a protective layer. In an analogous manner, additional layers may be present between the light-emitting layer (3) and the layer (4) in order to ease the transport of the negative charge and/or to match the band gaps between the layers to one another. Alternatively, this layer may serve as a protective layer.

In a preferred embodiment, the inventive OLED, in addition to the layers (1) to (5), comprises at least one of the further layers mentioned below:
- a hole injection layer between the anode (1) and the hole-transporting layer (2);
- a blocking layer for electrons between the hole-transporting layer (2) and the light-emitting layer (3);
- a blocking layer for holes between the light-emitting layer (3) and the electron-transporting layer (4);
- an electron injection layer between the electron-transporting layer (4) and the cathode (5).

As already mentioned above, however, it is also possible that the OLED does not have all of the layers (1) to (5)

mentioned; for example, an OLED comprising layers (1) (anode), (3) (light-emitting layer) and (5) (cathode) is likewise suitable, in which case the functions of layers (2) (hole-transporting layer) and (4) (electron-transporting layer) are assumed by the adjoining layers. OLEDs having layers (1), (2), (3) and (5) or layers (1), (3), (4) and (5) are likewise suitable.

Those skilled in the art know how suitable materials have to be selected (for example on the basis of electrochemical investigations). Suitable materials for the individual layers are known to those skilled in the art and disclosed, for example, in WO 00/70655.

In addition, it is possible that some or all of the layers (1), (2), (3), (4) and (5) have been surface-treated in order to increase the efficiency of charge carrier transport. The selection of the materials for each of the layers mentioned is preferably determined by obtaining an OLED having a high efficiency.

The inventive OLED can be produced by methods known to those skilled in the art. In general, the OLED is produced by successive vapor deposition of the individual layers onto a suitable substrate. Suitable substrates are, for example, glass, inorganic materials like ITO or IZO or polymer films. For the vapor deposition, customary techniques may be used, such as thermal evaporation, chemical vapor deposition (CVD), physical vapor deposition (PVD) and others.

In an alternative process, the organic layers may be coated from solutions or dispersions in suitable solvents, in which case coating techniques known to those skilled in the art are employed.

Suitable coating techniques are, for example, spin-coating, the casting method, the Langmuir-Blodgett ("LB") method, the inkjet printing method, dip-coating, letterpress printing, screen printing, doctor blade printing, roller printing, reverse roller printing, offset lithography printing, flexographic printing, web printing, spray coating, coating by a brush or pad printing, and the like. Among the processes mentioned, in addition to the aforementioned vapor deposition, preference is given to spin-coating, the inkjet printing method and the casting method since they are particularly simple and inexpensive to perform. In the case that layers of the OLED are obtained by the spin-coating method, the casting method or the inkjet printing method, the coating can be obtained using a solution prepared by dissolving the composition in a concentration of 0.0001 to 90% by weight in a suitable organic solvent such as benzene, toluene, xylene, tetrahydrofuran, methyltetrahydrofuran, N,N-dimethylformamide, acetone, acetonitrile, anisole, dichloromethane, dimethyl sulfoxide, water and mixtures thereof.

It is also possible that all layers of the OLED are prepared with the same coating technique. It is further also possible that two or more coating techniques are carried out in the production of the layers of the OLED.

In general, the different layers have the following thicknesses: anode (2) 500 to 5000 Å, preferably 1000 to 2000 Å (ångström); hole-transporting layer (3) 50 to 1000 Å, preferably 200 to 800 Å; light-emitting layer (4) 10 to 1000 Å, preferably 100 to 800 Å; electron-transporting layer (5) 50 to 1000 Å, preferably 200 to 800 Å; cathode (6) 200 to 10 000 Å, preferably 300 to 5000 Å. The position of the recombination zone of holes and electrons in the inventive OLED and thus the emission spectrum of the OLED may be influenced by the relative thickness of each layer. This means that the thickness of the electron transport layer should preferably be selected such that the electron/hole recombination zone is within the light-emitting layer. The ratio of the layer thicknesses of the individual layers in the OLED is dependent upon the materials used. The layer thicknesses of any additional layers used are known to those skilled in the art.

In a preferred embodiment, the present invention also relates to an OLED comprising at least one inventive heteroleptic complex of the general formula (I), and at least one compound of the general formula (X)

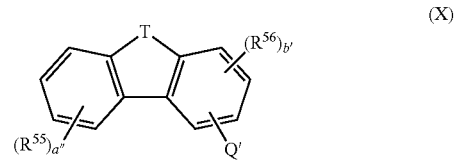

(X)

in which

T is $NR^{57}$, S, O or $PR^{57}$, preferably S or O, more preferably O;

$R^{57}$ is aryl, heteroaryl, alkyl, cycloalkyl or heterocycloalkyl;

Q' is $-NR^{58}R^{59}$, $-P(O)R^{60}R^{61}$, $-PR^{62}R^{63}$, $-S(O)_2R^{64}$, $-S(O)R^{65}$, $-SR^{66}$ or $-OR^{67}$, preferably $-NR^{58}R^{59}$; more preferably

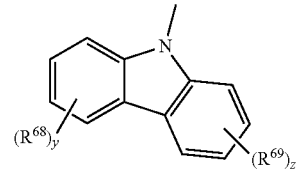

in which $R^{68}$, $R^{69}$ are each independently alkyl, cycloalkyl, heterocycloalkyl, aryl or heteroaryl; preferably methyl, carbazolyl, dibenzofuryl or dibenzothienyl;

y, z are each independently 0, 1, 2, 3 or 4, preferably 0 or 1;

$R^{55}$, $R^{56}$ are each independently alkyl, cycloalkyl, heterocycloalkyl, aryl, heteroaryl, $SiR^{70}R^{71}R^{72}$, a Q' group or a group with donor or acceptor action;

a" is 0, 1, 2, 3 or 4;

b' is 0, 1, 2 or 3;

$R^{58}$, $R^{59}$ form, together with the nitrogen atom, a cyclic radical which has 3 to 10 ring atoms and may be unsubstituted or substituted by one or more substituents selected from alkyl, cycloalkyl, heterocycloalkyl, aryl, heteroaryl and a group with donor or acceptor action, and/or may be fused to one or more further cyclic radicals having 3 to 10 ring atoms, where the fused radicals may be unsubstituted or substituted by one or more substituents selected from alkyl, cycloalkyl, heterocycloalkyl, aryl, heteroaryl and a group with donor or acceptor action;

$R^{70}$, $R^{71}$, $R^{72}$, $R^{60}$, $R^{61}$, $R^{62}$, $R^{63}$, $R^{64}$, $R^{65}$, $R^{66}$, $R^{67}$ are each independently aryl, heteroaryl, alkyl, cycloalkyl or heterocycloalkyl, or two units of the general formula (X) are bridged to one another via a linear or branched, saturated or unsaturated bridge optionally interrupted by at least one heteroatom, via a bond or via O.

Preference is given to compounds of the formula (X) in which:

T is S or O, preferably O, and

Q' is

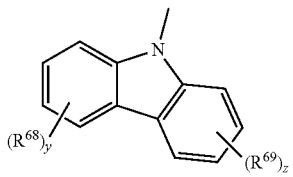

in which

R$^{68}$, R$^{69}$ are each independently alkyl, cycloalkyl, heterocycloalkyl, aryl or heteroaryl; preferably methyl, carbazolyl, dibenzofuryl or dibenzothienyl;

y, z are each independently 0, 1, 2, 3 or 4, preferably 0 or 1.

Particularly preferred compounds of the formula (X) have the following formula (Xa):

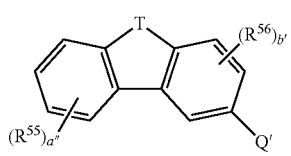

(Xa)

in which the symbols and indices Q', T, R$^{55}$, R$^{56}$, a" and b' are each as defined above.

Very particularly preferred compounds of the formula (X) have the formula Xaa):

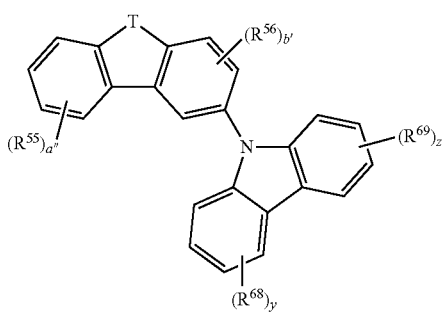

(Xaa)

in which the symbols and indices R$^{68}$, R$^{69}$ y, z, T, R$^{55}$, R$^{56}$, a" and b' are each as defined above.

In a very particularly preferred embodiment, in formula (Xaa):

T is O or S, preferably O;
a" is 1;
b' is 0;
y, z are each independently 0 or 1; and
R$^{68}$, R$^{69}$ are each independently methyl, carbazolyl, dibenzofuryl or dibenzothienyl
R$^{55}$ is substituted phenyl, carbazolyl, dibenzofuryl or dibenzothienyl.

In a further preferred embodiment, the compounds of the formula (X) have the formula (XI) or (XI*):

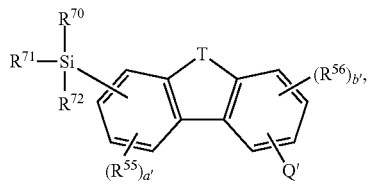

(XI)

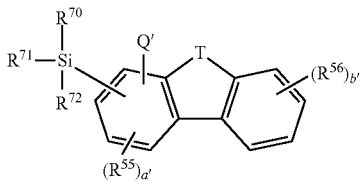

(XI*)

in which

T is NR$^{57}$, S, O or PR$^{57}$;

R$^{57}$ is aryl, heteroaryl, alkyl, cycloalkyl or heterocycloalkyl;

Q' is —NR$^{58}$R$^{59}$, —P(O)R$^{60}$R$^{61}$, —PR$^{62}$R$^{63}$, —S(O)$_2$R$^{64}$, —S(O)R$^{65}$, —SR$^{66}$ or —OR$^{67}$;

R$^{70}$, R$^{71}$, R$^{72}$ are each independently aryl, heteroaryl, alkyl, cycloalkyl, heterocycloalkyl, where at least one of the R$^{70}$, R$^{71}$, R$^{72}$ radicals comprises at least two carbon atoms, or OR$^{73}$, R$^{55}$, R$^{56}$ are each independently alkyl, cycloalkyl, heterocycloalkyl, aryl, heteroaryl, a Q group or a group with donor or acceptor action;

a', b' for the compound of the formula (XI): are each independently 0, 1, 2, 3; for the compound of the formula (XI*), a' is 0, 1, 2 and b' is 0, 1, 2, 3, 4;

R$^{58}$, R$^{59}$ form, together with the nitrogen atom, a cyclic radical which has 3 to 10 ring atoms and may be unsubstituted or substituted by one or more substituents selected from alkyl, cycloalkyl, heterocycloalkyl, aryl, heteroaryl and a group with donor or acceptor action and/or may be fused to one or more further cyclic radicals having 3 to 10 ring atoms, where the fused radicals may be unsubstituted or substituted by one or more substituents selected from alkyl, cycloalkyl, heterocycloalkyl, aryl, heteroaryl and a group with donor or acceptor action;

R$^{73}$ are each independently SiR$^{74}$R$^{75}$R$^{76}$, aryl, heteroaryl, alkyl, cycloalkyl or heterocycloalkyl, optionally substituted by an OR$^{77}$ group, R$^{77}$ are each independently SiR$^{74}$R$^{75}$R$^{76}$, aryl, heteroaryl, alkyl, cycloalkyl or heterocycloalkyl, R$^{60}$, R$^{61}$, R$^{62}$, R$^{63}$, R$^{64}$, R$^{65}$, R$^{66}$, R$^{67}$, R$^{74}$, R$^{75}$, R$^{76}$ are each independently aryl, heteroaryl, alkyl, cycloalkyl or heterocycloalkyl, or two units of the general formulae (XI) and/or (XI*) are bridged to one another via a linear or branched, saturated or unsaturated bridge optionally interrupted by at least one heteroatom or via O, where this bridge in the general formulae (XI) and/or (XI*) is in each case attached to the silicon atoms in place of R$^1$.

The compounds of the general formula (X) can be used as a matrix (diluent material), hole/exciton blocker, electron/exciton blocker, electron transport material or hole transport material in combination with the heteroeleptic complexes claimed, which then preferably serve as emitters. Inventive OLEDs which include both at least one compound of the formula (X) and a compound of the formula (I) exhibit particularly good efficiencies and lifetimes. Depending on the function in which the compound of the formula (X) is used, it is present in pure form or in different mixing ratios. In a particularly preferred embodiment, one or more compounds of the formula (X) are used as matrix material in the light-emitting layer.

For the compounds of the general formula (X), especially for the $R^{55}$ to $R^{77}$ radicals:

The terms aryl radical or group, heteroaryl radical or group, alkyl radical or group, cycloalkyl radical or group, heterocycloalkyl radical or group, alkenyl radical or group, alkynyl radical or group, and groups with donor and/or acceptor action are each defined as follows:

An aryl radical (or group) is understood to mean a radical having a base skeleton of 6 to 30 carbon atoms, preferably 6 to 18 carbon atoms, which is formed from an aromatic ring or a plurality of fused aromatic rings. Suitable base skeletons are, for example, phenyl, naphthyl, anthracenyl or phenanthrenyl, indenyl or fluorenyl. This base skeleton may be unsubstituted (which means that all carbon atoms which are substitutable bear hydrogen atoms), or may be substituted at one, more than one or all substitutable positions of the base skeleton.

Suitable substituents are, for example, deuterium, alkoxy radicals, aryloxy radicals, alkylamino groups, arylamino groups, carbazolyl groups, silyl groups, $SiR^{78}R^{79}R^{80}$, suitable silyl groups $SiR^{78}R^{79}R^{80}$ being specified below, alkyl radicals, preferably alkyl radicals having 1 to 8 carbon atoms, more preferably methyl, ethyl or i-propyl, aryl radicals, preferably $C_6$-aryl radicals, which may in turn be substituted or unsubstituted, heteroaryl radicals, preferably heteroaryl radicals which comprise at least one nitrogen atom, more preferably pyridyl radicals and carbazolyl radicals, alkenyl radicals, preferably alkenyl radicals which bear one double bond, more preferably alkenyl radicals having one double bond and 1 to 8 carbon atoms, alkynyl radicals, preferably alkynyl radicals having one triple bond, more preferably alkynyl radicals having one triple bond and 1 to 8 carbon atoms or groups with donor or acceptor action. Suitable groups with donor or acceptor action are specified below. The substituted aryl radicals most preferably bear substituents selected from the group consisting of methyl, ethyl, isopropyl, alkoxy, heteroaryl, halogen, pseudohalogen and amino, preferably arylamino. The aryl radical or the aryl group is preferably a $C_6$-$C_{18}$-aryl radical, more preferably a $C_6$-aryl radical, which is optionally substituted by at least one or more than one of the aforementioned substituents. The $C_6$-$C_{18}$-aryl radical, preferably $C_6$-aryl radical, more preferably has none, one, two, three or four, most preferably none, one or two, of the aforementioned substituents.

A heteroaryl radical or a heteroaryl group is understood to mean radicals which differ from the aforementioned aryl radicals in that at least one carbon atom in the base skeleton of the aryl radicals is replaced by a heteroatom, and in that the base skeleton of the heteroaryl radicals preferably has 5 to 18 ring atoms. Preferred heteroatoms are N, O and S. Heteroaryl radicals suitable with particular preference are nitrogen-containing heteroaryl radicals. Most preferably, one or two carbon atoms of the base skeleton are replaced by heteroatoms, preferably nitrogen. The base skeleton is especially preferably selected from systems such as pyridine, pyrimidine and five-membered heteroaromatics such as pyrrole, furan, pyrazole, imidazole, thiophene, oxazole, thiazole, triazole. In addition, the heteroaryl radicals may be fused ring systems, for example benzofuryl, benzothienyl, benzopyrrolyl, dibenzofuryl, dibenzothienyl, phenanthrolinyl, carbazolyl radicals, azacarbazolyl radicals or diazacarbazolyl radicals. The base skeleton may be substituted at one, more than one or all substitutable positions of the base skeleton. Suitable substituents are the same as have already been specified for the aryl groups.

An alkyl radical or an alkyl group is understood to mean a radical having 1 to 20 carbon atoms, preferably 1 to 10 carbon atoms, more preferably 1 to 8, most preferably 1 to 4 carbon atoms. This alkyl radical may be branched or unbranched and optionally be interrupted by one or more heteroatoms, preferably Si, N, O or S, more preferably N, O or S. In addition, this alkyl radical may be substituted by one or more of the substituents specified for the aryl groups. In addition, the alkyl radicals present in accordance with the invention may have at least one halogen atom, for example F, Cl, Br or I, especially F. In a further embodiment, the alkyl radicals present in accordance with the invention may be fully fluorinated. It is likewise possible that the alkyl radical bears one or more (hetero)aryl groups. In the context of the present application, for example, benzyl radicals are thus substituted alkyl radicals. In this context, all of the (hetero)aryl groups listed above are suitable. The alkyl radicals are more preferably selected from the group consisting of methyl, ethyl, isopropyl, n-propyl, n-butyl, iso-butyl and tert-butyl, very particular preference being given to methyl and ethyl.

A cycloalkyl radical or a cycloalkyl group is understood to mean a radical having 3 to 20 carbon atoms, preferably 3 to 10 carbon atoms, more preferably 3 to 8 carbon atoms. This base skeleton may be unsubstituted (which means that all carbon atoms which are substitutable bear hydrogen atoms) or substituted at one, more than one or all substitutable positions of the base skeleton. Suitable substituents are the groups already mentioned above for the aryl radicals. It is likewise possible that the cycloalkyl radical bears one or more (hetero)aryl groups. Examples of suitable cycloalkyl radicals are cyclopropyl, cyclopentyl and cyclohexyl.

A heterocycloalkyl radical or a heterocycloalkyl group is understood to mean radicals which differ from the aforementioned cycloalkyl radicals in that at least one carbon atom in the base skeleton of the cycloalkyl radicals is replaced by a heteroatom. Preferred heteroatoms are N, O and S. Most preferably, one or two carbon atoms of the base skeleton of the cycloalkyl radicals are replaced by heteroatoms. Examples of suitable heterocycloalkyl radicals are radicals derived from pyrrolidine, piperidine, piperazine, tetrahydrofuran, dioxane.

An alkenyl radical or an alkenyl group is understood to mean a radical which corresponds to the aforementioned alkyl radicals having at least two carbon atoms, with the difference that at least one C—C single bond of the alkyl radical is replaced by a C=C double bond. The alkenyl radical preferably has one or two double bonds.

An alkynyl radical or an alkynyl group is understood to mean a radical which corresponds to the aforementioned alkyl radicals having at least two carbon atoms, with the difference that at least one C—C single bond of the alkyl radical is replaced by a C—C triple bond. The alkynyl radical preferably has one or two triple bonds.

An $SiR^{70}R^{79}R^{80}$ group is understood to mean a silyl radical in which $R^{78}$, $R^{79}$ and $R^{80}$ are each independently alkyl, cycloalkyl, heterocycloalkyl, aryl, heteroaryl or $OR^{73}$.

An $SiR^{74}R^{75}R^{76}$ group is understood to mean a silyl radical in which $R^{74}$, $R^{75}$ and $R^{76}$ are each independently alkyl, cycloalkyl, heterocycloalkyl, aryl, heteroaryl or $OR^{73}$.

In the context of the present application, a group or a substituent with donor or acceptor action is understood to mean the following groups:

Groups with donor action are understood to mean groups which have a +I and/or +M effect, and groups with acceptor action are understood to mean groups which have a −I and/or −M effect. Preferred suitable groups are selected from $C_1$-$C_{20}$-alkoxy, $C_6$-$C_{30}$-aryloxy, $C_1$-$C_{20}$-alkylthio, $C_6$-$C_{30}$-arylthio, $SiR^{81}R^{82}R^{83}$, $OR^{73}$, halogen radicals, halogenated $C_1$-$C_{20}$-alkyl radicals, carbonyl (—CO($R^{81}$)), carbonylthio (—C=O ($SR^{81}$)), carbonyloxy (—C=O($OR^{81}$)), oxycarbonyl (—OC=O($R^{81}$)), thiocarbonyl (—SC=O($R^{81}$)) amino (—$NR^{81}R^{82}$), pseudohalogen radicals, amido (—C=O ($NR^{81}$)), —$NR^{81}$C=O ($R^{83}$), phosphonate (—P(O)($OR^{81}$)$_2$), phosphate (—OP(O) ($OR^{81}$)$_2$), phosphine (—$PR^{81}R^{82}$), phosphine oxide (—P(O)$R^{81}{}_2$), sulfate (—OS(O)$_2OR^{81}$), sulfoxide (—S(O)$R^{81}$), sulfonate (—S(O)$_2OR^{81}$), sulfonyl (—S(O)$_2R^{81}$, sulfonamide (—S(O)$_2NR^{81}R^{82}$), $NO_2$, boronic esters (—OB($OR^{81}$)$_2$), imino (—C=$NR^{81}R^{82}$)), borane radicals, stannane radicals, hydrazine radicals, hydrazone radicals, oxime radicals, nitroso groups, diazo groups, vinyl groups, sulfoximines, alanes, germanes, boroximes and borazines.

The $R^{81}$, $R^{82}$ and $R^{83}$ radicals mentioned in the aforementioned groups with donor or acceptor action are each independently:

substituted or unsubstituted $C_1$-$C_{20}$-alkyl or substituted or unsubstituted $C_6$-$C_{30}$-aryl, or $OR^{76}$, suitable and preferred alkyl and aryl radicals having been specified above. The $R^{81}$, $R^{82}$ and $R^{83}$ radicals are more preferably $C_1$-$C_6$-alkyl, e.g. methyl, ethyl or i-propyl, or phenyl. In a preferred embodiment—in the case of $SiR^{81}R^{82}R^{83}$-$R^{81}$, $R^{82}$ and $R^{83}$ are preferably each independently substituted or unsubstituted $C_1$-$C_{20}$-alkyl or substituted or unsubstituted aryl, preferably phenyl.

Preferred substituents with donor or acceptor action are selected from the group consisting of:

$C_1$- to $C_{20}$-alkoxy, preferably $C_1$-$C_6$-alkoxy, more preferably ethoxy or methoxy; $C_6$-$C_{30}$-aryloxy, preferably $C_6$-$C_{10}$-aryloxy, more preferably phenyloxy; $SiR^{81}R^{82}R^{83}$ where $R^{81}$, $R^{82}$ and $R^{83}$ are preferably each independently substituted or unsubstituted alkyl or substituted or unsubstituted aryl, preferably phenyl; more preferably, at least one of the $R^{81}$, $R^{82}$ and $R^{83}$ radicals is substituted or unsubstituted phenyl, suitable substituents having been specified above; halogen radicals, preferably F, Cl, more preferably F, halogenated $C_1$-$C_{20}$-alkyl radicals, preferably halogenated $C_1$-$C_6$-alkyl radicals, most preferably fluorinated $C_1$-$C_6$-alkyl radicals, e.g. $CF_3$, $CH_2F$, $CHF_2$ or $C_2F_5$; amino, preferably dimethylamino, diethylamino or diarylamino, more preferably diarylamino; pseudohalogen radicals, preferably CN, —C(O)O$C_1$-$C_4$-alkyl, preferably —C(O)OMe, P(O)$R_2$, preferably P(O)$Ph_2$.

Very particularly preferred substituents with donor or acceptor action are selected from the group consisting of methoxy, phenyloxy, halogenated $C_1$-$C_4$-alkyl, preferably $CF_3$, $CH_2F$, $CHF_2$, $C_2F_5$, halogen, preferably F, CN, $SiR^{81}R^{82}R^{83}$, suitable $R^{81}$, $R^{82}$ and $R^{83}$ radicals already having been specified, diarylamino ($NR^{84}R^{85}$ where $R^{84}$, $R^{85}$ are each $C_6$-$C_{30}$-aryl), —C(O)O$C_1$-$C_4$-alkyl, preferably —C(O)OMe, P(O)$Ph_2$.

Halogen groups are preferably understood to mean F, Cl and Br, more preferably F and Cl, most preferably F.

Pseudohalogen groups are preferably understood to mean CN, SCN and OCN, more preferably CN.

The aforementioned groups with donor or acceptor action do not rule out the possibility that further radicals and substituents mentioned in the present application, but not included in the above list of groups with donor or acceptor action, have donor or acceptor action.

The aryl radicals or groups, heteroaryl radicals or groups, alkyl radicals or groups, cycloalkyl radicals or groups, heterocycloalkyl radicals or groups, alkenyl radicals or groups and groups with donor and/or acceptor action may—as mentioned above—be substituted or unsubstituted. In the context of the present application, an unsubstituted group is understood to mean a group in which the substitutable atoms of the group bear hydrogen atoms. In the context of the present application, a substituted group is understood to mean a group in which one or more substitutable atom(s) bear(s) a substituent in place of a hydrogen atom at least at one position. Suitable substituents are the substituents specified above for the aryl radicals or groups.

When radicals having the same numbering occur more than once in the compounds according to the present application, these radicals may each independently have the definitions specified.

The T radical in the compounds of the formula (X) is $NR^{57}$, S, O or $PR^{57}$, preferably $NR^{57}$, S or O, more preferably O or S, most preferably O.

The $R^{57}$ radical is aryl, heteroaryl, alkyl, cycloalkyl or heterocycloalkyl, preferably aryl, heteroaryl or alkyl, more preferably aryl, where the aforementioned radicals may be unsubstituted or substituted. Suitable substituents have been specified above. $R^{65}$ is more preferably phenyl which may be substituted by the aforementioned substituents or unsubstituted. $R^{57}$ is most preferably unsubstituted phenyl.

The Q' group in the compounds of the formula (X) is —$NR^{58}R^9$, —P(O)$R^{60}R^{61}$, —$PR^{62}R^{63}$, —S(O)$_2R^{64}$, —S(O)$R^{65}$, —$SR^{66}$ or —$OR^{67}$; preferably $NR^{58}R^{59}$, —P(O)$R^{60}R^{61}$ or —$OR^{67}$, more preferably —$NR^{58}R^{59}$.

The $R^{58}$ to $R^{67}$ and $R^{74}$ to $R^{76}$ radicals are each defined as follows:

$R^{58}$, $R^{59}$ form, together with the nitrogen atom, a cyclic radical which has 3 to 10 ring atoms and may be unsubstituted or substituted by one or more substituents selected from alkyl, cycloalkyl, heterocycloalkyl, aryl, heteroaryl and a group with donor or acceptor action and/or may be fused to one or more further cyclic radicals having 3 to 10 ring atoms, where the fused radicals may be unsubstituted or substituted by one or more substituents selected from alkyl, cycloalkyl, heterocycloalkyl, aryl, heteroaryl and a group with donor or acceptor action;

$R^{60}$, $R^{61}$, $R^{62}$, $R^{63}$, $R^{64}$, $R^{65}$, $R^{66}$, $R^{67}$, $R^{74}$, $R^{75}$, $R^{76}$ are each independently aryl, heteroaryl, alkyl, cycloalkyl or heterocycloalkyl, preferably aryl or heteroaryl, where the radicals may be unsubstituted or substituted by one or more of the radicals selected from alkyl, cycloalkyl, heterocycloalkyl, aryl, heteroaryl and a group with donor or acceptor action, more preferably unsubstituted or substituted phenyl, suitable substituents having been specified above, for example tolyl or a group of the formula

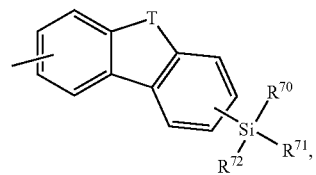

in which the T group and the $R^{70}$, $R^{71}$ and $R^{72}$ radicals are each independently as defined for the compounds of the formula (XI) or (XI*).

$R^{60}$, $R^{61}$, $R^{62}$, $R^{63}$, $R^{64}$, $R^{65}$, $R^{66}$ and $R^{87}$ are most preferably each independently phenyl, tolyl or a group of the formula

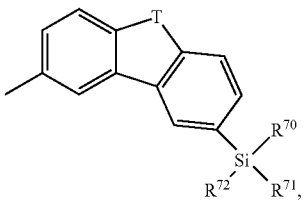

in which T is NPh, S or O.

Examples of —$NR^{58}R^{59}$ groups suitable with preference are selected from the group consisting of pyrrolyl, 2,5-dihydro-1-pyrrolyl, pyrrolidinyl, indolyl, indolinyl, isoindolinyl, carbazolyl, azacarbazolyl, diazacarbazolyl, imidazolyl, imidazolinyl, benzimidazolyl, pyrazolyl, indazolyl, 1,2,3-triazolyl, benzotriazolyl, 1,2,4-triazolyl, tetrazolyl, 1,3-oxazolyl, 1,3-thiazolyl, piperidyl, morpholinyl, 9,10-dihydroacridinyl and 1,4-oxazinyl, where the aforementioned groups may be unsubstituted or substituted by one or more substituents selected from alkyl, cycloalkyl, heterocycloalkyl, aryl, heteroaryl and a group with donor or acceptor action; the —$NR^{6}R^{7}$ group is preferably selected from carbazolyl, pyrrolyl, indolyl, imidazolyl, benzimidazolyl, azacarbazolyl and diazacarbazolyl, where the aforementioned groups may be unsubstituted or substituted by one or more substituents selected from alkyl, cycloalkyl, heterocycloalkyl, aryl, heteroaryl and a group with donor or acceptor action; the —$NR^{58}R^{59}$ group is more preferably carbazolyl which may be unsubstituted or substituted by one or more substituents selected from alkyl, cycloalkyl, heterocycloalkyl, aryl, heteroaryl and a group with donor or acceptor action.

Particularly preferred—$NR^{58}R^{59}$ groups are:

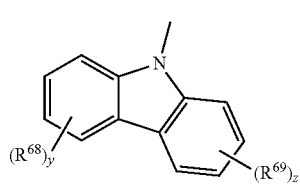

in which
$R^{68}$, $R^{69}$ are each independently alkyl, cycloalkyl, heterocycloalkyl, aryl or heteroaryl; preferably methyl, carbazolyl, dibenzofuryl or dibenzothienyl;
y, z are each independently 0, 1, 2, 3 or 4, preferably 0 or 1;
for example:

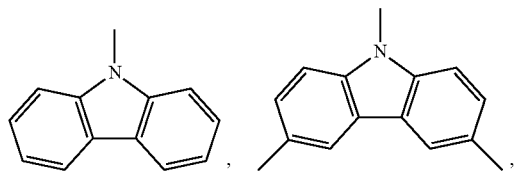

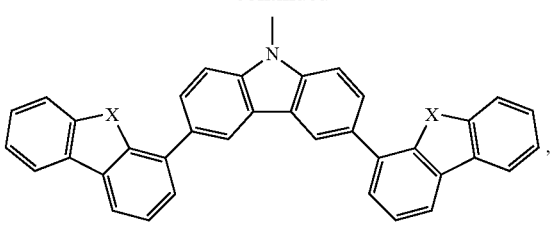

in which X is NPh, S or O;

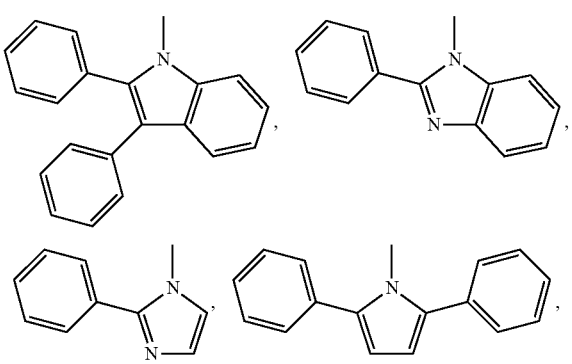

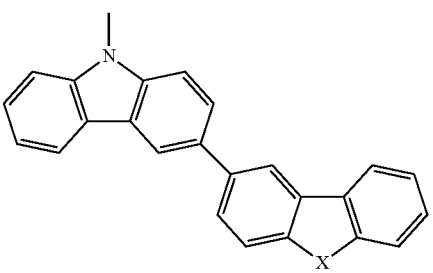

in which X is NPh, S or O,

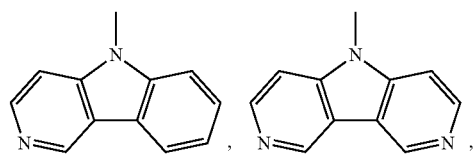

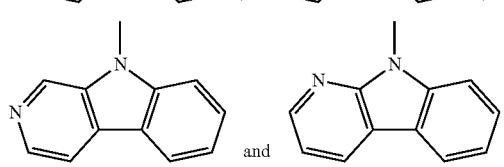

and

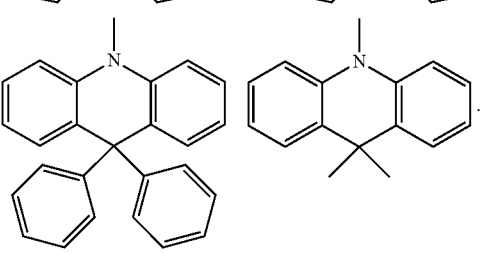

Particularly preferred —P(O)R$^{60}$R$^{61}$ groups are:

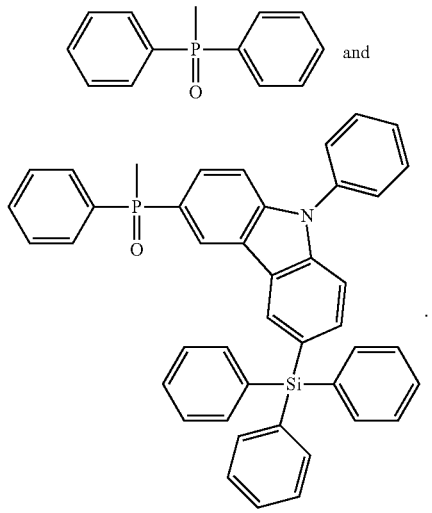

A particularly preferred PR$^{62}$R$^{63}$ group is:

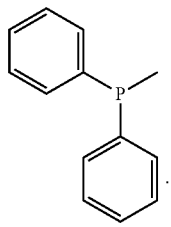

Particularly preferred groups —S(O)$_2$R$^{64}$ and —S(O)R$^{65}$ are:

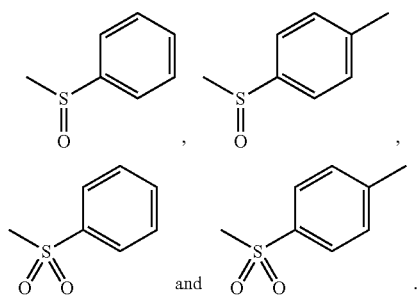

Particularly preferred groups —SR$^{66}$ and —OR$^{67}$ are:

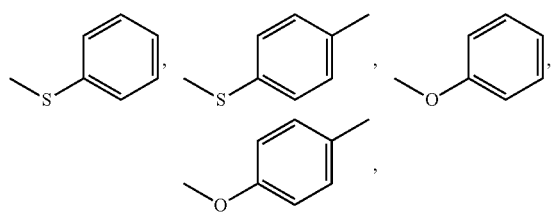

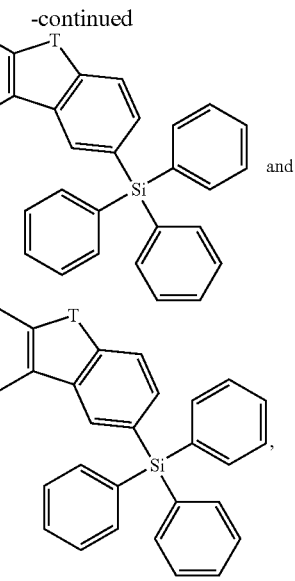

in which T is in each case NPh, S or O.

R$^{55}$, R$^{56}$ in the compounds of the formula (X) are each independently alkyl, cycloalkyl, heterocycloalkyl, aryl, heteroaryl, a further A group or a group with donor or acceptor action; preferably each independently alkyl, aryl, heteroaryl or a group with donor or acceptor action. For example, R$^{55}$ or R$^{56}$ may each independently be:

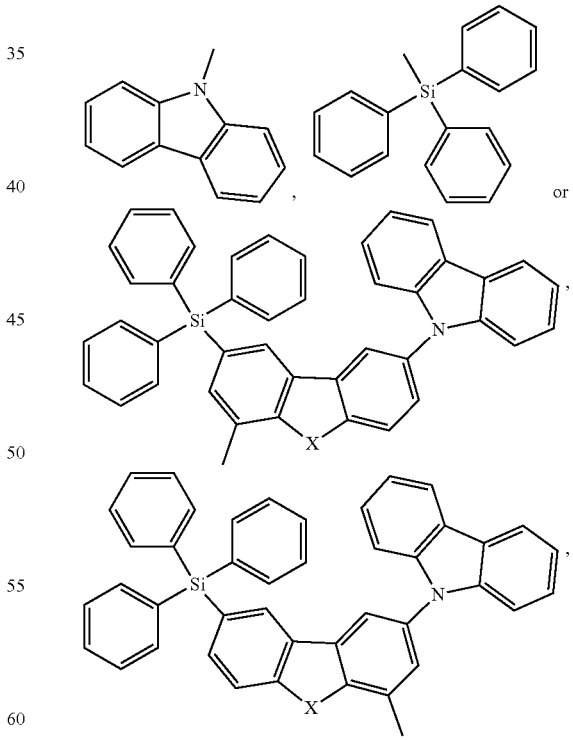

in which X is NPh, S or O.

In the compounds of the formula (X) a" R$^{55}$ groups and/or b' R$^{56}$ groups may be present, where a" and b' are:

a" is 0, 1, 2, 3 or 4; preferably independently 0, 1 or 2;
b' is 0, 1, 2 or 3; preferably independently 0, 1 or 2.

Most preferably at least a" or b' is 0, very especially preferably a" and b' are each 0 or a" is 1 and b' is 0.

$R^{73}$ in the compounds of the general formula (XI) is generally independently $SiR^{74}R^{75}R^{76}$, aryl, heteroaryl, alkyl, cycloalkyl or heterocycloalkyl, optionally substituted by an OR group.

$R^{77}$ in compounds of the general formula (XI) is generally independently aryl, heteroaryl, alkyl, cycloalkyl or heterocycloalkyl.

The $OR^{77}$ substituent optionally present may generally be present in the radicals mentioned at all sites which appear suitable to the person skilled in the art.

In a further embodiment, two units of the general formula (XI) and/or (XI*) are bridged to one another via a linear or branched, saturated or unsaturated bridge optionally interrupted by at least one heteroatom or via O, where this bridge in the general formula (XI) and/or (XI*) is in each case attached to the silicon atoms in place of $R^{71}$.

This bridge is preferably selected from the group consisting of —CH$_2$—, —C$_2$H$_4$—, —C$_3$H$_6$—, —C$_4$H$_8$—, —C$_6$H$_{12}$—, —C$_8$H$_{18}$—, —C$_9$H$_{18}$—, —CH(C$_8$H$_{17}$)CH$_2$, —C$_2$H$_4$(CF$_2$)$_8$ C$_2$H$_4$—, —C≡C—, -1,4-(CH$_2$)$_2$-phenyl-(CH$_2$)$_2$—, 1,3-(CH$_2$)$_2$-phenyl-(CH$_2$)$_2$—, -1,4-phenyl-, -1,3-phenyl-, —O—, —O—Si(CH$_3$)$_2$—O—, —O—Si(CH$_3$)—O— Si(CH$_3$)$_2$—O—, —O—.

In a preferred embodiment of the present application, the compounds of the general formula (X) have the general formula (XIa), (XIb), (XIc), (XId) or (XIe), i.e. they are preferred embodiments of the compounds of the general formula (XI) or (XI*):

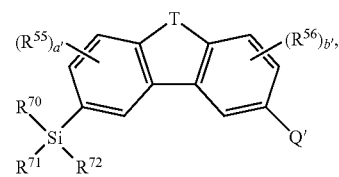
(XIa)

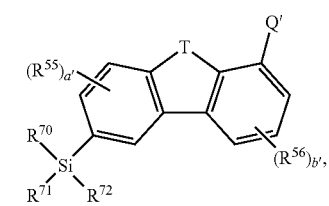
(XIb)

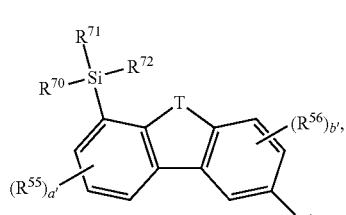
(XIc)

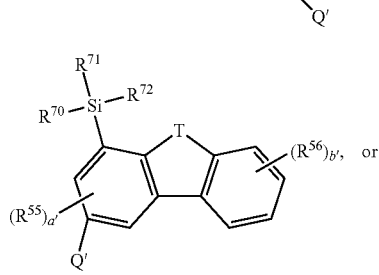
(XId)

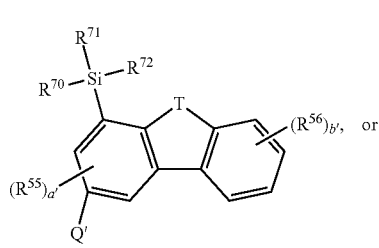
or

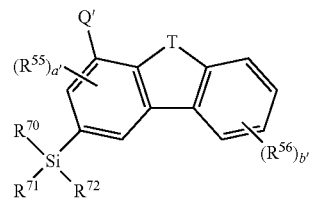
(XIe)

in which the Q', T, $R^{70}$, $R^{71}$, $R^{72}$, $R^{55}$, $R^{56}$ radicals and groups, and a' and b', are each as defined above.

In another embodiment preferred in accordance with the invention, $R^{70}$, $R^{71}$ or $R^{72}$ in the compounds of the general formula (XI) or (XI*) are aromatic units of the general formulae (XIi) and/or (XIi*)

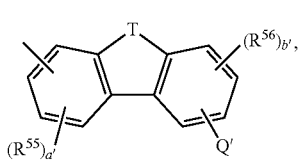
(XIi)

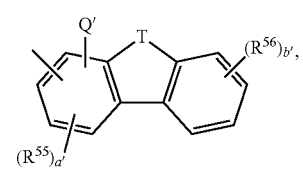
(XIi*)

where $R^{55}$, $R^{56}$, Q', T, a' and b' are each as defined above.

The present invention therefore relates, in one embodiment, to an inventive OLED where $R^{70}$, $R^{71}$ or $R^{72}$ in the compounds of the general formula (XI) or (XI*) are aromatic units of the general formulae (XIi) and/or (XIi*)

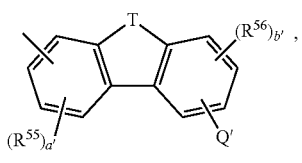
(XIi)

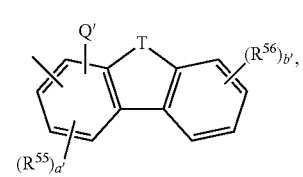
(XIi*)

where $R^{56}$, $R^{56}$, Q', T, a' and b' are each as defined above.

In a preferred embodiment, the present invention relates to an OLED wherein the compound of the general formula (XI) or (XI*) is selected from the following group:

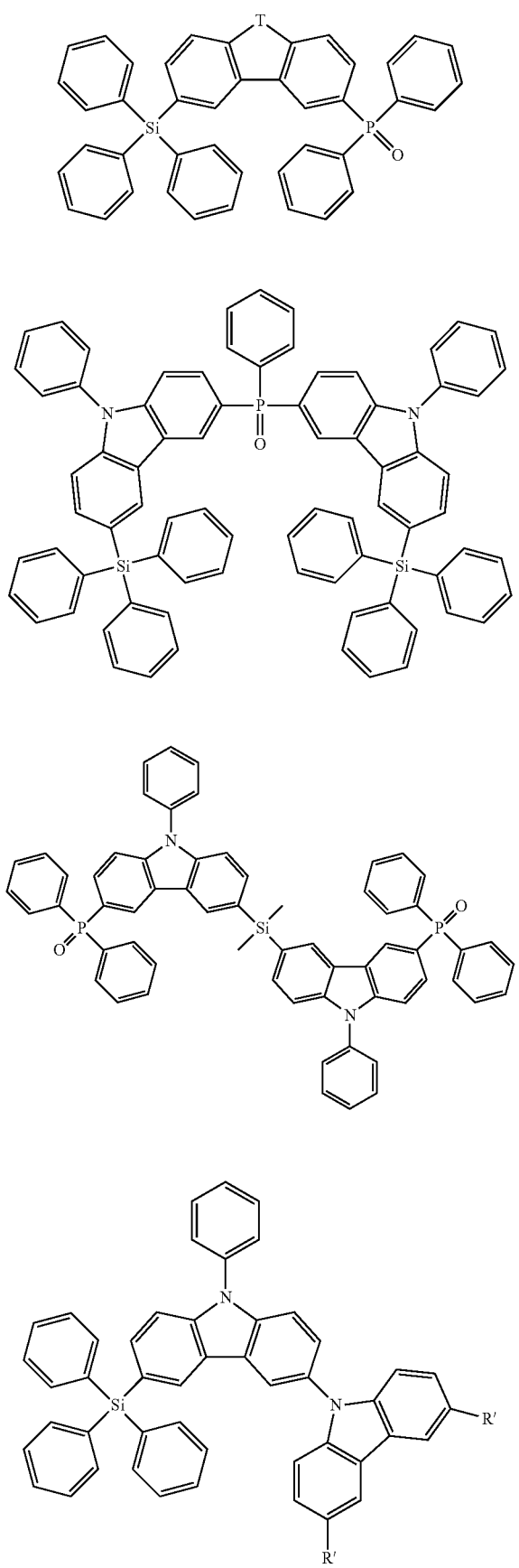
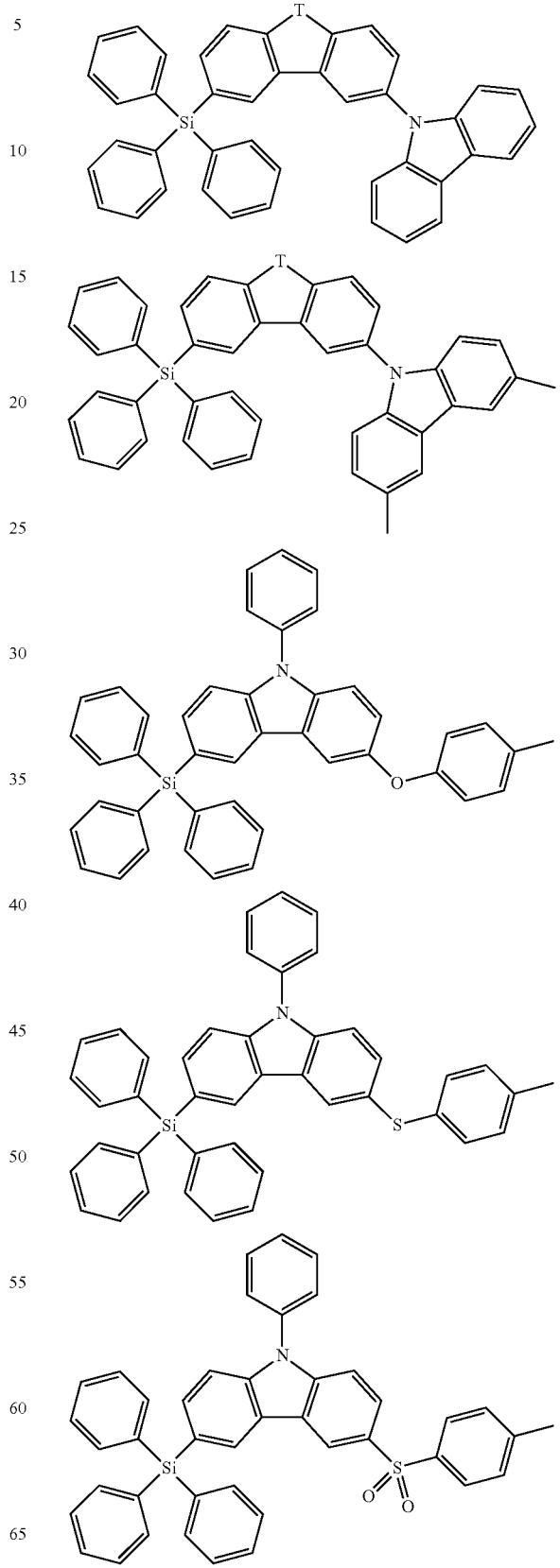

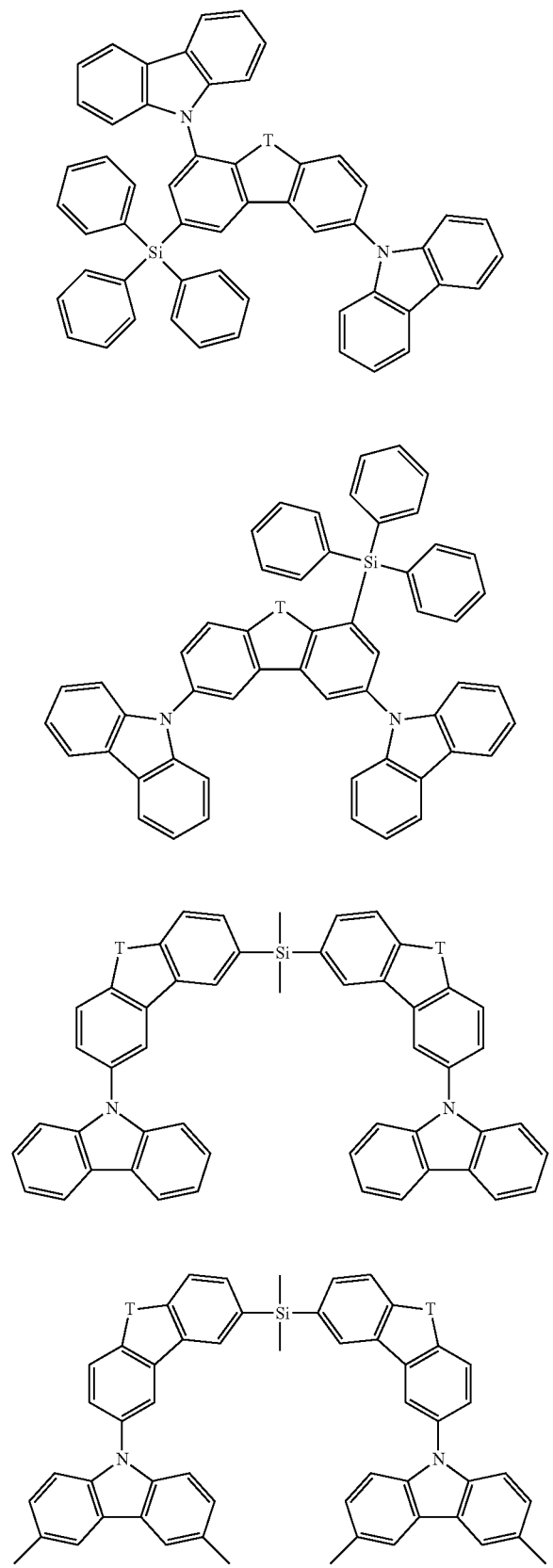
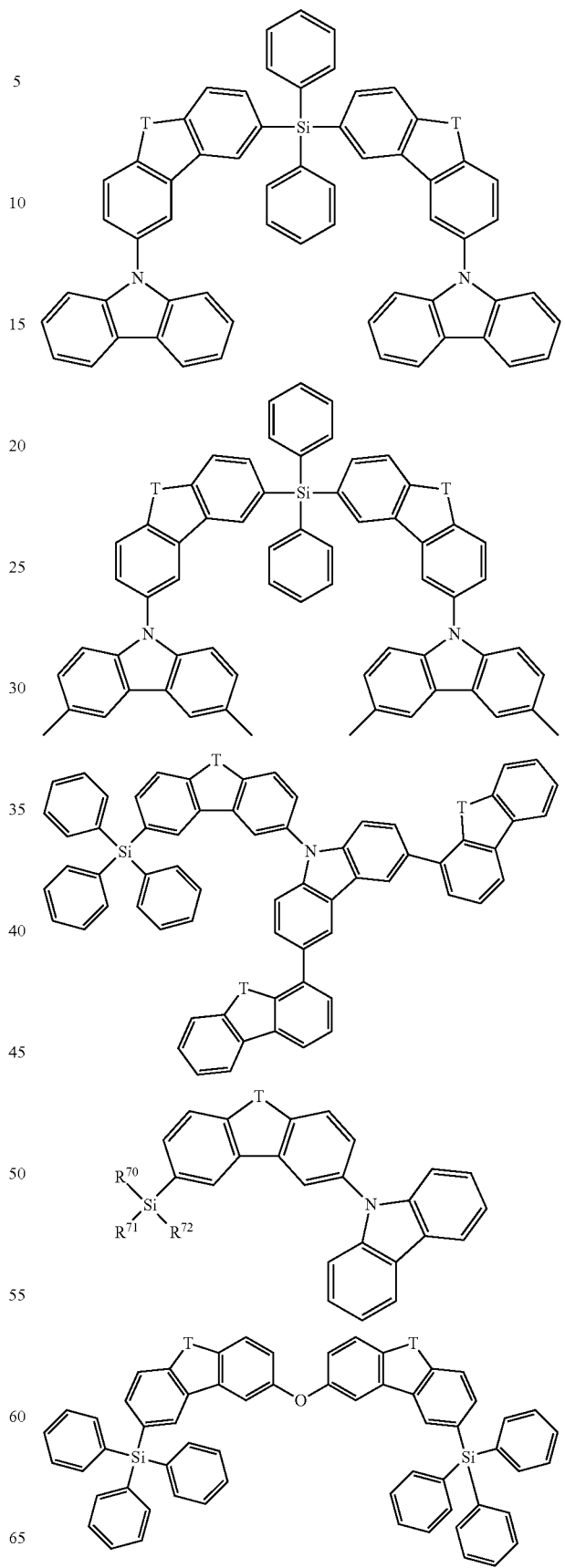

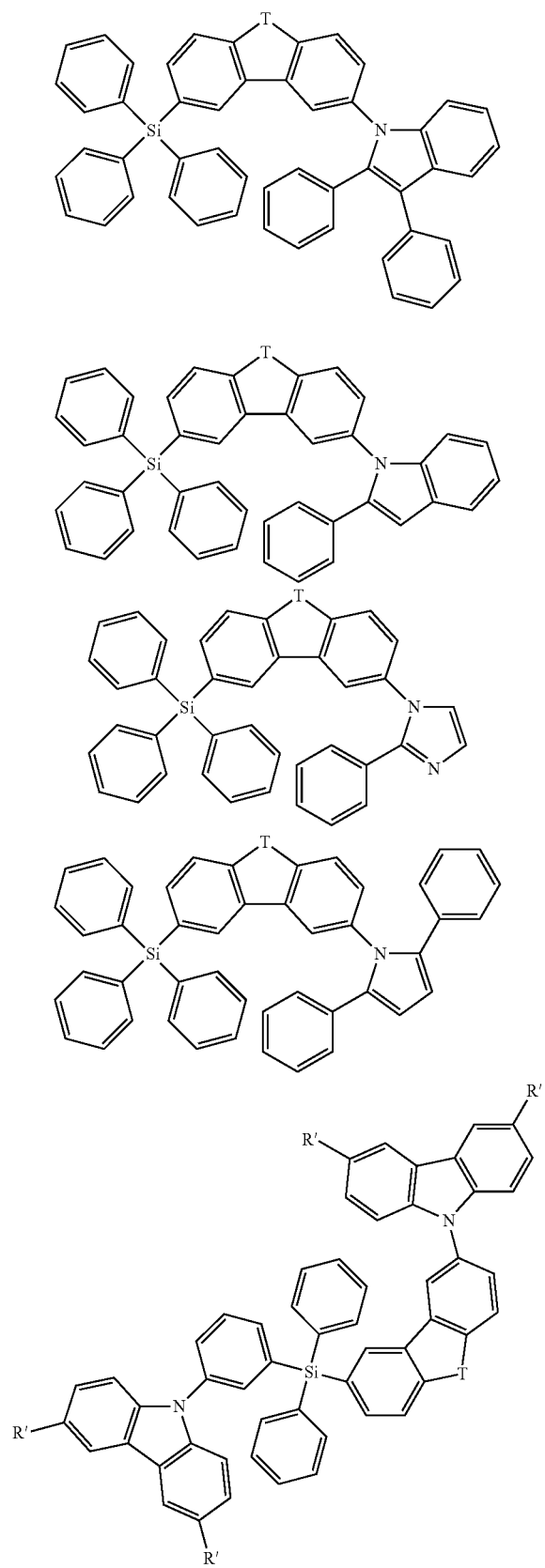
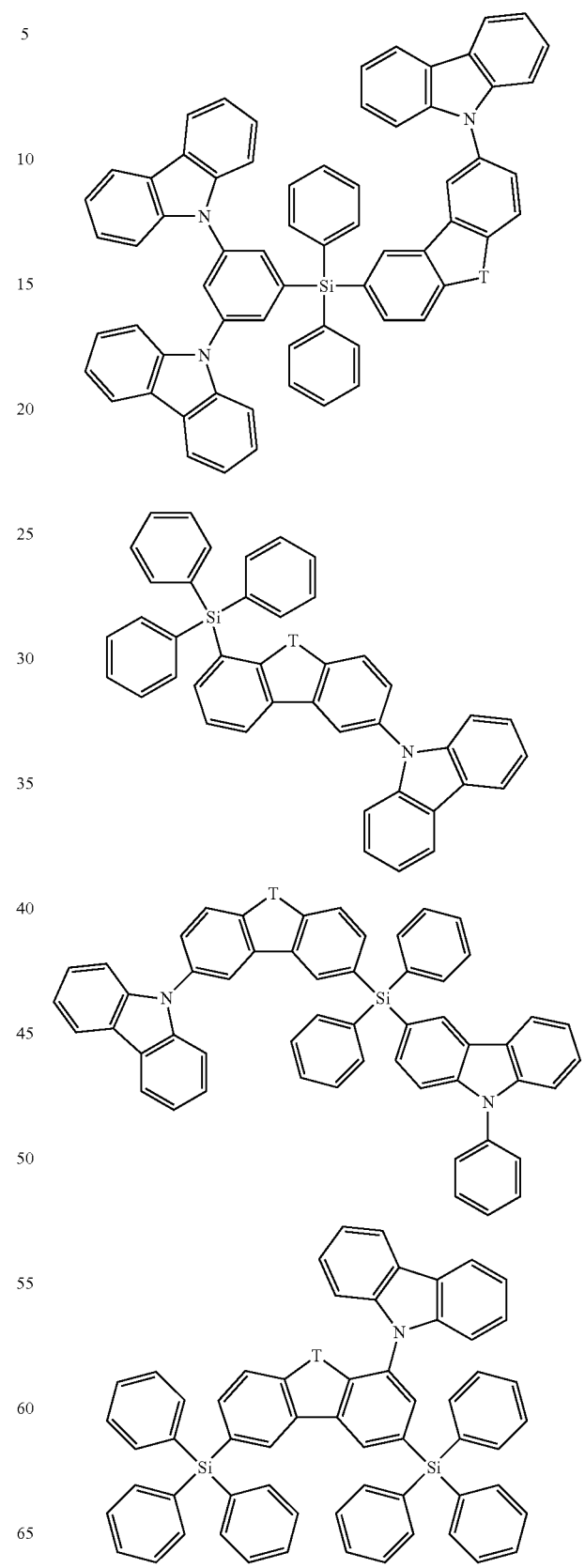

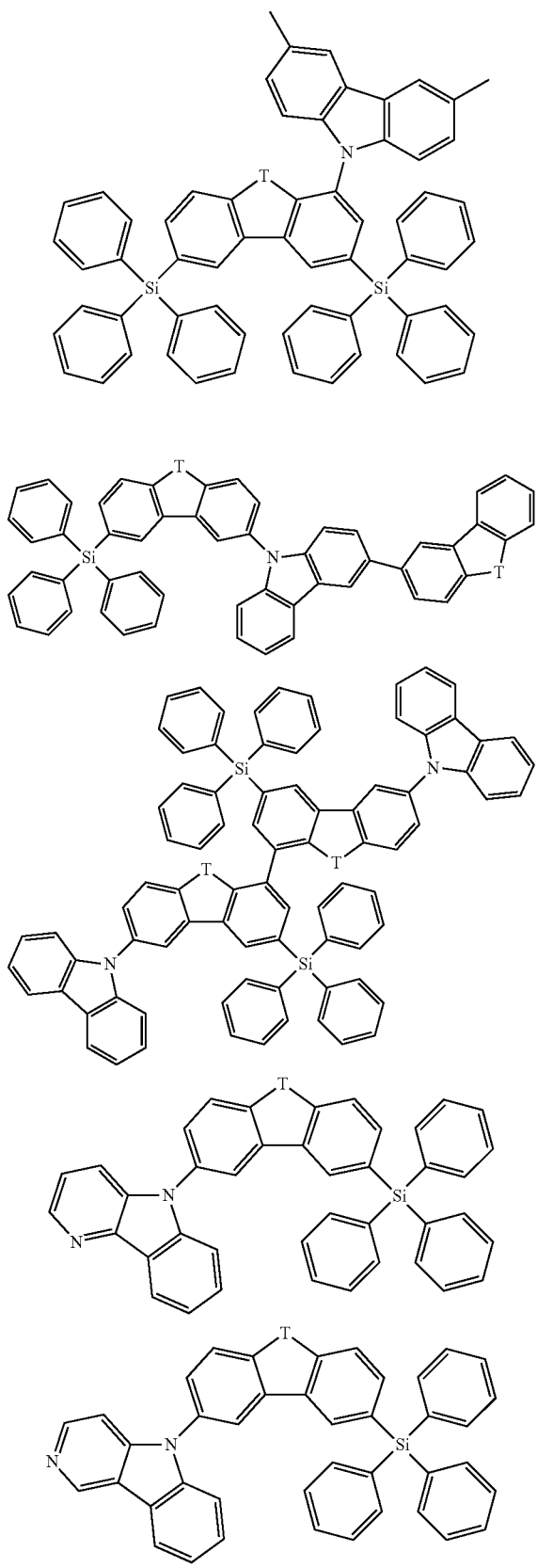
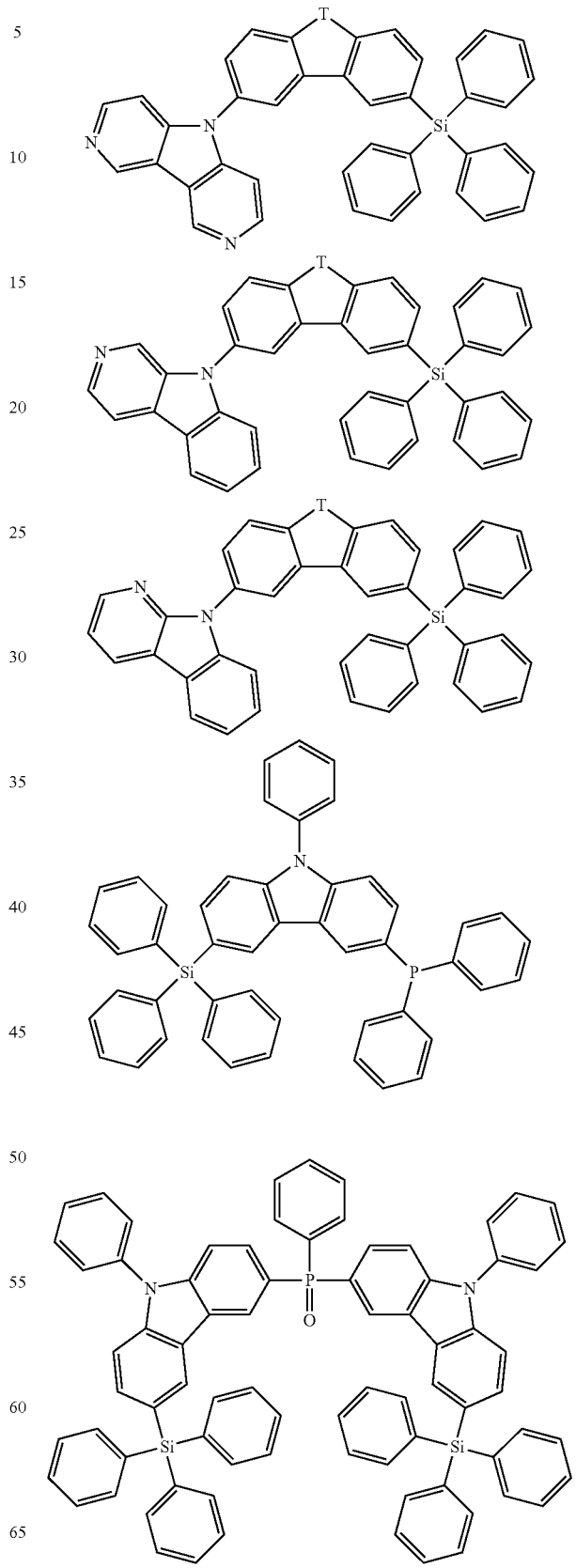

In these particularly preferred compounds of the general formula (XI) or (XI*):
T is S or O, and
R' is H or CH₃; and
R⁷⁰, R⁷¹, R⁷² are each phenyl, carbazolyl, dibenzofuran or dibenzothiophene.
Further particularly suitable compounds of the general formula XI or XI* are:
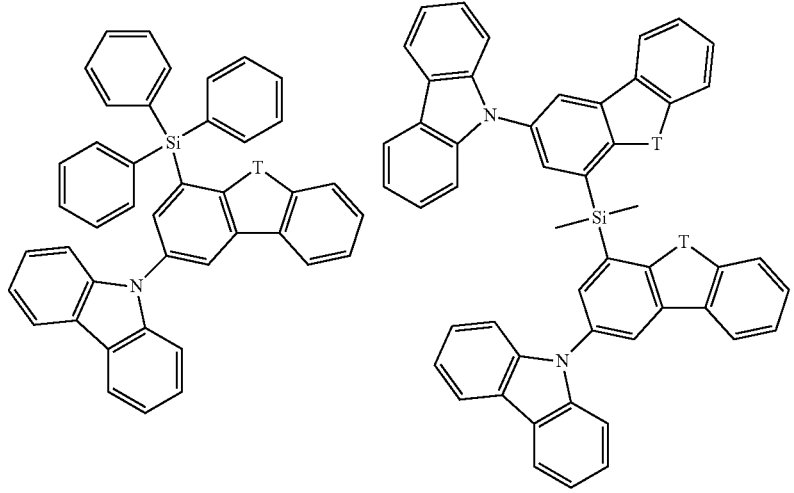
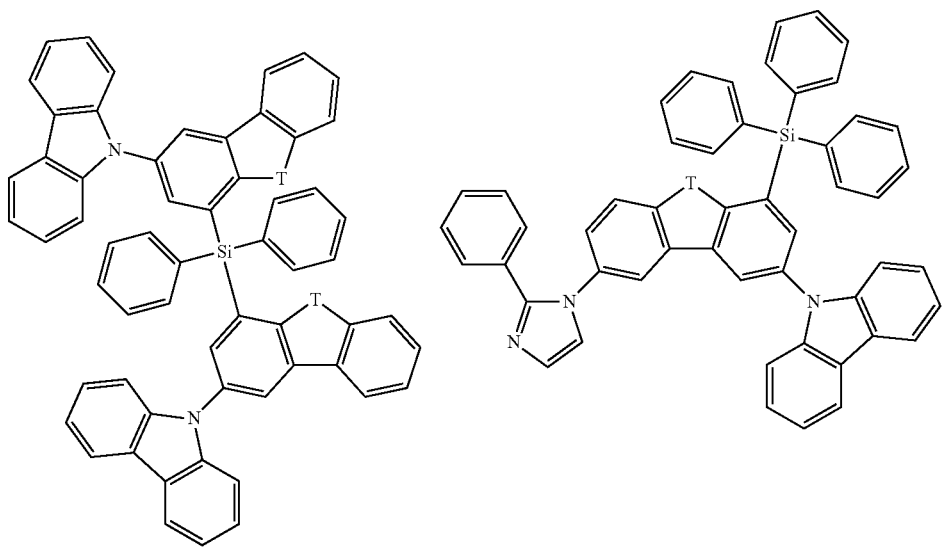
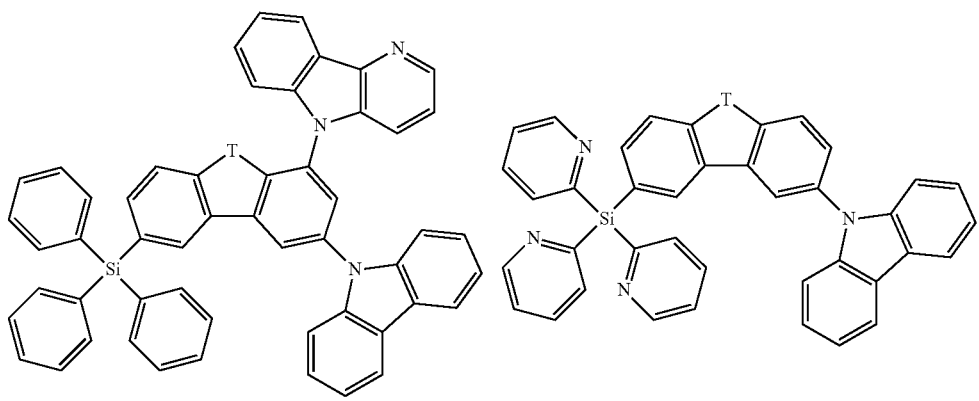

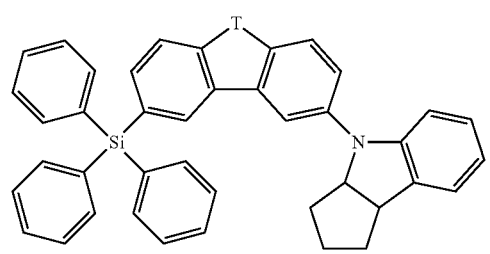
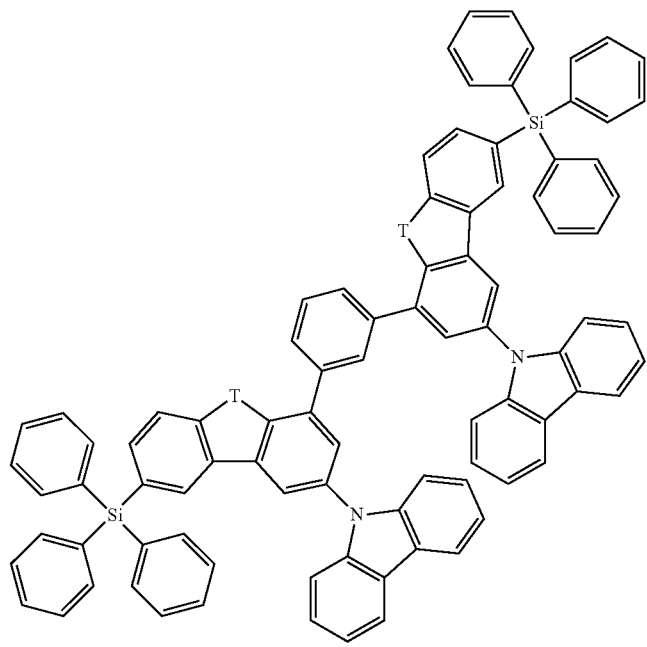
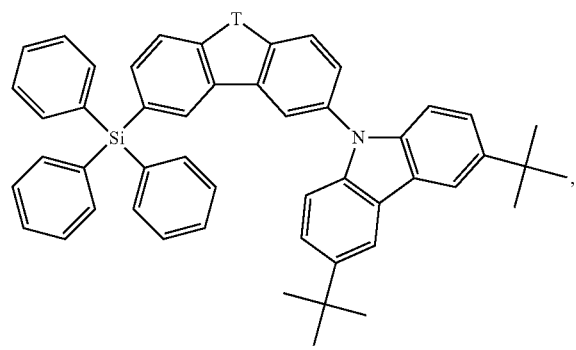
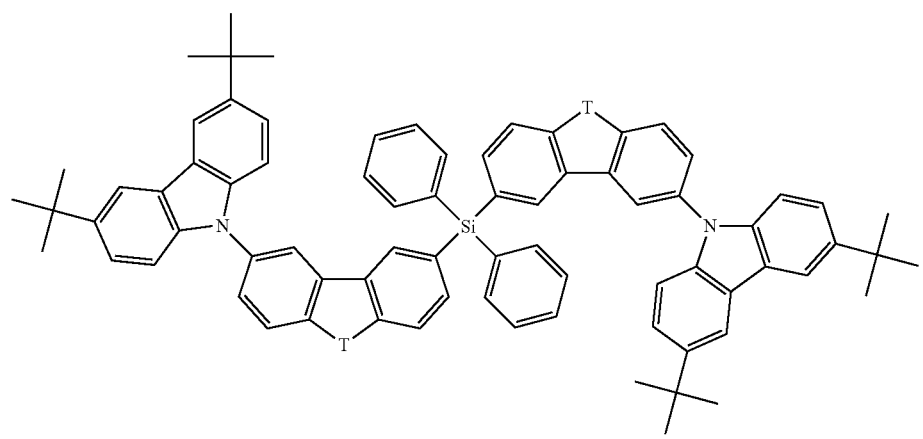

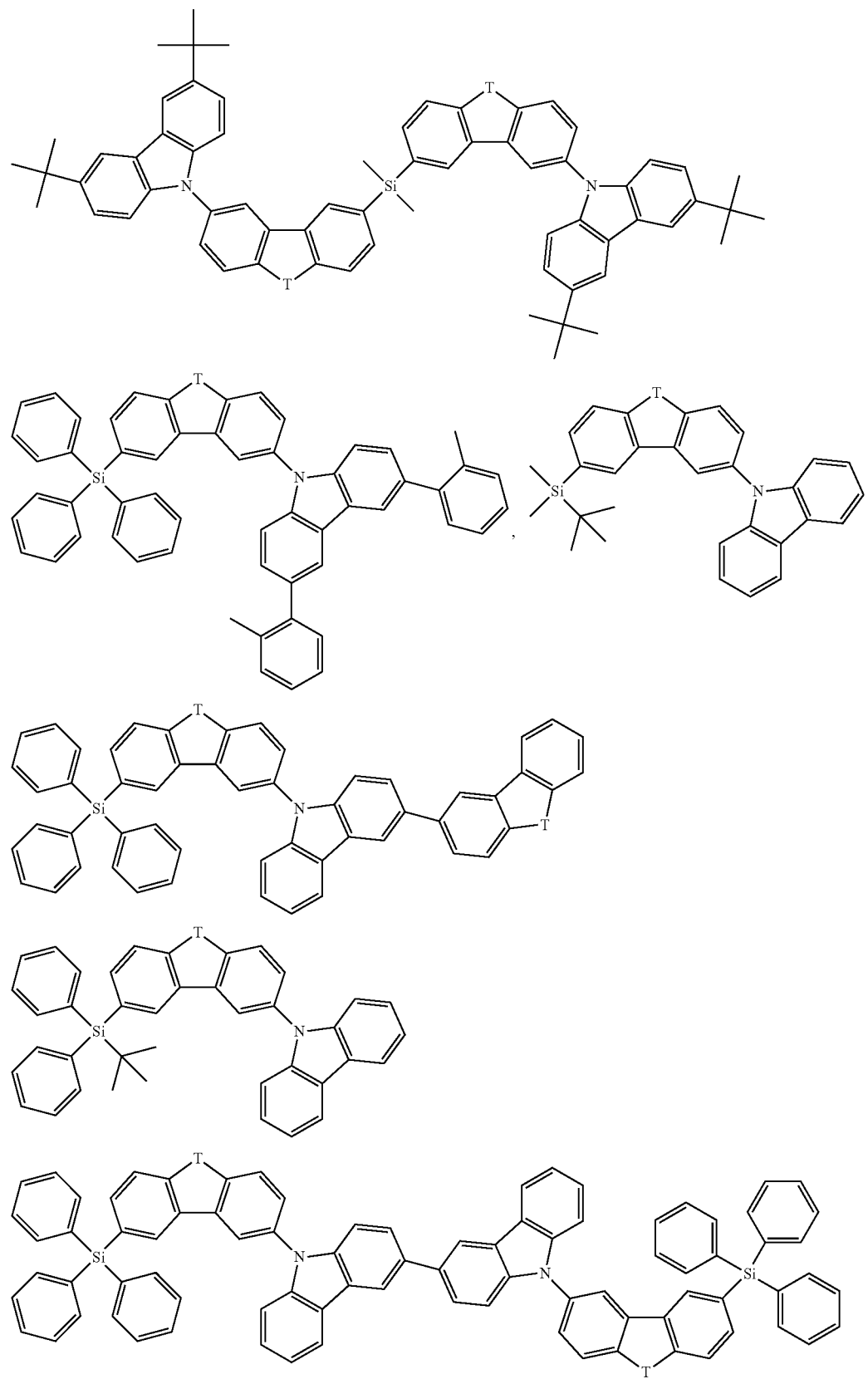

-continued
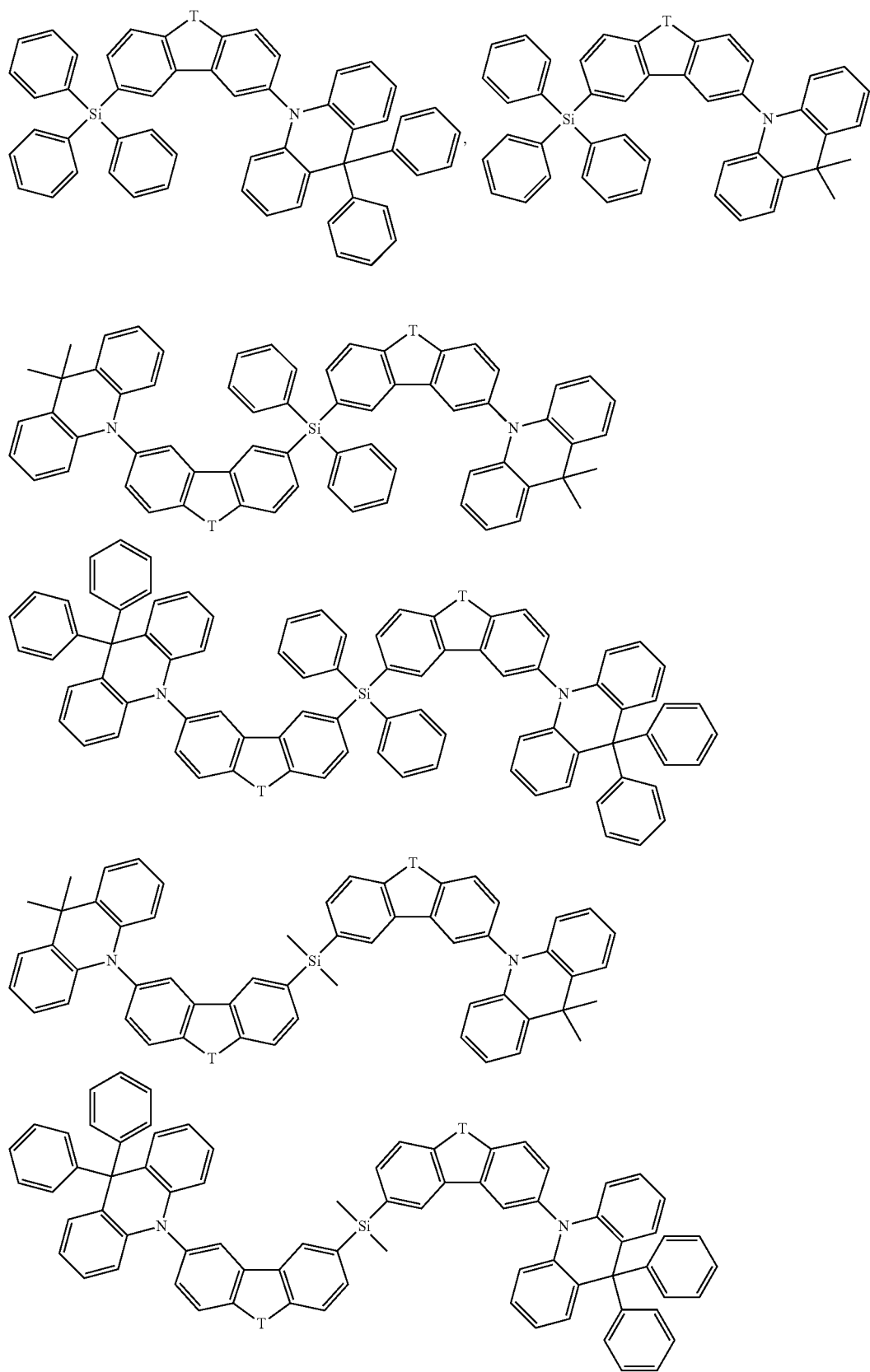

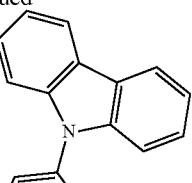
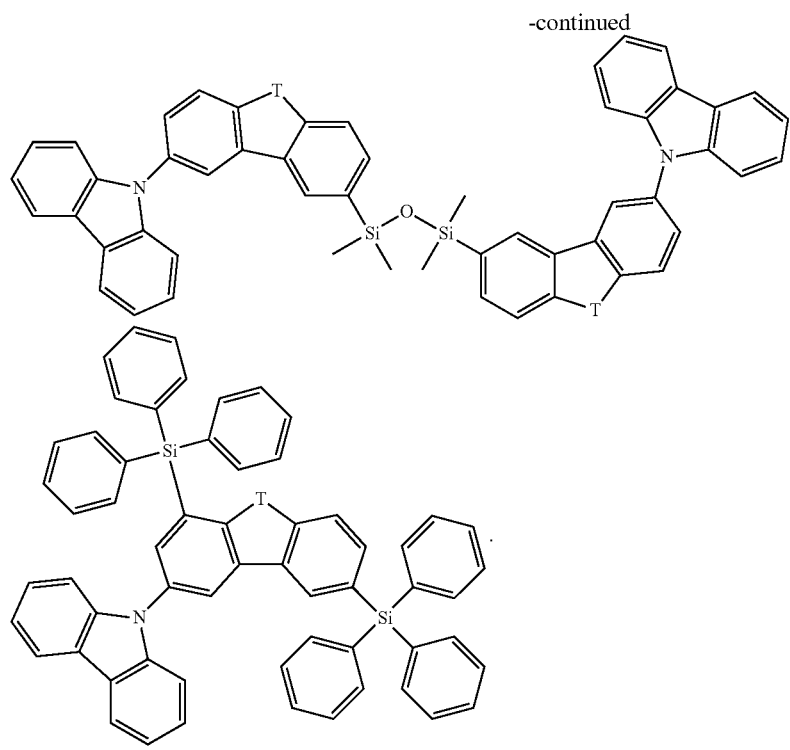

30

In these particularly preferred compounds of the general formula (XI) or (XI*) too, T is O or S, preferably O.

Further inventive compounds of the general formula (XI) or (XI') correspond to the following formula (XII)

(XII)

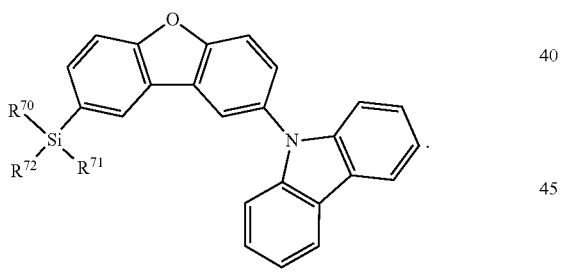

In the general formula (XII), $R^{70}$, $R^{71}$, $R^{72}$ are each defined as follows:

| Nr | $R^{70}$ | $R^{71}$ | $R^{72}$ |
|---|---|---|---|
| 1 | methyl | methyl | ethyl |
| 2 | methyl | methyl | i-propyl |
| 3 | methyl | methyl | n-propyl |
| 4 | methyl | methyl | n-butyl |
| 5 | methyl | methyl | i-butyl |
| 6 | methyl | methyl | t-butyl |
| 7 | methyl | methyl | n-pentyl |
| 8 | methyl | methyl | n-hexyl |
| 9 | methyl | methyl | —CH$_2$CH$_2$C(CH$_3$)$_3$ |
| 10 | methyl | methyl | n-C$_8$H$_{17}$ |
| 11 | methyl | methyl | i-C$_8$H$_{17}$ |
| 12 | methyl | methyl | n-C$_{10}$H$_{21}$ |
| 13 | methyl | methyl | n-C$_{12}$H$_{25}$ |
| 16 | methyl | methyl | n-C$_{18}$H$_{37}$ |

-continued

| Nr | $R^{70}$ | $R^{71}$ | $R^{72}$ |
|---|---|---|---|
| 17 | methyl | methyl | n-$C_{30}H_{61}$ |
| 19 | methyl | methyl | cyclohexyl |
| 20 | methyl | methyl | $C(CH_3)_2Ph$ |
| 21 | methyl | methyl | —$C(CH_3)_2CH(CH_3)_2$ |
| 22 | methyl | methyl | —$CCH_2CH(CH_3)(C_2H_5)$ |
| 23 | methyl | methyl | —$CH_2CH(C_{10}H_{21})_2$ |
| 24 | methyl | methyl | —$CH_2CH(C_{12}H_{25})_2$ |
| 25 | methyl | methyl | —$CH_2CH_2(C_3F_6)CF_3$ |
| 26 | methyl | methyl | —$CH_2CH_2(C_7F_{14})CF_3$ |
| 27 | methyl | methyl | —$CH_2CH_2(C_5F_{10})CF_3$ |
| 29 | methyl | methyl | —$CH_2CH_2CF_3$ |
| 30 | methyl | methyl | phenyl |
| 31 | methyl | methyl | 2-biphenyl |
| 32 | methyl | methyl | p-tolyl |
| 33 | methyl | methyl | $C_6F_5$ |
| 34 | methyl | methyl | 3,5-$(cf_3)_2$phenyl |
| 35 | methyl | methyl | —$ch_2c(ch_3)_2$phenyl |
| 36 | methyl | methyl | 9-fluorenyl |
| 37 | methyl | methyl | 3,6-di(tert-butyl)-9-fluorenyl |
| 15 | methyl | methyl | $R^{86}$ |
| 38 | methyl | methyl | —OMe |
| 39 | methyl | methyl | —OEt |
| 40 | methyl | methyl | 2,4,6-t-butylphenoxy |
| 41 | methyl | methyl | —O-tBu (tert-butoxy) |
| 42 | methyl | methyl | —$OSiEt_3$ |
| 43 | methyl | ethyl | ethyl |
| 44 | methyl | ethyl | phenyl |
| 45 | methyl | ethyl | $R^{86}$ |
| 46 | methyl | n-propyl | n-propyl |
| 47 | methyl | n-propyl | phenyl |
| 48 | methyl | n-propyl | $R^{86}$ |
| 49 | methyl | i-propyl | i-propyl |
| 50 | methyl | i-propyl | phenyl |
| 51 | methyl | i-propyl | $R^{86}$ |
| 52 | methyl | n-butyl | n-butyl |
| 53 | methyl | n-butyl | phenyl |
| 54 | methyl | n-butyl | $R^{86}$ |
| 55 | methyl | i-butyl | i-butyl |
| 56 | methyl | i-butyl | phenyl |
| 57 | methyl | i-butyl | $R^{86}$ |
| 58 | methyl | t-butyl | t-butyl |
| 59 | methyl | t-butyl | phenyl |
| 60 | methyl | t-butyl | $R^{86}$ |
| 61 | methyl | n-pentyl | n-Pentyl |
| 62 | methyl | n-pentyl | n-hexyl |
| 63 | methyl | n-pentyl | phenyl |
| 64 | methyl | n-pentyl | $R^{86}$ |
| 65 | methyl | n-hexyl | hexyl |
| 66 | methyl | n-hexyl | phenyl |
| 67 | methyl | n-hexyl | $R^{86}$ |
| 68 | methyl | n-heptyl | $R^{86}$ |
| 69 | methyl | n-octyl | $R^{86}$ |
| 70 | methyl | n-decyl | $R^{86}$ |
| 71 | methyl | n-$C_{12}H_{25}$ | $R^{86}$ |
| 72 | methyl | n-$C_{18}H_{37}$ | $R^{86}$ |
| 73 | methyl | n-$C_{22}H_{45}$ | $R^{86}$ |
| 74 | methyl | n-$C_{30}H_{61}$ | $R^{86}$ |
| 75 | methyl | cyclopentyl | cyclopentyl |
| 76 | methyl | cyclopentyl | phenyl |
| 77 | methyl | cyclopentyl | $R^{86}$ |
| 78 | methyl | cyclohexyl | cyclohexyl |
| 79 | methyl | cyclohexyl | phenyl |
| 80 | methyl | cyclohexyl | $R^{86}$ |
| 81 | methyl | —$CF_2CHF_2$ | $R^{86}$ |
| 82 | methyl | —$CH_2CH_2CF_3$ | $R^{86}$ |
| 83 | methyl | —$CH_2CH_2(CF_2)_3CF_3$ | $R^{86}$ |
| 84 | methyl | —$CH_2CH_2(CF_2)_5CF_3$ | $R^{86}$ |
| 85 | methyl | —$CH_2CH_2(CF_2)_7CF_3$ | $R^{86}$ |
| 86 | methyl | phenyl | phenyl |
| 87 | methyl | phenyl | p-tolyl |
| 89 | methyl | phenyl | mesityl |
| 90 | methyl | phenyl | $R^{86}$ |
| 91 | methyl | p-tolyl | p-tolyl |
| 92 | methyl | p-tolyl | $R^{86}$ |
| 93 | methyl | mesityl | mesityl |
| 94 | methyl | mesityl | R5 |
| 95 | methyl | $R^{86}$ | $R^{86}$ |

-continued

| Nr | $R^{70}$ | $R^{71}$ | $R^{72}$ |
|---|---|---|---|
| 96 | methyl | methoxy | methoxy |
| 97 | methyl | ethoxy | ethoxy |
| 98 | methyl | —OSiEt$_3$ | —OSiEt$_3$ |
| 99 | methyl | —O—SiMe$_2$—CH$_2$CH$_2$(CF$_2$)$_4$CF$_3$ | —O—SiMe$_2$-CH$_2$CH$_2$(CF$_2$)$_4$CF$_3$ |
| 100 | ethyl | ethyl | ethyl |
| 101 | ethyl | ethyl | n-propyl |
| 102 | ethyl | ethyl | i-propyl |
| 103 | ethyl | ethyl | n-butyl |
| 104 | ethyl | ethyl | i-butyl |
| 105 | ethyl | ethyl | t-butyl |
| 106 | ethyl | ethyl | phenyl |
| 107 | ethyl | ethyl | R5 |
| 108 | ethyl | phenyl | phenyl |
| 109 | ethyl | phenyl | $R^{86}$ |
| 110 | ethyl | $R^{86}$ | $R^{86}$ |
| 111 | ethyl | ethoxy | ethoxy |
| 112 | n-propyl | n-propyl | n-propyl |
| 113 | n-propyl | n-propyl | phenyl |
| 114 | n-propyl | n-propyl | $R^{86}$ |
| 115 | n-propyl | phenyl | phenyl |
| 116 | n-propyl | phenyl | $R^{86}$ |
| 117 | n-propyl | $R^{86}$ | $R^{86}$ |
| 118 | i-propyl | i-propyl | i-propyl |
| 119 | i-propyl | i-propyl | phenyl |
| 120 | i-propyl | i-propyl | $R^{86}$ |
| 121 | i-propyl | i-propyl | 2-biphenyl |
| 122 | i-propyl | i-propyl | ethoxy |
| 123 | i-propyl | phenyl | phenyl |
| 124 | i-propyl | phenyl | $R^{86}$ |
| 125 | i-propyl | $R^{86}$ | $R^{86}$ |
| 126 | n-butyl | n-butyl | n-butyl |
| 127 | n-butyl | n-butyl | phenyl |
| 128 | n-butyl | n-butyl | $R^{86}$ |
| 129 | n-butyl | n-hexyl | $R^{86}$ |
| 130 | n-butyl | phenyl | phenyl |
| 131 | n-butyl | phenyl | $R^{86}$ |
| 132 | n-butyl | $R^{86}$ | $R^{86}$ |
| 133 | sec-butyl | sec-butyl | sec-butyl |
| 134 | sec-butyl | sec-butyl | phenyl |
| 135 | sec-butyl | sec-butyl | $R^{86}$ |
| 136 | sec-butyl | phenyl | phenyl |
| 137 | sec-butyl | phenyl | $R^{86}$ |
| 138 | sec-butyl | $R^{86}$ | $R^{86}$ |
| 139 | i-butyl | i-butyl | i-butyl |
| 140 | i-butyl | i-butyl | n-C$_8$H$_{17}$ |
| 141 | i-butyl | i-butyl | n-C$_{18}$H$_{37}$ |
| 142 | i-butyl | i-butyl | phenyl |
| 143 | i-butyl | i-butyl | $R^{86}$ |
| 144 | i-butyl | phenyl | phenyl |
| 145 | i-butyl | phenyl | $R^{86}$ |
| 146 | i-butyl | $R^{86}$ | $R^{86}$ |
| 147 | t-butyl | t-butyl | t-butyl |
| 148 | t-butyl | t-butyl | n-C$_8$H$_{17}$ |
| 149 | t-butyl | t-butyl | phenyl |
| 150 | t-butyl | t-butyl | $R^{86}$ |
| 151 | t-butyl | phenyl | phenyl |
| 152 | t-butyl | phenyl | R5 |
| 153 | t-butyl | $R^{86}$ | $R^{86}$ |
| 154 | n-pentyl | n-pentyl | n-pentyl |
| 155 | n-pentyl | n-pentyl | phenyl |
| 156 | n-pentyl | n-pentyl | $R^{86}$ |
| 157 | n-pentyl | phenyl | phenyl |
| 158 | n-pentyl | phenyl | $R^{86}$ |
| 159 | n-pentyl | $R^{86}$ | $R^{86}$ |
| 160 | cyclopentyl | cyclopentyl | cyclopentyl |
| 161 | cyclopentyl | cyclopentyl | phenyl |
| 162 | cyclopentyl | cyclopentyl | $R^{86}$ |
| 163 | cyclopentyl | phenyl | phenyl |
| 164 | cyclopentyl | phenyl | $R^{86}$ |
| 165 | cyclopentyl | $R^{86}$ | $R^{86}$ |
| 166 | n-hexyl | n-hexyl | n-hexyl |
| 167 | n-hexyl | n-hexyl | phenyl |
| 168 | n-hexyl | n-hexyl | $R^{86}$ |
| 169 | n-hexyl | phenyl | phenyl |
| 170 | n-hexyl | phenyl | $R^{86}$ |
| 171 | n-hexyl | $R^{86}$ | $R^{86}$ |
| 172 | —CH$_2$CH$_2$C(CH$_3$)$_3$ | —CH$_2$CH$_2$C(CH$_3$)$_3$ | —CH$_2$CH$_2$C(CH$_3$)$_3$ |

-continued

| Nr | $R^{70}$ | $R^{71}$ | $R^{72}$ |
|---|---|---|---|
| 173 | $-CH_2CH_2C(CH_3)_3$ | $-CH_2CH_2C(CH_3)_3$ | $R^{86}$ |
| 174 | $-CH_2CH_2C(CH_3)_3$ | $R^{86}$ | $R^{86}$ |
| 175 | t-hexyl | t-hexyl | t-hexyl |
| 176 | t-hexyl | t-hexyl | $R^{86}$ |
| 177 | t-hexyl | $R^{86}$ | $R^{86}$ |
| 178 | n-heptyl | n-heptyl | n-heptyl |
| 179 | n-heptyl | n-heptyl | $R^{86}$ |
| 180 | n-heptyl | $R^{86}$ | $R^{86}$ |
| 181 | n-octyl | n-octyl | n-octyl |
| 182 | n-octyl | n-octyl | $R^{86}$ |
| 183 | n-octyl | $R^{86}$ | $R^{86}$ |
| 184 | i-octyl | i-octyl | i-octyl |
| 185 | i-octyl | i-octyl | $R^{86}$ |
| 186 | i-octyl | $R^{86}$ | $R^{86}$ |
| 187 | n-nonyl | n-nonyl | n-nonyl |
| 188 | n-nonyl | n-nonyl | $R^{86}$ |
| 189 | n-nonyl | $R^{86}$ | $R^{86}$ |
| 190 | cyclohexyl | cyclohexyl | cyclohexyl |
| 191 | cyclohexyl | cyclohexyl | $R^{86}$ |
| 192 | cyclohexyl | $R^{86}$ | $R^{86}$ |
| 193 | cyclooctyl | cyclooctyl | cyclooctyl |
| 194 | cyclooctyl | cyclooctyl | $R^{86}$ |
| 195 | cyclooctyl | $R^{86}$ | $R^{86}$ |
| 196 | $n-C_{10}H_{21}$ | $n-C_{10}H_{21}$ | $n-C_{10}H_{21}$ |
| 197 | $n-C_{10}H_{21}$ | $n-C_{10}H_{21}$ | $R^{86}$ |
| 198 | $n-C_{10}H_{21}$ | $R^{86}$ | $R^{86}$ |
| 199 | $n-C_{11}H_{23}$ | $n-C_{11}H_{23}$ | $n-C_{11}H_{23}$ |
| 200 | $n-C_{11}H_{23}$ | $n-C_{11}H_{23}$ | $R^{86}$ |
| 201 | $n-C_{11}H_{23}$ | $R^{86}$ | $R^{86}$ |
| 202 | $n-C_{12}H_{25}$ | $n-C_{12}H_{25}$ | $n-C_{12}H_{25}$ |
| 203 | $n-C_{12}H_{25}$ | $n-C_{12}H_{25}$ | $R^{86}$ |
| 204 | $n-C_{12}H_{25}$ | $R^{86}$ | $R^{86}$ |
| 205 | $n-C_{14}H_{29}$ | $n-C_{14}H_{29}$ | $n-C_{14}H_{29}$ |
| 206 | $n-C_{14}H_{29}$ | $n-C_{14}H_{29}$ | $R^{86}$ |
| 207 | $n-C_{14}H_{29}$ | $R^{86}$ | $R^{86}$ |
| 208 | $n-C_{16}H_{33}$ | $n-C_{16}H_{33}$ | $n-C_{16}H_{33}$ |
| 209 | $n-C_{16}H_{33}$ | $n-C_{16}H_{33}$ | $R^{86}$ |
| 210 | $n-C_{16}H_{33}$ | $R^{86}$ | $R^{86}$ |
| 211 | $n-C_{18}H_{37}$ | $n-C_{18}H_{37}$ | $R^{86}$ |
| 212 | $n-C_{18}H_{37}$ | $R^{86}$ | $R^{86}$ |
| 213 | $n-C_{18}H_{37}$ | OEt | OEt |
| 214 | $n-C_{18}H_{37}$ | $R^{86}$ | OMe |
| 215 | $n-C_{20}H_{41}$ | $n-C_{20}H_{41}$ | $n-C_{20}H_{41}$ |
| 216 | $n-C_{20}H_{41}$ | $n-C_{20}H_{41}$ | $R^{86}$ |
| 217 | $n-C_{20}H_{41}$ | $R^{86}$ | $R^{86}$ |
| 218 | $n-C_{22}H_{45}$ | $n-C_{22}H_{45}$ | $n-C_{22}H_{45}$ |
| 219 | $n-C_{22}H_{45}$ | $n-C_{22}H_{45}$ | $R^{86}$ |
| 220 | $n-C_{22}H_{45}$ | $R^{86}$ | $R^{86}$ |
| 221 | $n-C_{26}H_{53}$ | $n-C_{26}H_{53}$ | $n-C_{26}H_{53}$ |
| 222 | $n-C_{26}H_{53}$ | $n-C_{26}H_{53}$ | $R^{86}$ |
| 223 | $n-C_{26}H_{53}$ | $R^{86}$ | $R^{86}$ |
| 224 | $n-C_{30}H_{61}$ | $n-C_{30}H_{61}$ | $n-C_{30}H_{61}$ |
| 225 | $n-C_{30}H_{61}$ | $n-C_{30}H_{61}$ | $R^{86}$ |
| 226 | $n-C_{30}H_{61}$ | $R^{86}$ | $R^{86}$ |
| 227 | $-CH_2$-cyclohexyl | $-CH_2$-cyclohexyl | $R^{86}$ |
| 228 | $-CH_2CH_2CF_3$ | $-CH_2CH_2CF_3$ | $-CH_2CH_2CF_3$ |
| 229 | $-CH_2CH_2CF_3$ | $-CH_2CH_2CF_3$ | $R^{86}$ |
| 230 | $-CH_2CH_2CF_3$ | $R^{86}$ | $R^{86}$ |
| 231 | $-CH_2CH_2(CF_2)_3CF_3$ | $-CH_2CH_2(CF_2)_3CF_3$ | $-CH_2CH_2(CF_2)_3CF_3$ |
| 232 | $-CH_2CH_2(CF_2)_3CF_3$ | $-CH_2CH_2(CF_2)_3CF_3$ | $R^{86}$ |
| 233 | $-CH_2CH_2(CF_2)_3CF_3$ | $R^{86}$ | $R^{86}$ |
| 234 | $-CH_2CH_2(CF_2)_5CF_3$ | $-CH_2CH_2(CF_2)_5CF_3$ | $-CH_2CH_2(CF_2)_5CF_3$ |
| 235 | $-CH_2CH_2(CF_2)_5CF_3$ | $-CH_2CH_2(CF_2)_5CF_3$ | $R^{86}$ |
| 236 | $-CH_2CH_2(CF_2)_5CF_3$ | $R^{86}$ | $R^{86}$ |
| 237 | $-CH_2CH_2(CF_2)_7CF_3$ | $-CH_2CH_2(CF_2)_7CF_3$ | $-CH_2CH_2(CF_2)_7CF_3$ |
| 238 | $-CH_2CH_2(CF_2)_7CF_3$ | $-CH_2CH_2(CF_2)_7CF_3$ | $R^{86}$ |
| 239 | $-CH_2CH_2(CF_2)_7CF_3$ | $R^{86}$ | $R^{86}$ |
| 240 | $-CH_2CH_2(CF_2)_9CF_3$ | $-CH_2CH_2(CF_2)_9CF_3$ | $-CH_2CH_2(CF_2)_9CF_3$ |
| 241 | $-CH_2CH_2(CF_2)_9CF_3$ | $-CH_2CH_2(CF_2)_9CF_3$ | $R^{86}$ |
| 242 | $-CH_2CH_2(CF_2)_9CF_3$ | $R^{86}$ | $R^{86}$ |
| 243 | $-CH_2CH_2(CF_2)_{11}CF_3$ | $-CH_2CH_2(CF_2)_{11}CF_3$ | $-CH_2CH_2(CF_2)_{11}CF_3$ |
| 244 | $-CH_2CH_2(CF_2)_{11}CF_3$ | $-CH_2CH_2(CF_2)_{11}CF_3$ | $R^{86}$ |
| 245 | $-CH_2CH_2(CF_2)_{11}CF_3$ | $R^{86}$ | $R^{86}$ |
| 246 | $-CF_2CHF_2$ | $-CF_2CHF_2$ | $-CF_2CHF_2$ |
| 247 | $-CF_2CHF_2$ | $-CF_2CHF_2$ | $R^{86}$ |
| 248 | $-CF_2CHF_2$ | $R^{86}$ | $R^{86}$ |
| 249 | $-(CF_2)_3CHF_2$ | $-(CF_2)_3CHF_2$ | $-(CF_2)_3CHF_2$ |

-continued

| Nr | $R^{70}$ | $R^{71}$ | $R^{72}$ |
|---|---|---|---|
| 250 | —(CF$_2$)$_3$CHF$_2$ | —(CF$_2$)$_3$CHF$_2$ | $R^{86}$ |
| 251 | —(CF$_2$)$_3$CHF$_2$ | $R^{86}$ | $R^{86}$ |
| 14 | phenyl | phenyl | phenyl |
| 252 | phenyl | phenyl | p-tolyl |
| 253 | phenyl | phenyl | m-tolyl |
| 254 | phenyl | phenyl | o-tolyl |
| 255 | phenyl | phenyl | 2-xylyl |
| 256 | phenyl | phenyl | 5-xylyl |
| 257 | phenyl | phenyl | mesityl |
| 258 | phenyl | phenyl | 9-fluorenyl |
| 18 | phenyl | phenyl | $R^{86}$ |
| 259 | phenyl | phenyl | —O-tBu (tert-butoxy) |
| 260 | phenyl | p-tolyl | p-tolyl |
| 261 | phenyl | m-tolyl | m-tolyl |
| 262 | phenyl | o-tolyl | o-tolyl |
| 263 | phenyl | 2-xylyl | 2-xylyl |
| 264 | phenyl | 5-xylyl | 5-xylyl |
| 265 | phenyl | mesityl | mesityl |
| 266 | phenyl | $R^{86}$ | $R^{86}$ |
| 267 | phenyl | ethoxy | ethoxy |
| 268 | p-tolyl | p-tolyl | p-tolyl |
| 269 | p-tolyl | p-tolyl | $R^{86}$ |
| 270 | p-tolyl | $R^{86}$ | $R^{86}$ |
| 271 | m-tolyl | m-tolyl | m-tolyl |
| 272 | m-tolyl | m-tolyl | $R^{86}$ |
| 273 | o-tolyl | o-tolyl | o-tolyl |
| 274 | o-tolyl | o-tolyl | $R^{86}$ |
| 275 | 2-xylyl | 2-xylyl | 2-xylyl |
| 276 | 2-xylyl | 2-xylyl | $R^{86}$ |
| 277 | 5-xylyl | 5-xylyl | 5-xylyl |
| 278 | 5-xylyl | 5-xylyl | $R^{86}$ |
| 279 | mesityl | mesityl | mesityl |
| 280 | mesityl | mesityl | $R^{86}$ |
| 281 | C$_6$F$_5$ | C$_6$F$_5$ | C$_6$F$_5$ |
| 282 | C$_6$F$_5$ | C$_6$F$_5$ | $R^{86}$ |
| 283 | C$_6$F$_5$ | $R^{86}$ | $R^{86}$ |
| 284 | $R^{86}$ | $R^{86}$ | $R^{86}$ |
| 285 | $R^{86}$ | ethoxy | ethoxy |
| 286 | $R^{86}$ | n-butoxy | n-butoxy |
| 287 | $R^{86}$ | $R^{86}$ | methoxy |
| 288 | $R^{86}$ | $R^{86}$ | ethoxy |
| 289 | $R^{86}$ | $R^{86}$ | osime$_3$ |
| 290 | $R^{86}$ | $R^{86}$ | —(CH$_2$)$_{11}$O—(CH$_2$)$_2$OCH$_3$ |
| 291 | methoxy | methoxy | methoxy |
| 292 | ethoxy | ethoxy | ethoxy |
| 293 | i-propoxy | i-propoxy | i-propoxy |
| 294 | t-butoxy | t-butoxy | t-butoxy |
| 295 | OSiMe$_3$ | OSiMe$_3$ | osime$_3$ |
| 296 | cyclobutyl | | methyl |
| 297 | cyclobutyl | | $R^{86}$ |
| 298 | cyclobutyl | | p-methoxyphenyl |
| 299 | cyclopentyl | | methyl |
| 300 | cyclopentyl | | $R^{86}$ |
| 301 | cyclohexyl | | methyl |
| 302 | cyclohexyl | | $R^{86}$ |

In this table,

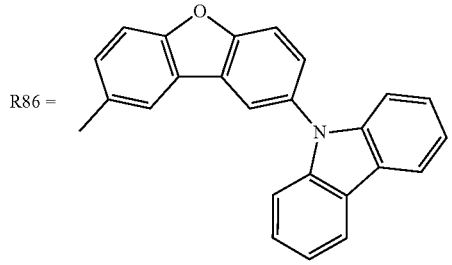 [SMILES: Cc1ccc2oc3ccc(-n4c5ccccc5c5ccccc54)cc3c2c1]

$R86 =$

Particularly preferred compounds in which two units of the general formulae (XI) and/or (XI*) are bridged to one another via a linear or branched, saturated or unsaturated bridge optionally interrupted by at least one heteroatom or via O, where this bridge in the general formulae (XI) and/or (XI*) is in each case attached to the silicon atoms in place of $R^{71}$, correspond to the general formula (XIII)

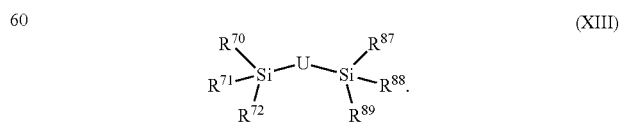

(XIII)

In formula (XIII), U, $R^{70}$, $R^{71}$, $R^{72}$, $R^{87}$, $R^{88}$ and $R^{89}$ are each defined as follows:

| Nr. | R70 | R71 | R72 | R87 | R88 | R89 | U |
|---|---|---|---|---|---|---|---|
| 303 | methyl | $R^{86}$ | $R^{86}$ | methyl | R5 | $R^{86}$ | —$CH_2$— |
| 304 | methyl | methyl | $R^{86}$ | methyl | methyl | $R^{86}$ | —$CH_2$— |
| 305 | $R^{86}$ | $R^{86}$ | $R^{86}$ | $R^{86}$ | $R^{86}$ | $R^{86}$ | —$CH_2$— |
| 306 | methyl | $R^{86}$ | $R^{86}$ | methyl | R5 | $R^{86}$ | —$C_2H_4$— |
| 307 | methyl | methyl | $R^{86}$ | methyl | methyl | $R^{86}$ | —$C_2H_4$— |
| 308 | $R^{86}$ | $R^{86}$ | $R^{86}$ | $R^{86}$ | $R^{86}$ | $R^{86}$ | —$C_2H_4$— |
| 309 | methyl | $R^{86}$ | $R^{86}$ | methyl | $R^{86}$ | $R^{86}$ | —$C_3H_6$— |
| 310 | methyl | methyl | $R^{86}$ | methyl | methyl | $R^{86}$ | —$C_3H_6$— |
| 311 | $R^{86}$ | $R^{86}$ | $R^{86}$ | $R^{86}$ | $R^{86}$ | $R^{86}$ | —$C_3H_6$— |
| 312 | methyl | $R^{86}$ | $R^{86}$ | methyl | $R^{86}$ | $R^{86}$ | —$C_4H_8$— |
| 313 | methyl | methyl | $R^{86}$ | methyl | methyl | $R^{86}$ | —$C_4H_8$— |
| 314 | $R^{86}$ | $R^{86}$ | $R^{86}$ | $R^{86}$ | $R^{86}$ | $R^{86}$ | —$C_4H_8$— |
| 315 | methyl | $R^{86}$ | $R^{86}$ | methyl | $R^{86}$ | $R^{86}$ | —$C_6H_{12}$— |
| 316 | methyl | methyl | $R^{86}$ | methyl | methyl | $R^{86}$ | —$C_6H_{12}$— |
| 317 | $R^{86}$ | $R^{86}$ | $R^{86}$ | $R^{86}$ | $R^{86}$ | $R^{86}$ | —$C_6H_{12}$— |
| 318 | methyl | $R^{86}$ | $R^{86}$ | methyl | $R^{86}$ | $R^{86}$ | —$C_8H_{16}$— |
| 319 | methyl | methyl | $R^{86}$ | methyl | methyl | $R^{86}$ | —$C_8H_{16}$— |
| 320 | $R^{86}$ | $R^{86}$ | $R^{86}$ | $R^{86}$ | $R^{86}$ | $R^{86}$ | —$C_8H_{16}$— |
| 321 | methyl | $R^{86}$ | $R^{86}$ | methyl | $R^{86}$ | $R^{86}$ | —$C_9H_{18}$— |
| 322 | methyl | methyl | $R^{86}$ | methyl | methyl | $R^{86}$ | —$C_9H_{18}$— |
| 323 | $R^{86}$ | $R^{86}$ | $R^{86}$ | $R^{86}$ | $R^{86}$ | $R^{86}$ | —$C_9H_{18}$— |
| 324 | $R^{86}$ | $R^{86}$ | $R^{86}$ | $R^{86}$ | $R^{86}$ | $R^{86}$ | —$CH(C_8H_{17})CH_2$— |
| 325 | methyl | $R^{86}$ | $R^{86}$ | methyl | $R^{86}$ | $R^{86}$ | —$C_2H_4(CF_2)_8C_2H_4$— |
| 326 | methyl | methyl | $R^{86}$ | methyl | methyl | $R^{86}$ | —$C_2H_4(CF_2)_8C_2H_4$— |
| 327 | $R^{86}$ | $R^{86}$ | $R^{86}$ | $R^{86}$ | $R^{86}$ | $R^{86}$ | —$C_2H_4(CF_2)_8C_2H_4$— |
| 328 | methyl | $R^{86}$ | $R^{86}$ | methyl | $R^{86}$ | $R^{86}$ | —C≡C— |
| 329 | methyl | methyl | $R^{86}$ | methyl | methyl | $R^{86}$ | —C≡C— |
| 330 | $R^{86}$ | $R^{86}$ | $R^{86}$ | $R^{86}$ | $R^{86}$ | $R^{86}$ | —C≡C— |
| 331 | methyl | $R^{86}$ | $R^{86}$ | methyl | $R^{86}$ | $R^{86}$ | -1,4-$(CH_2)_2$-phenyl-$(CH_2)_2$— |
| 332 | methyl | methyl | $R^{86}$ | methyl | methyl | $R^{86}$ | -1,4-$(CH_2)_2$-phenyl-$(CH_2)_2$— |
| 333 | $R^{86}$ | $R^{86}$ | $R^{86}$ | $R^{86}$ | $R^{86}$ | $R^{86}$ | -1,4-$(CH_2)_2$-phenyl-$(CH_2)_2$— |
| 334 | methyl | $R^{86}$ | $R^{86}$ | methyl | $R^{86}$ | $R^{86}$ | -1,3-$(CH_2)_2$-phenyl-$(CH_2)_2$— |
| 335 | methyl | methyl | $R^{86}$ | methyl | methyl | $R^{86}$ | -1,3-$(CH_2)_2$-phenyl-$(CH_2)_2$— |
| 336 | $R^{86}$ | $R^{86}$ | $R^{86}$ | $R^{86}$ | $R^{86}$ | $R^{86}$ | -1,3-$(CH_2)_2$-phenyl-$(CH_2)_2$— |
| 337 | methyl | $R^{86}$ | $R^{86}$ | methyl | $R^{86}$ | $R^{86}$ | -1,4-$(CH_2)_3$-phenyl-$(CH_2)_3$— |
| 338 | methyl | methyl | $R^{86}$ | methyl | methyl | $R^{86}$ | -1,4-$(CH_2)_3$-phenyl-$(CH_2)_3$— |
| 339 | $R^{86}$ | $R^{86}$ | $R^{86}$ | $R^{86}$ | $R^{86}$ | $R^{86}$ | -1,4-$(CH_2)_3$-phenyl-$(CH_2)_3$— |
| 340 | methyl | $R^{86}$ | $R^{86}$ | methyl | $R^{86}$ | $R^{86}$ | -1,3-$(CH_2)_3$-phenyl-$(CH_2)_3$— |
| 341 | methyl | methyl | $R^{86}$ | methyl | methyl | $R^{86}$ | -1,3-$(CH_2)_3$-phenyl-$(CH_2)_3$— |
| 342 | $R^{86}$ | $R^{86}$ | $R^{86}$ | $R^{86}$ | $R^{86}$ | $R^{86}$ | -1,3-$(CH_2)_3$-phenyl-$(CH_2)_3$— |
| 343 | methyl | $R^{86}$ | $R^{86}$ | methyl | $R^{86}$ | $R^{86}$ | -1,4-phenyl- |
| 344 | methyl | methyl | $R^{86}$ | methyl | methyl | $R^{86}$ | -1,4-phenyl- |
| 345 | $R^{86}$ | $R^{86}$ | $R^{86}$ | $R^{86}$ | $R^{86}$ | $R^{86}$ | -1,4-phenyl- |
| 346 | methyl | $R^{86}$ | $R^{86}$ | methyl | $R^{86}$ | $R^{86}$ | -1,3-phenyl- |
| 347 | methyl | methyl | $R^{86}$ | methyl | methyl | $R^{86}$ | -1,3-phenyl- |
| 348 | $R^{86}$ | $R^{86}$ | $R^{86}$ | $R^{86}$ | $R^{86}$ | $R^{86}$ | -1,3-phenyl- |
| 28 | methyl | methyl | $R^{86}$ | methyl | methyl | $R^{86}$ | —O— |
| 349 | methyl | $R^{86}$ | $R^{86}$ | methyl | $R^{86}$ | $R^{86}$ | —O— |
| 350 | methyl | methyl | $R^{86}$ | methyl | methyl | $R^{86}$ | —O—$Si(CH_3)_2$—O— |
| 351 | methyl | methyl | $R^{86}$ | methyl | methyl | $R^{86}$ | —O—$Si(CH_3)(Ph)$—O— |
| 352 | methyl | methyl | $R^{86}$ | methyl | methyl | $R^{86}$ | —O—$Si(CH_3)_2$—O—$Si(CH_3)_2$—O— |
| 353 | methyl | methyl | $R^{86}$ | methyl | methyl | $R^{86}$ | —O—$Si(CH_3)_2$—O—$Si(CH_3)_2$—O—$Si(CH_3)_2$—O— |
| 354 | methyl | —$OSiMe_3$ | $R^{86}$ | methyl | —$OSiMe_3$ | $R^{86}$ | —O— |
| 355 | methyl | phenyl | $R^{86}$ | methyl | phenyl | $R^{86}$ | —O— |
| 356 | i-propyl | i-propyl | $R^{86}$ | i-propyl | i-propyl | $R^{86}$ | —O— |
| 357 | cyclopentyl | cyclopentyl | $R^{86}$ | cyclopentyl | cyclopentyl | $R^{86}$ | —O— |
| 358 | phenyl | phenyl | $R^{86}$ | phenyl | phenyl | $R^{86}$ | —O— |
| 359 | phenyl | $R^{86}$ | $R^{86}$ | phenyl | $R^{86}$ | $R^{86}$ | —O— |
| 360 | $R^{86}$ | $R^{86}$ | $R^{86}$ | $R^{86}$ | $R^{86}$ | $R^{86}$ | —O— |

In this table,

R86 =

Further suitable compounds of the formula (XI) and/or (XI*) are specified hereinafter. R therein is independently Me, phenyl or $R^{86}$, where at least one R radical is $R^{86}$:

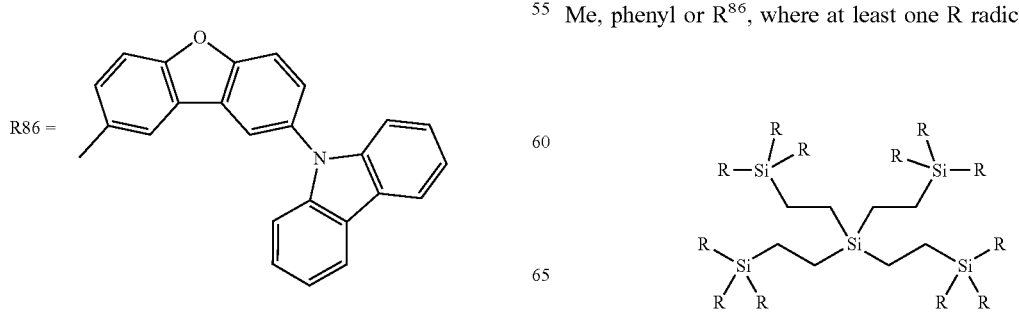

-continued
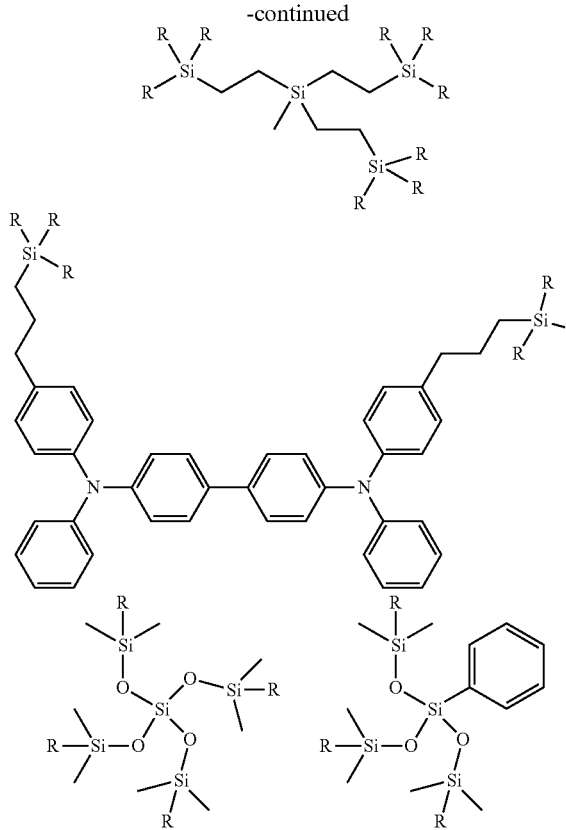
-continued
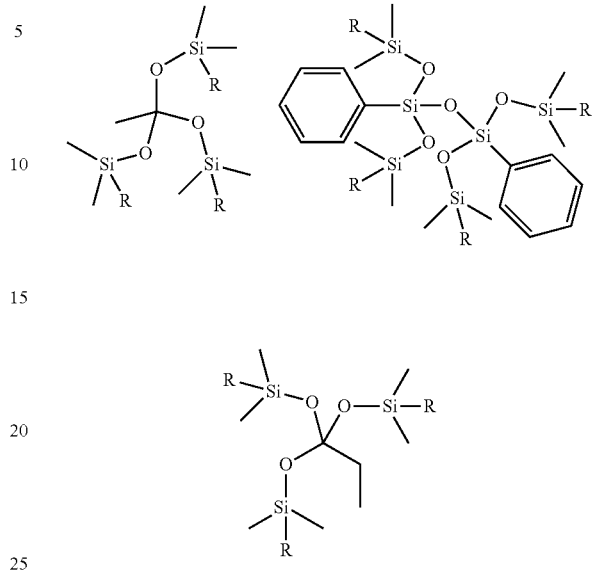
In a very particularly preferred embodiment, the present invention relates to an OLED which, as well as at least one metal-carbene complex of the general formula (I), comprises at least one compound of the general formula (X), in which case the compound of the formula (X) is most preferably at least one of the compounds specified below:
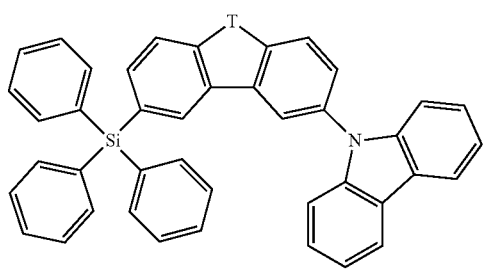
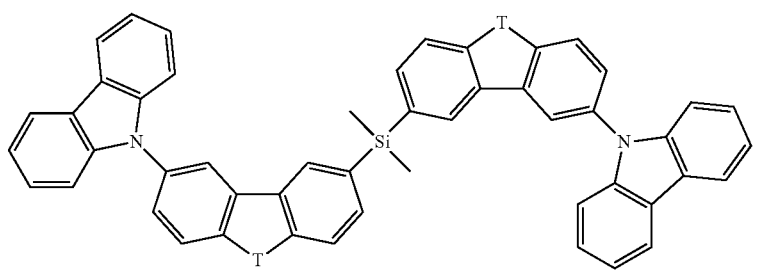

-continued
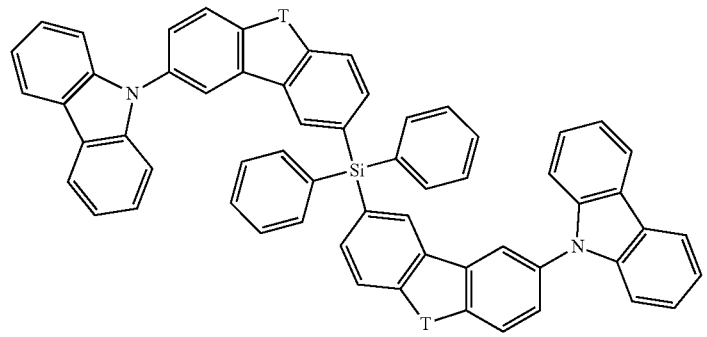
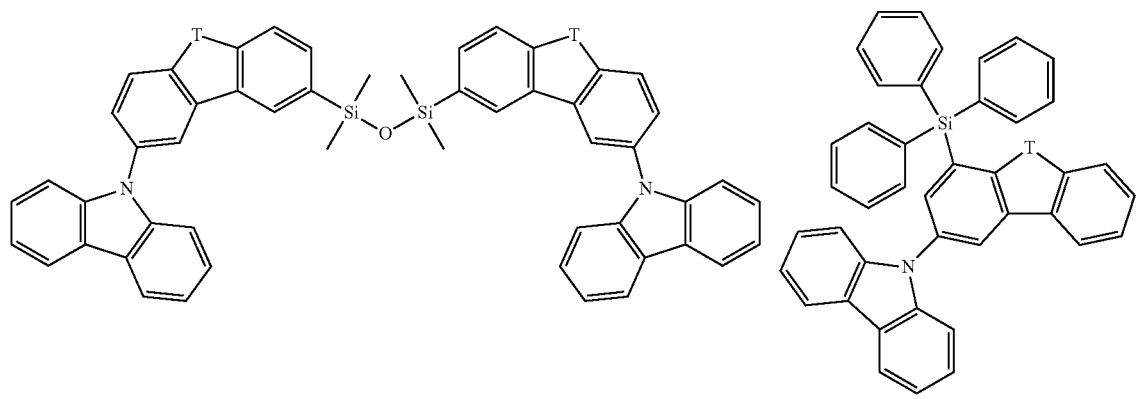
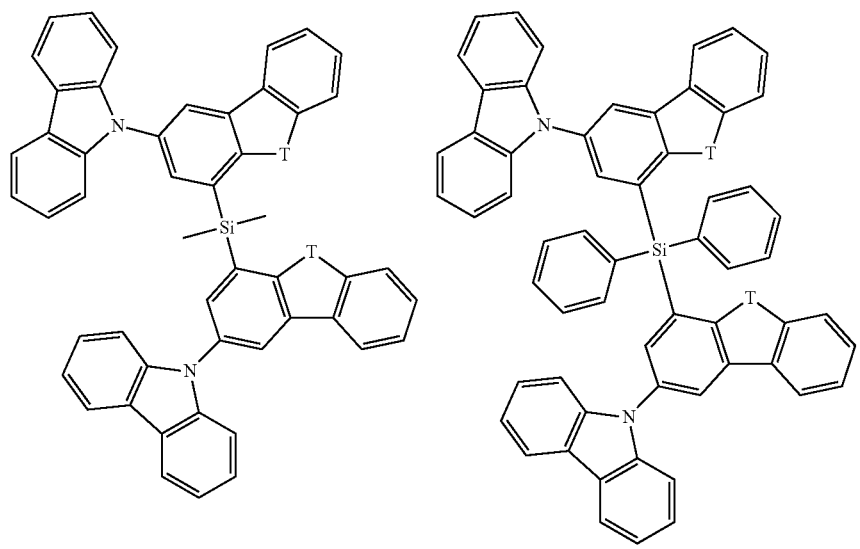
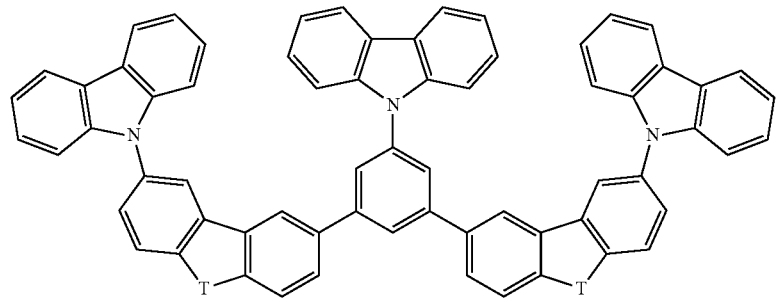

-continued
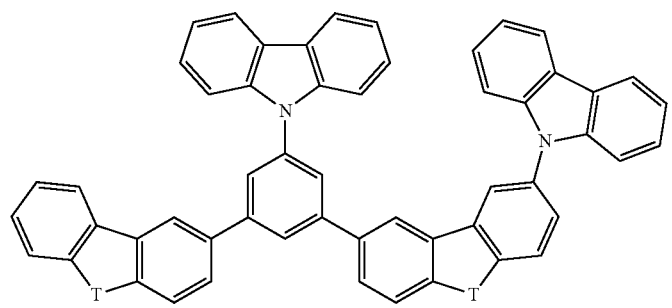
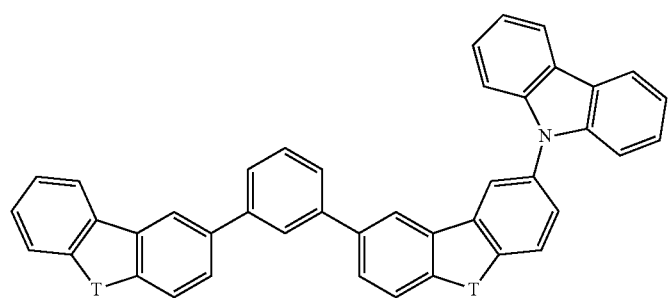
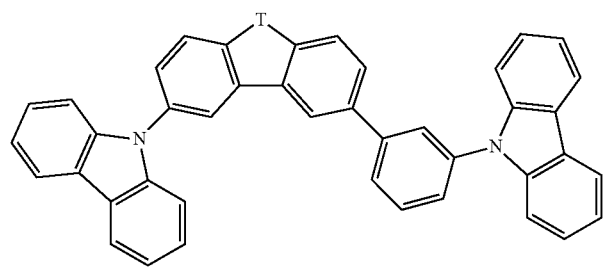
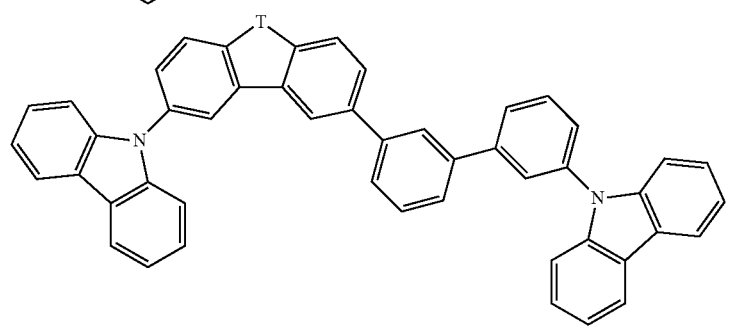
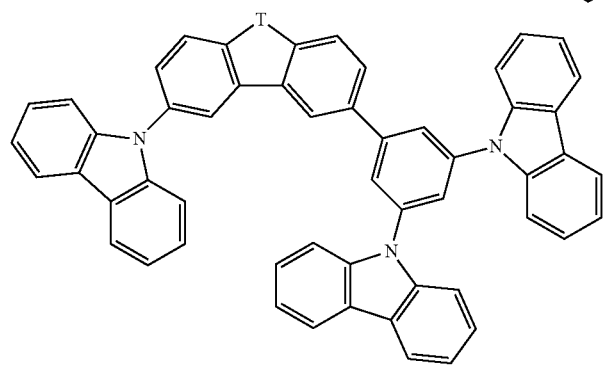

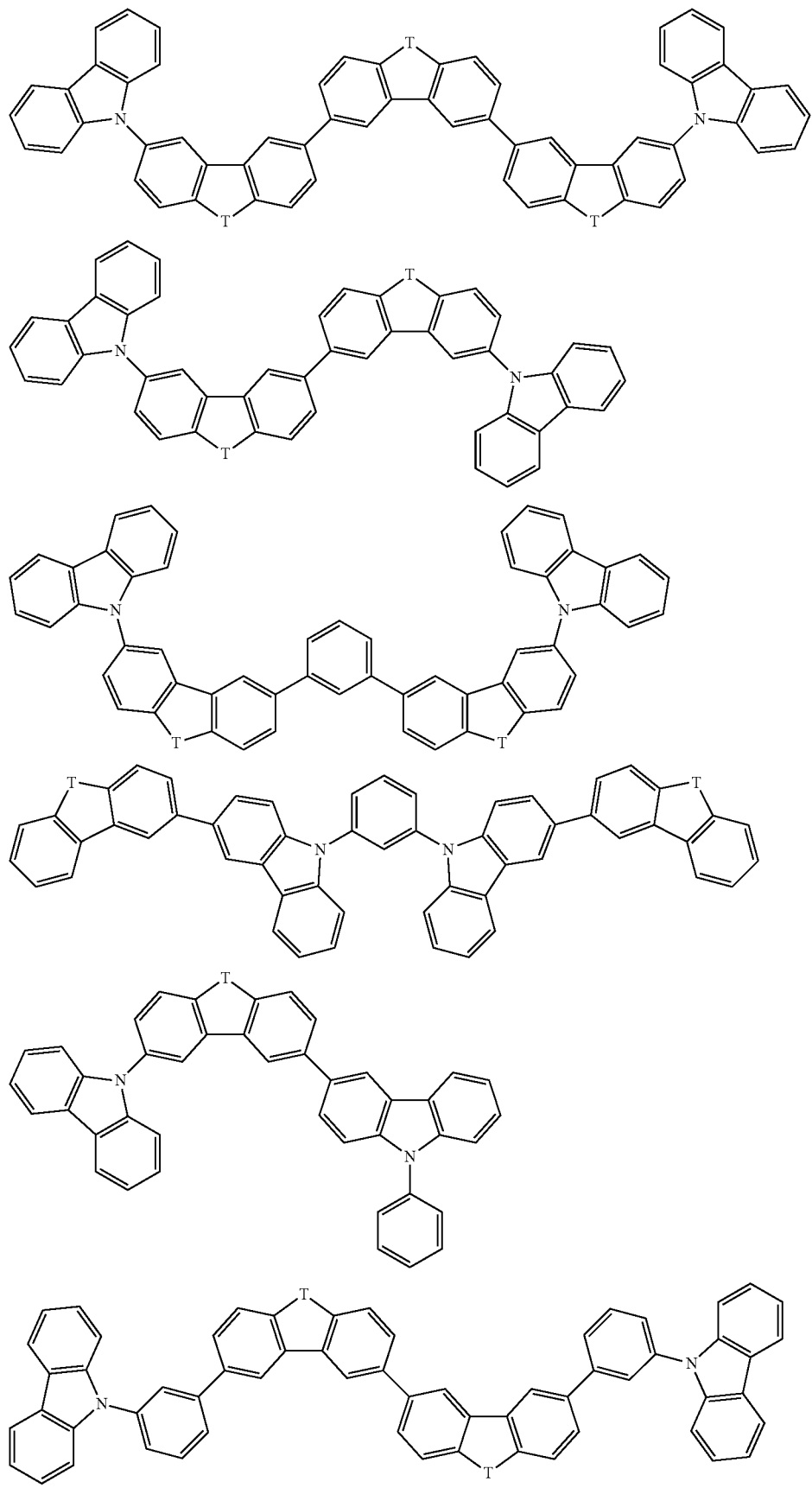

-continued
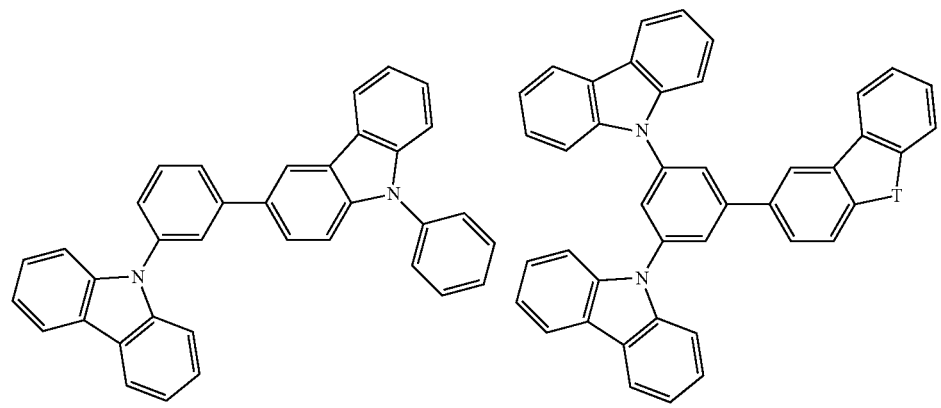
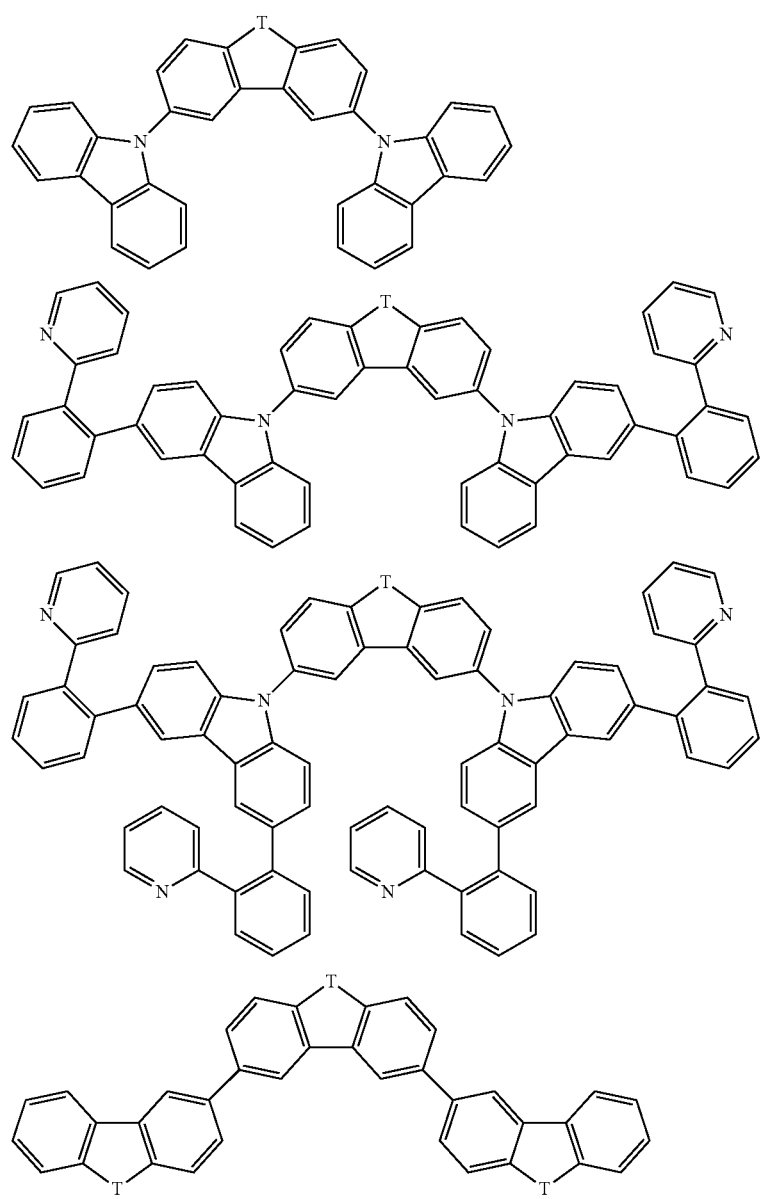

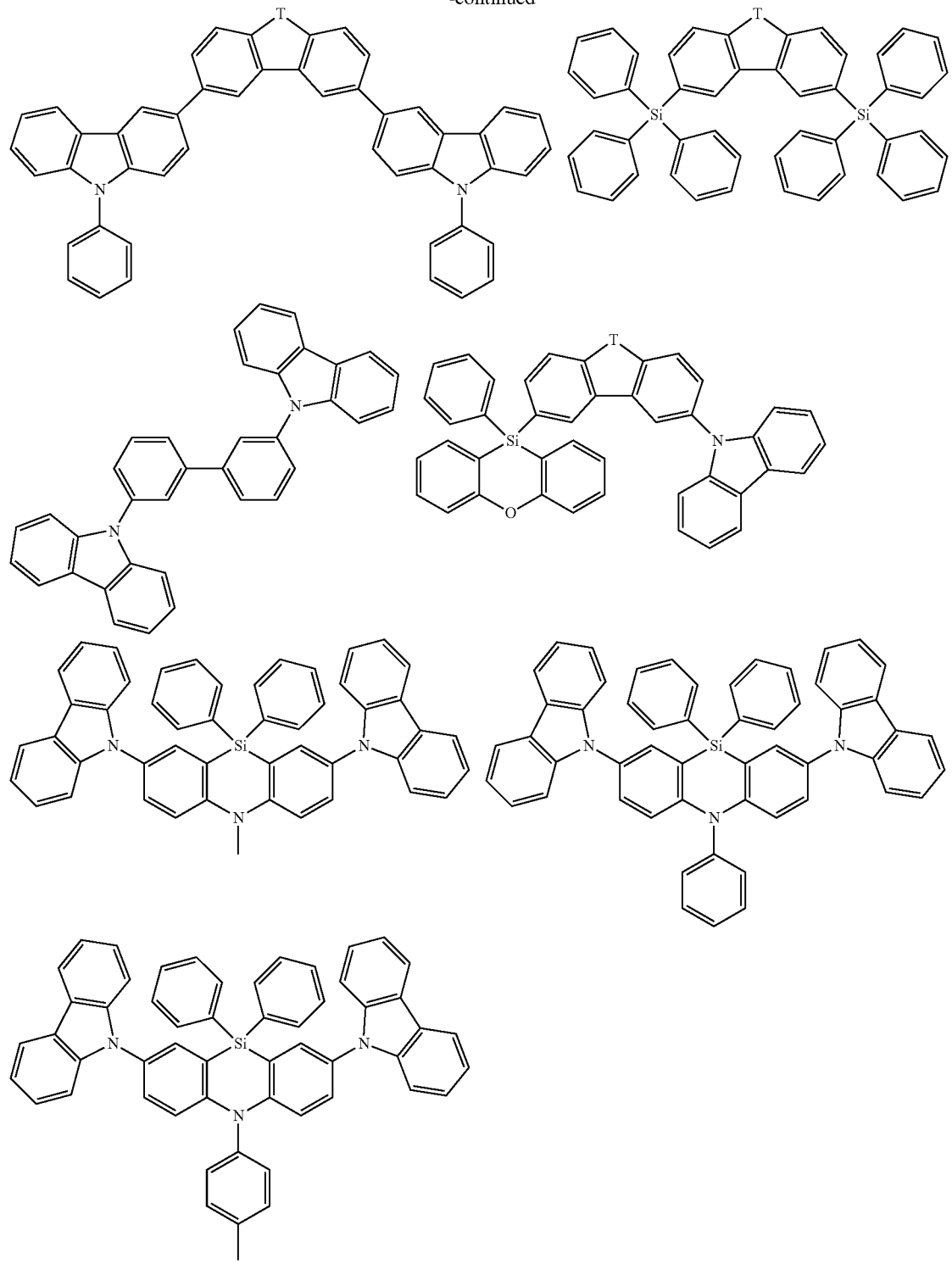

In the aforementioned compounds, T is O or S, preferably O. When more than one T occurs in the molecule, all T groups have the same definitions.

In addition to the compounds of the formula (X), according to the present invention, it is also possible to use crosslinked or polymeric materials comprising repeat units based on the general formula (X) in crosslinked or polymerized form together with at least one heteroleptic complex of the general formula (I). Like the compounds of the general formula (X), the latter are preferably used as matrix materials.

The crosslinked or polymeric materials have outstanding solubility in organic solvents, excellent film-forming properties and relatively high glass transition temperatures. In addition, high charge carrier mobilities, high stabilities of color emission and long operating times of the corresponding components can be observed when crosslinked or polymeric materials according to the present invention are used in organic light-emitting diodes (OLEDs).

The crosslinked or polymerized materials are particularly suitable as coatings or in thin films since they are thermally and mechanically stable and relatively defect-free.

The crosslinked or polymerized materials comprising repeat units based on the general formula (X) can be prepared by a process comprising steps (a) and (a):

(a) preparation of a crosslinkable or polymerizable compound of the general formula (X) where at least one of the a" $R^{55}$ radicals or at least one of the b' $R^{56}$ radicals is a crosslinkable or polymerizable group attached via a spacer, and (b) crosslinking or polymerization of the compound of the general formula (X) obtained from step (a).

The crosslinked or polymerized materials may be homopolymers, which means that exclusively units of the general formula (X) are present in crosslinked or polymerized form. They may also be copolymers, which means that further monomers are present in addition to the units of the general formula (X), for example monomers with hole-conducting and/or electron-conducting properties, in crosslinked or polymerized form.

In a further preferred embodiment of the inventive OLED, it comprises an emission layer comprising at least one inventive heteroleptic complex of the general formula (I), at least one matrix material of the formula (X), and optionally at least one further hole-transporting matrix material.

The inventive OLEDs can be used in all devices in which electroluminescence is useful. Suitable devices are preferably selected from stationary and mobile visual display units and illumination means. The present invention therefore also relates to a device selected from the group consisting of stationary visual display units and mobile visual display units and illumination means, comprising an inventive OLED.

Stationary visual display units are, for example, visual display units of computers, televisions, visual display units in printers, kitchen appliances and advertising panels, illuminations and information panels. Mobile visual display units are, for example, visual display units in cellphones, laptops, digital cameras, mp-3 players, smartphones, vehicles, and destination displays on buses and trains.

In addition, the inventive heteroleptic complexes of the general formula (I) can be used in OLEDs with inverse structure. The inventive complexes are preferably used in turn in these inverse OLEDs in the light-emitting layer. The structure of inverse OLEDs and the materials typically used therein are known to those skilled in the art.

A further embodiment of the present invention is a white OLED comprising at least one heteroleptic complex of the general formula (I). In a preferred embodiment, the heteroleptic complex of the general formula (I) is employed in the white OLED as emitter material. Preferred embodiments of the heteroleptic complex of the general formula (I) are mentioned before. Beside the at least one heteroleptic complex of the general formula (I) the white OLED may comprise at least one compound of the formula (X). The compound of formula (X) is preferably employed as matrix material. Preferred compounds of the formula (X) are mentioned before.

In order to obtain white light, the OLED must generate light which colors the entire visible range of the spectrum. However, organic emitters normally emit only in a limited portion of the visible spectrum—i. e. are colored. White light can be generated by the combination of different emitters. Typically, red, green and blue emitters are combined. However, the prior art also discloses other methods for formation of white OLEDs, for example the triplet harvesting approach. Suitable structures for white OLEDs or methods for formation of white OLEDs are known to those skilled in the art.

The present invention also relates to an organic electronic component, preferably an organic light-emitting diode (OLED), organic photovoltaic cell (OPV), organic filed-effect transistor (OFET) or light-emitting electrochemical cell (LEEC), comprising a least one inventive heteroleptic complex of the general formula (I).

EXAMPLES

The examples which follow, especially the methods, materials, conditions, process parameters, apparatus and the like, detailed in the examples, are intended to support the present invention, but not to restrict the scope of the present invention.

N-(2,6-Diisopropylphenyl)-2-phenylimidazole L1 is synthesized analogously to example 14 in WO2006/121811. The synthesis of 5-methoxy-1,3,4-triphenyl-4,5-dihydro-1H-1,2,4-triazole C1 is effected according to D. Enders, K. Breuer, G. Raabe, J. Runsink, J. H. Teles, J.-P. Melder, K. Ebel, S. Brode, Angew. Che-m. 1995, 107, 9, 1119-1122 or D. Enders, K. Breuer, U. Kallfass, T. Balensiefer, Synthesis 2003, 8, 1292-1295. 3-(2,6-Dimethylphenyl)-7-methylimidazo[1,2-f]phenanthridine L3 is synthesized analogously to example 10 in WO 2007/095118. The synthesis of the ligand precursor 1-isopropyl-1,2,4-triazolo[4,3-f]phenanthridinium iodide C3 is effected as described in WO 2009/050281. The synthesis of the exciton and hole blocker 2,8-bis(triphenyl-silyl)-dibenzofuran LB1 is disclosed in synthesis example 4g in WO 2009/003898.

All experiments are performed in protective gas atmosphere.

Example 1

μ-Dichloro Dimer D1:

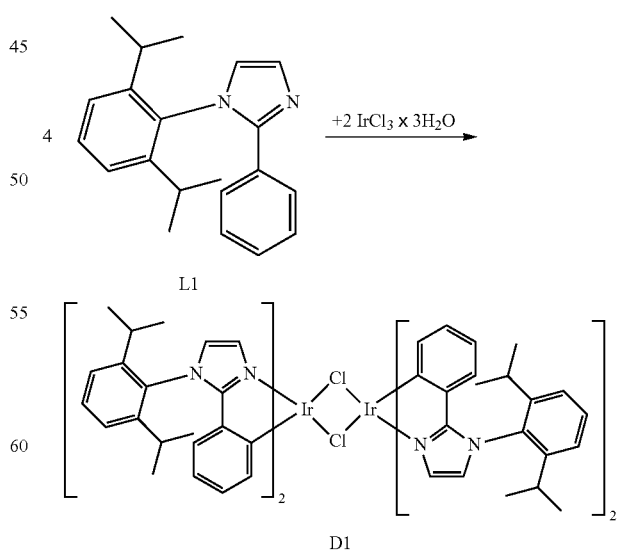

3.50 g (11.5 mmol) of 1-(2,6-diisopropylphenyl)-2-phenyl-1H-imidazole L1 are initially charged in 200 ml of 2-ethoxyethanol/water (ratio 3/1) and admixed with 1.84 g (5.2 mmol) of iridium(III) chloride trihydrate. The reaction mixture is heated at reflux for 18 h. After cooling, 50 ml of distilled water are added. The precipitate is filtered off, washed with distilled water and dried. This gives 3.50 g (80%) of p-dichloro dimer D1 as a yellow powder.

$^1$H NMR (CD$_2$Cl$_2$, 400 MHz):

δ=0.95 (d, $^3J_{H,H}$=6.9 Hz, 12H), 1.18 (d, $^3J_{H,H}$=6.9 Hz, 12H), 1.27 (d, $^3J_{H,H}$=6.9 Hz, 12H), 1.34 (d, $^3J_{H,H}$=6.9 Hz, 12H), 2.80-2.91 (m, 8H), 6.08 (d, $^3J_{H,H}$=7.7 Hz, 4H), 6.24 (d, $^3J_{H,H}$=7.7 Hz, 4H), 6.39 (pt, $^3J_{H,H}$=7.5 Hz, 4H), 6.53 (pt, $^3J_{H,H}$=7.5 Hz, 4H), 6.97 (d, J$_{H,H}$=1.5 Hz, 4H), 7.39-7.45 (m, 8H), 7.59 (t, $^3J_{H,H}$=7.8 Hz, 4H), 7.67 (d, J$_{H,H}$=1.5 Hz, 4H).

Complex Em1-s:

2.37 g (7.2 mmol) of 5-methoxy-1,3,4-triphenyl-4,5-dihydro-1H-1,2,4-triazole C1 are heated to 90° C. under reduced pressure for 18 h. After cooling to room temperature, first 100 ml of anhydrous toluene and then a suspension of 3.00 g (1.8 mmol) of chloro dimer D1 and 150 ml of anhydrous toluene are added. The mixture is heated to 90° C. for 2 h. The white precipitate formed (1.15 g, imidazolium chloride C1*) is filtered off. The filtrate is washed with 3×40 ml of saturated NaHCO$_3$ solution and 1×40 ml of distilled water, dried over MgSO$_4$ and freed of the solvent under reduced pressure. The residue is washed with 2×50 ml of methanol, recrystallized from methylene chloride/methanol and then recrystallized from nitromethane. This gives 3.2 g of the complex Em1-s as a yellow powder (82%).

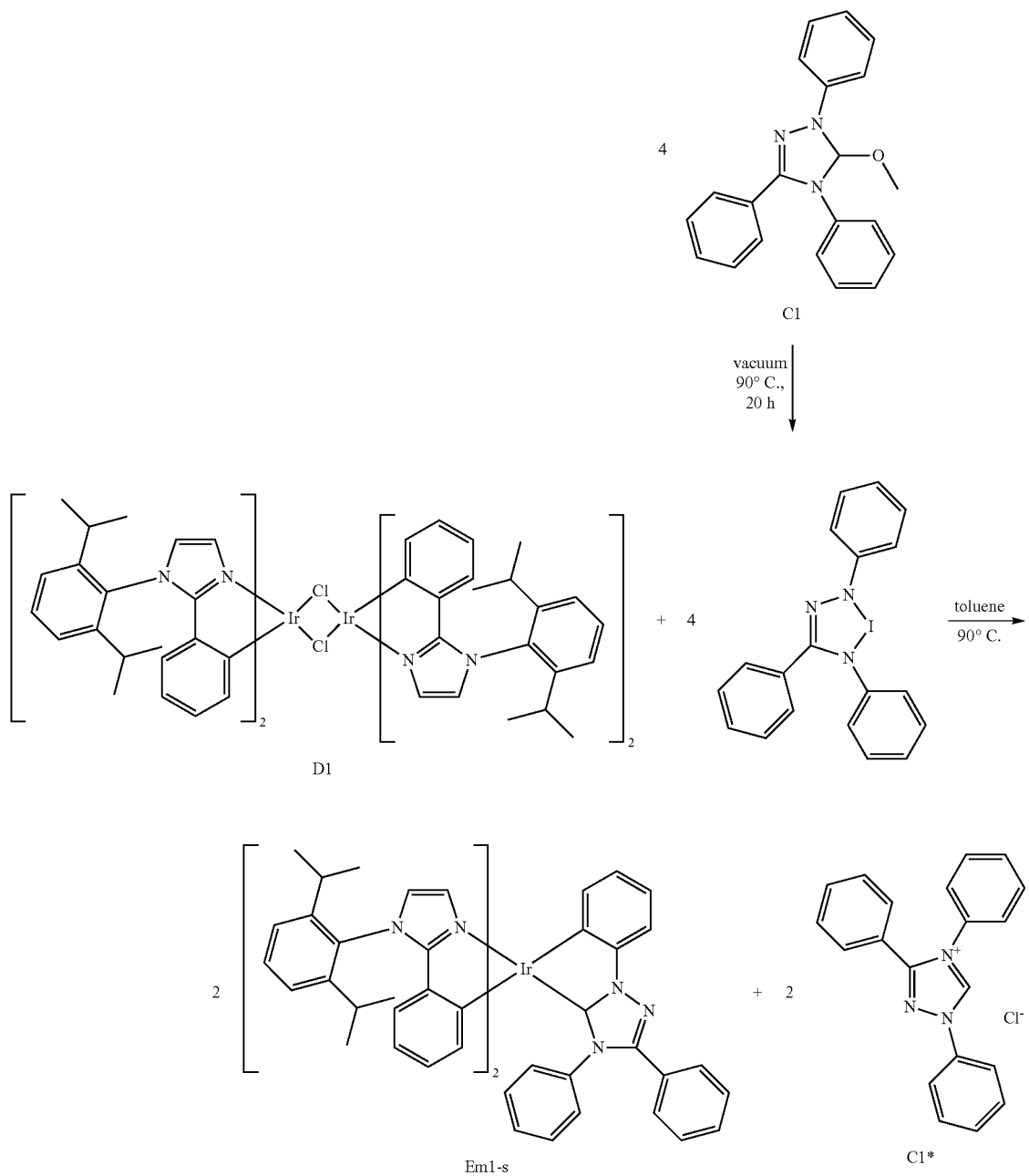

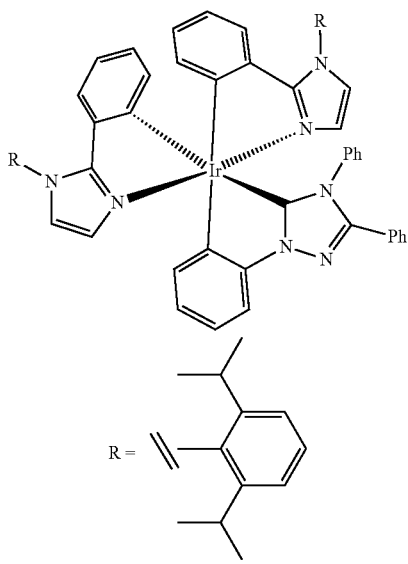

Em1-s: The configuration of Em1-s corresponds to the configuration of the pseudo-meridional isomer S1a or S1b. Em1-s is present as the racemate; for crystal structure see FIG. 1, only one enantiomer is depicted, large sphere=C, small sphere=H. Sample for the x-ray structure analysis is crystallized from nitromethane (nitromethane still present in the crystals).

$^1$H NMR (CD$_2$Cl$_2$, 400 MHz):

δ=0.88 (d, $^3J_{H,H}$=6.8 Hz, 3H), 0.91 (d, $^3J_{H,H}$=6.9 Hz, 9H), 1.14 (d, $^3J_{H,H}$=6.9 Hz, 3H), 1.16 (d, $^3J_{H,H}$=6.8 Hz, 3H), 1.20 (d, $^3J_{H,H}$=6.9 Hz, 3H), 1.28 (d, $^3J_{H,H}$=6.9 Hz, 3H), 2.08 (sept, $^3J_{H,H}$=6.7 Hz, 1H), 2.65-2.77 (m, 3H), 6.08-6.15 (m, 3H), 6.19-6.25 (m, 2H), 6.42-6.45 (m, 1H), 6.50-6.52 (m, 2H), 6.67 (s, b, 2H), 6.71 (dt, $^3J_{H,H}$=7.4 Hz, J=1.2 Hz, 1H), 6.75 (d, J=1.5 Hz, 1H), 6.79-6.87 (m, 6H), 7.00-7.07 (m, 2H), 7.28-7.43 (m, 9H), 7.50 (t, $^3J_{H,H}$=7.8 Hz, 1H), 7.56 (t, $^3J_{H,H}$=7.8 Hz, 1H), 7.71 (d, $^3J_{H,H}$=7.5 Hz, 1H).

Photoluminescence (in a film, 2% in PMMA):

λ=460, 490 nm, CIE: (0.19; 0.34)

Example 2

Complex Em1-i:

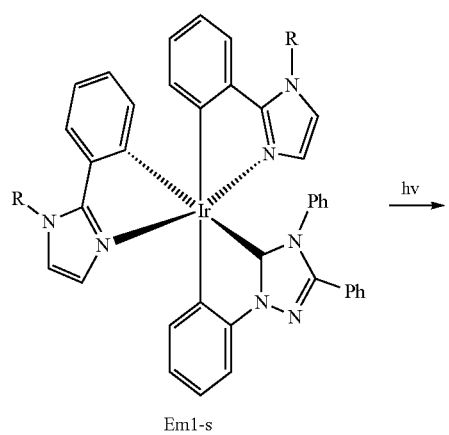

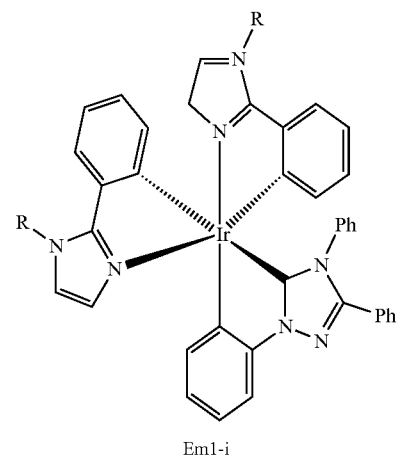

racemic in each case, only one enantiomer of each depicted

A solution of 1.6 g of complex Em1-s in 200 ml of 3-methoxypropionitrile is irradiated at room temperature with a blacklight blue lamp for 5 h (Osram, L18W/73, λ$_{max}$=370-380 nm). The solvent is removed under reduced pressure. The residue is washed with methanol and recrystallized from methylene chloride/methanol. This gives 1.2 g of Em1-i as a lemon yellow powder (75%).

Figure 2:
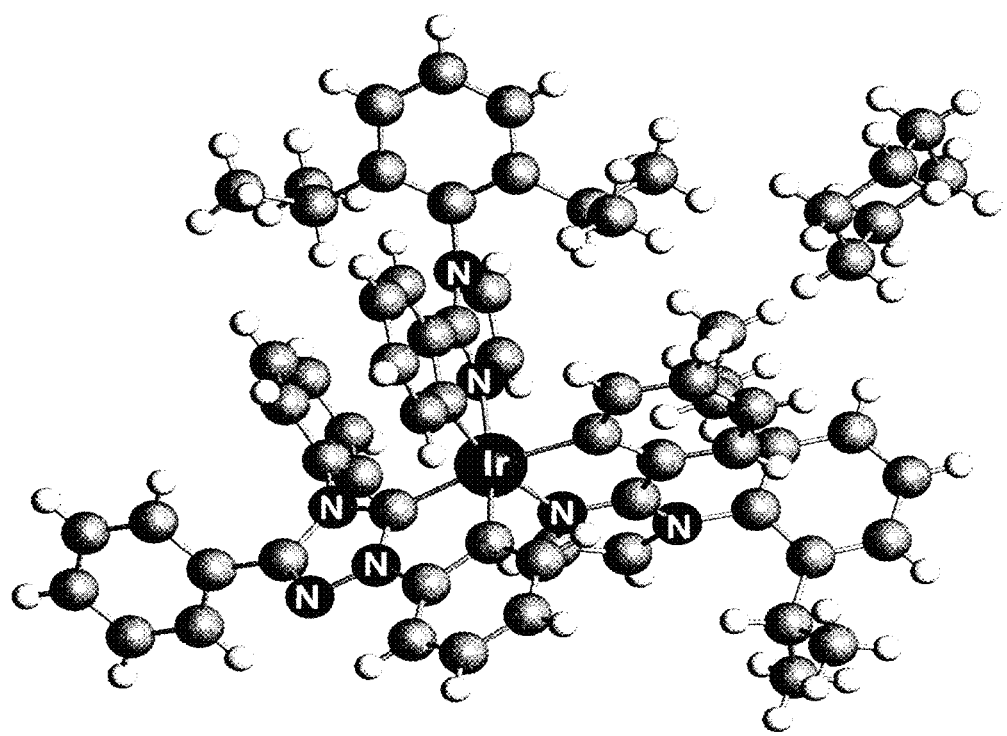
FIG. 2 depicts a crystal structure of Em1-i.

The configuration of Em1-i corresponds to the configuration IVa or IVb of the pseudo-facial isomer S4a or S4b. Emi-i is present as the racemate; for crystal structure see FIG. 2, the sample for the x-ray structure analysis is crystallized from cyclohexane/ethyl acetate (cyclohexane still present in the crystals).

$^1$H NMR (CD$_2$Cl$_2$, 500 MHz):

δ=0.46 (d, $^3J_{H,H}$=6.8 Hz, 3H), 0.75 (d, $^3J_{H,H}$=6.8 Hz, 3H), 0.81 (d, $^3J_{H,H}$=6.8 Hz, 3H), 1.01 (d, $^3J_{H,H}$=6.8 Hz, 3H), 1.09 (d, $^3J_{H,H}$=6.9 Hz, 3H), 1.14 (d, $^3J_{H,H}$=6.9 Hz, 3H), 1.17 (d, $^3J_{H,H}$=6.9 Hz, 3H), 1.26 (d, $^3J_{H,H}$=6.8 Hz, 3H), 1.50 (sept, $^3J_{H,H}$=6.8 Hz, 1H), 2.49-2.60 (m, 3H), 6.01 (d, J=1.3 Hz, 1H), 6.10 (t, $^3J_{H,H}$=8.2 Hz, 2H), 6.34 (d, J=1.4 Hz, 1H), 6.38 (d, $^3J_{H,H}$=7.2 Hz, 1H), 6.41-6.45 (m, 2H), 6.57-6.73 (m, 5H), 6.85 (d, J=1.4 Hz, 1H), 6.96-7.00 (m, 1H), 7.11 (d, J=1.4 Hz, 1H), 7.17-7.42 (m, 14H), 7.46 (t, $^3J_{H,H}$=7.8 Hz, 1H), 7.54 (t, $^3J_{H,H}$=7.8 Hz, 1H), 7.68 (d, J$_{H,H}$=8.2 Hz, 1H).

Photoluminescence (in a film, 2% in PMMA):

λ$_{max}$=456, 488 nm, CIE: (0.21;0.37)

The photoluminescence quantum yield of the facial isomer Em1-i is 1.36 times the quantum yield of the meridional isomer Em1-s.

Example 3

4-Bromodibenzofuran

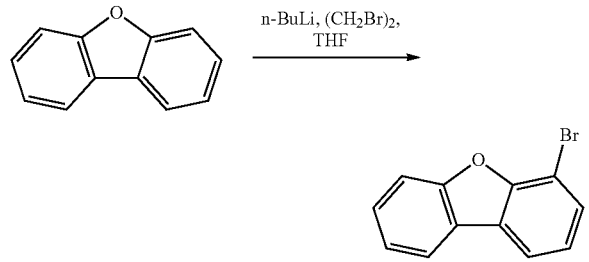

100.00 g (99%, 588.6 mmol) of dibenzofuran are dissolved in 800 ml of anhydrous THF and admixed at −40° C. with 400 ml (640.0 mmol) of n-BuLi (1.6M in hexane). The cooling bath is removed. The reaction solution is allowed to come to room temperature in a water bath within approx. 30 min and stirred for a further two hours. Thereafter, it is cooled to −78° C. and a solution of 160.34 g (99%, 844.9 mmol, 73.55 ml) of 1,2-dibromoethane in 80 ml of anhydrous THF is added dropwise. The cooling bath is removed, and the mixture is allowed to come to room temperature in a water bath within approx. 30 min and stirred for a further two hours. Subsequently, 60 ml of saturated sodium chloride solution are added cautiously (slightly exothermic reaction, temperature rise 1-2° C.). The organic phase is removed and freed of the solvent under reduced pressure. The oily red-brown residue is taken up in 900 ml of dichloromethane and washed successively with 500 ml of HCl solution (1N) and 400 ml of water. The organic phase is dried over magnesium sulfate and freed of the solvent under reduced pressure. In the course of cooling, a yellowish solid precipitates out, which is comminuted in a mortar and washed on a frit with 2×150 ml of isopropanol. After drying, 120.36 g of beige powder are obtained (according to GC and NMR: DBF/Br-DBF ratio=10/90, corresponds to 111.93 g of Br-DBF/76% yield). After removing the solvent, a further 15.84 g of a mixture of dibenzofuran and 4-bromodibenzofuran (comprises a further approx. 7.8 g/5% Br-DBF) are obtained from the isopropanol solution. This mixture can likewise be used in the further stages.

$^1$H NMR (CDCl$_3$, 500 MHz):

δ=7.92 (d, $^3J_{H,H}$=7.8 Hz, 1H), 7.86 (dd, $^3J_{H,H}$=7.7 Hz, $^4J_{H,H}$=1.0 Hz, 1H), 7.65 (d, $^3J_{H,H}$=8.2 Hz, 1H), 7.61 (dd, $^3J_{H,H}$=7.8 Hz, $^4J_{H,H}$=1.1 Hz, 1H), 7.50 (dt, $^3J_{H,H}$=8.2 Hz, $J_{H,H}$=1.3 Hz, 1H), 7.37 (dt, $^3J_{H,H}$=7.8 Hz, $J_{H,H}$=0.8 Hz, 1H), 7.21 (t, $^3J_{H,H}$=7.8 Hz, 1H).

1-Dibenzofuran-4-yl-1H-imidazole

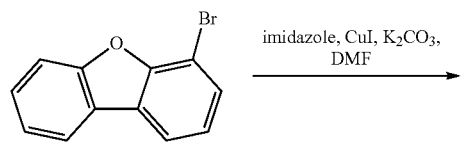

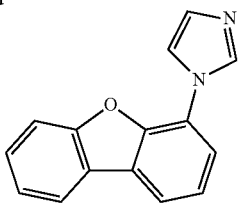

119.00 g of the first stage (comprise 110.66 g, 447.9 mmol of 4-bromodibenzofuran) are dissolved in 700 ml of dimethylformamide and admixed successively with 37.15 g (545.7 mmol) of imidazole, 15.80 g (83.0 mmol) of copper (I) iodide and 83.20 g (602.0 mmol) of potassium carbonate. The mixture is stirred at 150° C. for 48 h, in the course of which a further 3.75 g (55.1 mmol) of imidazole are added after 24 h and a further 1.93 g (28.3 mmol) after 44 h. Thereafter, the mixture is cooled to room temperature and the insoluble constituents are filtered off. The filtrate is concentrated to dryness. The residue is taken up in 500 ml of methylene chloride, washed successively with 150 ml of ammonia solution (25%) and 150 ml of water, dried over magnesium sulfate and concentrated. This gives 82.23 g of crude product, which is used in the next stage without further purification (78% crude yield).

3-Dibenzofuran-4-yl-1-methyl-3H-imidazol-1-ium Iodide C2

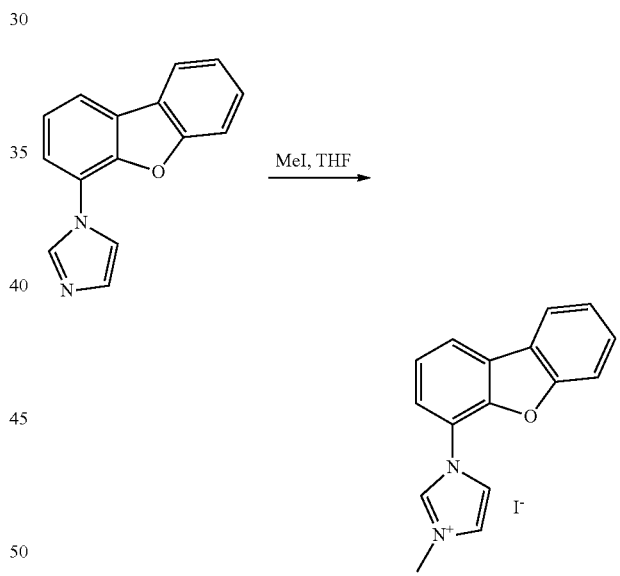

82.03 g (350.1 mmol) of 1-dibenzofuran-4-yl-1H-imidazole (crude product) are dissolved in 1 l of tetrahydrofuran and admixed slowly with 246.06 g (1.733 mol) of methyl iodide. The mixture is stirred at room temperature for 65 h. The precipitate formed is filtered off, washed with 1 l of tetrahydrofuran and dried. This gives 98.41 g (261.6 mmol, 75%) of beige powder.

$^1$H NMR (DMSO, 500 MHz):

δ=10.00 (s, 1H, NCHN), 8.49 (t, J=1.9 Hz, 1H, CH$_{Aryl}$), 8.41 (dd, $^3J_{H,H}$=7.8 Hz, J=1.0 Hz, 1H, CH$_{Aryl}$), 8.32-8.30 (m, 1H, CH$_{Aryl}$), 8.15 (t, J=1.8 Hz, 1H, CH$_{Aryl}$), 7.96 (dd, $^3J_{H,H}$=7.9 Hz, J=1.0 Hz, 1H, CH$_{Aryl}$), 7.84 (d, $^3J_{H,H}$=8.4 Hz, 1H, CH$_{Aryl}$), 7.69-7.65 (m, 2H, CH$_{Aryl}$), 7.53 (dt, $^3J_{H,H}$=7.5 Hz, J=0.9 Hz, 1H, CH$_{Aryl}$), 4.12 (s, 3H, CH$_3$).

Complex Em2-s:

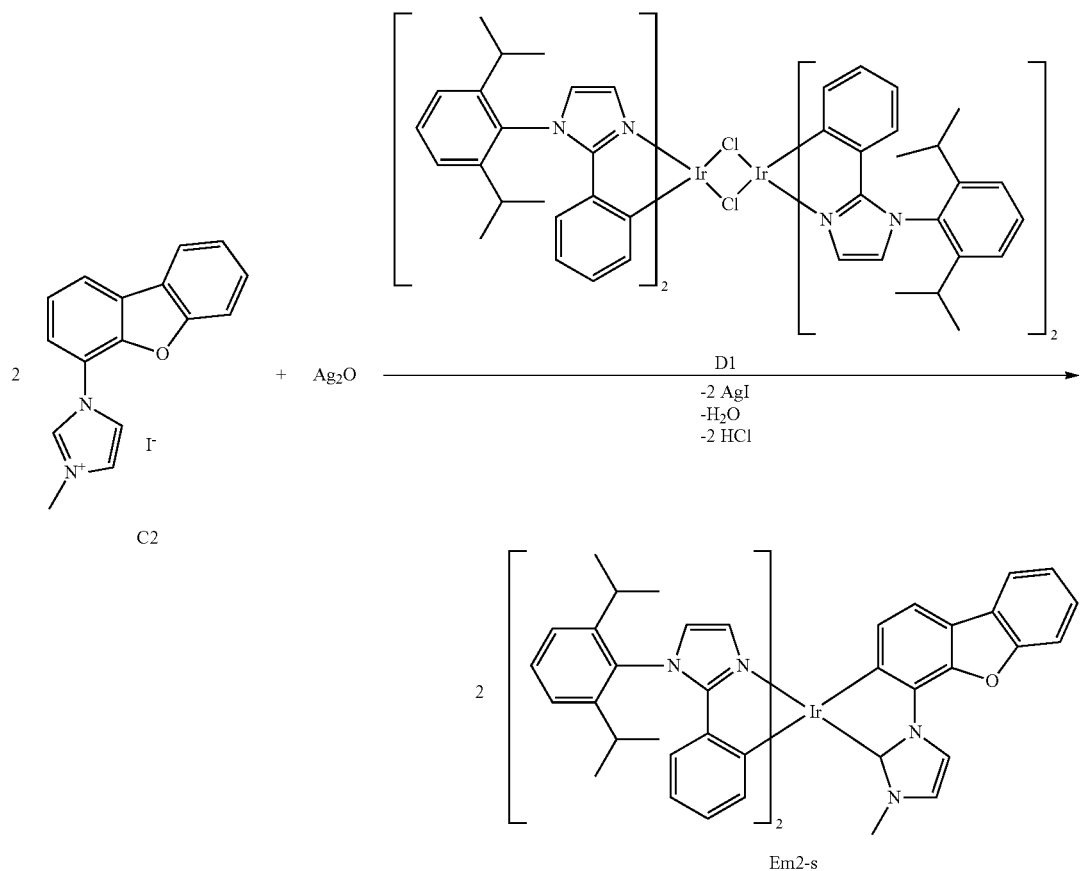

1.01 g (2.7 mmol) of imidazolium iodide C2 and 0.31 g (1.3 mmol) of Ag₂O are stirred in 200 ml of anhydrous acetonitrile at room temperature for 18 h. Then the solvent is removed under reduced pressure. The residue is taken up in 300 ml of anhydrous THF and 1.50 g (0.9 mmol) of chloro dimer D1 are added. Thereafter, the mixture is heated at reflux for 24 h. After cooling, the reaction solution is filtered. The filtrate is freed of the solvent under reduced pressure. The residue is washed with methanol and, after drying, 1.2 g of the complex Em2-s are obtained as a yellow powder (64%).

$^1$H NMR (CD$_2$Cl$_2$, 500 MHz):

δ=0.86 (d, $^3J_{H,H}$=6.9 Hz, 3H), 0.96 (d, $^3J_{H,H}$=6.8 Hz, 3H), 1.00 (d, $^3J_{H,H}$=6.7 Hz, 3H), 1.02 (d, $^3J_{H,H}$=7.1 Hz, 3H), 1.03 (d, $^3J_{H,H}$=7.1 Hz, 3H), 1.06 (d, $^3J_{H,H}$=6.9 Hz, 3H), 1.21 (d, $^3J_{H,H}$=7.0 Hz, 3H), 1.23 (d, $^3J_{H,H}$=7.0 Hz, 3H), 2.15 (sept, $^3J_{H,H}$=6.9 Hz, 1H), 2.39 (sept, $^3J_{H,H}$=6.9 Hz, 1H), 2.77-2.85 (m, 2H), 3.34 (s, 3H), 6.17 (bd, $^3J_{H,H}$=7.8 Hz, 1H), 6.20 (bd, $^3J_{H,H}$=7.8 Hz, 1H), 6.41 (d, J=1.5 Hz, 1H), 6.44-6.52 (m, 2H), 6.54 (d, J=1.5 Hz, 1H), 6.67-6.79 (m, 5H), 6.89 (d, $^3J_{H,H}$=7.4 Hz, 1H), 6.95 (d, J=1.9 Hz, 1H), 7.16 (bd, $^3J_{H,H}$=7.3 Hz, 1H), 7.29-7.41 (m, 7H), 7.51-7.55 (m, 2H), 7.61 (bd, $^3J_{H,H}$=8.1 Hz, 1H), 7.89 (bd, $^3J_{H,H}$=8.3 Hz, 1H), 8.46 (d, J=1.9 Hz, 1H).

Photoluminescence (in a film, 2% in PMMA):
$\lambda_{max}$=460, 491 nm, CIE: (0.18;0.33)

Example 4

Complex Em2-i:

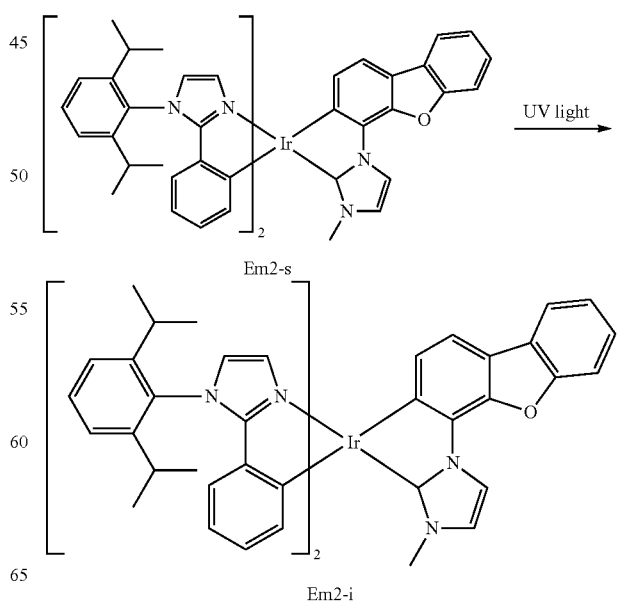

A solution of 0.90 g of complex Em2-s in 200 ml of 3-methoxypropionitrile is irradiated at room temperature with a blacklight blue lamp for 3 h (Osram, L18W/73, $\lambda_{max}$=370-380 nm). The solvent is removed under reduced pressure. The residue is carefully washed with methanol. This gives 0.63 g Em2-i as a yellow powder (70%).

Figure 3:
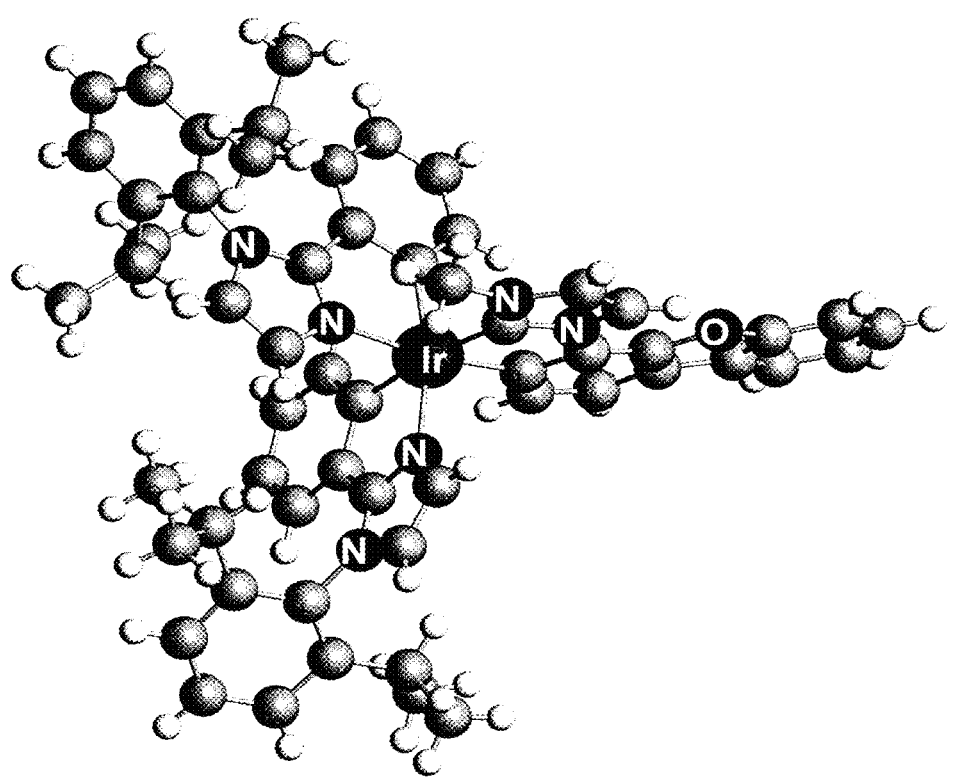
FIG. 3 depicts a crystal structure of Em2-i.

The configuration of Em2-i corresponds to the configuration IVa or IVb of the pseudo-facial isomer S4a or S4b. Em2-1 is present as the racemate; for crystal structure see FIG. 3, the sample for the x-ray structure analysis was crystallized from tetrahydrofuran/n-heptane.

$^1$H NMR (CD$_2$Cl$_2$, 400 MHz):

δ=0.72 (d, $^3J_{H,H}$=6.8 Hz, 3H), 0.85 (d, $^3J_{H,H}$=6.8 Hz, 3H), 0.90 (d, $^3J_{H,H}$=6.8 Hz, 3H), 0.99 (d, $^3J_{H,H}$=6.9 Hz, 3H), 1.02 (d, $^3J_{H,H}$=6.8 Hz, 3H), 1.11 (d, $^3J_{H,H}$=6.9 Hz, 3H), 1.19 (d, $^3J_{H,H}$=7.1 Hz, 3H), 1.21 (d, $^3J_{H,H}$=7.1 Hz, 3H), 1.90 (sept, $^3J_{H,H}$=6.8 Hz, 1H), 2.46 (sept, $^3J_{H,H}$=6.8 Hz, 1H), 2.60 (sept, $^3J_{H,H}$=6.9 Hz, 1H), 2.77 (sept, $^3J_{H,H}$=6.9 Hz, 1H), 3.53 (s, 3H), 6.16 (bd, $^3J_{H,H}$=7.7 Hz, 2H), 6.38-6.56 (m, 5H), 6.65-6.69 (m, 2H), 6.76-6.84 (m, 4H), 6.99 (d, J=1.9 Hz, 1H), 7.22 (d, $^3J_{H,H}$=7.7 Hz, 1H), 7.27-7.37 (m, 6H), 7.49-7.60 (m, 3H), 7.86 (bd, $^3J_{H,H}$=7.2 Hz, 1H), 8.38 (d, J=1.9 Hz, 1H).

Photoluminescence (in a film, 2% in PMMA):

$\lambda_{max}$=462, 490 nm, CIE: (0.17; 0.29)

The photoluminescence quantum yield of the facial isomer Em2-i is 1.44 times the quantum yield of the isomer Em2-s.

Example 5

Complex Em3-s:

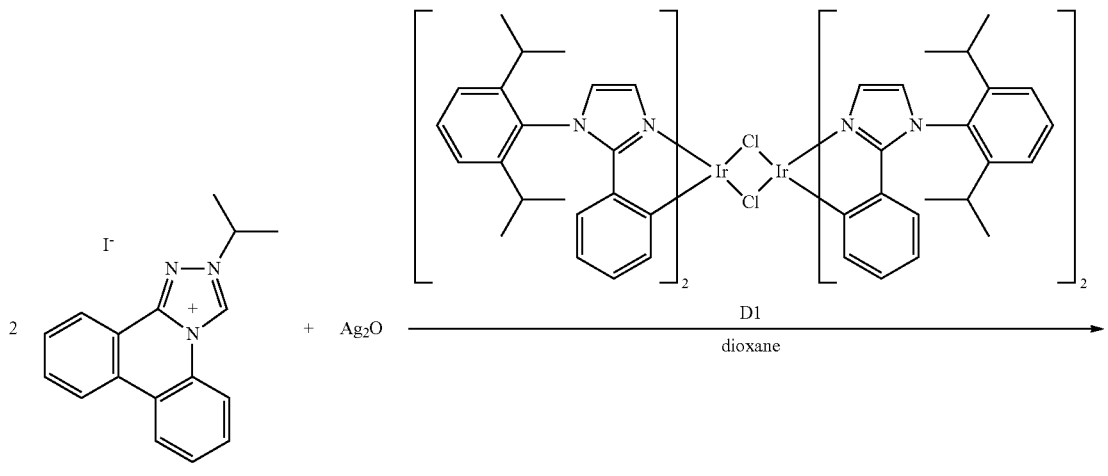

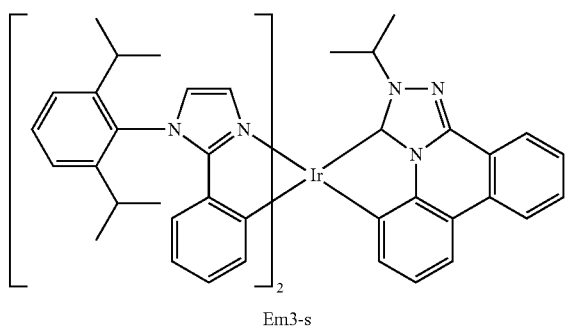

Em3-s 6.0 g (15.5 mmol) of 1-isopropyl-1,2,4-triazolo[4,3-f] phenanthridinium iodide C3 and 2.9 g (12.3 mmol) of Ag₂O are stirred in 400 ml of dioxane at room temperature for 40 h. Subsequently, 2.6 g (1.6 mmol) of chloro dimer D1 are added and the mixture is heated to reflux for 24 h. After cooling to room temperature, the precipitate is filtered off and washed with dichloromethane. The combined filtrates are concentrated to dryness and purified by column chromatography (silica gel, dichloromethane). After drying, 2.1 g of Em3-s are obtained as yellow powder (64%).

¹H NMR (CD₂Cl₂, 500 MHz):

δ=0.79 (d, 3H), 0.89 (d, 3H), 0.90 (d, 3H), 0.97 (d, 6H), 1.02 (d, 3H), 1.10 (d, 3H), 1.15 (d, 3H), 1.16 (d, 3H), 1.47 (d, 3H), 2.03 (sept, 1H), 2.47 (sept, 1H), 2.65 (sept, 1H), 2.76 (sept, 1H), 4.47 (sept, 1H), 6.13 (d, 1H), 6.21 (d, 1H), 6.35 (d, 1H), 6.46 (me, 3H), 6.58 (dd, 2H), 6.65-6.76 (m, 3H), 6.93 (dd, 1H), 7.09 (dd, 1H), 7.15 (d, 1H), 7.25 (dd, 1H), 7.28-7.33 (m, 3H), 7.44-7.52 (m, 2H), 7.58 (dd, 1H), 7.67-7.76 (m, 2H), 8.39 (dd, 1H), 8.43 (d, 1H).

Photoluminescence (in a film, 2% in PMMA):

λ$_{max}$=457, 489 nm, CIE: (0.18; 0.32)

Example 6

Complex Em3-i:

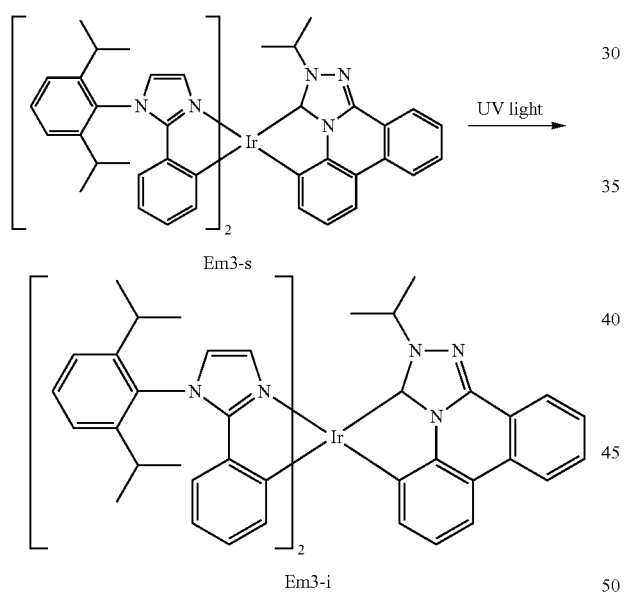

Em3-s

Em3-i

A suspension of 2.1 g of Em3-s in 2000 ml of acetonitrile is irradiated with a moderate-pressure mercury immersion lamp at room temperature for 8 h (TQ150 with Duran sheath). Subsequently, the solvent is removed under reduced pressure. The residue was stirred twice with acetone and filtered. 1.6 g of Em3-i were obtained as a yellow powder (76%).

¹H NMR (CD₂Cl₂, 500 MHz):

δ=0.68 (d, 3H), 0.75 (d, 3H), 0.82 (d, 3H), 0.96 (d, 3H), 0.99 (d, 3H), 1.05 (d, 3H), 1.13 (d, 3H), 1.20 (d, 3H), 1.24 (d, 3H), 1.60 (d, 3H), 1.79 (sept, 1H), 2.42 (sept, 1H), 2.51 (sept, 1H), 2.76 (sept, 1H), 4.56 (sept, 1H), 6.10 (dd, 2H), 6.30-6.35 (m, 1H), 6.38-6.45 (m, 2H), 6.53 (d, 1H), 6.61 (dd, 1H), 6.68 (d, 1H), 6.73 (d, 1H), 6.74-6.78 (m, 2H), 6.79 (d, 1H), 6.96 (dd, 1H), 7.07-7.15 (m, 1H), 7.19 (d, 1H), 7.22 (d, 1H), 7.27-7.34 (m, 3H), 7.47 (dd, 1H), 7.49 (dd, 1H), 7.66-7.72 (m, 2H), 8.34 (d, 1H), 8.40 (d, 1H).

Photoluminescence (in a film, 2% in PMMA):

λ$_{max}$=456, 487 nm, CIE: (0.19; 0.32)

The photoluminescence quantum yield of the isomer Em3-i is 1.21 times the quantum yield of the isomer Em3-s.

Example 7

4-Methyl-1.3-diphenyl-1H-[1,2,4]-triazolium Iodide C4

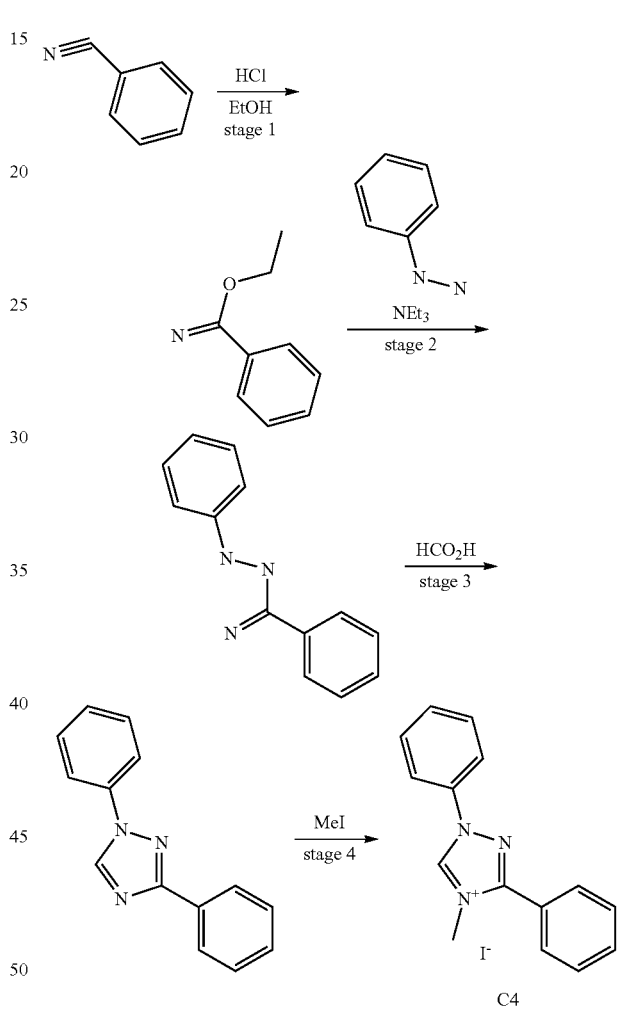

C4

Stage 1: Benzonitrile (51.5 g, 0.50 mol) is admixed with ethanol (anhydrous, 25 ml). Then a constant stream of HCl gas is introduced over 2 h and the mixture is subsequently stirred at room temp. for 48 h, in the course of which a solid forms. The solvent is drawn off from the reaction mixture under reduced pressure (95 g).

Stages 2+3: 12 g of stage 1 (64.6 mmol) are again dissolved in EtOH (120 ml), and phenylhydrazine (9.4 g, 84 mmol, 1.3 equiv.) is added, in the course of which a solid forms. Triethylamine (22 ml, 162 mmol, 2.5 equiv.) is added and then the mixture is stirred at room temp. for 16 h. The solvent is again removed from the reaction mixture under reduced pressure at room temp., such that the amidrazone formed remains, still moist. After the addition of formic acid (200 ml), the mixture is heated to reflux for 3.5 h. After a further 48 h at room temp., the mixture is cautiously added to an aq. potassium carbonate solution (44%, 900 ml), cooled to 0° C. After the addition of $CH_2Cl_2$ (500 ml), the phases are separated, and the organic phase is dried over $Na_2SO_4$ and concentrated under reduced pressure. The sample is recrystallized from dichloromethane/petroleum ether, from which slightly contaminated product is obtained (5.5 g, 40%). The mother liquor is column-filtered ($CH_2Cl_2$/n-hexane), from which a further batch of clean product is obtained (1.7 g, 12%).

Stage 4: The triazole of the preceding stage (1.5 g, 66 mmol) is dissolved in THF (anhydrous, 40 ml), admixed with MeI (14 ml) and heated to reflux for 5 days. The solid obtained is filtered off, recrystallized repeatedly ($CH_2Cl_2$/n-hexane) and dried (780 mg, 32%).

$^1$H NMR (400 MHz, $CD_2Cl_2$):

δ=4.26 (s, 3H), 7.53-7.71 (m, 6H), 7.74-7.76 (m, 2H), 8.09-8.11 (m, 2H), 12.27 (s, 1H).

Complex Em4-s:

0.40 g (1.1 mmol) of imidazolium iodide C4 and 0.13 g (0.56 mmol) of $Ag_2O$ are stirred in 50 ml of anhydrous acetonitrile at room temperature for 18 h. Then a solution of 0.61 g (0.37 mmol) of chloro dimer D1 in 25 ml of anhydrous acetonitrile is added. Thereafter, the mixture is heated to reflux for 6 h and then stirred at room temperature for another 16 h. After cooling, the reaction solution is filtered. The filtrate is freed of the solvent under reduced pressure. After washing the residue with methanol, 0.2 g of the complex Em4-s is obtained as a yellow powder (26%).

$^1$H NMR (500 MHz, $CD_2Cl_2$):

δ=0.91 (d, $^3J_{H,H}$=6.9 Hz, 3H), 0.95 (d, $^3J_{H,H}$=7.1 Hz, 3H), 0.97 (d, $^3J_{H,H}$=7.1 Hz, 3H), 0.98 (d, $^3J_{H,H}$=6.8 Hz, 3H), 1.00 (d, $^3J_{H,H}$=6.9 Hz, 3H), 1.05 (d, $^3J_{H,H}$=6.9 Hz, 3H), 1.20 (d, $^3J_{H,H}$=6.9 Hz, 3H), 1.21 (d, $^3J_{H,H}$=6.9 Hz, 3H), 2.17 (sept, $^3J_{H,H}$=6.8 Hz, 1H), 2.40 (sept, $^3J_{H,H}$=6.9 Hz, 1H), 2.75-2.82 (m, 2H), 3.36 (s, 3H), 6.17 (bt, $^3J_{H,H}$=7.0 Hz, 2H), 6.43-6.50 (m, 3H), 6.62 (d, J=1.5 Hz, 1H), 6.66-6.82 (m, 6H), 6.88 (dd, $^3J_{H,H}$=7.1 Hz, J=1.3 Hz, 1H), 6.96 (dt, $^3J_{H,H}$=7.4 Hz, J=1.5 Hz, 1H), 7.08 (bd, $^3J_{H,H}$=6.7 Hz, 1H), 7.31-7.37 (m, 4H), 7.51-7.59 (m, 6H), 7.69-7.72 (m, 2H).

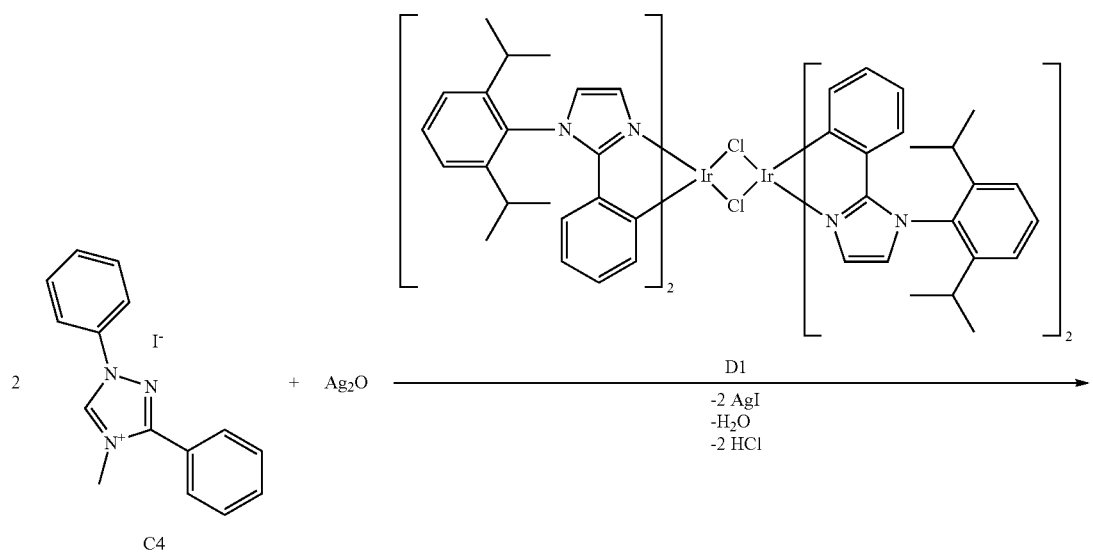

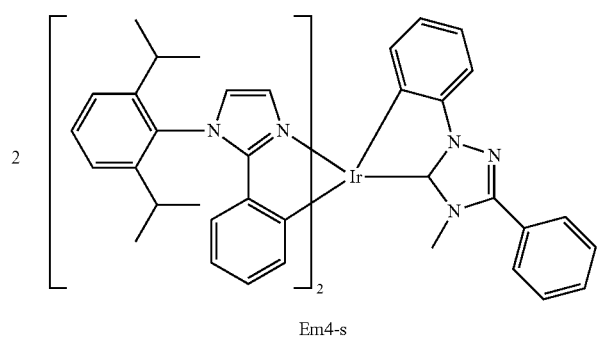

Em4-s

Photoluminescence (in a film, 2% in PMMA):

$\lambda_{max}$=458, 488 nm, CIE: (0.19; 0.33)

Example 8

Complex Em4-i:

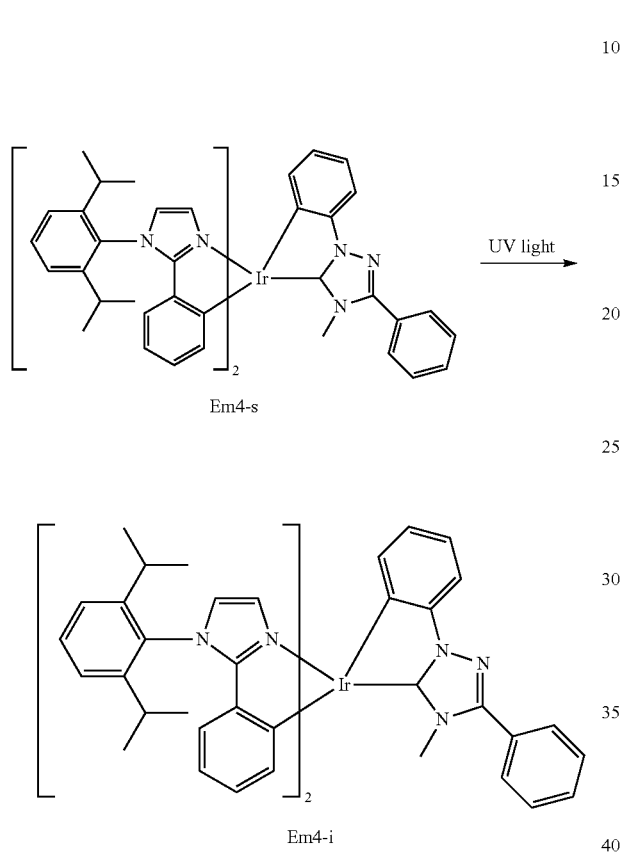

A solution of 0.15 g of complex Em4-s in 200 ml of 3-methoxypropionitrile is irradiated with a blacklight blue lamp at room temperature for 2 h (Osram, L18W/73, $\lambda_{max}$=370-380 nm). The solvent is removed under reduced pressure. The residue is carefully washed with methanol. This gives 0.05 g Em4-i as a yellow powder (33%).

$^1$H NMR (500 MHz, CD$_2$Cl$_2$):

δ=0.71 (d, $^3J_{H,H}$=6.9 Hz, 3H), 0.84 (d, $^3J_{H,H}$=6.8 Hz, 3H), 0.88 (d, $^3J_{H,H}$=6.9 Hz, 3H), 1.03 (d, $^3J_{H,H}$=6.8 Hz, 3H), 1.06 (d, $^3J_{H,H}$=6.7 Hz, 3H), 1.07 (d, $^3J_{H,H}$=6.8 Hz, 3H), 1.18 (d, $^3J_{H,H}$=6.9 Hz, 3H), 1.19 (d, $^3J_{H,H}$=6.9 Hz, 3H), 1.89 (sept, $^3J_{H,H}$=6.8 Hz, 1H), 2.50 (sept, $^3J_{H,H}$=6.9 Hz, 1H), 2.58 (sept, $^3J_{H,H}$=6.9 Hz, 1H), 2.73 (sept, $^3J_{H,H}$=6.9 Hz, 1H), 6.17 (bd, $^3J_{H,H}$=7.8 Hz, 2H), 6.42-6.52 (m, 3H), 6.60 (dt, $^3J_{H,H}$=7.6 Hz, J=1.3 Hz, 1H), 6.64-6.70 (m, 4H), 6.76-6.78 (m, 2H), 6.81 (d, J=61.4 Hz, 1H), 6.91-6.94 (m, 2H), 7.27-7.38 (m, 4H), 7.50-7.56 (m, 6H), 7.75-7.77 (m, 2H).

Photoluminescence (in a film, 2% in PMMA):

$\lambda_{max}$=456, 488 nm, CIE: (0.19; 0.33)

The photoluminescence quantum yield of the isomer Em4-i has 1.40 times the quantum yield of the isomer Em4-s.

Example 9

3,4-Diphenyl-1-o-tolyl-4H-[1,2,4]-triazolium Iodide
C5

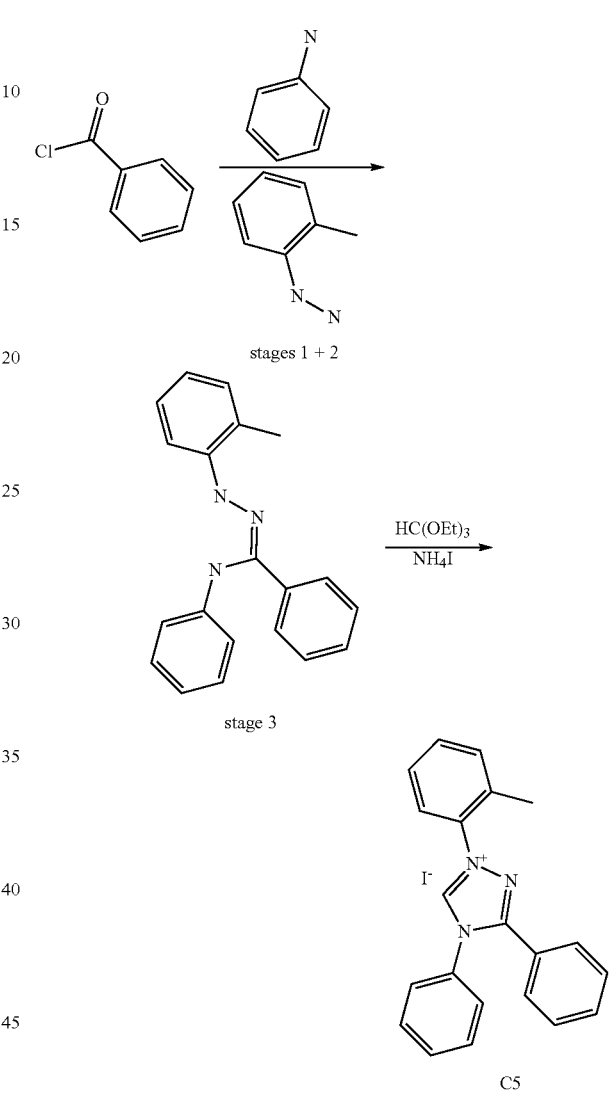

Stage 1: Aq. NaHCO$_3$ solution (5%, 330 g, 190 mmol, 2.0 equiv.) is added at room temp. to a suspension of o-tolyl-hydrazine hydrochloride (15 g, 97 mmol) in methyl chloride (450 ml). After stirring for 30 minutes, the biphasic solution is phase-separated. The organic phase is dried over Na$_2$SO$_4$, freed of the solvent and dried under reduced pressure at 60° C. to isolate tolylhydrazine as a pale yellow solid (7.3 g, 62%).

Stage 2: Benzoyl chloride (8.4 g, 60 mmol, 1.0 equiv.) is initially charged in toluene (anhydrous, 60 ml) and cooled to 5° C. Then aniline (5.6 g, 60 mmol, 1.0 equiv.) is added, and the reaction mixture is heated to reflux for 16 h and then stirred at room temp. for a further 48 h. Then the mixture is heated to 80° C., thionyl chloride (21.4 g, 180 mmol, 3.0 equiv.) is added at this temperature and the mixture is stirred for a further 2 h. Then the mixture is cooled to room temp. and the excess thionyl chloride is drawn off under reduced pressure. The reaction mixture is admixed with THF (anhydrous, 180 ml) and triethylamine (9.1 g, 90 mmol, 1.5 equiv.) and cooled to 5° C., and then the tolylhydrazine of stage 1 (7.3 g, 60 mmol), dissolved in THF (20 ml), is added. The mixture is stirred at room temperature for 16 h. After the removal of the solvent, the residue is recrystallized from acetic acid (2%, 150 ml), washed with iPrOH (80 ml, 20 ml) and dried (10.3 g, 57%).

Stage 3: Triethyl orthoformate (9.0 ml, 8.1 g, 56 mmol, 5.6 equiv.) and 3 g of the hydrazone of stage 2 (10 mmol) are initially charged, ammonium iodide (1.4 g, 10 mmol, 1.0 equiv.) is added and the suspension is heated to reflux for 7 h. After cooling, the solid is filtered off with suction and washed repeatedly with n-hexane and ethyl acetate, from which the iodide salt is obtained as a gray powder (3.2 g, 73%).

$^1$H NMR (400 MHz, DMSO):

δ=2.55 (s, 3H), 7.47-7.90 (m, 14H), 11.07 (s, 1H).

Complex Mixture Em5-s:

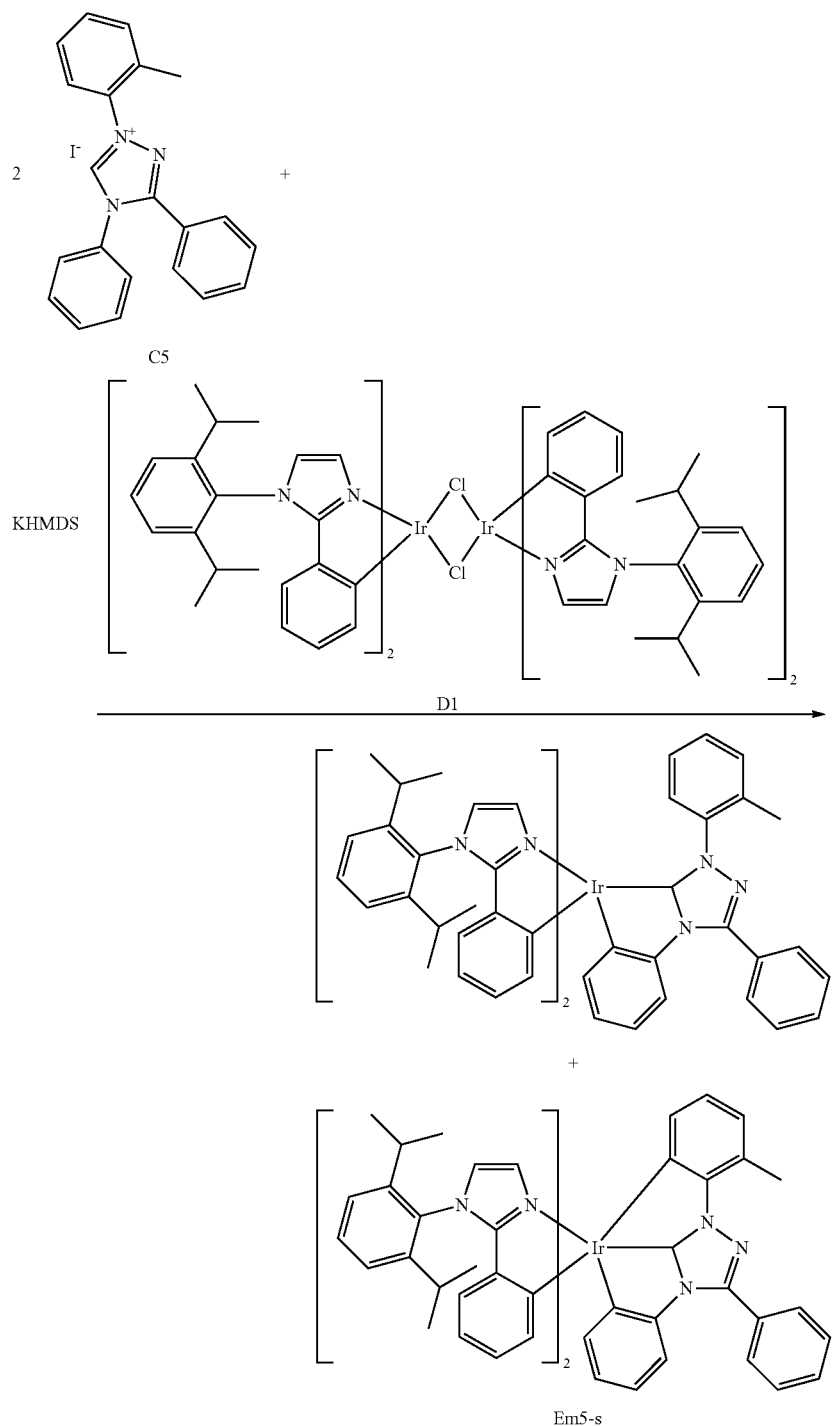

1.12 g (2.5 mmol) of imidazolium iodide C5 are suspended in 100 ml of anhydrous toluene. At 0° C., 8.2 ml (4.1 mmol) of potassium bis(trimethylsilyl)amide (0.5M in toluene) are added dropwise within 5 min. The solution formed is allowed to warm up to 10° C. and admixed with a suspension of 1.42 g (0.85 mmol) of chloro dimer D1 and 75 ml of anhydrous toluene. The reaction mixture is heated to 90° C. and stirred at this temperature for 2 h. After cooling, the precipitate is removed. The filtrate is washed successively with 3×30 ml of aqueous NaHCO$_3$ solution and 1×30 ml of water, dried over MgSO$_4$ and freed of the solvent under reduced pressure. The residue is purified by column chromatography (solvent: cyclohexane/acetone=4/1). This gives 1.2 g (63%) Em5-s as a mixture of two cyclometalation isomers.

Photoluminescence (in a film, 2% in PMMA):
$\lambda_{max}$=461, 489 nm, CIE: (0.19; 0.33)

Example 10

Complex Mixture Em5-i:

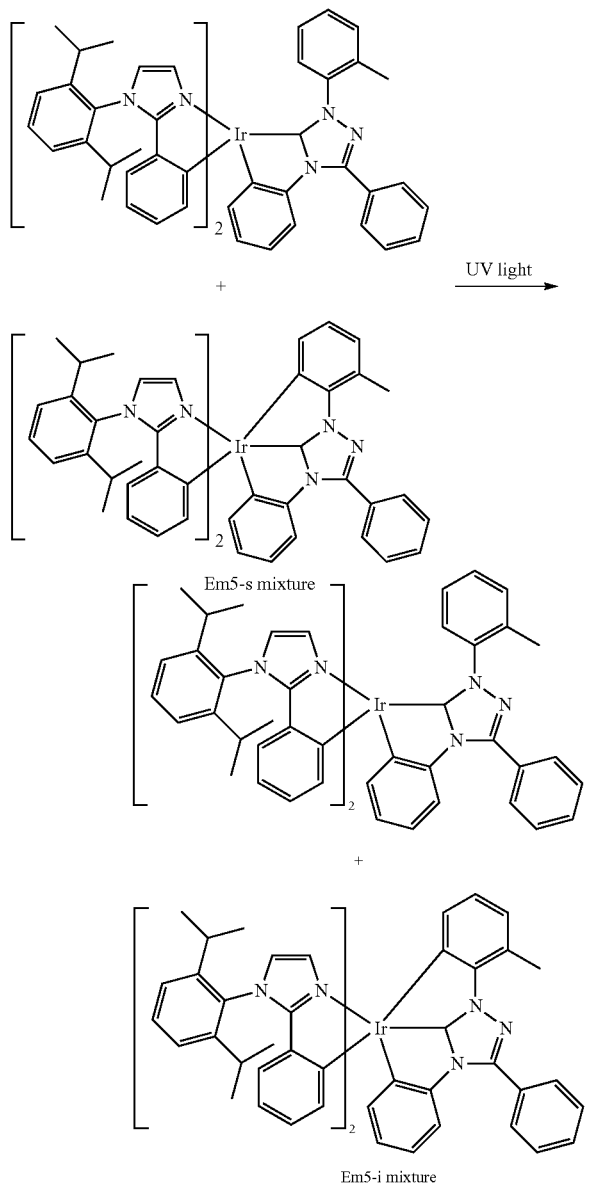

A solution of 0.60 g of Em5-s complex mixture in 200 ml of 3-methoxypropionitril is irradiated with a blacklight blue lamp at room temperature for 7 h (Osram, L18W/73, $\lambda_{max}$=370-380 nm). The solvent is removed under reduced pressure. The residue is carefully washed with methanol. This gives 0.10 g of Em5-i as a pale yellow powder (17%, again mixture of two cyclometalation isomers).

MS (Maldi):
m/e=1110 (M+H)$^+$
Photoluminescence (in a film, 2% in PMMA):
$\lambda_{max}$=456,487 nm, CIE: (0.20; 0.34)

The photoluminescence quantum yield of the isomerized Em5-i complex mixture has 1.50 times the quantum yield of the Em5-s complex mixture.

Example 11

1-Methyl-2-phenyl-1H-imidazole L-2

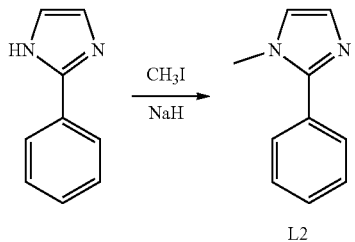

13.0 g (90 mmol) of 2-phenylimidazole are dissolved in 600 ml of DMF, admixed slowly with 4.0 g (100 mmol) of sodium hydride (60% in mineral oil) and stirred at room temperature for 30 min. Then 14.0 g (99 mmol) of methyl iodide are added. The reaction mixture is stirred at room temperature for 1.5 h and then admixed cautiously with 350 ml of water. The mixture is extracted with 2×200 ml of ethyl acetate. The extract is dried over sodium sulfate and concentrated. This gives 12.0 g (84%) L2.

$^1$H NMR (400 MHz, CD$_2$Cl$_2$):
δ=3.74 (s, 3H), 7.00 (s, 1H), 7.05 (s, 1H), 7.40-7.43 (m, 1H), 7.45-7.48 (m, 2H), 7.62-7.63 (m, 2H).

µ-Dichloro Dimer D2:

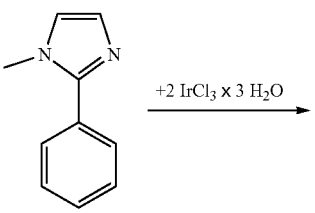

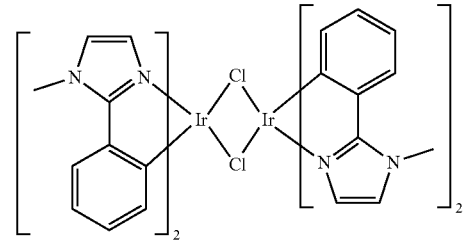

The synthesis is performed analogously to D1. The precipitate obtained is extracted with dichloromethane. After removing the solvent, D2 is obtained from the extract in a yield of 36%.

¹H NMR (CD₂Cl₂, 400 MHz):

δ=4.13 (s, 12H), 6.05 (d, ³J$_{H,H}$=7.7 Hz, 4H), 6.55 (t, ³J$_{H,H}$=7.5 Hz, 4H), 6.74 (t, ³J$_{H,H}$=7.5 Hz, 4H), 6.94 (s, 4H), 7.27 (s, 4H), 7.37 (d, ³J$_{H,H}$=7.7 Hz, 4H).

Complex Em6-s:

cessively with 3×500 ml of saturated NaHCO₃ solution and 1×500 ml of distilled water, dried over Na₂SO₄ and freed of the solvent under reduced pressure. The residue is purified by column chromatography (cyclohexane/acetone=5/1). This gives 118 mg of the complex Em6-s (8%).

¹H NMR (CD₂Cl₂, 400 MHz):

δ=3.95 (s, 3H), 4.03 (s, 3H), 6.00 (bd, ³J$_{H,H}$=7.3 Hz, 1H), 6.23 (bt, ³J$_{H,H}$=7.3 Hz, 1H), 6.27 (d, J=1.5 Hz, 1H), 6.47

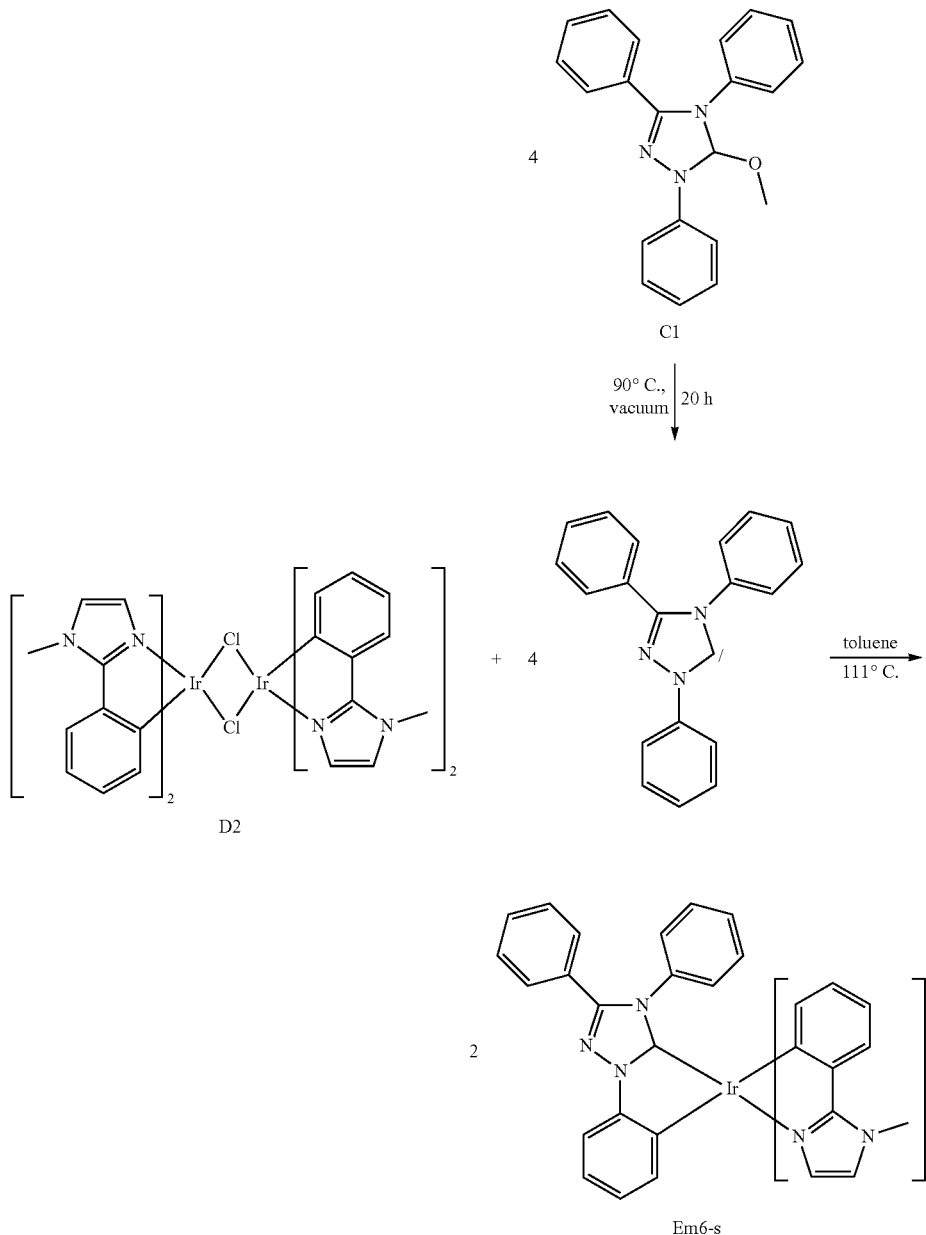

1.20 g (3.6 mmol) of 5-methoxy-1,3,4-triphenyl-4,5-dihydro-1H-1,2,4-triazole C1 are heated to 90° C. under reduced pressure for 20 h. After cooling to room temperature, first 1.2 l of anhydrous toluene and then 0.99 g (0.9 mmol) of chloro dimer D2 are added. The mixture is heated to reflux for 8 h. The precipitate formed is filtered off. The filtrate is concentrated to approx. 800 ml and washed suc- (bd, ³J$_{H,H}$=7.1 Hz, 1H), 6.51 (d, J=1.5 Hz, 1H), 6.60 (bt, ³J$_{H,H}$=7.5 Hz, 1H), 6.67-6.72 (m, 4H), 6.79-6.88 (m, 6H), 6.95 (dt, ³J$_{H,H}$=7.5 Hz, J=1.5 Hz, 1H), 7.05 (bt, ³J$_{H,H}$=7.5 Hz, 1H), 7.24-7.27 (m, 2H), 7.33-7.36 (m, 4H), 7.47 (bd, ³J$_{H,H}$=6.8 Hz, 1H), 7.61 (bd, ³J$_{H,H}$=6.9 Hz, 1H).

Photoluminescence (in a film, 2% in PMMA):

λ$_{max}$=456, 486 nm, CIE: (0.21; 0.33)

Example 12

Complex Em7-s:

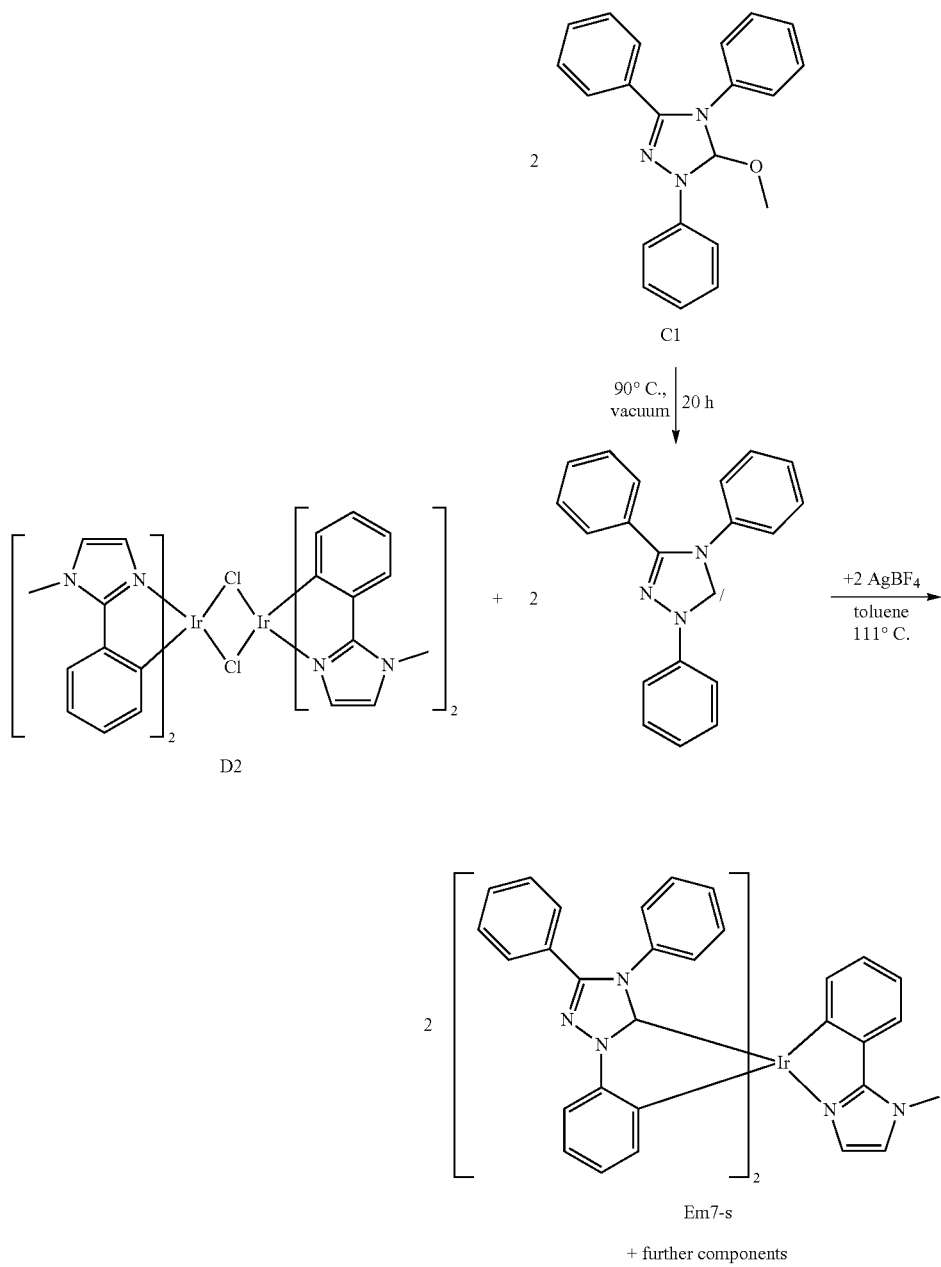

+ further components 0.67 g (2.0 mmol) of 5-methoxy-1,3,4-triphenyl-4,5-dihydro-1H-1,2,4-triazole C1 are heated to 90° C. under reduced pressure for 20 h. After cooling to room temperature, the residue is dissolved in 50 ml of anhydrous toluene and added to a suspension of 1.00 g (0.9 mmol) of chloro dimer D2 and 0.36 g (1.9 mmol) of AgBF$_4$ in 1.2 l of anhydrous toluene. The mixture is stirred under reflux for 8 h. The precipitate formed is filtered off. The filtrate is concentrated to approx. 800 ml and washed successively with 3×500 ml of saturated NaHCO$_3$ solution and 1×500 ml of distilled water, dried over Na$_2$SO$_4$ and freed of the solvent under reduced pressure. The residue is purified by column chromatography (cyclohexane/acetone=5/1). This gives 70 mg of the complex Em7-s (5%).

MS (Maldi):
m/e=943 (M+H)$^+$
$^1$H NMR (CD$_2$Cl$_2$, 400 MHz):
δ=3.70 (s, 3H), 5.86 (d, J=1.3 Hz, 1H), 5.96 (bd, $^3J_{H,H}$=8.1 Hz, 2H), 6.10 (d, J=1.3 Hz, 1H), 6.56 (bd, $^3J_{H,H}$=7.2 Hz, 1H), 6.72-6.75 (m, 4H), 6.80 (bt, $^3J_{H,H}$=7.3 Hz, 1H), 6.86-6.92 (m, 3H), 6.94 (bt, $^3J_{H,H}$=7.5 Hz, 1H), 7.02-7.12 (m, 5H), 7.19-7.40 (m, 13H), 7.56 (bd, $^3J_{H,H}$=7.7 Hz, 1H), 7.70 (bd, $^3J_{H,H}$=7.0 Hz, 1H).

Photoluminescence (in a film, 2% in PMMA):
λ$_{max}$=476, 502 nm, CIE: (0.22; 0.37)

Example 13

Complex Em7-s*:

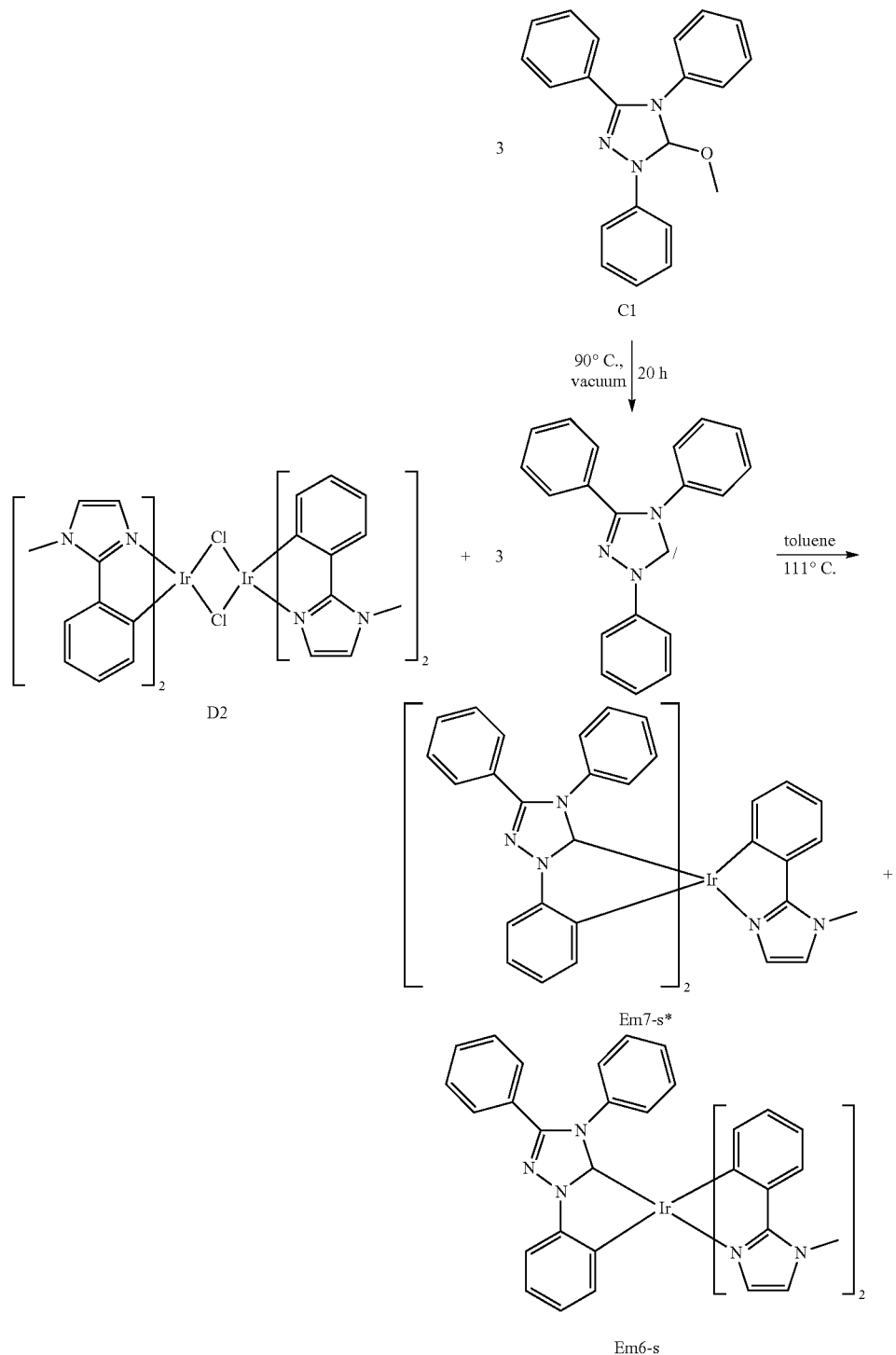

0.90 g (2.7 mmol) of 5-methoxy-1,3,4-triphenyl-4,5-dihydro-1H-1,2,4-triazole C1 are heated to 90° C. under reduced pressure for 20 h. After cooling to room temperature, first 800 ml of anhydrous toluene and then 0.99 g (0.9 mmol) of chloro dimer D2 are added. The mixture is stirred under reflux for 3 h. The precipitate formed is filtered off. The filtrate is washed successively with 3×50 ml of saturated NaHCO₃ solution and 1×50 ml of distilled water, dried over MgSO₄ and freed of the solvent under reduced pressure. The residue is purified by column chromatography (cyclohexane/acetone=2/1). As well as 50 mg of the complex Em6-s, 150 mg of the complex Em7-s* are obtained.

$^1$H NMR (CD$_2$Cl$_2$, 500 MHz):

δ=3.86 (s, 3H), 5.95 (bd, $^3J_{H,H}$=7.3 Hz, 2H), 6.23 (bd, J=1.4 Hz, 1H), 6.38 (bt, $^3J_{H,H}$=7.3 Hz, 1H), 6.44 (bd, $^3J_{H,H}$=7.3 Hz, 1H), 6.54 (bt, $^3J_{H,H}$=7.5 Hz, 1H), 6.61-6.67 (m, 4H), 6.78-6.91 (m, 5H), 6.96 (bt, $^3J_{H,H}$=7.5 Hz, 1H), 7.07-7.13 (m, 4H), 7.19-7.36 (m, 12H), 7.53 (bd, $^3J_{H,H}$=7.0 Hz, 1H), 7.76 (bd, $^3J_{H,H}$=7.3 Hz, 1H).

Photoluminescence (in a film, 2% in PMMA):
λ$_{max}$=482, 508 nm, CIE: (0.24; 0.40)

Example 14

μ-Dichloro Dimer D3

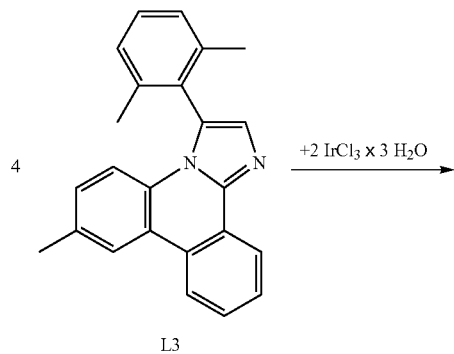

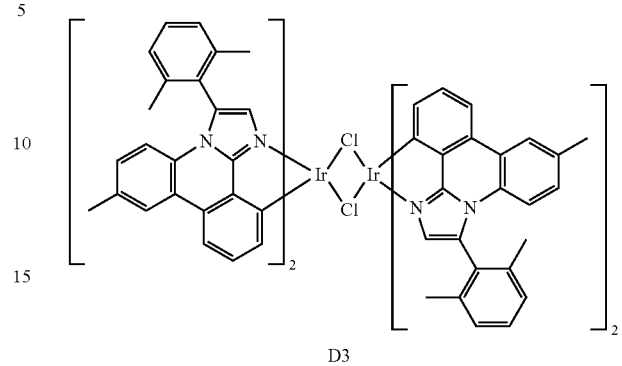

The synthesis is performed analogously to D1. Yield: 87%.

$^1$H NMR (CD$_2$Cl$_2$, 400 MHz):

δ=2.21 (s, 12H), 2.28 (s, 12H), 2.44 (s, 12H), 6.38 (d, $^3J_{H,H}$=7.4 Hz, 4H), 7.09 (d, $^3J_{H,H}$=8.7 Hz, 4H), 7.19 (m, 4H), 7.30 (bd, $^3J_{H,H}$=8.7 Hz, 4H), 7.42 (m, 8H), 7.55 (m, 4H), 7.86 (s, 4H), 8.00 (d, $^3J_{H,H}$=8.4 Hz, 4H), 8.48 (bs, 4H).

Complex Em8-s:

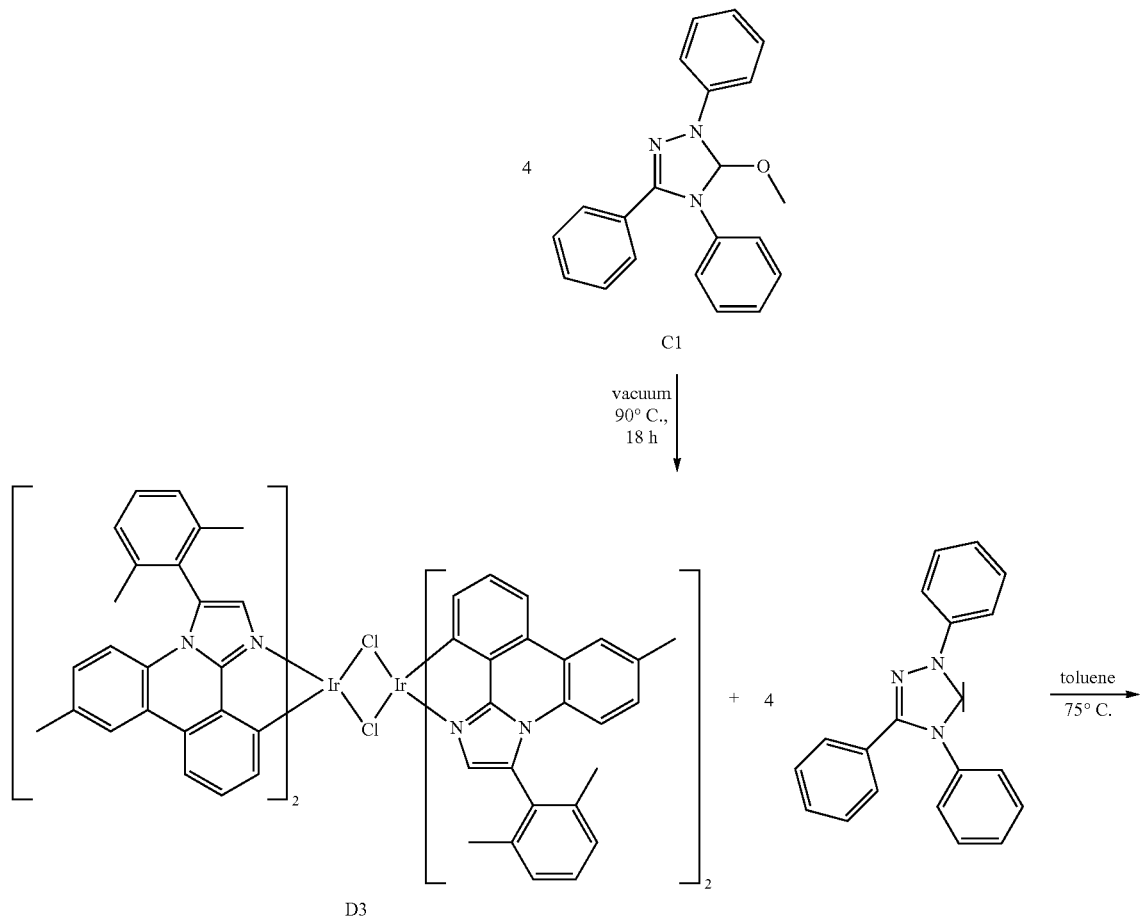

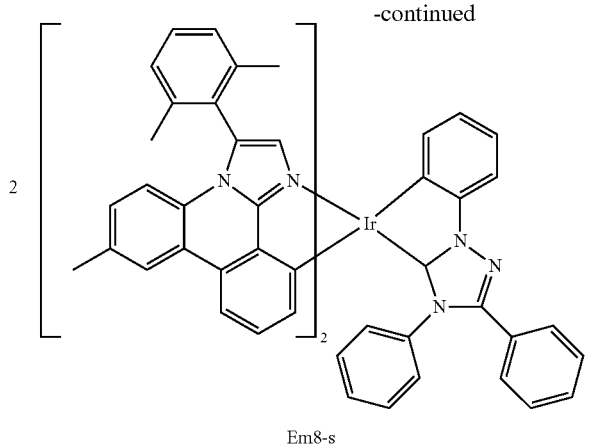

Em8-s

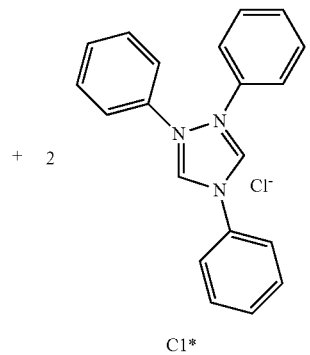

C1*

0.37 g (1.1 mmol) of 5-methoxy-1,3,4-triphenyl-4,5-dihydro-1H-1,2,4-triazole C1 are heated to 90° C. under reduced pressure for 18 h. After cooling to room temperature, first 120 ml of anhydrous toluene and then 0.50 g (0.28 mmol) of chloro dimer D3 are added. The mixture is heated to 75° C. for 3 h. The white precipitate formed is filtered off. The filtrate is washed with 3×30 ml of saturated NaHCO$_3$ solution and 1×30 ml of distilled water, dried over MgSO$_4$ and freed of the solvent under reduced pressure. The residue is purified by column chromatography (silica gel, ethyl acetate:cyclohexane=1:5). This gives 0.19 g of the complex Em8-s (28%).

$^1$H NMR (CD$_2$Cl$_2$, 500 MHz):

δ=2.03 (s, 3H), 2.10 (s, 3H), 2.20 (s, 3H), 2.28 (s, 3H), 2.44 (s, 3H), 2.48 (s, 3H), 6.21 (d, $^3J_{H,H}$=7.6 Hz, 1H), 6.63-7.39 (m, 28H), 7.45 (d, $^3J_{H,H}$=7.9 Hz, 1H), 7.67 (d, $^3J_{H,H}$=7.9 Hz, 1H), 7.70 (d, $^3J_{H,H}$=7.6 Hz, 1H), 8.21 (bs, 2H).

Photoluminescence (in a film, 2% in PMMA):

$\lambda_{max}$=456 nm, CIE: (0.24; 0.29)

Example 15 (Comparative Example, Noninventive)

Complex CEm1:

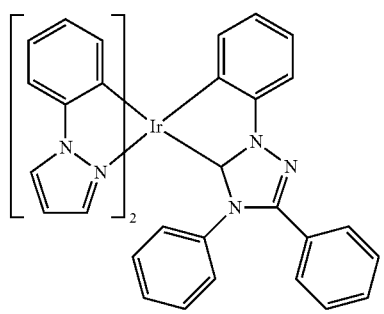

CEm1

CEm1 corresponds to compound (N-3) from WO 2006067074

The synthesis is analogous to WO 2006067074.

$\lambda_{PL}$ (PMMA): 472 nm, 491 nm, quantum yield$_{PL}$: 2%

Owing to its very low phosphorescence quantum yield, complex CEm1 is not suitable as an emitter in OLEDs.

Example 16 (Comparative Example, Noninventive)

Complex CEm2:

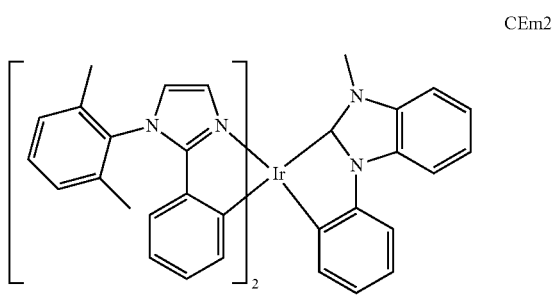

CEm2

CEm2 corresponds to the compound "Compound 3" from WO 2006121811. The synthesis was analogous WO 2006121811.

Example 17

Production of an OLED—Comparison of Different Emitters

The ITO substrate used as the anode is cleaned first with commercial detergents for LCD production (Deconex® 20NS, and 25ORGAN-ACID® neutralizing agent) and then in an acetone/isopropanol mixture in an ultrasound bath. To eliminate possible organic residues, the substrate is exposed to a continuous ozone flow in an ozone oven for a further 25 minutes. This treatment also improves the hole injection properties of the ITO. Next, the hole injection layer AJ20-1000 from Plexcore respectively PEDT: PSS (CLEVIOS P AR 4083) from H. C. Starck Is spun on from solution.

Thereafter, the organic materials specified below are applied by vapor deposition to the cleaned substrate at about $10^{-7}$-$10^{-9}$ mbar at a rate of approx. 0.5-5 nm/min. The hole conductor and exciton blocker applied to the substrate is Ir(DPBIC)$_3$ with a thickness of 45 nm, of which the first 35 nm are doped with MoO$_x$ to improve the conductivity,

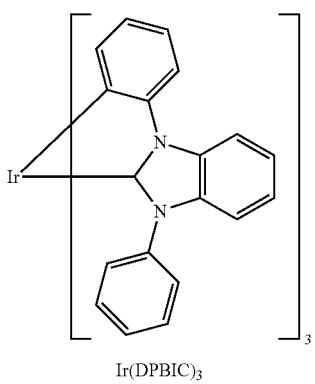

Ir(DPBIC)₃

(for preparation see Ir complex (7) in the application PCT/EP/04/09269).

Subsequently, a mixture of emitter and of the compound Ma1 is applied by vapor deposition with a thickness of 40 nm, the latter compound functioning as a matrix material. Subsequently, the material Ma1 is applied by vapor deposition with a thickness of 10 nm as an exciton and hole blocker.

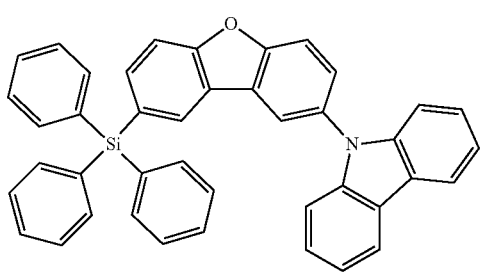

Ma1

Next, an electron transporter BCP (2,9-dimethyl-4,7-diphenyl-1,10-phenanthroline) is applied by vapor deposition in a thickness of 20 nm, as are a 0.75 nm-thick lithium fluoride layer and finally a 100 nm-thick Al electrode. All components are adhesive-bonded to a glass lid in an inert nitrogen atmosphere.

To characterize the OLED, electroluminescence spectra are recorded at different currents and voltages. In addition, the current-voltage characteristic is measured in combination with the light output emitted. The light output can be converted to photometric parameters by calibration with a photometer. The lifetime $t_{1/2}$ of the diode is defined by the time taken for the luminance to fall to 50% of its initial value. The lifetime measurement is carried out at a constant current.

For the different emitters in the above-described OLED structure, the following electrooptical data are obtained:

| Emitter | CIE | Cd/A @ 300 nits | $t_{1/2}$ @ 1000 nits (normalized to the value of CEm2) |
| --- | --- | --- | --- |
| Em1-i | 0.22/0.37 | 23.2 cd/A | 594% |
| Em3-i | 0.18/0.28 | 19.5 cd/A | 135% |
| Em2-i | 0.17/0.25 | 24.5 cd/A | 245% |
| CEm2 | 0.20/0.35 | 10.3 cd/A | 100% |

Example 18

Comparison of Different Isomers of One Emitter

By way of example, the influence of the different isomers on the OLED performance is shown in two cases. For the different emitters and isomers in the above-described OLED structure, the following electrooptical data are obtained:

| Emitter | CIE | Cd/A @ 300 nits | $t_{1/2}$ @ 1000 nits (normalized to the value of Em1-s) |
| --- | --- | --- | --- |
| Em1-s | 0.19/0.31 | 18.2 cd/A | 100% |
| Em1-i | 0.22/0.37 | 23.2 cd/A | 406% |

| Emitter | CIE | Cd/A @ 300 nits | $t_{1/2}$ @ 1000 nits (normalized to the value of Em2-s) |
| --- | --- | --- | --- |
| Em2-s | 0.21/0.35 | 15.4 cd/A | 100% |
| Em2-i | 0.17/0.25 | 24.5 cd/A | 178% |

Example 19

Influence of a Mixed Electron Conductor Layer

The example which follows shows the influence of the doping of the BCP electron conductor layer with Liq.

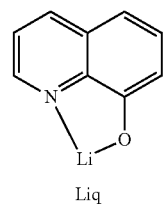

Liq

The following OLED structure is used:

ITO—40 nm AJ20—1000—35 nm Ir(DPBIC)₃ mixed with MoO$_x$—10 nm Ir(DPBIC)₃—40 nm Ma1 mixed with 20 wt % Em1-i—5 nm Ma1—40 nm electron conductor—1 nm Liq-100 nm Al. The preparation of the OLED is carried out in analogy to Example 17.

| Electron conductor | CIE | Cd/A @ 300nits | $t_{1/2}$ @ 1000 nits (normalized to the value of BCP) |
| --- | --- | --- | --- |
| BCP | 0.22/0.36 | 16.8 cd/A | 100% |
| BCP:Liq 50% | 0.21/0.36 | 21.7 cd/A | 170% |

Example 20

Complex Em9-s:

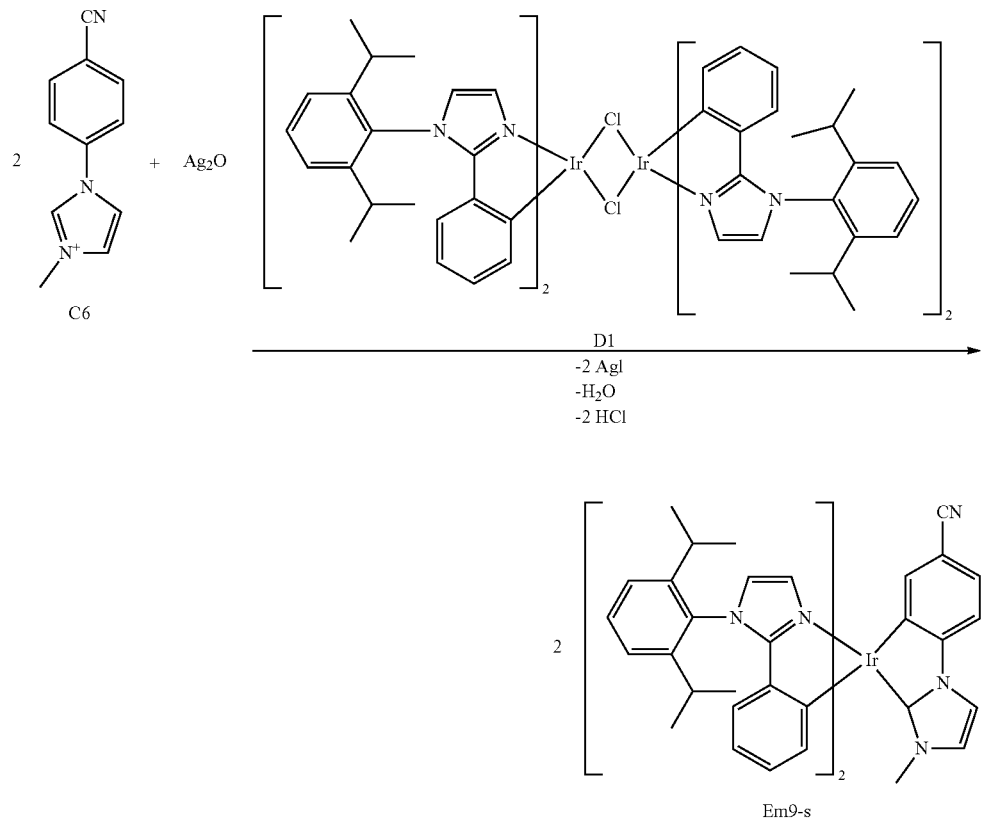

Imidazoliumiodide C6 corresponds to a pre-intermediate of the compound "example 1" in WO 2006056418. The synthesis is carried out in analogy to the synthesis of the compound "example 1" in WO 2006056418.

2.0 g (6.4 mmol) of imidazoliumiodide C6 and 0.75 g (3.2 mmol) Ag$_2$O are stirred in 170 ml anhydrous acetonitrile for 4 h at 50° C. The solvent is then removed in vacuo.

To the residue 170 ml anhydrous toluene is added and 3.6 g (2.1 mmol) chlorodimer D1 are added. Subsequently it is heated under reflux for 24 h. After cooling the reaction mixture is filtered. The filtrate is freed from solvent in vacuo. To the residue methylene chloride is added, washed with water, reduced after drying and purified by chromatography (cyclohexane/acetic ester), where by 0.26 g Em9-s are isolated (6%) and 0.63 g of a mixed fraction of complex Em9-s with not complexed phenylimidazol-ligand as well as 0.10 mg of a further complex with inverse ligand stoichiometry. Further 1.3 g of chlorodimer D1 (36%) are reisolated.

$^1$H-NMR (CD$_2$Cl$_2$, 400 MHz):

δ=0.83 (d, 3H), 0.89-0.96 (m, probably interpreted as 4×d, 12H), 1.00 (d, 3H), 1.13 (d, 3H), 1.15 (d, 3H), 1.98 (sept, 1H), 2.31 (sept, 1H), 2.70 (sept, 1H), 2.74 (sept, 1H), 3.21 (s, 3H), 6.10 (dd, 2H), 6.37-6.45 (m, 4H), 6.56-6.65 (m, 4H), 6.70 (dd, 1H), 6.83 (me, 1H), 6.95 (d, 1H), 7.06 (me, 1H), 7.19 (me, 2H), 7.25-7.31 (m, 4H), 7.44-7.50 (m, 3H).

MS (Maldi):

m/e=979 (M+H)$^+$ photoluminescence (in film, 2% in PMMA):

$\lambda_{max}$=456, 487 nm, CIE: (0.20; 0.30)

Example 21

Complex Em9-i:

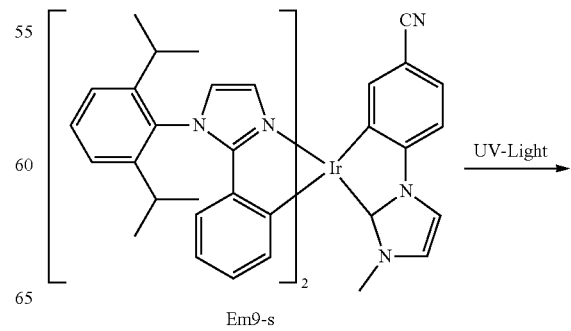

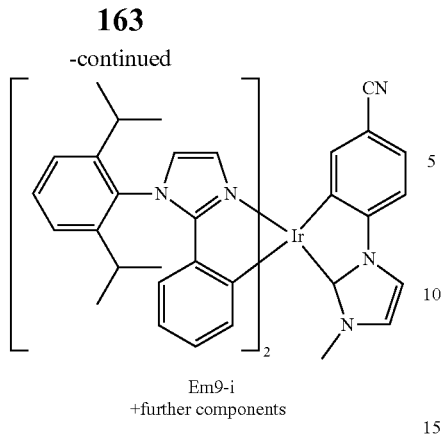

Em9-i
+further components

A solution of 0.17 g of complex Em9-s in 2000 ml acetonitril are irradiated at 15° C. for 9.5 h with a blacklight-blue-lamp (Osram, L18W/73, $\lambda_{max}$=370-380 nm). The solvent is removed in vacuo. The residue is purified by chromatography (cyclohexane/acetic ester). 0.055 g of Em9-i (32%, contaminated with traces of a further complex) are obtained as well as 0.075 g of reisolated Em9-s (44%) are reisolated.

$^1$H-NMR [CD$_2$Cl$_2$, 400 MHz, sample comprises traces of a further complex observable for example at 0.77 (m), 0.83 (d), 1.04 (d), 1.21 (m), 1.92 (sept), 2.34 (sept), 7.20-7.23 (m), 7.31-7.34 (m)]:

δ=0.65 (d, 3H), 0.77 (d, 3H), 0.85 (d, 3H), 0.97 (d, 3H), 0.98 (d, 3H), 1.02 (d, 3H), 1.13 (d, 6H), 1.82 (sept, 1H), 2.33 (sept, 1H), 2.54 (sept, 1H), 2.67 (sept, 1H), 3.04 (s, 3H), 6.09 (dd, 2H), 6.37 (td, 1H), 6.40-6.44 (m, 3H), 6.50 (m, 1H), 6.59 (d, 1H), 6.61 (td, 1H), 6.68 (d, 1H), 6.70 (d, 1H), 6.72 (d, 1H), 6.86 (d, 1H), 6.96 (br.s, 1H), 7.14 (me, 2H), 7.20-7.23 (m, 1H), 7.23-7.31 (m, 3H), 7.44-7.50 (m, 3H).

MS (Maldi):

m/e=979 (M+H)$^+$ photoluminescence (in film, 2% in PMMA):

$\lambda_{max}$=457, 485 nm, CIE: (0.17; 0.26)

The photoluminescence quantum efficiency of the isomer Em9-i has the 1.14-fold value of the quantum efficiency of the isomer Em9-s.

Example 22

Complex Em10-s 1.3-Diphenyl-4,5-di-o-tolyl-imidazolium-tetrafluoroborate C7

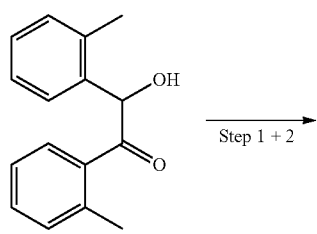

Step 1 + 2

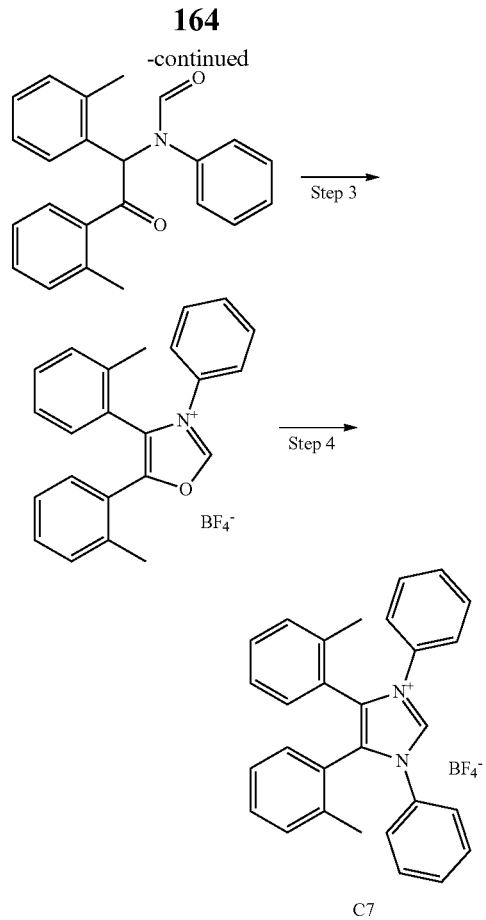

C7

Step 1: Preparation of
2-anilino-1,2-di-o-toluene-ethanone

A solution of 18.00 g (74.91 mmol) o-toluoine are dissolved in 100 ml anhydrous toluene and 21.00 g (224.9 mmol) of anilin and 0.2 g conc. HCl are added at room temperature. The reaction mixture is heated for 10 hours to boiling under reflux, where by the water formed is revolved out. After cooling to room temperature the reaction mixture is diluted with 100 ml acetic ester and then shaked two times with 70 ml 1 n HCl each. Subsequently the organic phase is washed with 100 ml of water and 70 ml of brine, dryed over magnesium sulfate and reduced to a yellow resin. The crude product is purified chromatographically on silica gel with methylene chloride as eluent. After removal of the solvent 19.6 g (83%) of a yellow oil are obtained.

Step 2: Preparation of N-(2-oxo-1,2-di-o-tolyl-ethyl)-N-phenyl-formamide

A solution of 19.50 g (58.7 mmol) 2-anilino-1,2-di-o-tolyl-ethanone in 80 ml of tetrahydrofuran is meaned with 7.80 g (88.1 mmol) acetformylanhydride and stirred for 17 hours at room temperature. The reaction mixture is reduced at a rotarap to a syrup and purified at silica gel with a petrol ether-acetic ester solution as eluent at first in a ratio of 10:1 then 1:1. After removal of the solvent 18.4 g (91%) of a nearly colorless syrup are obtained.

Step 3: Preparation of 3-phenyl-4,5-di-o-tolyl-oxazolium-tetrafluoroborate

To 9.80 g (55.9 mmol) of 50% tetrafluoroboric acid 63 g trifluoroacetic anhydride are added by a syringe at 5-10° C.

in 15 min (exothermicl). The cooled solution is subsequently added dropwise to a suspension of 20.00 g (55.3 mmol)N-(2-oxo-1,2-di-o-tolyl-ethyl)-N-phenyl-formamide in 60 g of trifluoroacetic anhydride at room temperature in 10 min, whereby the temperature rises to 28° C. The reaction mixture is stirred for 3 hours at 20-25° C. and then reduced at a rotarap to an oil. After addition of 100 ml diethylether 9.7 g (55.3 mmol) 50% tetrafluoroboric acid are added dropwise by stirring, whereby a precipitate is formed. After stirring for one hour the precipitate is drawn off, washed three times with 10 ml diethyl ether each and dried. 22.55 g (99%) of a colorless powder are obtained.

Step 4: Preparation of 1,3-diphenyl-4,5-di-o-tolyl-imidazolium-tetrafluoroborate C7

To a suspension of 3.50 g (8.47 mmol) 3-phenyl-4,5-di-o-tolyl-oxazolium-tetrafluoroborate in 35 ml of ethanol 1.58 g (16.9 mmol) of aniline are added. After stirring for 45 min at room temperature, the solution is reduced to an orange colored resin and subsequently 15 mol sulfuric acid are added. The solution is stirred for 2 hours at room temperature. The reaction solution is stirred in 300 ml ice water where by a precipitate is formed. The suspension is stirred for a further hour and then filtered over a suction filter. The residue is washed with water and sucked to dryness to a large extend. The residue is stirred in an Erlenmeyer flask with 40 ml of diethyl ether, sucked and washed with 10 ml of diethyl ether. The stirring in diethyl ether with subsequent suction is repeated two times. After drying 3.10 g (71% d.th.) of a colorless powder are obtained.

Complex Em10-s:

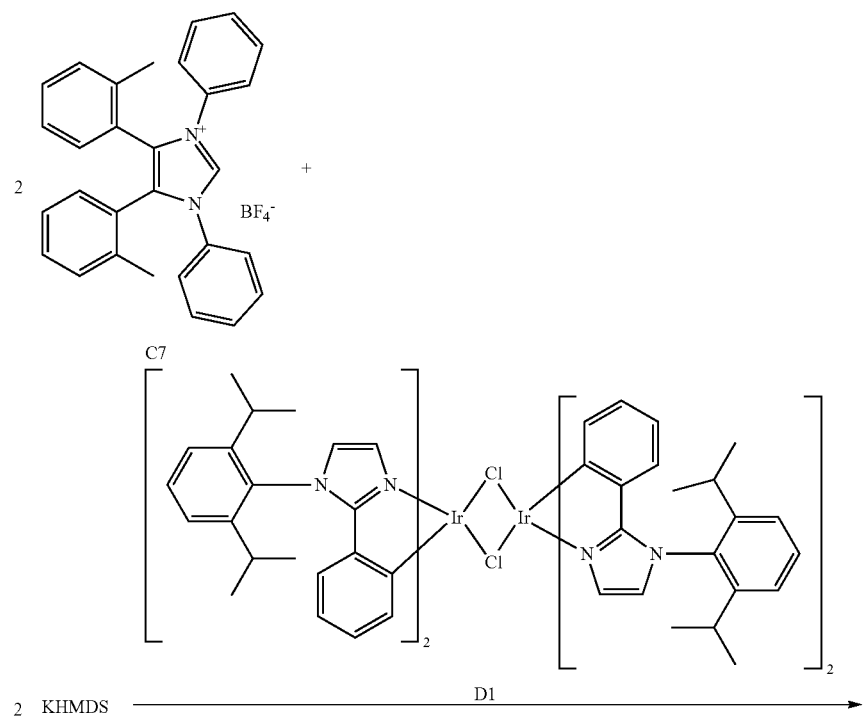

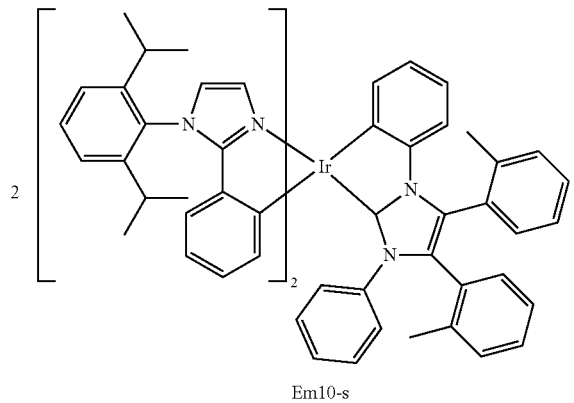

Em10-s

A suspension of 1.61 g (3.30 mmol) 1,3-diphenyl-4,5-di-o-tolyl-imidazolium-tetrafluoroborate in 25 ml of toluene are stirred for 15 min under argon at room temperature and then cooled to 0° C. 12.6 ml (6.29 mmol) 0.5 M potassium-bis(trimethylsilyl)-amide in toluene are added with 1 min. The reaction solution is then stirred for 15 min at 0-12° C., and subsequently, 2.50 g (1.50 mmol) bis(iridium-p-chloro-complex) D1 are added. It is purged with 5 ml of toluene. The orange-yellow suspension is heated under reflux to boiling. After 75 min the reaction solution is cooled to room temperature diluted with 20 ml acetic ester and then extracted two times with 20 ml of phosphate buffer solution (ph 7). The organic phase is separated, dryed over sodium sulfate and then reduced to dryness. The solid is shortly heated in 150 ml of methanol under reflux to boiling. After cooling of the suspension to 50° C. the solid is sucked, washed two times with 10 ml of methanol each and dryed. 2.52 g of a yellow solid are obtained. The filtrate is reduced to 40 ml and stirred overnight at room temperature. The precipitate is sucked, washed with a small amount of methanol and dried. 0.28 g of a yellow solid are obtained, which is combined with the residue.

Therefore, alltogether 2.80 g (78% of th.) of a yellow solid melting at 282-283° C. are obtained.

MS (Maldi):

m/e=1197.4 (M+H)$^+$

Photoluminescence (in film, 2% in PMMA):

$\lambda_{max}$=464, 493 nm, CIE: (0.19; 0.35)

Example 23

Complexes Em10-i and Em10-i*:

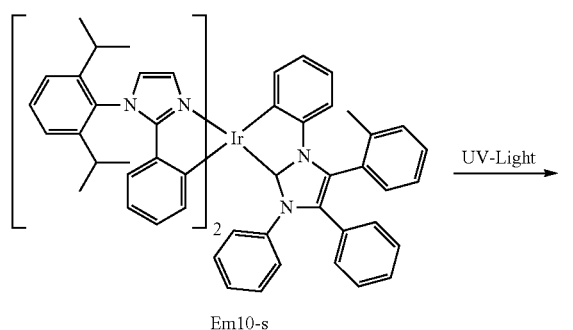

Em10-s

UV-Light
→

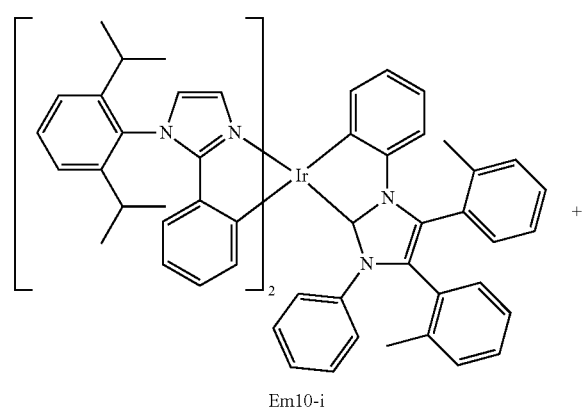

Em10-i

+

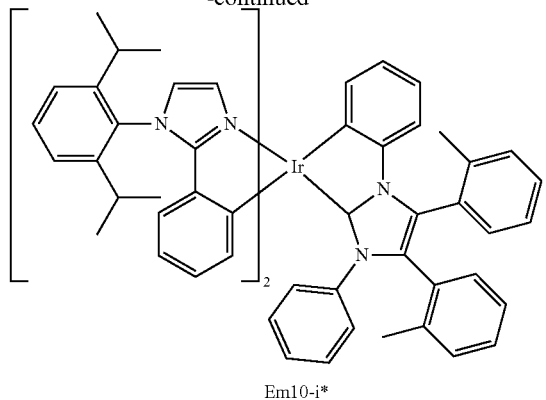

Em10-i*

0.50 g (0.42 mmol) of Em10-s are dissolved in 300 ml of acetonitril and irradiated with a mercury pressure dipping lamp TQ 150 (365 nm, 150 W) for 5.5 hours. The solution is freed from the solvent. The residue is dissolved in 30 ml of methanol by heating. After cooling the precipitate is sucked, washed with methanol and dried. The complex isomer Em10-i [0.19 g (38%)] is obtained as yellow powder melting at 316-317° C.

MS (Maldi):

m/e=1196.7 (M)$^+$

Photoluminescence (in film, 2% in PMMA):

$\lambda_{max}$=460, 491 nm, CIE: (0.18; 0.32)

The filtrate is reduced to dryness, stirred with 10 ml of n-pentane, sucked, washed with pentane and dried. The complex isomer Em10-i* [0.16 g (32%)] is obtained as ocher yellow solid melting at 207-209° C.

MS (Maldi):

m/e=1197.8 (M+H)$^+$

Photoluminescence (in film, 2% in PMMA):

$\lambda_{max}$=458, 490 nm, CIE: (0.19; 0.33)

I) Diode Examples Concerning Em1-s

Example 24—Influence of the Matrix Materials on Em1-s

Diode Structure:

ITO—PEDT:PSS—35 nm Ir(DPBIC)$_3$ mixed with 10 wt.-% MoO$_x$—10 nm Ir(DPBIC)$_3$—40 nm Matrix MaX mixed with 15 wt.-% Em1-s-10 nm LB1—20 nm electron conductor BCP—0.70 nm LiF—100 nm Al.

The preparation of the diode is carried out in analogy to Example 17.

Exciton and hole blocker LB1:

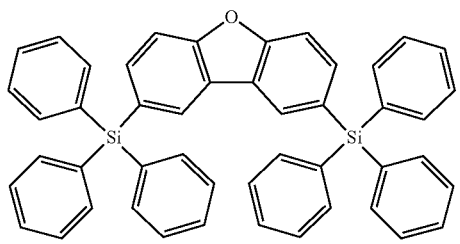 [SMILES: c1ccc([Si](c2ccccc2)(c2ccccc2)c2ccc3oc4ccc([Si](c5ccccc5)(c5ccccc5)c5ccccc5)cc4c3c2)cc1]

| Matrix "MaX" | CIE | Voltage in V @ 300 nits | Cd/A @ 300 nits | EQE @ 300 nits and normalized to the value of Ma2 |
|---|---|---|---|---|
| Ma2[1] | 0.20/0.36 | 8.8 | 10.1 | 100% |
| Ma3 | 0.20/0.32 | 5.5 | 20.5 | 166% |
| Ma4[2] | 0.19/0.32 | 6.5 | 16.3 | 134% |
| Ma5 | 0.20/0.31 | 6.2 | 13.9 | 115% |
| Ma6[3] | 0.19/0.30 | 6.2 | 22.8 | 195% |

[1]In this case 40 nm BCP were used as electron conductor.
[2]In this case 30 nm BCP were used as electron conductor.
[3]In this case AJ20-1000 of Plexcore instead of PEDT:PSS were used as hole injection layer.

Structures of the matrices "MaX" (=Ma2–Ma6) and description of their synthesys in WO2010/079051:

| Matrix "MaX" | Synthesis of MaX described in WO2010/079051 as | Structure |
|---|---|---|
| Ma2 | BS 10 | |
| Ma3 | BS15 | |
| Ma4 | BS18 | |

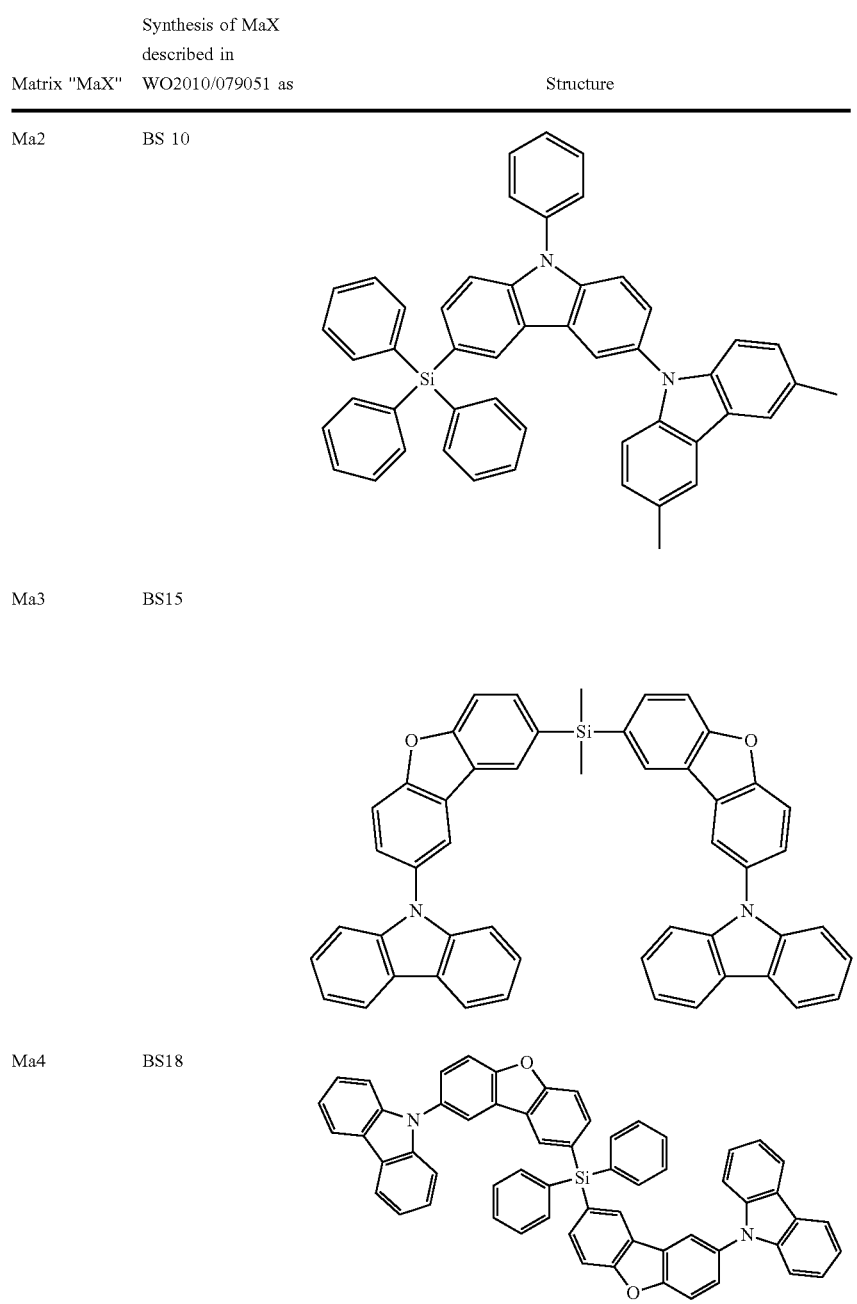

| Matrix "MaX" | Synthesis of MaX described in WO2010/079051 as | Structure |
|---|---|---|
| Ma5 | BS20 | 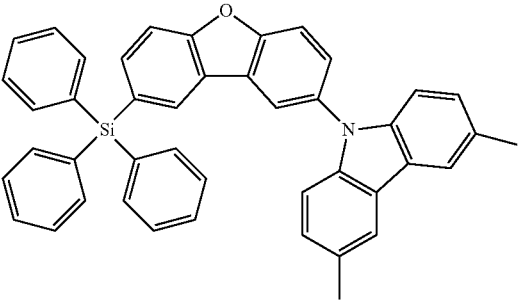 [SMILES: Cc1ccc2c(c1)c1cc(C)ccc1n2-c1ccc2oc3ccc([Si](c4ccccc4)(c4ccccc4)c4ccccc4)cc3c2c1] |
| Ma6 | BS 31 | 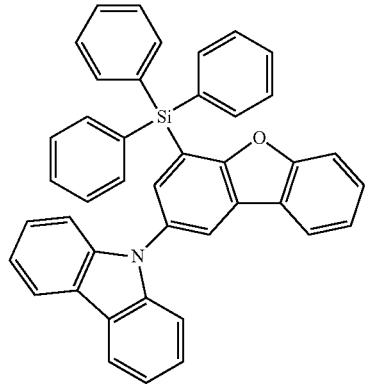 [SMILES: c1ccc([Si](c2ccccc2)(c2ccccc2)c2cc(-n3c4ccccc4c4ccccc43)cc3c2oc2ccccc23)cc1] |

II) Diode Examples Concerning Em1-i

Example 25—Influence of the Matrix Materials on Em1-i

Structure A: ITO—AJ20—1000—35 nm Ir(DPBIC)$_3$ mixed with 50 wt.-% MoO$_3$—10 nm Ir(DPBIC)$_3$—40 nm "MaX" mixed with 20 wt.-% Em1-i—5 nm "MaX"—40 nm electron conductor BCP: Liq 50 wt.-%—1 nm Liq-100 nm Al. The preparation of the diode is carried out in analogy to Example 17.

Structure B: ITO—AJ20—1000—35 nm Ir(DPBIC)$_3$ mixed with 10 wt.-% MoO$_3$—10 nm Ir(DPBIC)$_3$—40 nm "MaX" mixed with 15 wt.-% Em1-i—10 nm LB1—20 nm electron conductor BCP—0.70 nm LiF—100 nm Al. The preparation of the diode is carried out in analogy to Example 17.

| Matrix MaX | Diode structure | CIE | Voltage in V @ 300 nits | Cd/A@ 300 nits | EQE @ 300 nits normalized to the value of |
|---|---|---|---|---|---|
| Ma7 | Structure A | 0.22/0.36 | 5.8 | 18.8 | 100% |
| Ma8 | Structure B | 0.23/0.38 | 7.0 | 17.3 | 91% |
| Ma9 | Structure A[1] | 0.23/0.38 | 4.3 | 17.9 | 95% |

[1]In this case 5 nm Ma1 are used as excition and hole blocker.

Structures of the Matrices MaX and Description of their Synthesis in WO2010/079051:

| Matrix MaX | Compound in WO2010/079051 | Structure |
|---|---|---|
| Ma7 | BS26 | 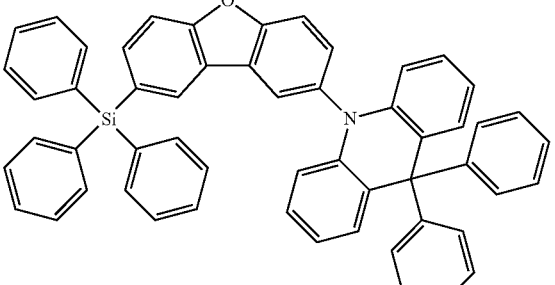 |

-continued

| Matrix MaX | Compound in WO2010/079051 | Structure |
|---|---|---|
| Ma8 | BS29 | 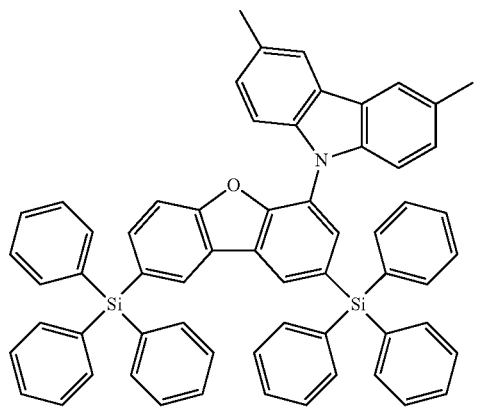 [SMILES: Cc1ccc2c(c1)c1cc(C)ccc1n2-c1cc([Si](c2ccccc2)(c2ccccc2)c2ccccc2)cc2c1oc1ccc([Si](c3ccccc3)(c3ccccc3)c3ccccc3)cc12] |
| Ma9 | BS28 | 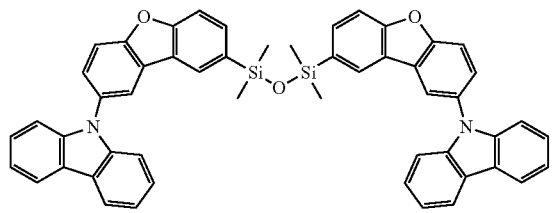 [SMILES: C[Si](C)(O[Si](C)(C)c1ccc2oc3ccc(-n4c5ccccc5c5ccccc54)cc3c2c1)c1ccc2oc3ccc(-n4c5ccccc5c5ccccc54)cc3c2c1] |

Example 26—Influence of the Matrix Materials on Em1-i

ITO—AJ20—1000-10 nm Ma1 mixed with 10 wt.-% $MoO_x$—10 nm Ma10 mixed with 15 wt.-% Em1-i and 15 wt.-% Ma1—5 nm Ma1—20 nm electron conductor BCP mixed with 20 wt.-% Ma1—1 nm $Cs_2CO_3$—100 nm Al. The preparation of the diode is carried out in analogy to Example 17.

The synthesis of matrix material Ma10 is described in JP2009046408, compound B, [0039], p. 13.

Ma10

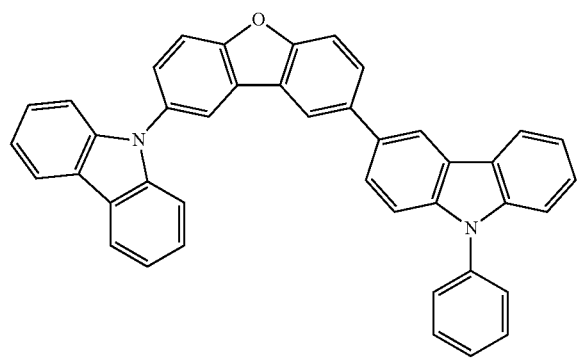 [SMILES: c1ccc(-n2c3ccccc3c3cc(-c4ccc5oc6ccc(-n7c8ccccc8c8ccccc87)cc6c5c4)ccc32)cc1]

| Matrix MaX | CIE | Voltage in V @ 300 units |
|---|---|---|
| Ma10 | 0.19/0.35 | 3.8 |

The invention claimed is:

1. A heteroleptic complex of the general formula (I)

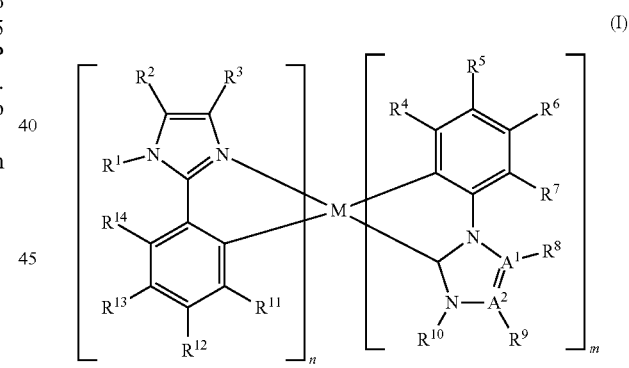

(I)

wherein:
M is a metal atom selected from the group consisting of Ir and Pt,
$A^1$, $A^2$ are each independently N or C,
n, m are each independently 1 or 2, where, if M is Pt, the sum of n and m is 2, or, if M is Ir, the sum of n and m is 3,
$R^1$ is a linear or branched alkyl radical optionally interrupted by at least one heteroatom, optionally bearing at least one functional group and having 1 to 20 carbon atoms, cycloalkyl radical optionally interrupted by at least one heteroatom, optionally bearing at least one functional group and having 3 to 20 carbon atoms, substituted or unsubstituted aryl radical optionally interrupted by at least one heteroatom, optionally bearing at least one functional group and having 6 to 30 carbon atoms, substituted or unsubstituted heteroaryl radical optionally interrupted by at least one heteroatom, optionally bearing at least one functional group and having 5 to 18 carbon atoms and/or heteroatoms, $R^2$, $R^3$ are each independently hydrogen, linear or branched alkyl radical optionally interrupted by at least one heteroatom, optionally bearing at least one functional group and having 1 to 20 carbon atoms, cycloalkyl radical optionally interrupted by at least one heteroatom, optionally bearing at least one functional group and having 3 to 20 carbon atoms, substituted or unsubstituted aryl radical optionally interrupted by at least one heteroatom, optionally bearing at least one functional group and having 6 to 30 carbon atoms, substituted or unsubstituted heteroaryl radical optionally interrupted by at least one heteroatom, optionally bearing at least one functional group and having 5 to 18 carbon atoms and/or heteroatoms, $R^4$, $R^5$, $R^6$, $R^7$ are each independently hydrogen, substituent with donor or acceptor action, linear or branched alkyl radical optionally interrupted by at least one heteroatom, optionally bearing at least one functional group and having 1 to 20 carbon atoms, cycloalkyl radical optionally interrupted by at least one heteroatom, optionally bearing at least one functional group and having 3 to 20 carbon atoms, substituted or unsubstituted aryl radical optionally interrupted by at least one heteroatom, optionally bearing at least one functional group and having 6 to 30 carbon atoms, substituted or unsubstituted heteroaryl radical optionally interrupted by at least one heteroatom, optionally bearing at least one functional group and having 5 to 18 carbon atoms and/or heteroatoms, or $R^4$ and $R^5$ or $R^5$ and $R^6$ and/or $R^6$ and $R^7$ together form a saturated, unsaturated or aromatic carbon ring optionally interrupted by at least one heteroatom and having a total of 5 to 30 carbon atoms or heteroatoms, $R^8$, $R^9$ are each independently a free electron pair if $A^1$ or $A^2$ is N, or, if $A^1$ or $A^2$ is C, hydrogen, linear or branched alkyl radical optionally interrupted by at least one heteroatom, optionally bearing at least one functional group and having 1 to 20 carbon atoms, cycloalkyl radical optionally interrupted by at least one heteroatom, optionally bearing at least one functional group and having 3 to 20 carbon atoms, substituted or unsubstituted aryl radical optionally interrupted by at least one heteroatom, optionally bearing at least one functional group and having 6 to 30 carbon atoms, substituted or unsubstituted heteroaryl radical optionally interrupted by at least one heteroatom, optionally bearing at least one functional group and having 5 to 18 carbon atoms and/or heteroatoms, $R^{10}$ is a linear or branched alkyl radical optionally interrupted by at least one heteroatom, optionally bearing at least one functional group and having 1 to 20 carbon atoms, cycloalkyl radical optionally interrupted by at least one heteroatom, optionally bearing at least one functional group and having 3 to 20 carbon atoms, substituted or unsubstituted aryl radical optionally interrupted by at least one heteroatom, optionally bearing at least one functional group and having 6 to 30 carbon atoms, substituted or unsubstituted heteroaryl radical optionally interrupted by at least one heteroatom, optionally bearing at least one functional group and having 5 to 18 carbon atoms and/or heteroatoms, $R^{11}$, $R^{12}$, $R^{13}$, $R^{14}$ are each independently hydrogen, substituent with donor or acceptor action, linear or branched alkyl radical optionally interrupted by at least one heteroatom, optionally bearing at least one functional group and having 1 to 20 carbon atoms, cycloalkyl radical optionally interrupted by at least one heteroatom, optionally bearing at least one functional group and having 3 to 20 carbon atoms, substituted or unsubstituted aryl radical optionally interrupted by at least one heteroatom, optionally bearing at least one functional group and having 6 to 30 carbon atoms, substituted or unsubstituted heteroaryl radical optionally interrupted by at least one heteroatom, optionally bearing at least one functional group and having 5 to 18 carbon atoms and/or heteroatoms, or $R^{11}$ and $R^{12}$ or $R^{12}$ and $R^{13}$ and/or $R^{14}$ together form a saturated, unsaturated or aromatic carbon ring optionally interrupted by at least one heteroatom and having a total of 5 to 30 carbon atoms and/or heteroatoms, $R^1$ and $R^{14}$ optionally together form a saturated or unsaturated, linear or branched bridge optionally comprising heteroatoms, aromatic units, heteroaromatic units and/or functional groups and having a total of 1 to 30 carbon atoms and/or heteroatoms, to which a substituted or unsubstituted, five-to eight-membered ring comprising carbon atoms and/or heteroatoms is optionally fused, if $A^1$ is C, $R^7$ and $R^8$ optionally together form a saturated or unsaturated, linear or branched bridge optionally comprising heteroatoms, aromatic units, heteroaromatic units and/or functional groups and having a total of 1 to 30 carbon atoms and/or heteroatoms, to which a substituted or unsubstituted, five- to eight-membered ring comprising carbon atoms and/or heteroatoms is optionally fused.

2. The heteroleptic complex according to claim 1, wherein:

M is Ir, $A^1$, $A^2$ is C, n, m are each independently 1 or 2, where the sum of n and m is 3, $R^1$ is a linear or branched alkyl radical having 1 to 20 carbon atoms, substituted or unsubstituted aryl radical having 6 to 30 carbon atoms, substituted or unsubstituted heteroaryl radical having 5 to 18 carbon atoms and/or heteroatoms, $R^2$, $R^3$ are each independently hydrogen, linear or branched alkyl radical having 1 to 20 carbon atoms, substituted or unsubstituted aryl radical having 6 to 30 carbon atoms, substituted or unsubstituted heteroaryl radical having 5 to 18 carbon atoms and/or heteroatoms, $R^4$, $R^5$, $R^6$, $R^7$ are each hydrogen or $R^4$ and $R^5$ or $R^5$ and $R^6$ or $R^6$ and $R^7$ together form a saturated, unsaturated or aromatic ring optionally interrupted by at least one heteroatom and having a total of 5 to 30 carbon atoms and/or heteroatoms, $R^8$, $R^9$ are each hydrogen, $R^{10}$ is a linear or branched alkyl radical having 1 to 20 carbon atoms, substituted or unsubstituted aryl radical having 6 to 30 carbon atoms, and $R^{11}$, $R^{12}$, $R^{13}$, $R^{14}$ are each independently hydrogen or linear or branched alkyl radical having 1 to 20 carbon atoms, $R^1$ and $R^{14}$ optionally together form a saturated or unsaturated, linear or branched bridge optionally comprising heteroatoms, aromatic units, heteroaromatic units and/or functional groups and having a total of 1 to 30 carbon atoms and/or heteroatoms, to which a substituted or unsubstituted, five- to eight-membered ring comprising carbon atoms and/or heteroatoms is optionally fused, $R^7$ and $R^8$ optionally together form a saturated or unsaturated, linear or branched bridge optionally comprising heteroatoms, aromatic units, heteroaromatic units and/or functional groups and having a total of 1 to 30 carbon atoms and/or heteroatoms, to which a substituted or unsubstituted, five- to eight-membered ring comprising carbon atoms and/or heteroatoms is optionally fused.

3. The heteroleptic complex according to claim 1, wherein:

M is Ir, $A^1$, $A^2$ are each N or C, where $A^1$=N when $A^2$=C and $A^1$=C when $A^2$=N n, m are each independently 1 or 2, where the sum of n and m is 3, $R^1$ is a linear or branched alkyl radical having 1 to 20 carbon atoms, substituted or unsubstituted aryl radical having 6 to 30 carbon atoms, substituted or unsubstituted heteroaryl radical having 5 to 18 carbon atoms and/or heteroatoms, $R^2$, $R^3$ are each independently hydrogen, linear or branched alkyl radical having 1 to 20 carbon atoms, substituted or unsubstituted aryl radical having 6 to 30 carbon atoms, substituted or unsubstituted heteroaryl radical having 5 to 18 carbon atoms and/or heteroatoms, $R^4$, $R^5$, $R^6$, $R^7$ are each hydrogen, or $R^4$ and $R^5$ are $R^5$ and $R^6$ or $R^6$ and $R^7$ together form a saturated, unsaturated or aromatic ring optionally interrupted by at least one heteroatom and having a total of 5 to 30 carbon atoms and/or heteroatoms, $R^8$, $R^9$ are each independently a free electron pair if $A^1$ or $A^2$ is N, or, if $A^1$ or $A^2$ is C, hydrogen, linear or branched alkyl radical having 1 to 20 carbon atoms, substituted or unsubstituted aryl radical having 6 to 30 carbon atoms, substituted or unsubstituted heteroaryl radical having 5 to 18 carbon atoms and/or heteroatoms, $R^{10}$ is a linear or branched alkyl radical having 1 to 20 carbon atoms, substituted or unsubstituted aryl radical having 6 to 30 carbon atoms, and $R^{11}$, $R^{12}$, $R^{13}$, $R^{14}$ are each independently hydrogen or linear or branched alkyl radical having 1-20 carbon atoms, $R^1$ and $R^{14}$ optionally together form a saturated or unsaturated, linear or branched bridge optionally comprising heteroatoms, aromatic units, heteroaromatic units and/or functional groups and having a total of 1 to 30 carbon atoms and/or heteroatoms, to which a substituted or unsubstituted, five- to eight-membered ring comprising carbon atoms and/or heteroatoms is optionally fused, if $A^1$ is C, $R^7$ and $R^8$ optionally together form a saturated or unsaturated, linear or branched bridge optionally comprising heteroatoms, aromatic units, heteroaromatic units and/or functional groups and having a total of 1 to 30 carbon atoms and/or heteroatoms, to which a substituted or unsubstituted, five- to eight-membered ring comprising carbon atoms and/or heteroatoms is optionally fused.

4. The heteroleptic complex according to claim 1, wherein:

M is Ir, $A^1$ is C, $A^2$ is N or C, n, m are each independently 1 or 2, where the sum of n and m is 3, $R^1$ is a linear or branched alkyl radical having 1 to 20 carbon atoms, substituted or unsubstituted aryl radical having 6 to 30 carbon atoms, substituted or unsubstituted heteroaryl radical having 5 to 18 carbon atoms and/or heteroatoms, $R^2$, $R^3$ are each independently hydrogen, linear or branched alkyl radical having 1 to 20 carbon atoms, substituted or unsubstituted aryl radical having 6 to 30 carbon atoms, substituted or unsubstituted heteroaryl radical having 5 to 18 carbon atoms and/or heteroatoms, $R^4$, $R^5$, $R^6$ are each independently hydrogen, linear or branched alkyl radical having 1 to 20 carbon atoms, substituted or unsubstituted aryl radical having 6 to 30 carbon atoms, $R^7$, $R^8$ together form an unsaturated $C_2$ bridge, to which a substituted or unsubstituted, five- to eight-membered ring comprising carbon atoms and/or heteroatoms, may be fused, $R^9$ is a free electron pair if $A^2$ is N or, if $A^2$ is C, hydrogen, linear or branched alkyl radical having 1 to 20 carbon atoms, substituted or unsubstituted aryl radical having 6 to 30 carbon atoms, substituted or unsubstituted heteroaryl radical having 5 to 18 carbon atoms and/or heteroatoms, $R^{10}$ is a linear or branched alkyl radical having 1 to 20 carbon atoms, substituted or unsubstituted aryl radical having 6 to 30 carbon atoms, and $R^{11}$, $R^{12}$, $R^{13}$, $R^{14}$ are each independently hydrogen or linear or branched alkyl radical having 1 to 20 carbon atoms, $R^1$ and $R^{14}$ optionally together form a saturated or unsaturated, linear or branched bridge optionally comprising heteroatoms, aromatic units, heteroaromatic units and/or functional groups and having a total of 1 to 30 carbon atoms and/or heteroatoms, to which a substituted or unsubstituted, five- to eight-membered ring comprising carbon atoms and/or heteroatoms is optionally fused.

5. The heteroleptic complex according to claim 1, wherein $R^1$ is an aryl radical which has 6 to 30 carbon atoms and is substituted in the ortho,ortho' positions in each case by a linear or branched alkyl radical having 1 to 10 carbon atoms.

6. The heteroleptic complex according to claim 1, wherein $R^1$ and $R^{14}$ together form a saturated or unsaturated, linear or branched bridge optionally comprising heteroatoms, aromatic units, heteroaromatic units and/or functional groups and having a total of 1 to 30 carbon atoms and/or heteroatoms, to which a substituted or unsubstituted, five- to eight-membered ring comprising carbon atoms and/or heteroatoms is optionally fused.

7. The heteroleptic complex according to claim 1, wherein $R^4$ and $R^5$, $R^5$ and $R^6$ or $R^6$ and $R^7$ together form a cycle of the general formula (IIa) or (IIb)

(IIa)

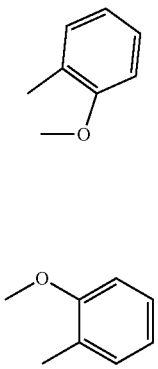

(IIb)

8. The heteroleptic complex according to claim 1, which has one of the following configurations IIIa, IIIb, IVa or IVb:

(IIIa)

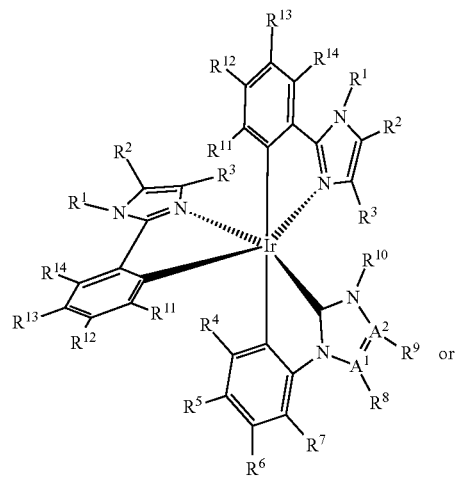

or (IIIb)

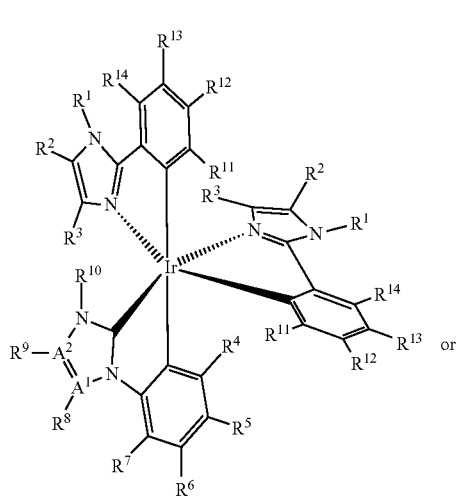

or (IVa)

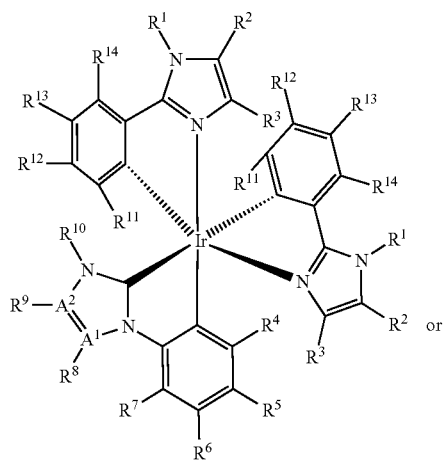

or (IVb)

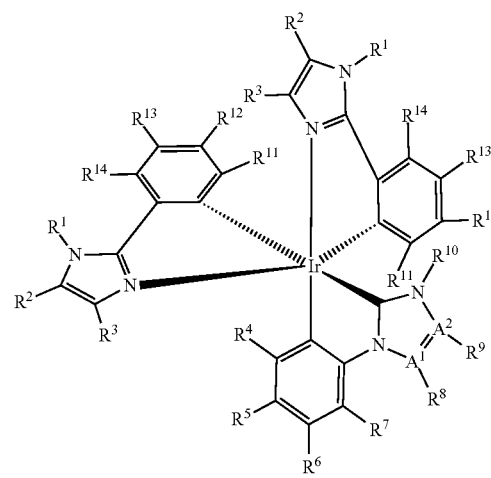

9. A process for preparing a heteroleptic complex according to claim 1 by contacting at least one precursor compound comprising the metal M and the at least one ligand which, in the complexes of the general formula (I), is attached to M via noncarbene bonds with at least one ligand which, in the complexes of the general formula (I), is attached to M via at least one carbene bond, or the ligand precursor thereof, for example a corresponding imidazolium salt, or by contacting at least one precursor compound comprising the metal M and a ligand which, in the complexes of the general formula (I), is bonded to M via at least one carbene bond with at least one ligand which, in the complexes of the general formula (I), is attached to M via noncarbene bonds.

10. An OLED comprising at least one heteroleptic complex according to claim 1.

11. An OLED comprising a heteroleptic complex according to claim 1 and at least one compound of the formula (X)

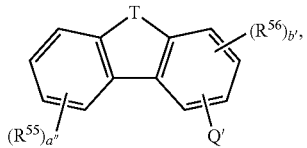

(X)

in which T is $NR^{57}$, S, O or $PR^{57}$;
$R^{57}$ is aryl, heteroaryl, alkyl, cycloalkyl or heterocycloalkyl;
Q' is $-NR^{58}R^{59}$, $-P(O)R^{60}R^{61}$, $PR^{62}R^{63}$, $S(O)_2R^{64}$, $-S(O)R^{65}$, $-SR^{66}$, $-OR^{67}$, or

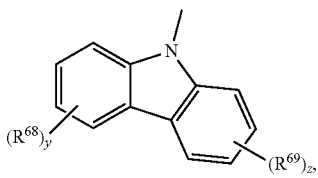

wherein
$R^{68}$, $R^{69}$ are each independently alkyl, cycloalkyl, heterocycloalkyl, aryl or heteroaryl;
y, z are each independently 0, 1, 2, 3 or 4;
$R^{55}$, $R^{56}$ are each independently alkyl, cycloalkyl, heterocycloalkyl, aryl, heteroaryl, $SiR^{70}R^{71}R^{72}$, a group Q' or a group with donor or acceptor action;
a" 0, 1, 2, 3 or 4;
b' 0, 1, 2 or 3;
$R^{58}$, $R^{59}$ together with the nitrogen atom form a cyclic radical which has 3 to 10 ring atoms and may be unsubstituted or substituted by one or more substitutents selected from alkyl, cycloalkyl, heterocycloalkyl, aryl, heteroaryl and a group with donor or acceptor action and/or may be fused to one or more further cyclic radicals having 3 to 10 ring atoms, where the fused radicals may be unsubstituted or substituted by one or more substituents selected from alkyl, cycloalkyl, heterocycloalkyl, aryl, heteroaryl and a group with donor or acceptor action;
$R^{70}$, $R^{71}$, $R^{72}$, $R^{60}$, $R^{61}$, $R^{62}$, $R^{63}$, $R^{64}$, $R^{65}$, $R^{66}$, $R^{67}$ are each independently aryl, heteroaryl, alkyl, cycloalkyl or heterocycloalkyl,
or
two units of the general formula (X) are bridged by a linear or branched, saturated or unsaturated bridge, optionally interrupted by at least one heteroatom, by a bonding or by O.

12. The OLED according to claim 11 comprising at least one compound of formula (XI) or (XI*)

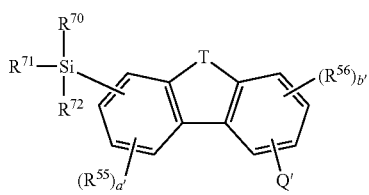

(XI)

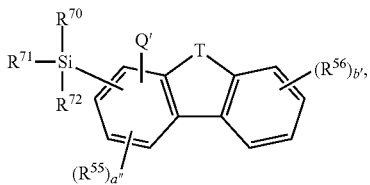

(XI*)

wherein
T is $NR^{57}$, S, O or $PR^{57}$;
$R^{57}$ is aryl, heteroaryl, alkyl, cycloalkyl or heterocycloalkyl;
Q' is $-NR^{58}R^{59}$, $-P(O)R^{60}R^{61}$, $PR^{62}R^{63}$, $S(O)_2R^{64}$, $-S(O)R^{65}$, $-SR^{66}$ or $-OR^{67}$;
$R^{70}$, $R^{71}$, $R^{72}$ are each independently aryl, heteroaryl, alkyl, cycloalkyl, heterocycloalkyl, wherein of at least one of the radicals $R^{70}$, $R^{71}$, $R^{72}$ comprises at least two carbon atoms or $OR^{73}$,
$R^{55}$, $R^{56}$ are each independently alkyl, cycloalkyl, heterocycloalkyl, aryl, heteroaryl, a group Q or a group with donor or acceptor action;
a', b' are for the compound of formula (XI): each independently 0, 1, 2, 3; for the compound of formula (XI*) a' is 0, 1, 2 and b is' 0, 1, 2, 3, 4;
$R^{58}$, $R^{59}$ together with the nitrogen atom form a cyclic radical which has 2 to 10 ring atoms and may be unsubstituted or substituted by one or more substituents selected from alkyl, cycloalkyl, heterocycloalkyl, aryl, heteroaryl and a group with donor or acceptor action and/or may be fused to one or more further cyclic radicals having 3 to 10 ring atoms, where the fused radicals may be unsubstituted or substituted by one or more substituents selected from alkyl, cycloalkyl, heterocycloalkyl, aryl, heteroaryl and a group with donor or acceptor action;
$R^{73}$ is independently $SiR^{74}R^{75}R^{76}$, aryl, heteroaryl, alkyl, cycloalkyl or heterocycloalkyl, optionally substituted with a group $OR^{77}$
$R^{77}$ is independently $SiR^{74}R^{75}R^{76}$, aryl, heteroaryl, alkyl, cycloalkyl or heterocycloalkyl,
$R^{60}$, $R^{61}$, $R^{62}$, $R^{63}$, $R^{64}$, $R^{65}$, $R^{66}$, $R^{67}$, $R^{74}$, $R^{75}$, $R^{76}$ are each independently aryl, heteroaryl, alkyl, cycloalkyl or heterocycloalkyl,
or
two units of the general formulae (XI) and/or (XI*) are bridged by a linear or branched, saturated or unsaturated bridge, optionally interrupted by at least one heteroatom or by O, wherein said bridge is bonded in the general formulae (XI) and/or (XI*) each time instead of $R^{71}$ to the Si-atoms.

13. The OLED according to claim 12, wherein in the compounds of the general formulae (XI) or (XI*) $R^{70}$ and/or $R^{71}$ and/or $R^{72}$ are aromatic units of the general formulae (XIi) and/or (Xii*)

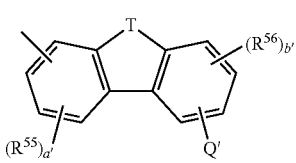

(XIi)

-continued

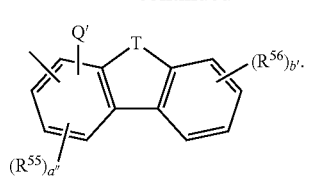

(XIi*)

14. A light-emitting layer comprising at least one heteroleptic complex according to claim 1.

15. An OLED comprising a light-emitting layer according to claim 14.

16. The OLED according to claim 10, which comprises an electron-transporting layer comprising at least two different materials, of which at least one material is electron-conductive.

17. The OLED according to claim 16, wherein the electron-transporting layer comprises at least one phenanthroline derivative and optionally comprises at least one alkali metal hydroxyquinolate complex.

18. A device selected from the group consisting of illuminating elements, stationary visual display units and mobile visual display units, comprising at least one OLED according to claim 10.

19. An OLED comprising a heteroleptic complex according to claim 1.

20. The OLED according to claim 19, wherein the heteroleptic complex is an emitter, matrix material, charge transport material or charge blocker.

* * * * *